United States Patent [19]

Nakano et al.

[11] Patent Number: 6,025,117
[45] Date of Patent: Feb. 15, 2000

[54] METHOD OF FORMING A PATTERN USING POLYSILANE

[75] Inventors: Yoshihiko Nakano, Tokyo; Rikako Kani, Yokohama; Shuji Hayase, Yokohama; Yasuhiko Sato, Yokohama; Seiro Miyoshi, Kawasaki; Toru Ushirogouchi, Yokohama; Sawako Yoshikawa, Yokohama; Hideto Matsuyama, Yokohama; Yasunobu Onishi, Yokohama; Masaki Narita, Yokohama; Toshiro Hiraoka, Yokohama, all of Japan

[73] Assignee: Kabushiki Kaisha Toshiba, Kawasaki, Japan

[21] Appl. No.: 08/986,517

[22] Filed: Dec. 8, 1997

[30] Foreign Application Priority Data

Dec. 9, 1996 [JP] Japan .................................... 8-328587
Jan. 7, 1997 [JP] Japan .................................... 9-000624
Jun. 12, 1997 [JP] Japan .................................... 9-155553
Nov. 21, 1997 [JP] Japan .................................... 9-336655

[51] Int. Cl.$^7$ .................................... G03F 7/00
[52] U.S. Cl. .................... 430/314; 430/316; 430/323; 430/327; 430/330; 216/79; 216/99; 216/2
[58] Field of Search ................... 430/313, 316, 430/317, 323, 327, 330; 216/2, 79, 99

[56] References Cited

U.S. PATENT DOCUMENTS

| | | | |
|---|---|---|---|
| 4,464,460 | 8/1984 | Hiraoka et al. | 430/323 |
| 4,599,243 | 7/1986 | Sachdev et al. | 427/38 |
| 5,270,151 | 12/1993 | Agostino et al. | 430/313 |
| 5,380,621 | 1/1995 | Dichiara et al. | 430/272 |
| 5,482,817 | 1/1996 | Dichiara et al. | 430/271.1 |
| 5,484,687 | 1/1996 | Wantanabe et al. | 430/296 |
| 5,547,808 | 8/1996 | Wantanabe et al. | 430/176 |
| 5,554,485 | 9/1996 | Dichiara et al. | 430/271.1 |

FOREIGN PATENT DOCUMENTS

| | | |
|---|---|---|
| 2-101463 | 4/1990 | Japan . |
| 4-034553 | 2/1992 | Japan . |
| 5-257288 | 10/1993 | Japan . |
| 410209134 | 8/1998 | Japan . |

*Primary Examiner*—Sharon Gibson
*Assistant Examiner*—Jill N. Holloman
*Attorney, Agent, or Firm*—Oblon, Spivak, McClelland, Maier & Neustadt, P.C.

[57] ABSTRACT

A polysilane having a repeating unit represented by the following general formula (LPS-I),

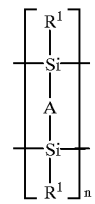

[LPS-I]

wherein A is a bivalent organic group, $R^1$ substituents may be the same or different and are selected from hydrogen atom and substituted or unsubstituted hydrocarbon group and silyl group. The polysilane is excellent in solublity in an organic solvent so that it can be formed into a film by way of a coating method, which is excellent in mechanical strength and heat resistance. The polysilane can be employed as an etching mask to be disposed under a resist in a manufacturing method of a semiconductor device. The polysilane exhibits anti-reflective effect during exposure, a large etch rate ratio in relative to a resist, and excellent dry etching resistance.

4 Claims, 6 Drawing Sheets

METHOD OF FORMING A PATTERN USING POLYSILANE

BACKGROUND OF THE INVENTION

This invention relates to a novel polysilane and to a method of forming a pattern for semiconductor devices by means of lithography using an organosilicon polymer such as polysilane.

In the manufacture of a semiconductor device, various steps are performed, such as the processing of a silicon-based insulation film, e.g., a silicon oxide film, a silicon nitride film a silicon oxynitride film for a spin-on-glass. The processing of these silicon-based insulating film is usually performed as follows.

Namely, a resist film is formed on an insulating film at first and then this resist film is subjected to exposure and development, thereby forming a resist film pattern. This resist film pattern is then employed as an etching mask in the following dry etching process, thus making it possible to process the insulation film. In order to ensure a desired resolution and exposure dose margin or focus margin in the exposure step, the thickness of the resist is required to be made thinner. However, if the thickness of the resist is too thin, the resist pattern may be completely etched away during the dry etching process of the insulating film, thus making it impossible to continue the processing of the insulating film. In order to solve this problem, a method has been developed wherein an etching mask and a resist are formed on an insulating film, and the resist pattern is transferred onto the etching mask, and then dry etching of the insulating film is performed.

In this case, the following materials have been employed as a material for such an etching mask, i.e., (a) silicon-based materials such as polysilicon and amorphous silicon; (b) carbon; and (c) resin materials such as novolak resin and polyhydroxystyrene.

However, these materials for an etching mask are accompanied with the problems to be explained below with reference to FIGS. 1 and 2. FIGS. 1 and 2 illustrate a state wherein an etching mask 3 and a resist 4 are deposited and patterned on a silicon-based insulating film 2 formed on a silicon substrate 1.

When the etching mask material of (a) is employed, the reflection light from the etching mask in the exposure step becomes too strong, so that a standing wave may be generated in the resist, whereby making the side wall of the resist pattern corrugated in shape as shown in FIG. 1.

On the other hand, the etching mask materials of (b) and (c) are capable of functioning as an anti-reflective coating, so that the aforementioned problem may be overcome. However, since these etching mask materials exhibit a small etch rate ratio in relative to the resist, the resist pattern may be disappeared during the etching of these etching masks. In particular, in the case of etching mask consisting of carbon, the profile of the pattern to be obtained may become tapered as shown in FIG. 2.

Furthermore, since the etching mask materials of (a) and (b) are formed into a film by means of a CVD method or a sputtering method, the process becomes complicated and leads to an increase in manufacturing cost as compared with the process where a film is formed by means of coating. On the other hand, if the material of (c) is employed in combination with a silicone-containing resist, it is possible to achieve a sufficiently large etch rate ratio between the resist and the etching mask. However, there is a problem that the silicone-containing resist is relatively low in resolution and in exposure dose margin or focus margin as compared with the ordinary resists.

As explained above, it has been impossible according to the prior art to obtain an etching mask material which can be formed into a film by means of coating, which is capable of suppressing the reflecting light in the exposure step, which exhibits a large etch rate ratio in relative to a resist, and which is excellent in dry etching resistance. Under the circumstances, an organosilicon polymer such as polysilane is now considered as a promising etching mask material which is capable of overcoming the aforementioned problems. However, if an organosilicon polymer is to be employed as an etching mask, features such as mechanical strength and heat resistance are of course required for the polymer. Further, if a resist solution is to be coated on an etching mask comprising an organosilicon polymer thereby to form a resist film, some measures are required to be taken so as to prevent a mixing between an etching mask and a resist.

Furthermore, when a resist is processed through exposure and development steps to form a resist pattern, and then an etching mask is to be etched by means of reactive ion etching (RIE) with the resist pattern being employed as a mask, the etching mask may be accumulated with electric charges (charge-up), which may lead to a dielectric breakdown of an insulating film in the worst case. For the purpose of realizing an increasingly refined processing, a specific method can be taken wherein a resist is once exposed to ultraviolet rays (and developed if required), and then unexposed portions are further exposed to electron beam (EB exposure) and subjected to development thereby to obtain a very fine pattern. In this EB exposure, if the resist is suffered from the charge-up, the electron beam may be repulsed by the electric charges and hence drifted. In this case, since regions other than the regions to which the exposure is intended to be directed may also be exposed to the electron beam, it is no more possible to perform a desired fine processing. Therefore, it is desired to overcome the problems involved due to the charge-up in the processing step employing an etching mask and charged particles such as an electron beam.

BRIEF SUMMARY OF THE INVENTION

Therefore, one object of the present invention is to provide polysilane which can be dissolved in an organic solvent and easily formed into a film, and which is excellent in mechanical strength and in heat resistance.

Another object of the present invention is to employ a specific organosilicon polymer as an etching mask in a process of manufacturing a semiconductor device, whereby making it possible to prevent the mixing thereof with a resist, to suppress a reflecting light in the exposure step, to ensure a large etch rate ratio in relative to a resist, to realize excellent dry etching resistance, to prevent a charge-up in a processing step employing charged particles, and to form an extremely fine pattern.

In order to achieve these objects, this invention provides a polysilane having a repeating unit represented by the following general formula (LPS-I):

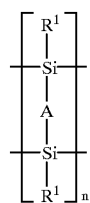

[LPS-I]

wherein A is a bivalent organic group; $R^1$ substituents may be the same or different and are selected from hydrogen atom and a substituted or unsubstituted hydrocarbon group and silyl group.

The polysilane of the present invention may be a copolymer having repeating units represented by the following general formula (LPS-II). Examples of the polysilane having a repeating unit represented by the general formula (LPS-I) are polysilanes having a repeating unit represented by the general formulas (LPS-III) and (LPS-IV). Each polysilane having a repeating unit represented by the general formulas (LPS-III) or (LPS-IV) may be a copolymer like the general formula (LPS-II).

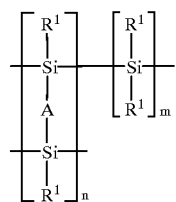

(LPS-II)

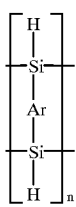

(LPS-III)

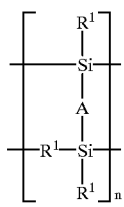

(LPS-V)

wherein Ar in the general formula (LPS-II) is selected from a substituted or unsubstituted aryl group and heteroaromatic group.

This invention also provides a method of forming a pattern, which comprises the steps of: forming an insulating layer on a substrate; forming an organosilicon polymer film on the insulating layer; forming a resist pattern on the organosilicon polymer film; etching the organosilicon polymer film with the resist pattern being employed as a mask thereby to form an organosilicon polymer film pattern; and etching the insulating layer with the resist pattern and the organosilicon polymer film pattern being employed as a mask.

In this method, abovementioned polysilanes having a repeating unit represented by the general formula such as (LPS-I) etc. may be used as the organosilicon polymer. Another organosilicon polymers useful in this method are polysilane dendrimer, a polysilane represented by any one of the following general formulas (ArPs-I) and (ArPs-II), or an organosilicon polymer having a silacyclopentadiene skeleton in its main chain.

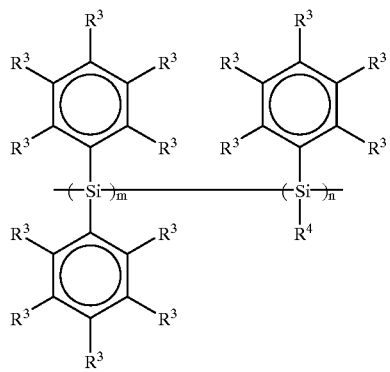

(ArPs-I)

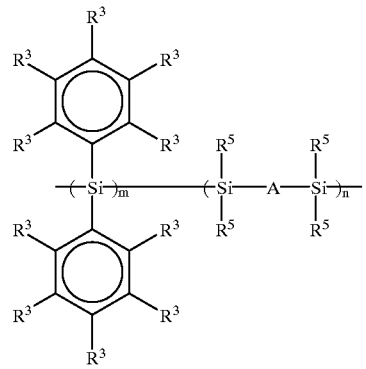

(ArPs-II)

wherein $R^3$ substituents are selected from hydrogen atom and a substituted or unsubstituted hydrocarbon group having not more than four carbon atoms, silyl group and alkoxyl group; $R^4$ substituent is selected from hydrogen atom and a substituted or unsubstituted hydrocarbon group having not more than four carbon atoms and silyl group; $R^5$ substituents are selected from hydrogen atom and a substituted or unsubstituted aryl group and a hydrocarbon group having not more than four carbon atoms, and m and n are positive integers.

This invention further provides a method of forming a pattern, which comprises the steps of: forming an insulating layer on a substrate; forming a crosslinkable organosilicon polymer film on the insulating layer; subjecting the crosslinkable organosilicon polymer film to a crosslinking reaction by means of light or heat; forming a resist pattern on the organosilicon polymer film; etching the organosilicon polymer film with the resist pattern being employed as a mask thereby to form an organosilicon polymer film pattern; and etching the insulating layer with the resist pattern and the organosilicon polymer film pattern being employed as a mask.

Preferable examples of the organosilicon polymer useful in this method are polysilane having hydroxymethylphenyl group or a substituent group comprising hydroxymethylphenyl group whose hydroxyl group is capped with a protective group, polysilane having a photocyclizable substituent group, and an organosilicon polymer added with a crosslinking agent or a crosslinking agent and a reaction accelerator.

It is possible according to this method to prevent a mixing between the resist and the organosilicon polymer since the organosilicon polymer is allowed to crosslink before the resist film is formed, and to improve the heat resistance and etching resistance of the organosilicon polymer film.

This invention further provides a method of forming a pattern, which comprises the steps of: successively forming an insulating layer, an organosilicon polymer film and a resist film on a substrate; and forming the pattern by subjecting the resist pattern to exposure and development and by performing a processing with charged particles, wherein a conductive material is added to the organosilicon polymer film. The conductive material is referred to as a material which brings about electron transfer by light irradiation.

It is also possible in this method to add a precursor which is capable of generating a conductive material when it is exposed to light. Alternatively, a conductive material may be doped into the organosilicon polymer film from vapor phase after the formation of the organosilicon polymer film or after the development of the resist film. Since the organosilicon polymer film is provided with photoconductivity according to this method, it is possible to discharge electric charges even if the organosilicon polymer film is subjected to a processing step using charged particles, thus overcoming the problems resulting from charge-up.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
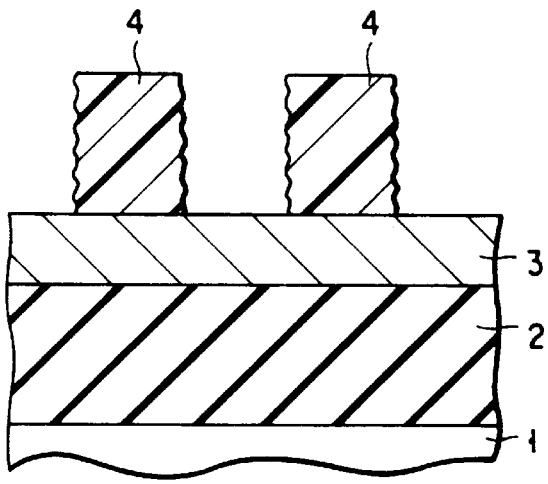
FIG. 1 is a sectional view illustrating the shape of a resist pattern obtained when an etching mask material according to the prior art is employed.
Figure 2:
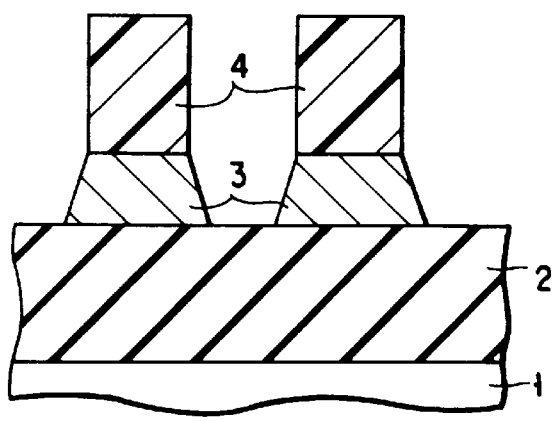
FIG. 2 is a sectional view illustrating the shape of a resist pattern obtained when an etching mask material according to the prior art is employed.

This invention will be further explained with reference to the following preferred embodiments.

The present invention mainly relates to an etching mask material to be disposed beneath a resist film in the manufacture of a semiconductor devise. This invention provides an organosilicon polymer which is suited for use as such an etching mask. The organosilicon polymer according to this invention can also be employed as a resist. Preferably, the organosilicon polymer according to this invention is formed of a crosslinked three-dimensional structure or is capable of crosslinking after being formed into a film.

First of all, a polysilane having a repeating unit represented by the following general formula (LPS-I) will be explained. This polysilane has a three-dimensional structure in which one-dimensional polysilanes are crosslinked.

[LPS-I]

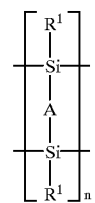

wherein A is a bivalent organic group; $R^1$ substituents may be the same or different and are selected from hydrogen atom and a substituted or unsubstituted hydrocarbon group and silyl group.

Specific examples of bivalent organic group represented by "A" are alkylidene (for example, methylidene, ethylidene and isopropylidene), alkylene (for example, ethylene, propylene and triethylene), and arylene (for example, phenylene, biphenylene and naphthylene). If $R^1$ is a hydrocarbon group, it may be any of an aliphatic hydrocarbon group, an aromatic hydrocarbon group and a heterocyclic group. Specific examples of $R^1$ are methyl, ethyl, propyl, trifluoromethyl, 3,3,3-trifluoropropyl, cyclohexyl, phenyl, naphthyl, 4-methoxyphenyl, 4-biphenylene, anthranil, etc. The polysilane according to the present invention contains a copolymer having two or more repeating units.

The crosslinking degree of the polysilane according to this invention can be easily adjusted. For example, a copolymer comprising a couple of repeating units represented by the general formula (LPS-II) may be employed. It is possible in this polysilane to lower the crosslinking degree by introducing therein a linear repeating unit.

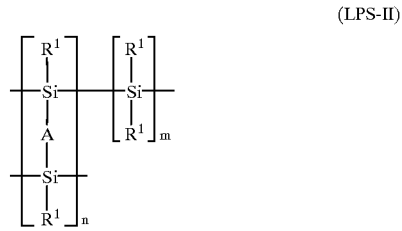
(LPS-II)

wherein A is a bivalent organic group; $R^1$ substituents may be the same or different and are selected from hydrogen atom and a substituted or unsubstituted hydrocarbon group and silyl group. The copolymer may have three or more repeating units.

If the crosslinking degree is to be increased, a polysilane where $R^1$ is formed of hydrogen atom in the general formula (LPS-I) or (LPS-II) may be employed. Since there is a possibility that such a polysilane may be crosslinked at Si—H site, the crosslinking degree would be increased. In particular, a polysilane where $R^1$ is formed of hydrogen atom and the linkage group A at the crosslinking portion is formed of aryl group or heteroaromatic group is employed, the Tg thereof would be raised and hence the heat resistance thereof would be improved. Polysilane of this kind can be represented by the following general formulas (LPS-III) and (LPS-IV).

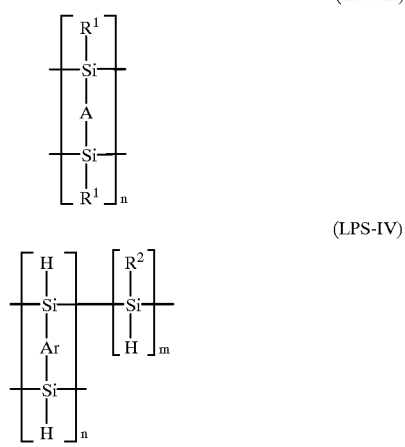
(LPS-III)

(LPS-IV)

wherein Ar is selected from aryl group and heteroaromatic group; $R^2$ substituent is selected from a substituted or unsubstituted hydrocarbon group and silyl group.

The polysilane represented by the general formula (LPS-I) can be synthesized through a polymerization of a silane compound represented by the following general formula (S-I) in the presence of an alkaline metal or an alkaline earth metal. The polysilane represented by the general formula (LPS-II) can be synthesized through a copolymerization of a silane compound represented by the following general formula (S-I) with dihalosilane represented by the following general formula (S-II) in the presence of an alkaline metal or an alkaline earth metal. The polysilane represented by the general formulas (LPS-III) and (LPS-IV) can also be synthesized in the same manner as mentioned above.

[S-I]

[S-II]

wherein A is a bivalent organic group; $R^1$ substituents may be the same or different and are selected from hydrogen atom and a substituted or unsubstituted hydrocarbon group and silyl group; X is F, Cl, Br or I. A typical example of silane compound represented by the general formula (S-I) is 1, ω-bis(dihalosilyl)alkane in which A is formed of —$(CH_2)_n$—, where n is an integer.

Dihalosilane represented the general formula (S-II) may be partially or entirely substituted by trihalosilane represented the following general formula (S-III) for the purpose of adjusting the crosslinking degree of polysilane.

[S-III]

The polymerization reaction of these silane compounds can be performed in a solvent containing an alkaline metal or an alkaline earth metal. If desired, a polymerization catalyst may be added to the reaction mixture. As for the solvent useful in this case, an aprotic polar solvent or a mixed solvent consisting of a non-polar solvent and an aprotic polar solvent may be employed. Specific examples of the aprotic polar solvent include an ether type solvent (such as tetrahydrofuran and dimethoxyethane). Specific examples of the non-polar solvent include a hydrocarbon-based solvent (such as hexane, toluene and xylene). As for the polymerization catalyst, an interphase mobile catalyst (crown ether and cryptand) and a copper compound may be employed.

The dihalosilane represented by the general formula (S-II) may be dripped into a solvent containing an alkaline metal or an alkaline earth metal so as to allow the dihalosilane to take place a polymerization reaction, and then a silane compound represented by the general formula (S-I) may be dripped into this reaction mixture thereby to additionally proceed a polymerization reaction, thus obtaining a polysilane block copolymer.

It is also possible to synthesize a polysilane block copolymer through a condensation polymerization between a polysilane represented by the following general formula (PS-M) having Si—M bonds (M is an alkaline metal) attached to ends of the compound and a silane compound represented by the general formula (SI). The polysilane (silyldianion) represented by the general formula (PS-M) can be prepared by a reaction between a silane compound represented by the general formula (S-II) or a cyclic oligosilane and an alkaline metal.

[PS-M]

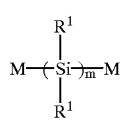

wherein $R^1$ substituents may be the same or different and are selected from hydrogen atom and a substituted or unsubstituted hydrocarbon group and silyl group; M is an alkaline metal; and m is a positive integer.

Followings are specific examples of the silane compound represented by the general formula (S-I), and of the dihalosilane represented by the general formula (S-II). Specific examples of polysilanes represented by the general formulas (LPS-I), (LPS-II)t (LPS-III) are (LPS-IV) are also shown below.

[S-II]

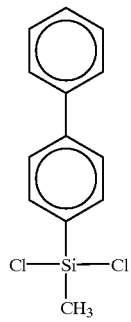

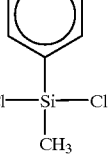

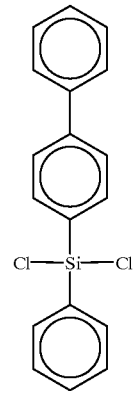

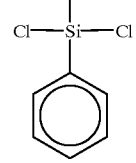

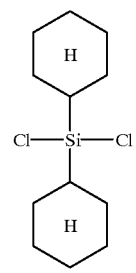

-continued

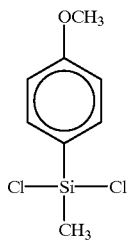

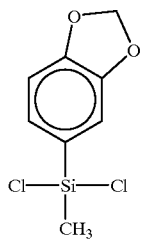

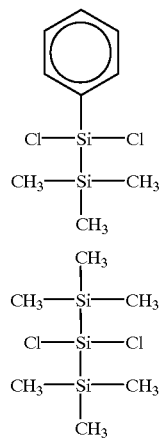

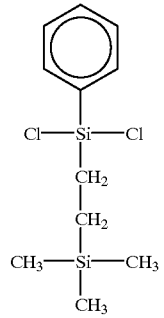

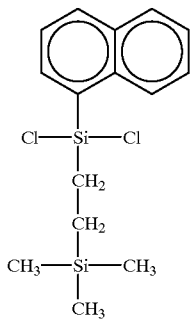

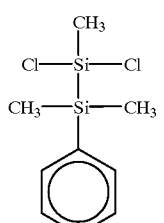
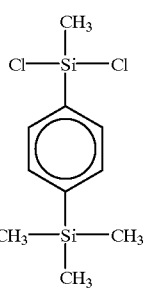
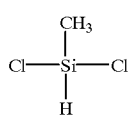
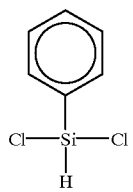
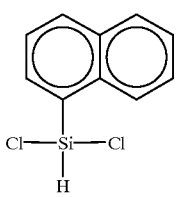
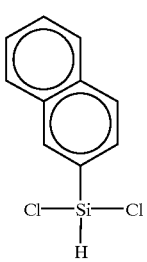
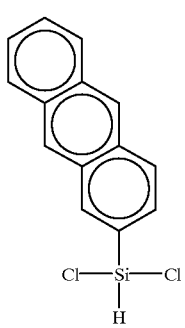
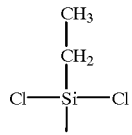
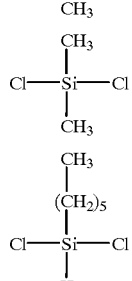
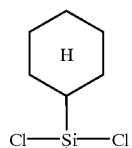
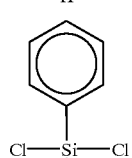
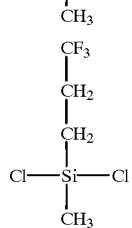
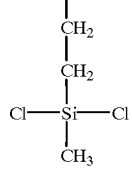
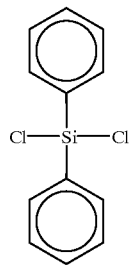
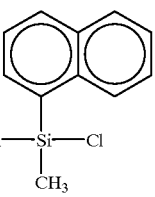

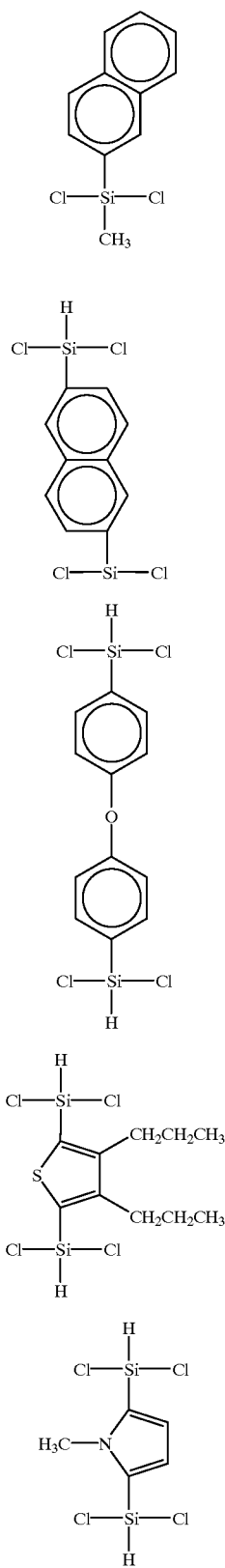
[S-I]

-continued
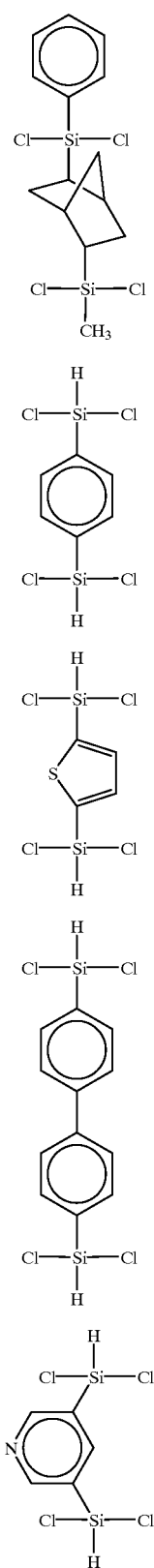
-continued
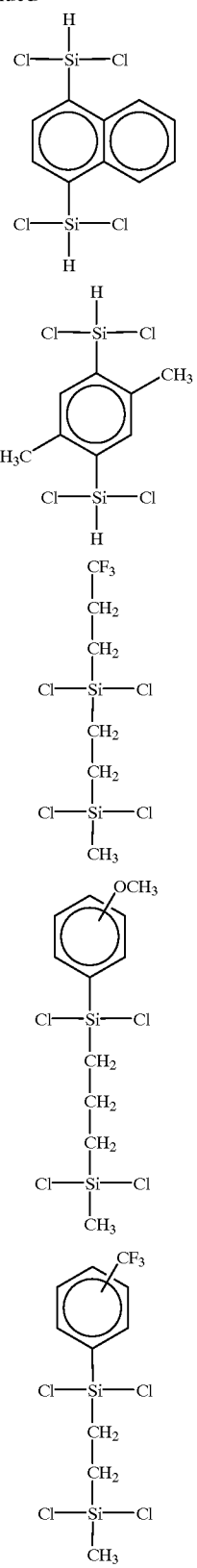

-continued
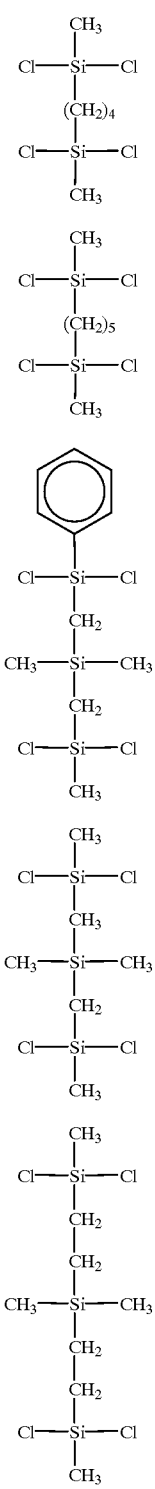
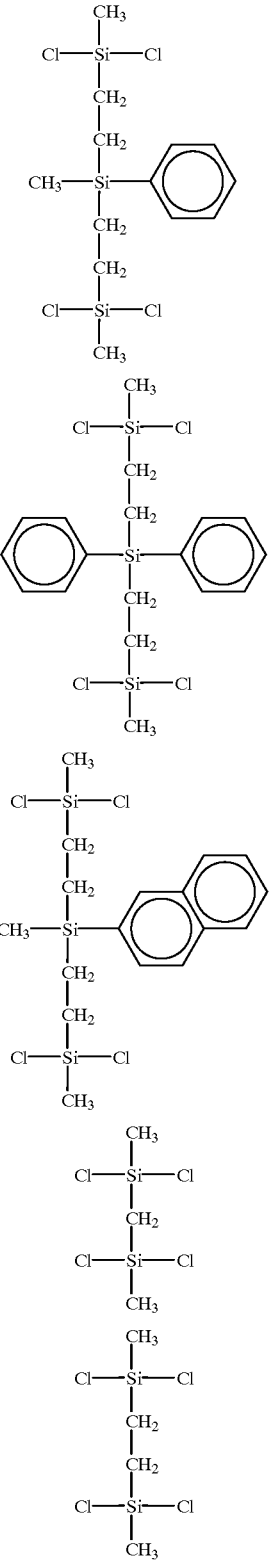

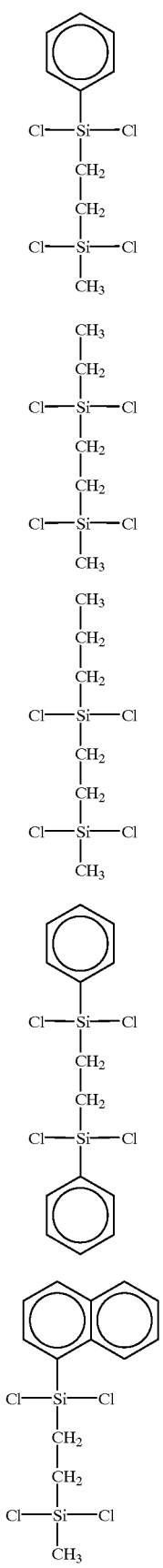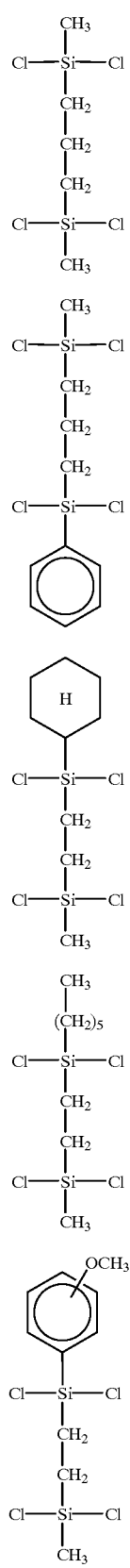

-continued
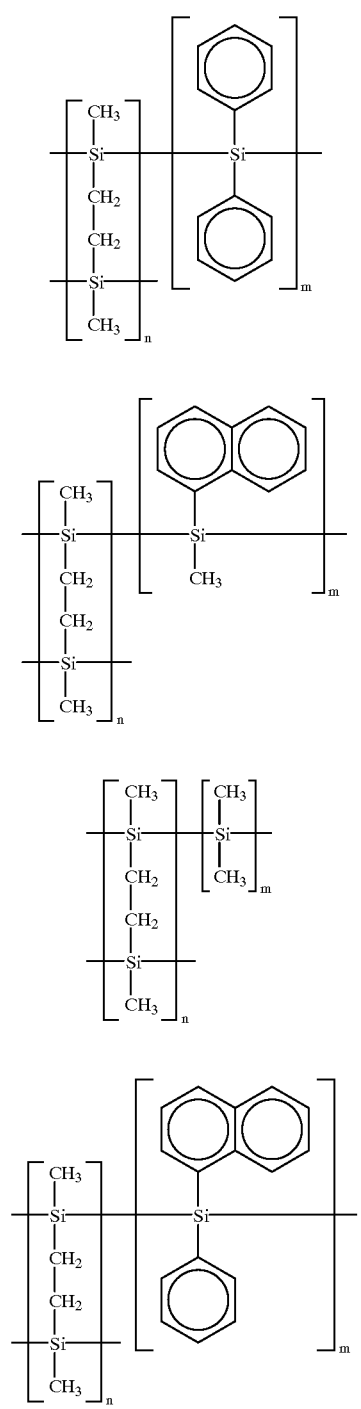
[LPS-1]
[LPS-2]
[LPS-3]
[LPS-4]
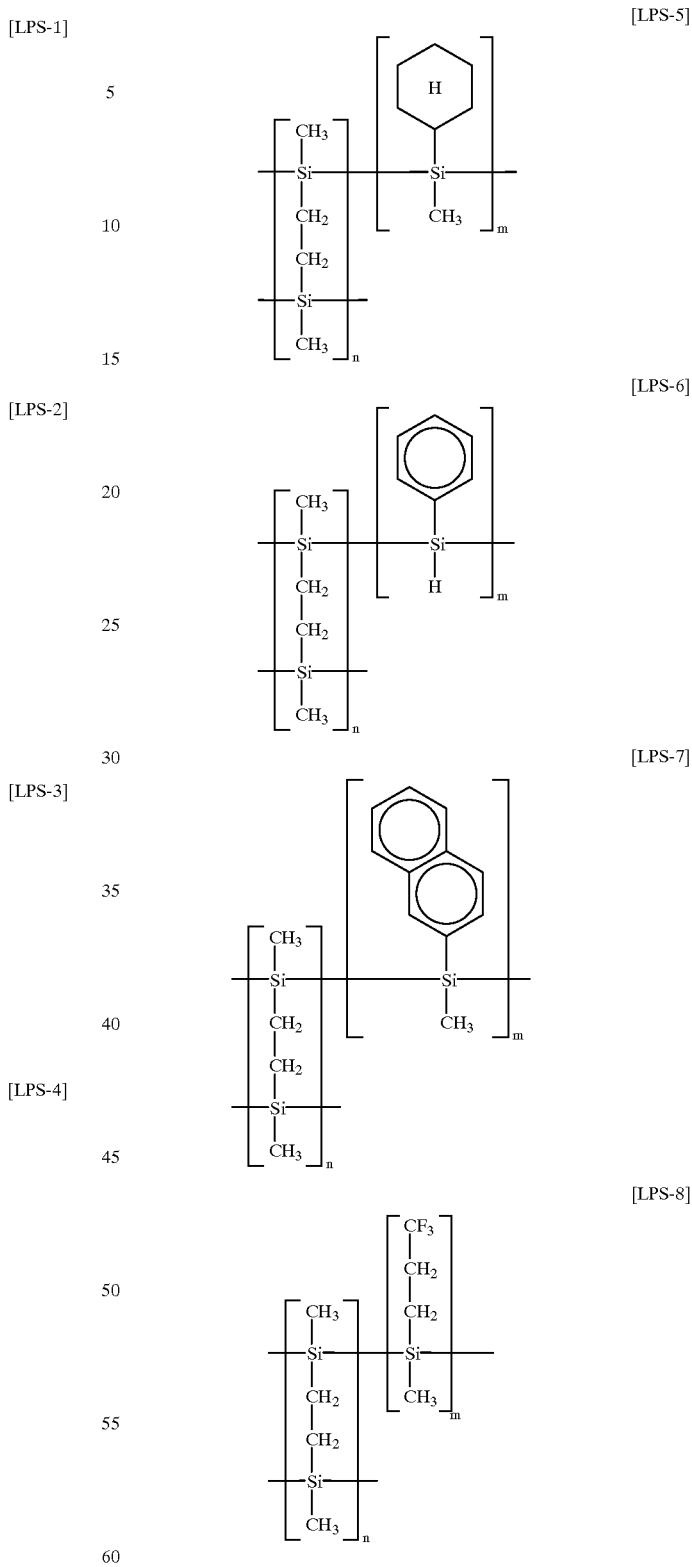
[LPS-5]
[LPS-6]
[LPS-7]
[LPS-8]

[LPS-9]
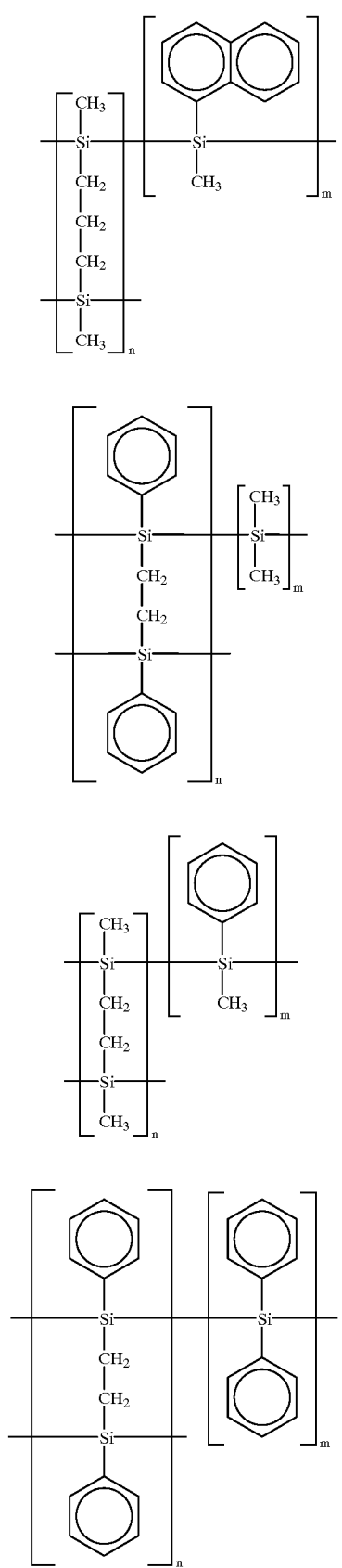
[LPS-10]
[LPS-11]
[LPS-12]
[LPS-13]
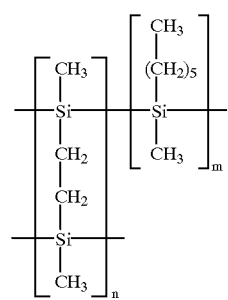
[LPS-14]
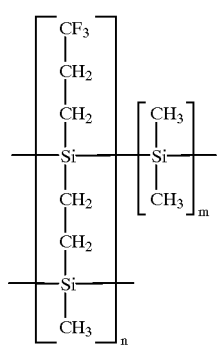
[LPS-15]
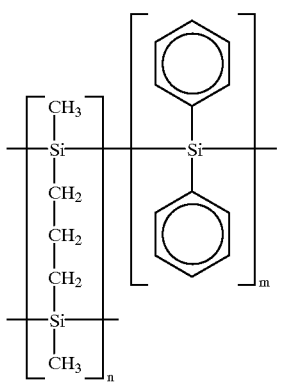
[LPS-16]
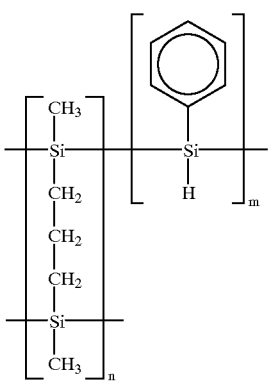

[LPS-17]
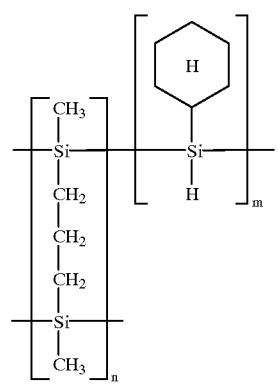
[LPS-18]
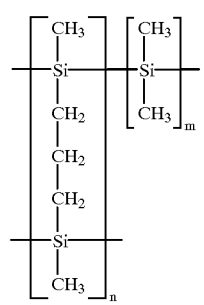
[LPS-19]
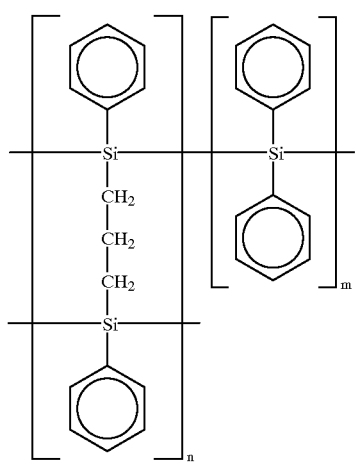
[LPS-20]
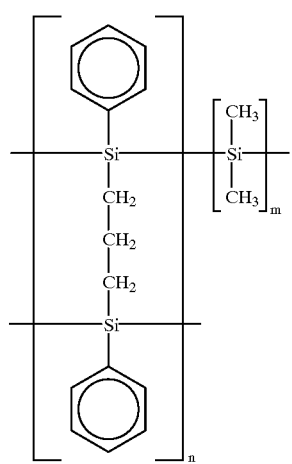
[LPS-21]
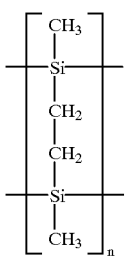
[LPS-22]
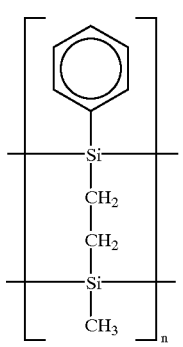
[LPS-23]
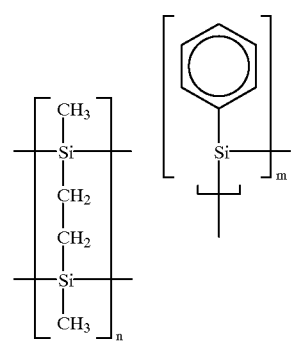
[LPS-24]
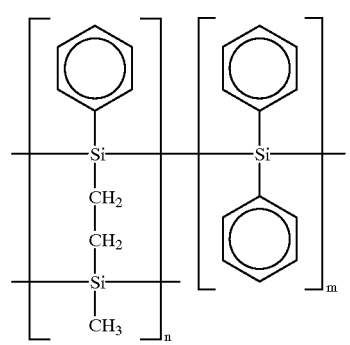
[LPS-25]
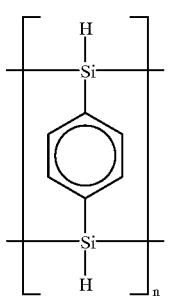

-continued
[LPS-26]
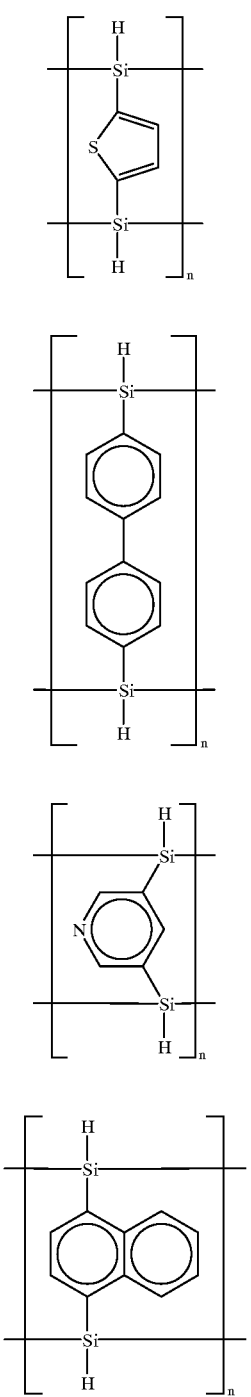
[LPS-27]
[LPS-28]
[LPS-29]
-continued
[LPS-30]
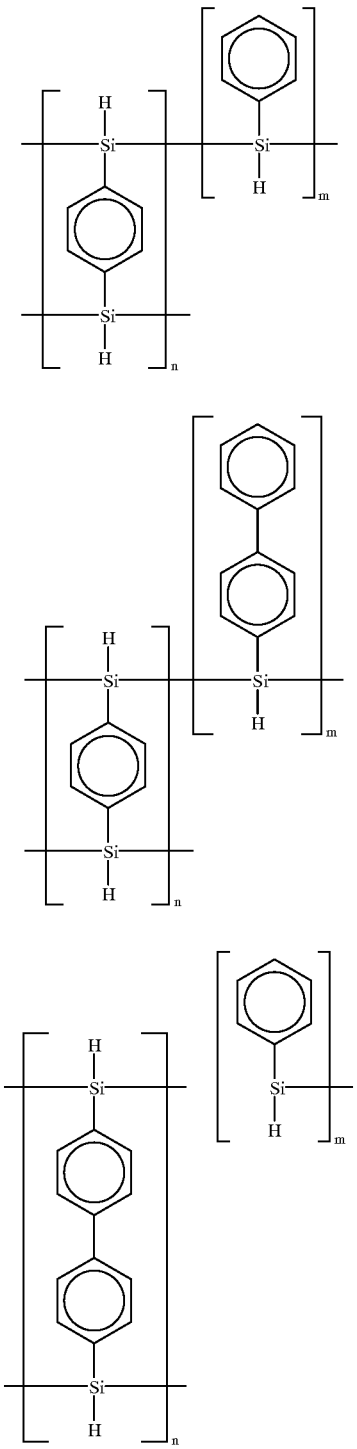
[LPS-31]
[LPS-32]

[LPS-33]
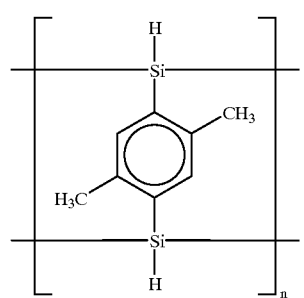
[LPS-34]
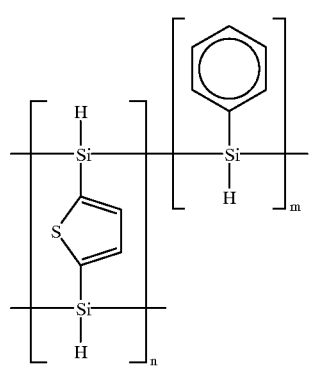
[LPS-35]
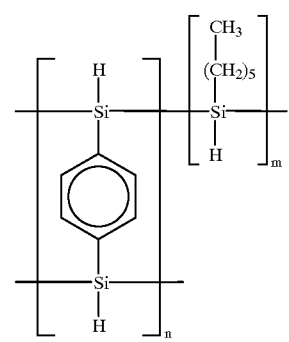
[LPS-36]
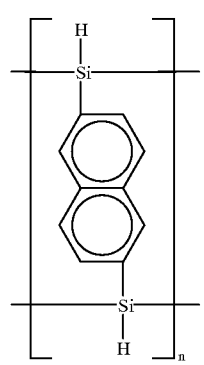
[LPS-37]
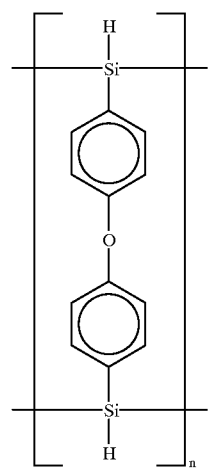
[LPS-38]
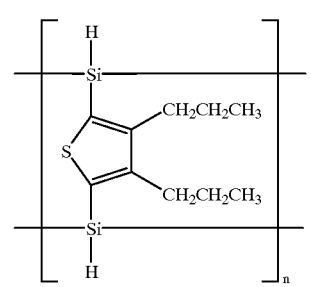
[LPS-39]
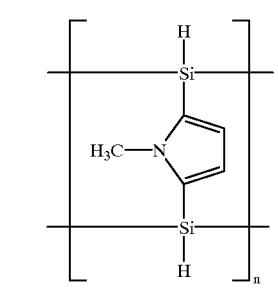
It is also possible in this invention to employ a polysilane represented by the following general formulas (LPS-V) or (LPS-VI), which is a three-dimensional polymer having a low crosslinking degree.
[LPS-V]
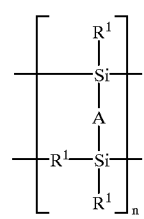

[LPS-VI]

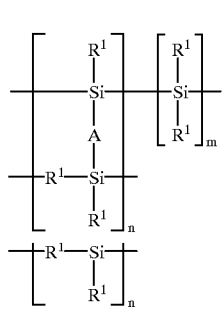

wherein A is a bivalent organic group; $R^1$ substituents may be the same or different and are selected from hydrogen atom and a substituted or unsubstituted hydrocarbon group and silyl group.

The polysilane represented by the general formula (LPS-V) can be synthesized through a polymerization of a silane compound represented by the following general formula (S-V) in the presence of an alkaline metal or an alkaline earth metal. The polysilane represented by the general formula (LPS-VI) can be synthesized through a polymerization of a silane compound represented by the following general formula (S-V) with dihalosilane represented by the general formula (S-II) in the presence of an alkaline metal or an alkaline earth metal.

It is also possible in this case to substitute trihalosilane represented the general formula (S-III) for part or whole of dihalosilane represented the general formula (S-II). It is also possible in this case to synthesize a polysilane block copolymer in the same manner as described above.

[S-V]

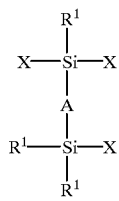

wherein A is a bivalent organic group; $R^1$ substituents may be the same or different and are selected from hydrogen atom and a substituted or unsubstituted hydrocarbon group and silyl group; and X is F, Cl, Br or I.

Followings are specific examples of the silane compound represented by the general formula (S-V). Specific examples of polysilanes represented by the general formulas (LPS-V) and (LPS-VI) are also shown below.

[S-V]

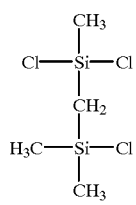

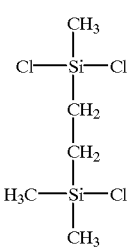

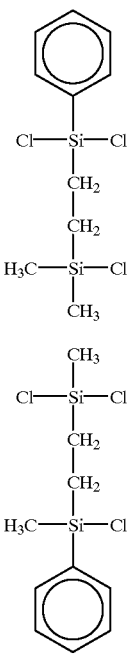

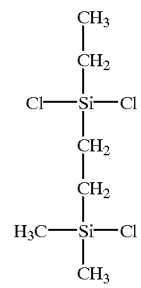

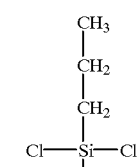

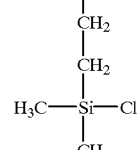

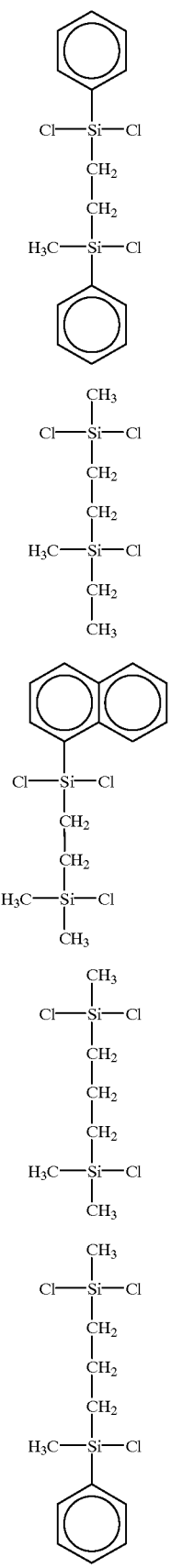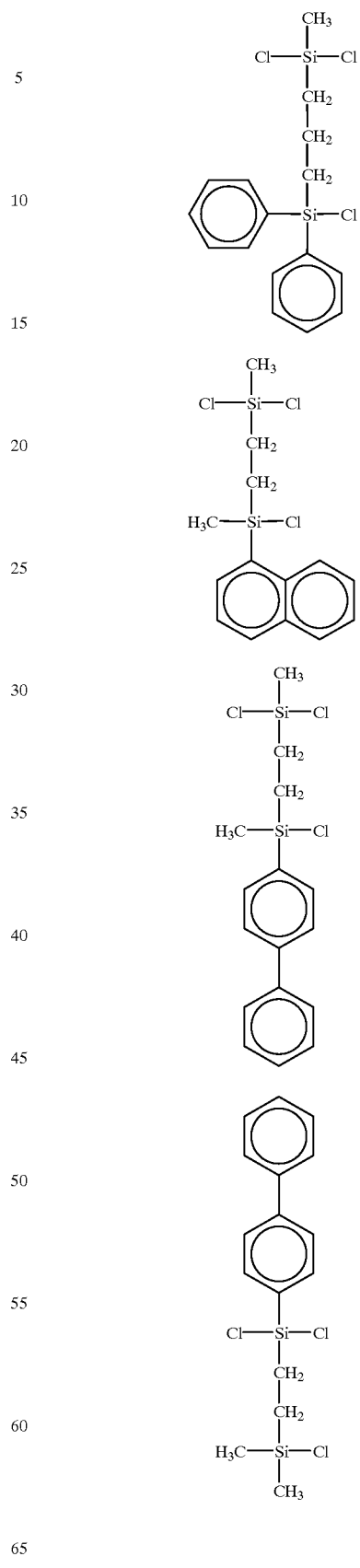

-continued
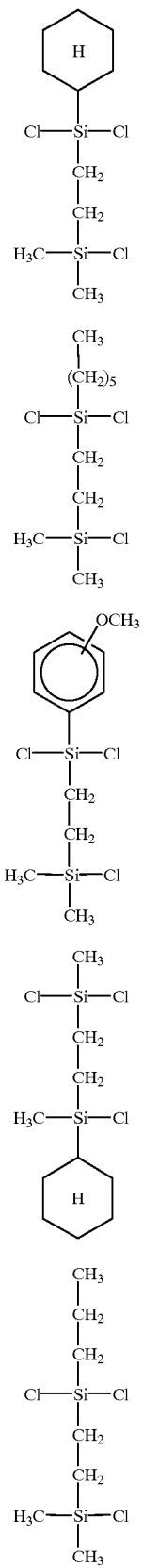
-continued
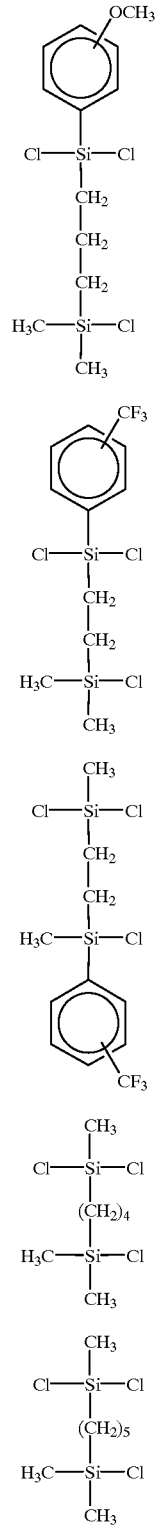

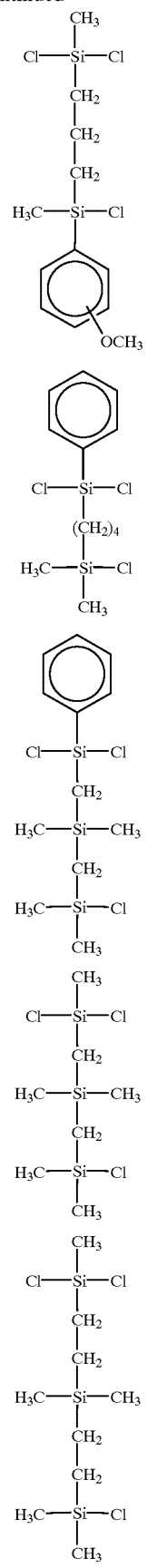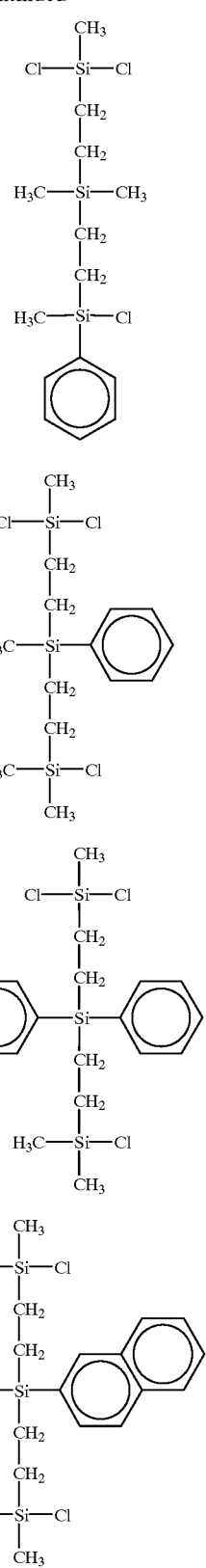

-continued
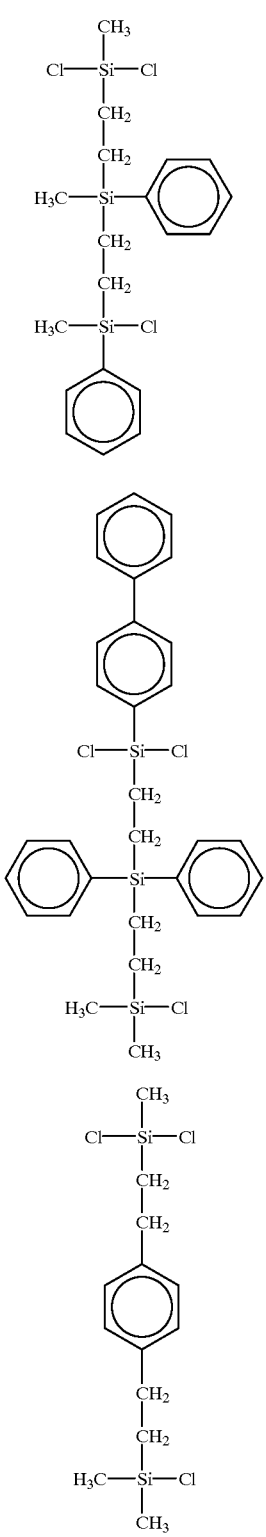
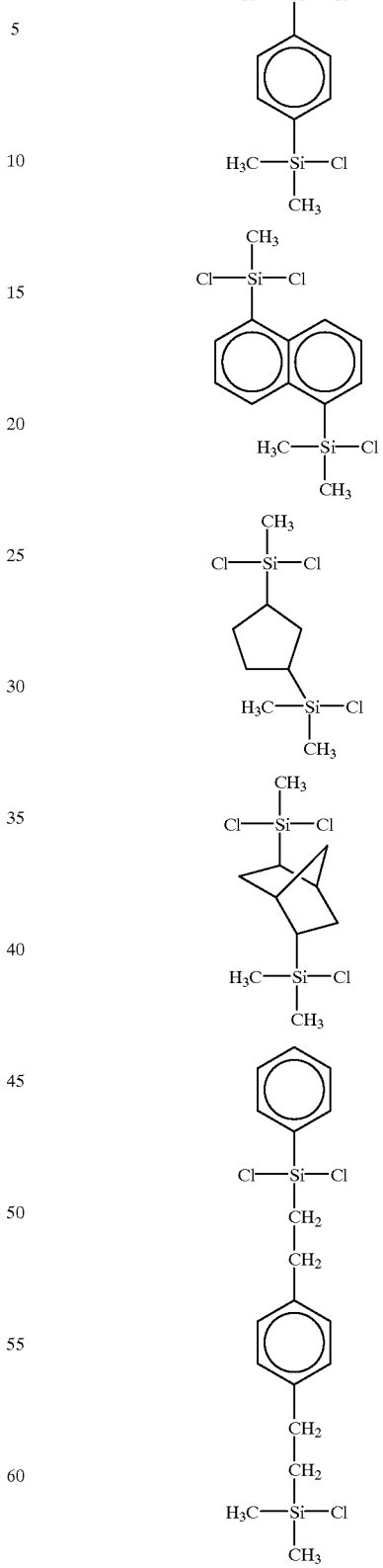

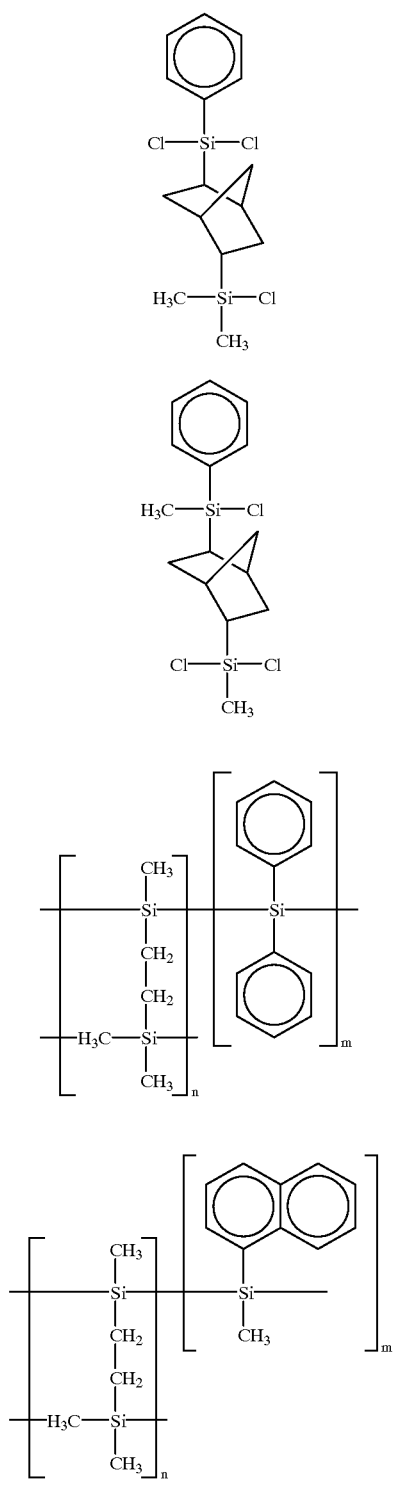
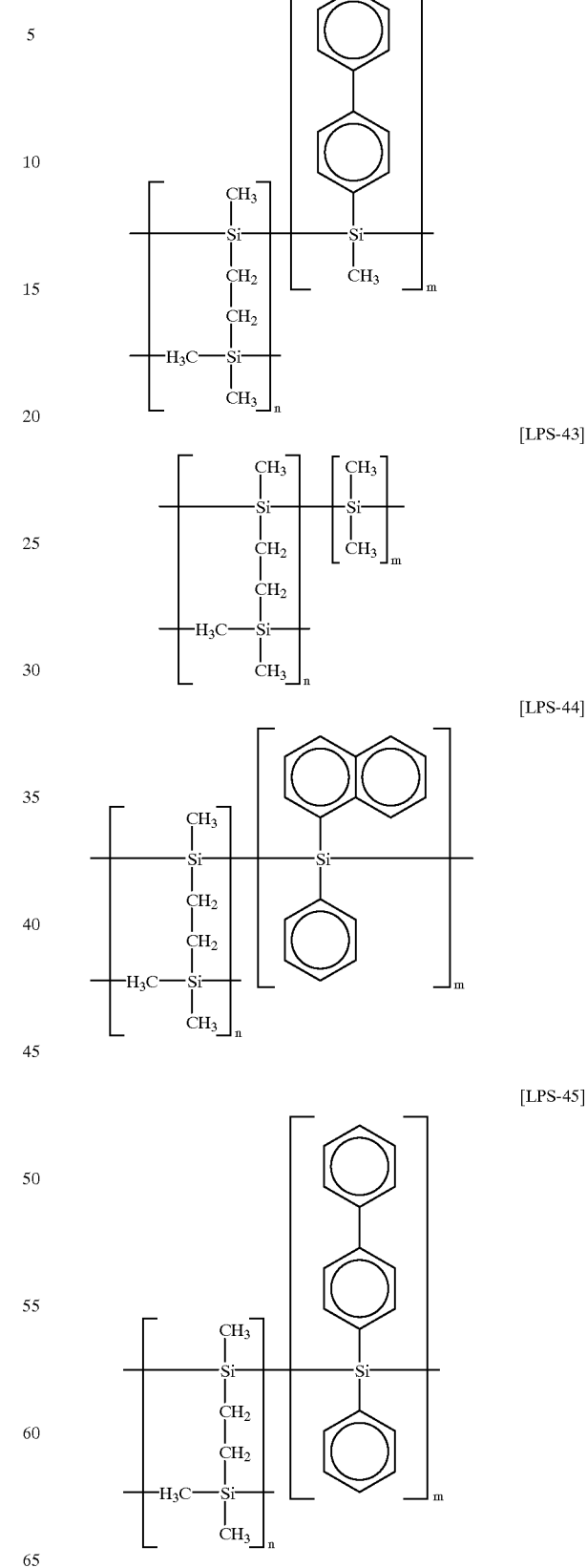

[LPS-46]
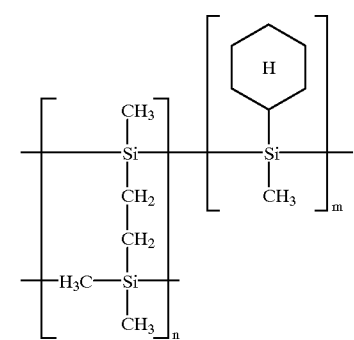
[LPS-47]
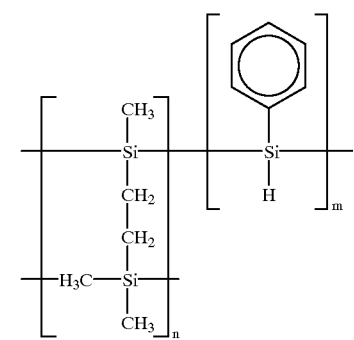
[LPS-48]
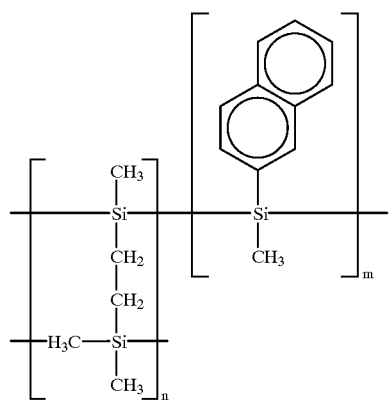
[LPS-49]
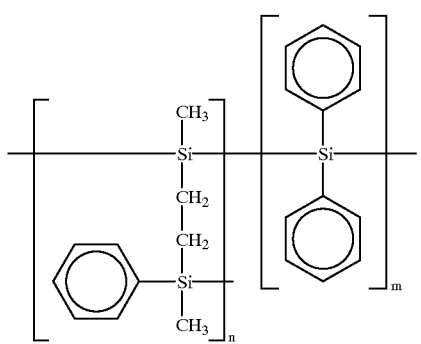
[LPS-50]
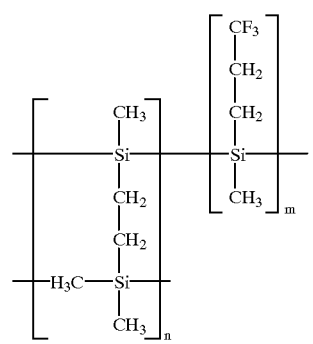
[LPS-51]
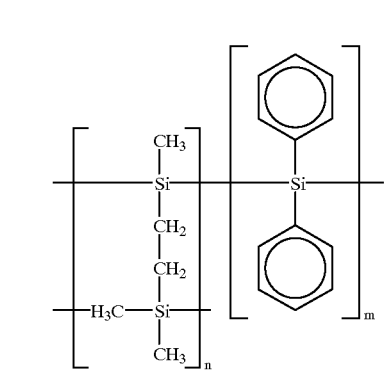
[LPS-52]
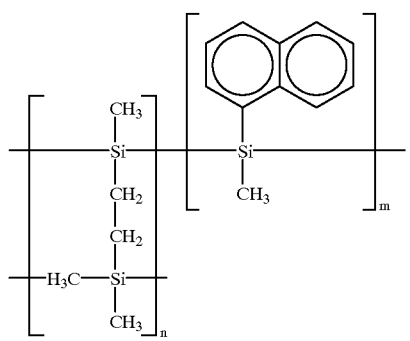
[LPS-53]
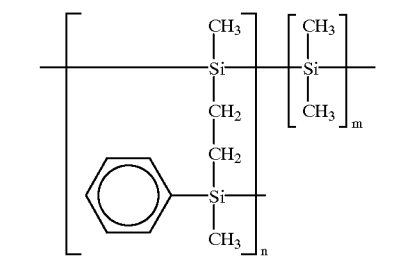

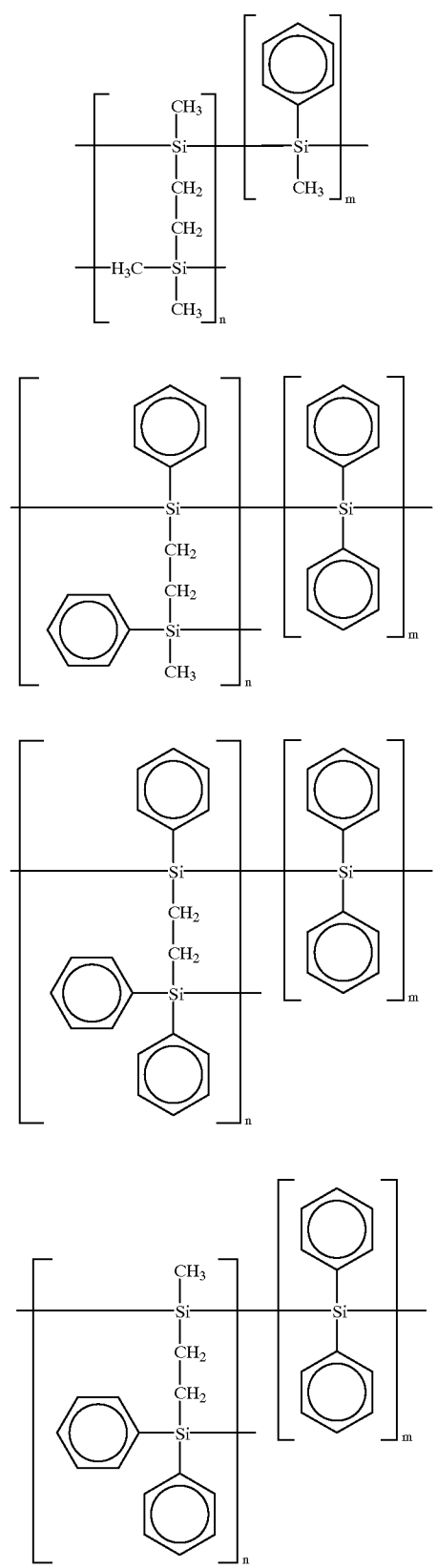
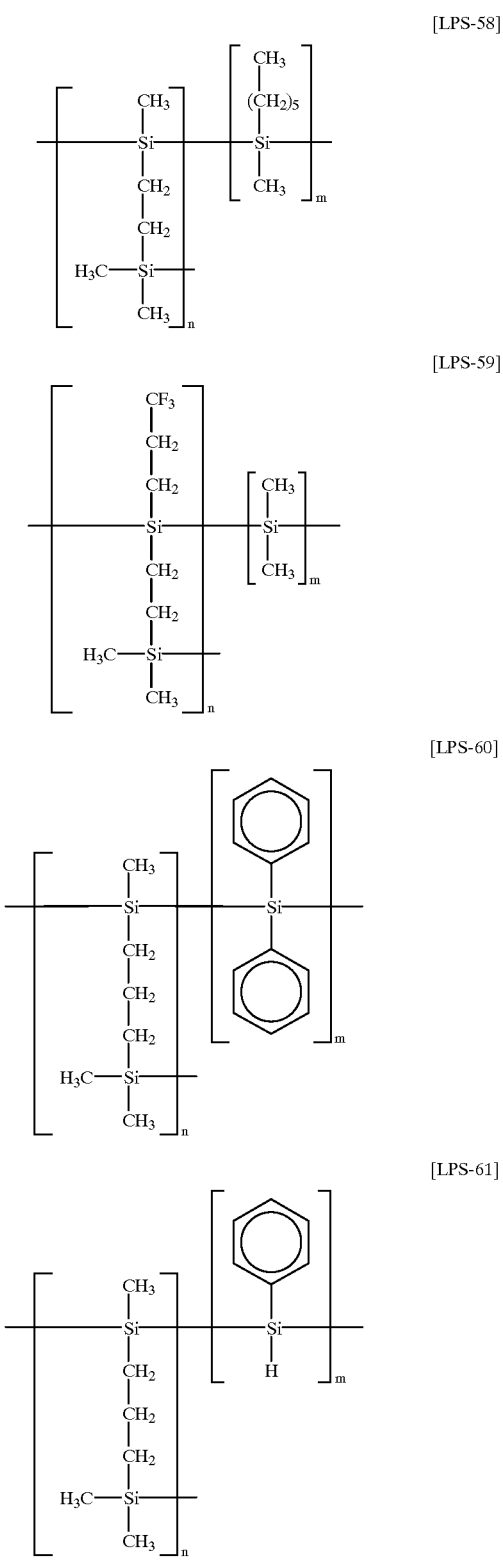

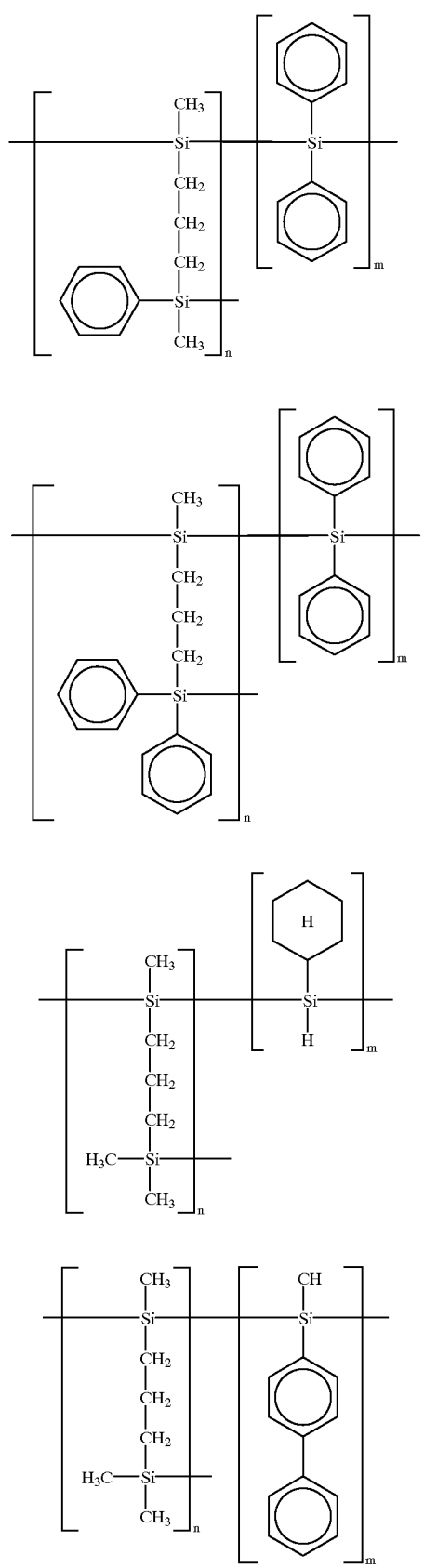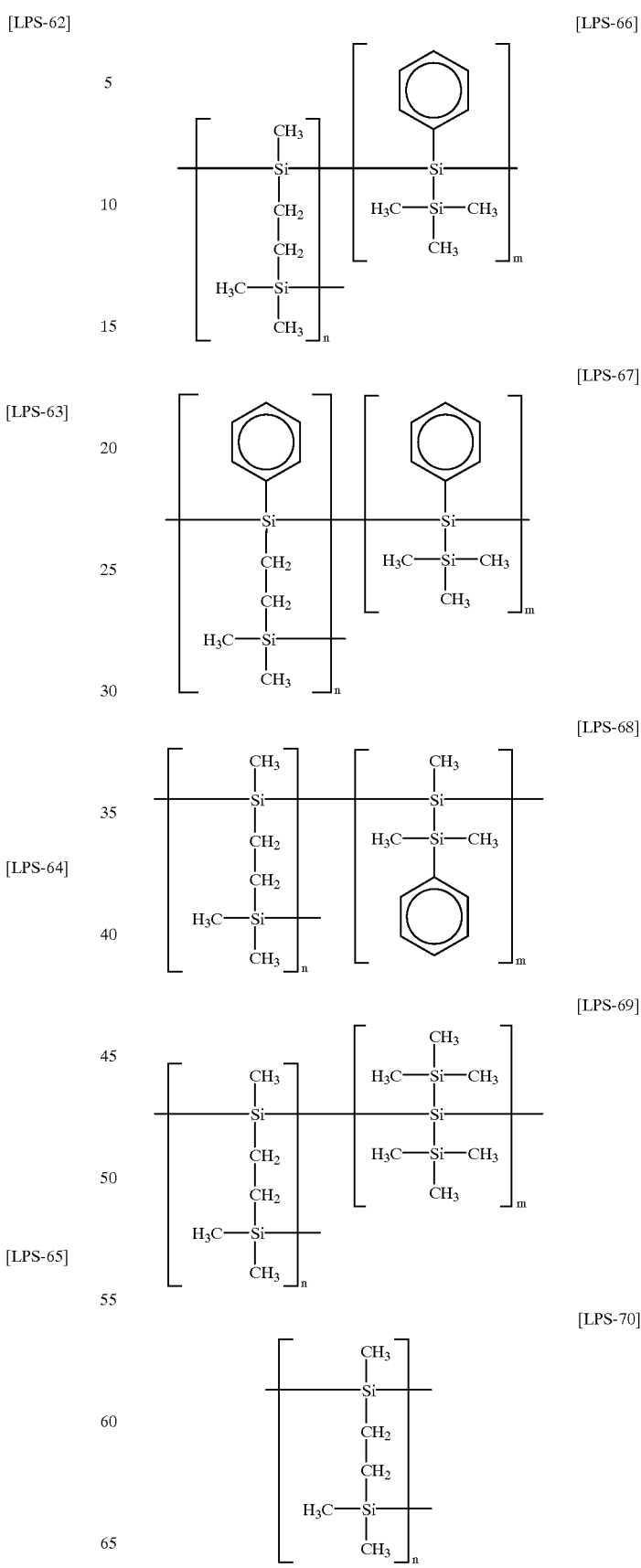

[LPS-71]
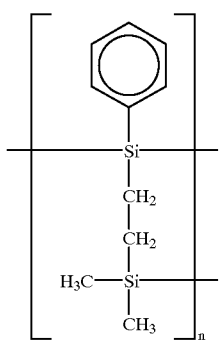

[LPS-72]
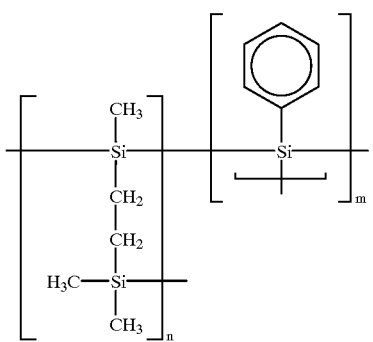

It is also possible in this invention to employ polysilane dendrimers represented by the following general formulas (PSD-I) and (PSD-II) as a polysilane having a three-dimensional structure. Specific examples of polysilane dendrimers represented by the general formulas (PSD-I) and (PSD-II) are shown below. Note that R is a substituted or unsubstituted hydrocarbon group.

[PSD-I]
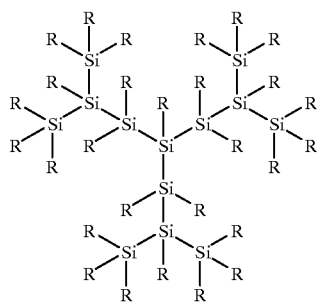

[PSD-II]
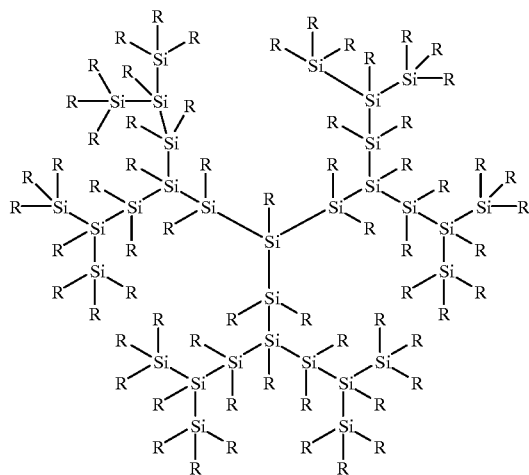

[PSD-1]
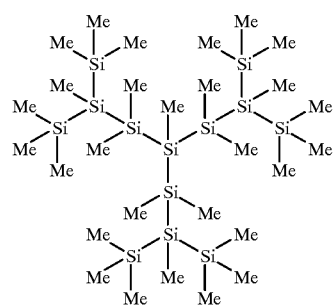
[PSD-2]
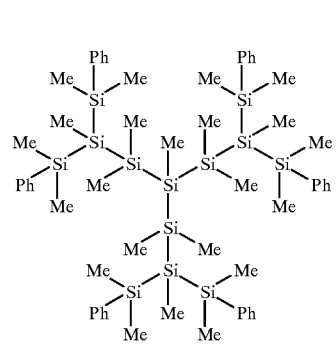
[PSD-3]
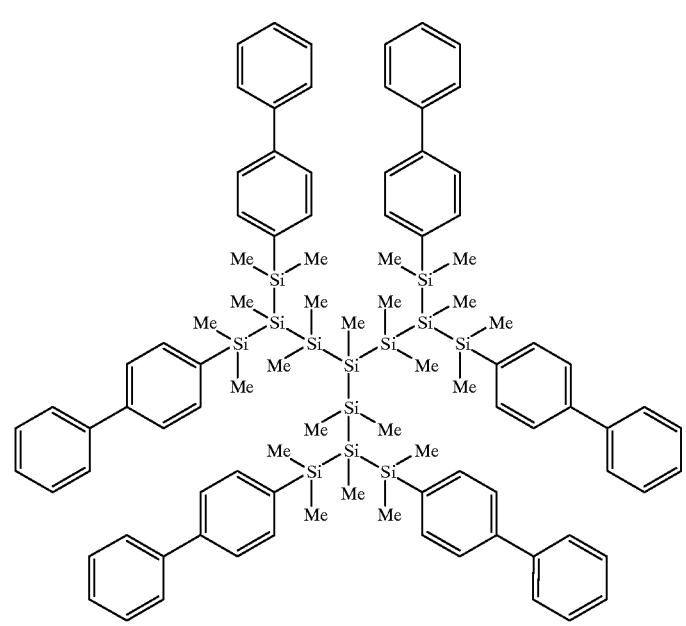

-continued
[PSD-4]
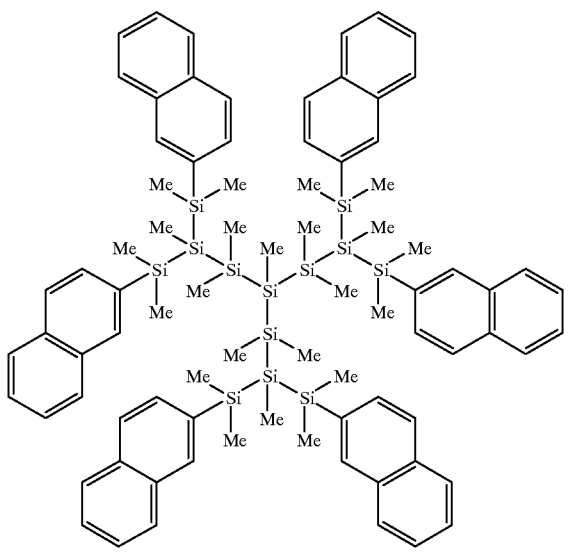
[PSD-5]
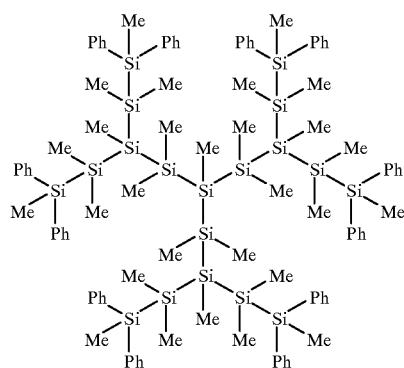
[PSD-6]
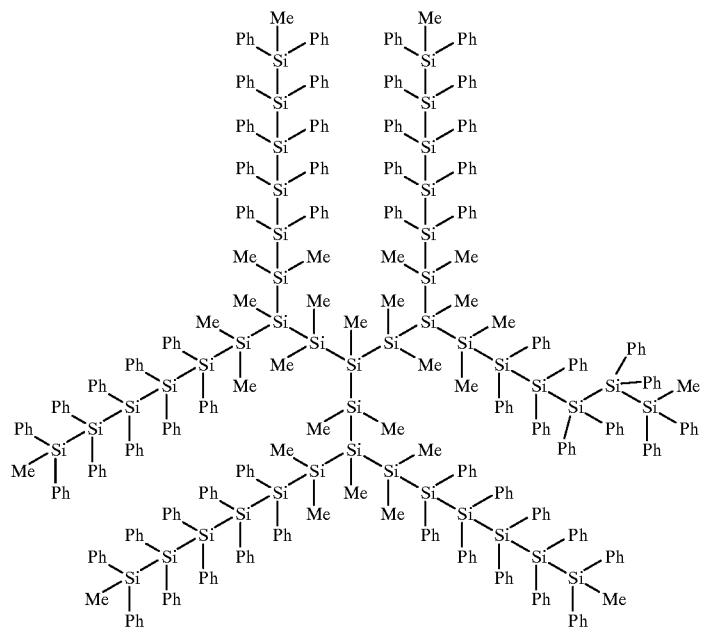

[PSD-7]
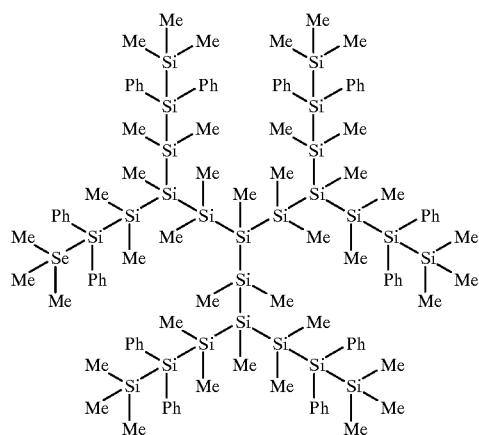
[PSD-8]
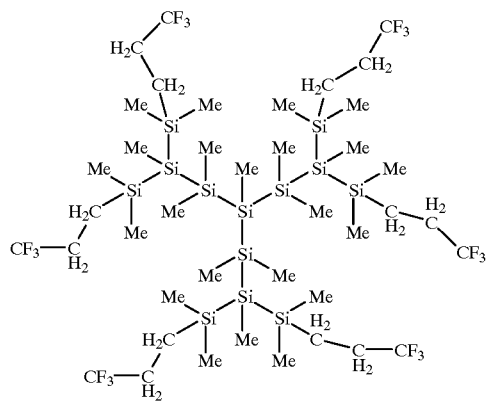
[PSD-9]
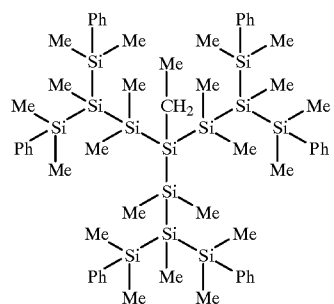
[PSD-10]
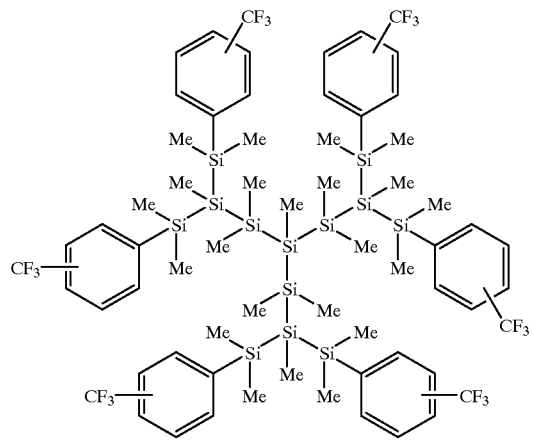

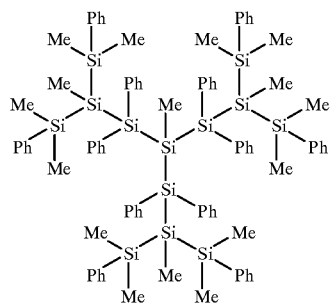
[PSD-11]
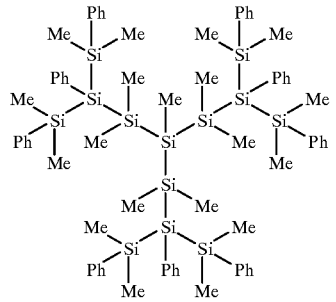
[PSD-12]
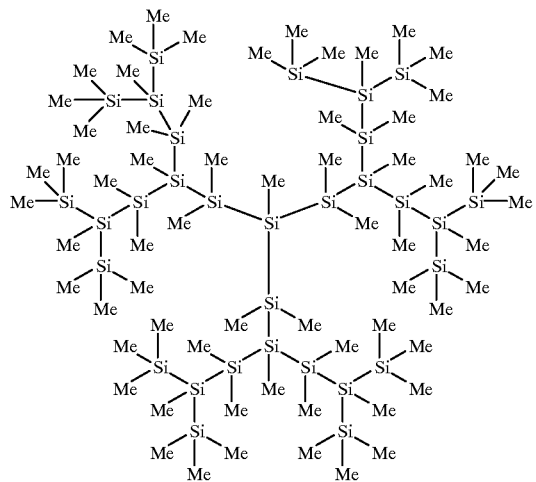
[PSD-13]
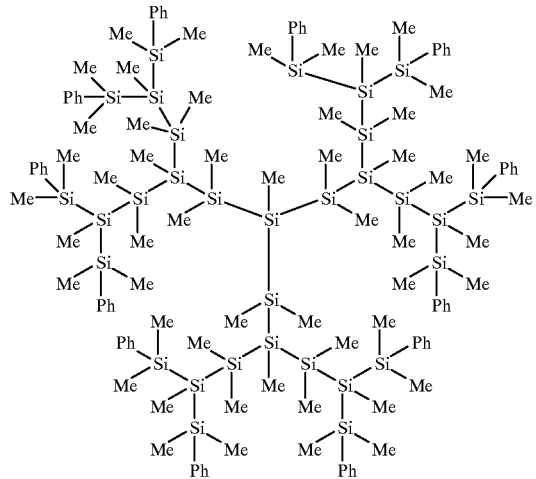
[PSD-14]

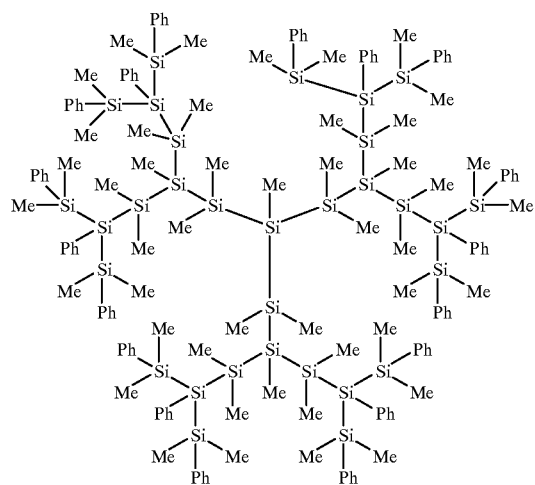
[PSD-15]
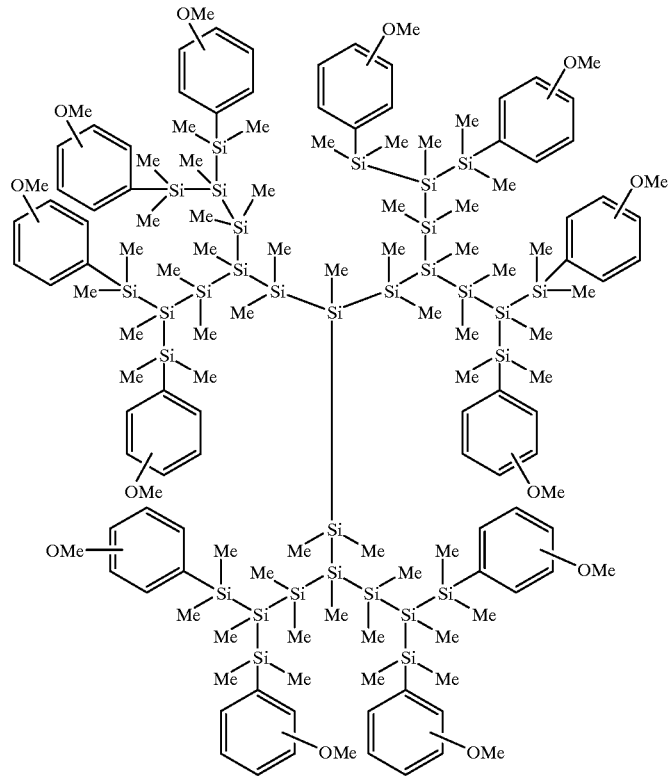
[PSD-16]

[PSD-17]
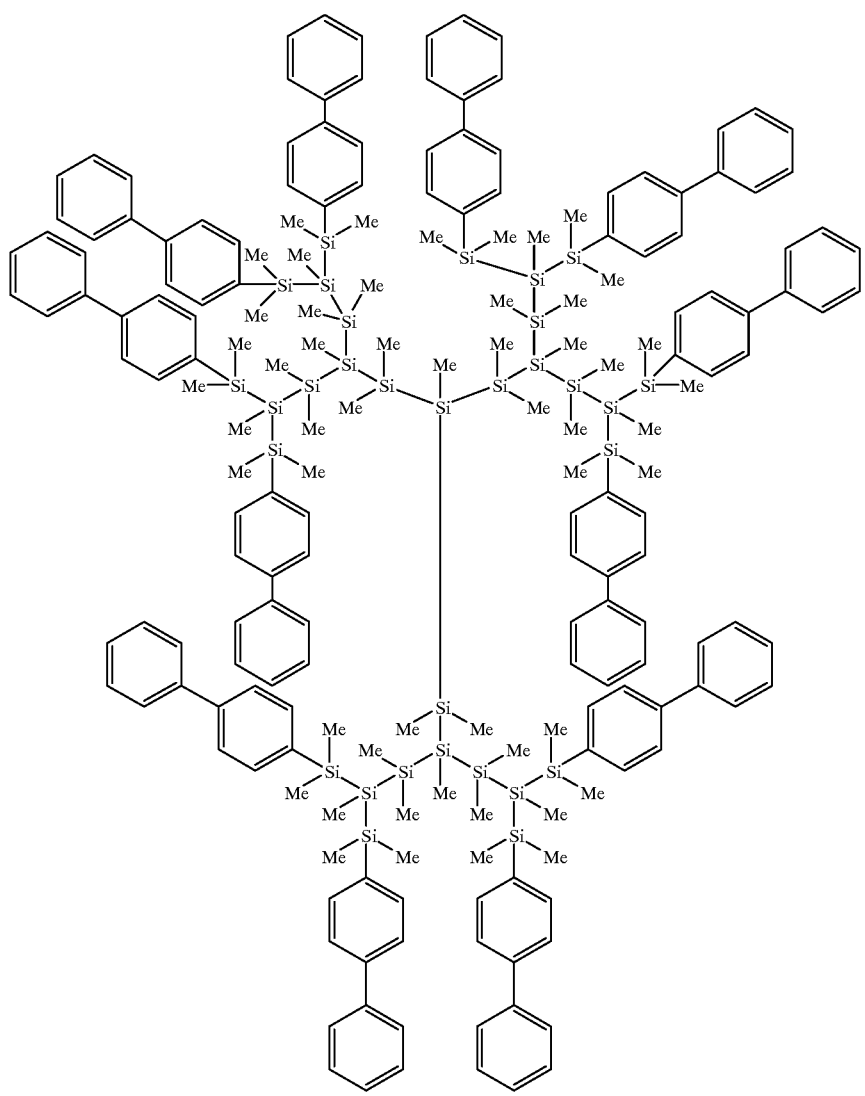

[PSD-18]
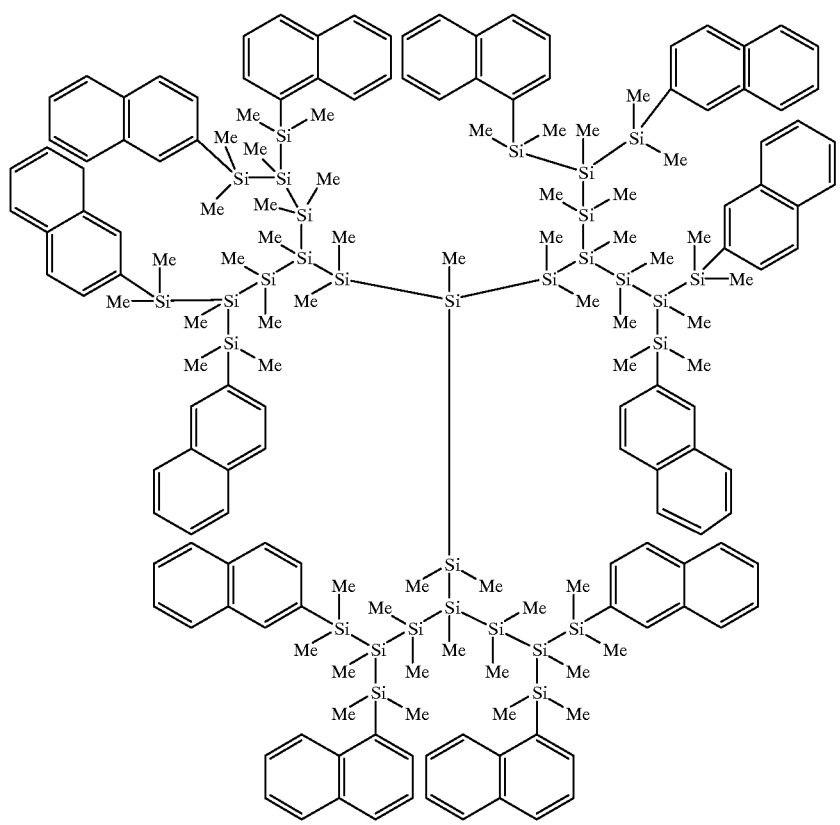
[PSD-19]
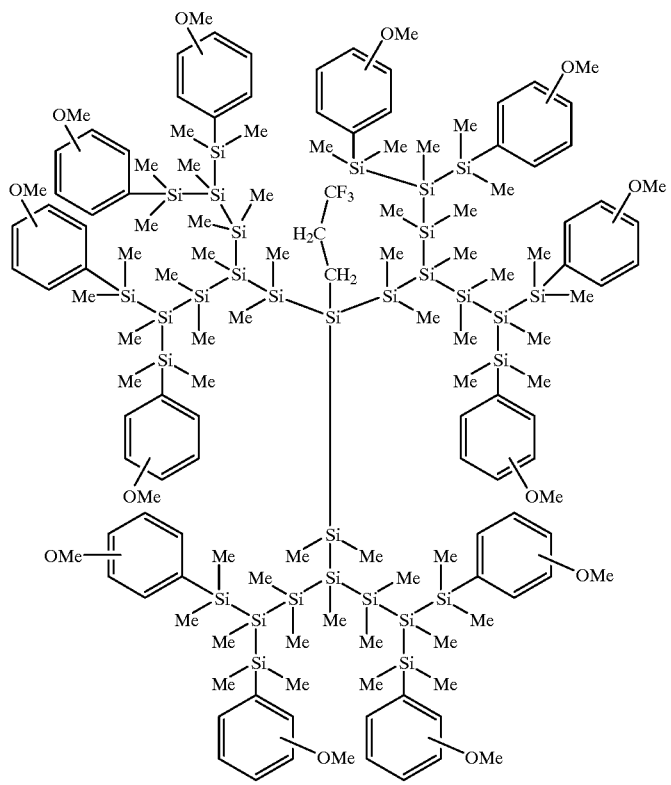

[PSD-20]

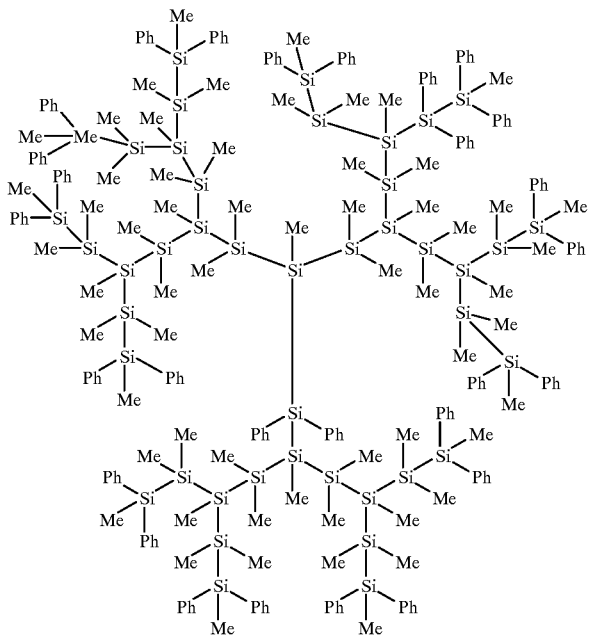

It is possible according to this invention to form an organosilicon polymer film on an insulating film formed on a semiconductor substrate and then to perform the crosslinking of the organosilicon polymer film by means of light or heat before a resist film is formed on the organosilicon polymer film. When the organosilicon polymer film is preliminarily crosslinked in this manner, the organosilicon polymer film becomes insoluble to a solvent for the resist, whereby making it possible to prevent a mixing thereof with the resist. In this method, an organosilicon polymer having a crosslinkable chemical structure can be employed.

Specific examples of organosilicon polymer which can be crosslinked by means of heat include a polysilane having on its side chain hydroxymethylphenyl group, as represented by the following general formula (HMPS-I).

[HMPS-I]

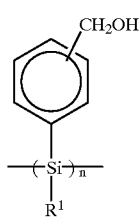

wherein $R^1$ substituent is selected from hydrogen atom and a substituted or unsubstituted hydrocarbon group and silyl group. Preferably, the hydrocarbon group is selected from the group consisting of alkyl group having 1 to 20 carbon atoms, aryl group and aralkyl group. Specific examples of such a polysilane are shown below.

[HMPS-1]

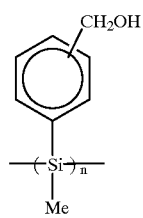

[HMPS-2]

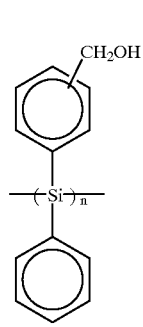

[HMPS-3]

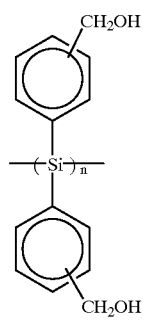

[HMPS-4]
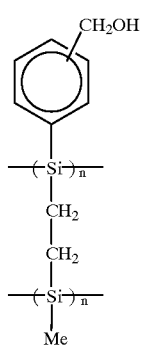
[HMPS-5]
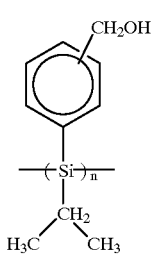
[HMPS-6]
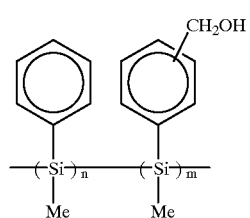
[HMPS-7]
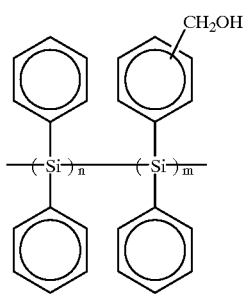
[HMPS-8]
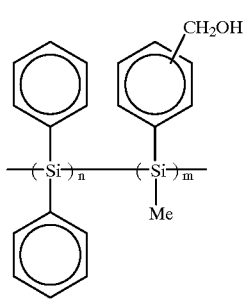
[HMPS-9]
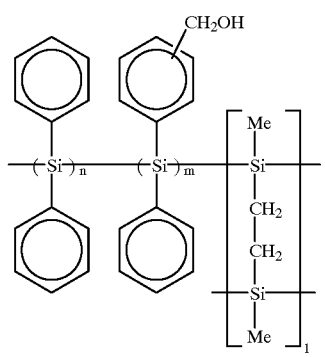
[HMPS-10]
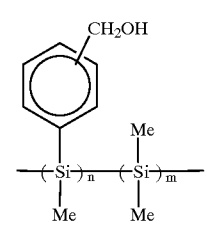
[HMPS-11]
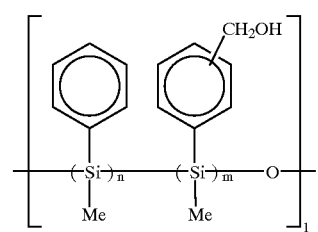
[HMPS-12]
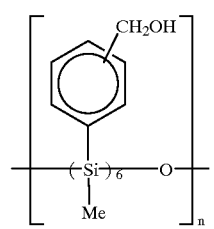
[HMPS-13]
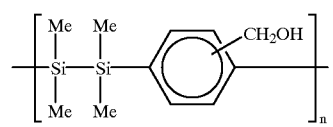
[HMPS-14]
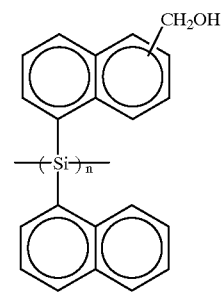

[HMPS-15]

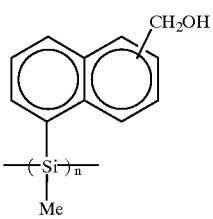

It is also possible to employ a polysilane having a substituent group represented by —CH$_2$XR, where —OR or —SR group is capped by a protective group, in place of the hydroxyl group of the general formula (HMPS-I). The aromatic group to be linked to the silicon atom in the main chain may not be limited to phenyl group, but may be naphthyl group or anthracenyl group. Specific examples of such a polysilane are those represented by the following general formulas (RMPS-I) to (RMPS-IV).

[RMPS-I]

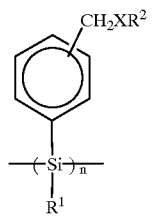

[RMPS-II]

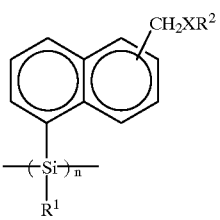

[RMPS-III]

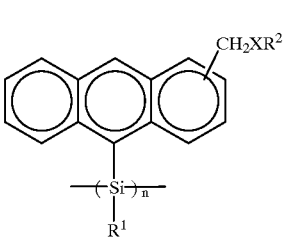

[RMPS-IV]

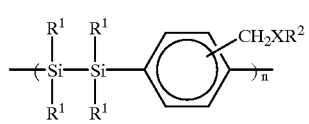

wherein X is oxygen atom or sulfur atom; R$^1$ substituent is selected from hydrogen atom and a substituted or unsubstituted hydrocarbon group and silyl group; and R$^2$ substituent is a substituted or unsubstituted hydrocarbon group. Preferably, the protective group R$^2$ is selected from the group consisting of alkyl group having 1 to 20 carbon atoms, aryl group and aralkyl group. Specific examples of the protective group are methyl, trimethylsilyl, t-butyl and t-butyloxycarbonyl.

Followings are specific examples of polysilane represented by the general formulas (RMPS-I) to (RMPS-IV).

[RMPS-1]

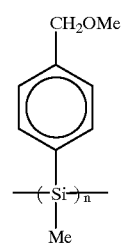

[RMPS-2]

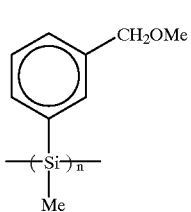

[RMPS-3]

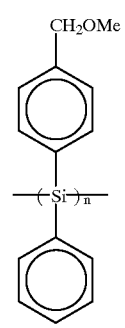

[RMPS-4]

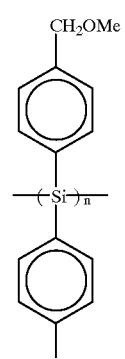

[RMPS-5]

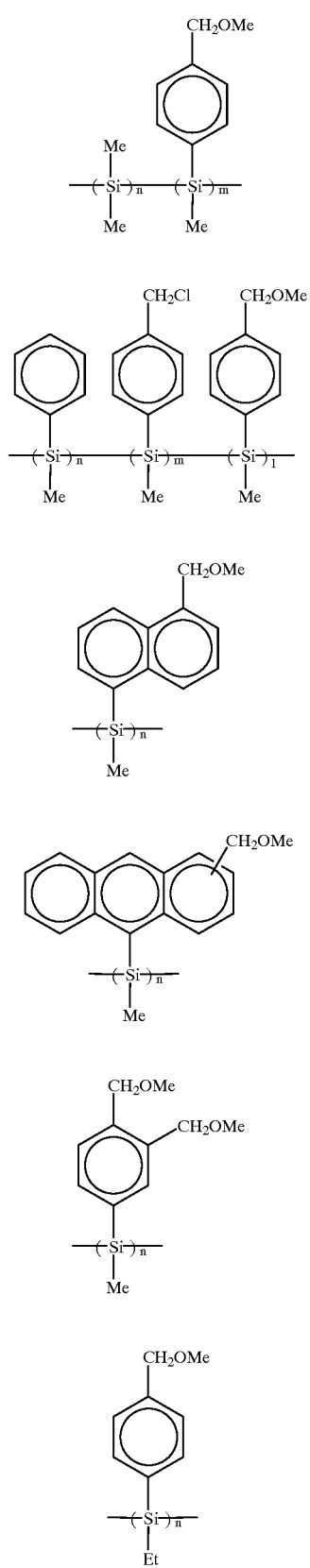
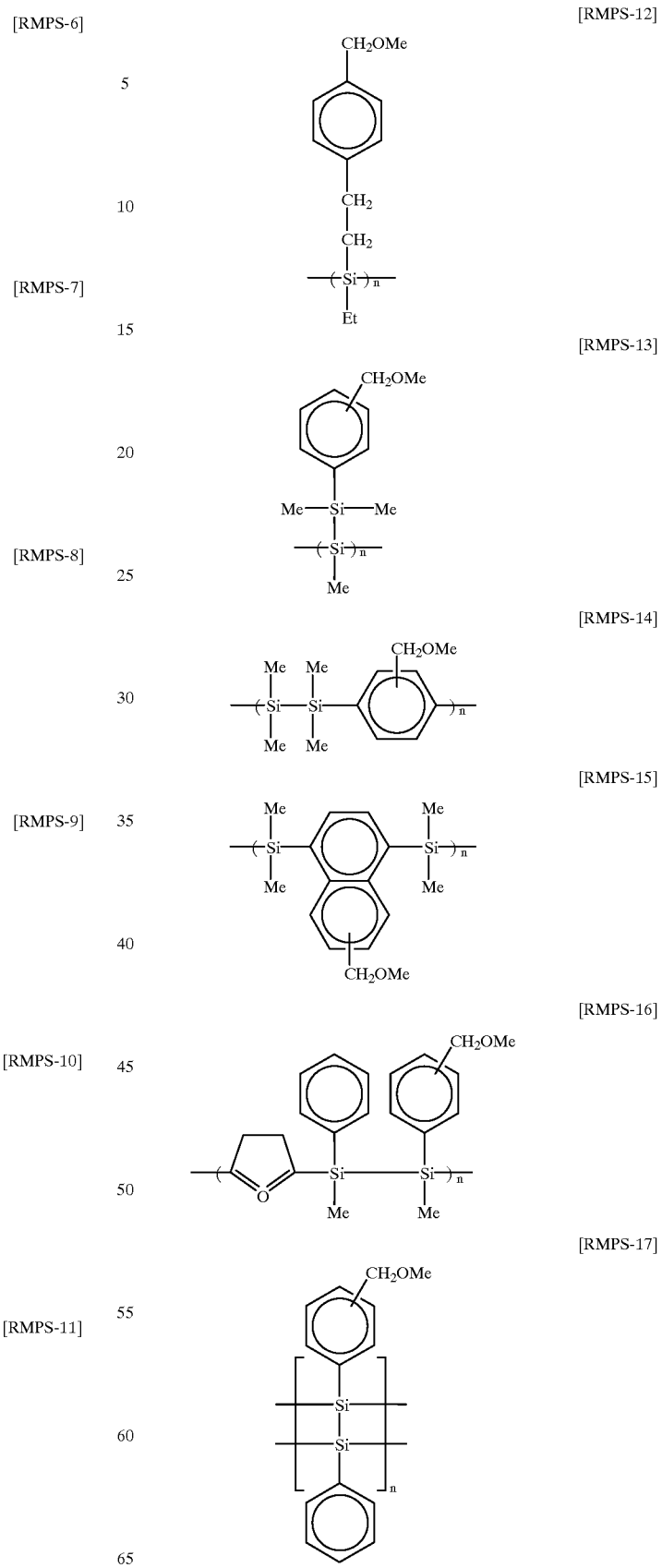

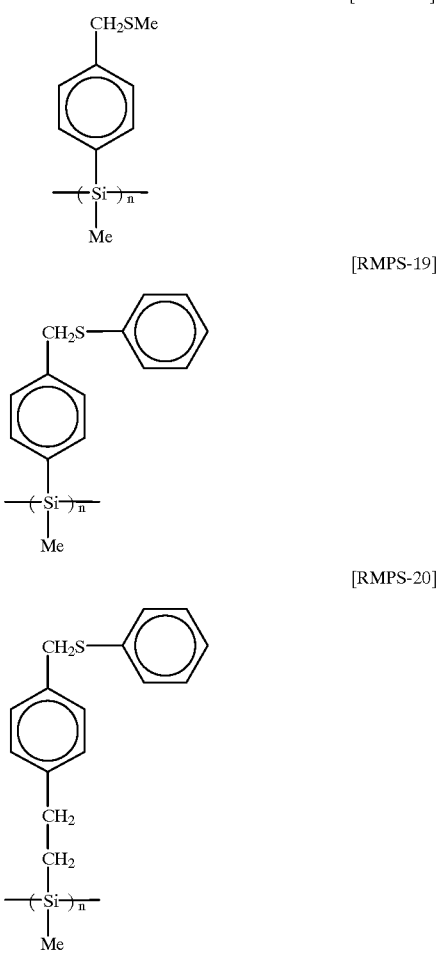

[RMPS-18]

[RMPS-19]

[RMPS-20]

The polysilanes represented by the general formulas (HMPS-I) and (RMPS-I) to (RMPS-IV) are accompanied at their side chain by —$CH_2OH$ or —$CH_2XR$ which are high in polarity, so that these polysilanes are highly soluble in ethyl lactate (EL) or propyleneglycol monomethylether acetate (PGMEA) which are usually employed as a solvent for a resist, thus making it possible to easily use them for coating. When these polysilanes are heat-treated after coating, —OX or —XR is dissociated, whereby allowing a crosslinking reaction to proceed and forming a three-dimensional structure where the molecules are linked via a benzylether type crosslinking site. The heat treatment in this case should preferable be 150° C. or more, more preferably 200° C. or more. Further, if this heat treatment is performed in an oxygen-containing atmosphere, the crosslinking reaction can be prominently accelerated.

It is also possible in this case to add an acid generator or a crosslinking agent (a compound having a multiple bond) to a polysilane as explained hereinafter so as to further accelerate the crosslinking reaction.

Specific examples of organosilicon polymer which can be crosslinked by means of light include a polysilane having a photocyclizable chemical structure. This photocyclization reaction should preferably be performed with light having a wavelength of 360 nm or more so as to avoid any substantial decomposition of the main chain of polysilane. It is also preferable to perform this photocyclization reaction in a nitrogen atmosphere. Examples of the photocyclization reaction are shown in the following formulas (1) to (3).

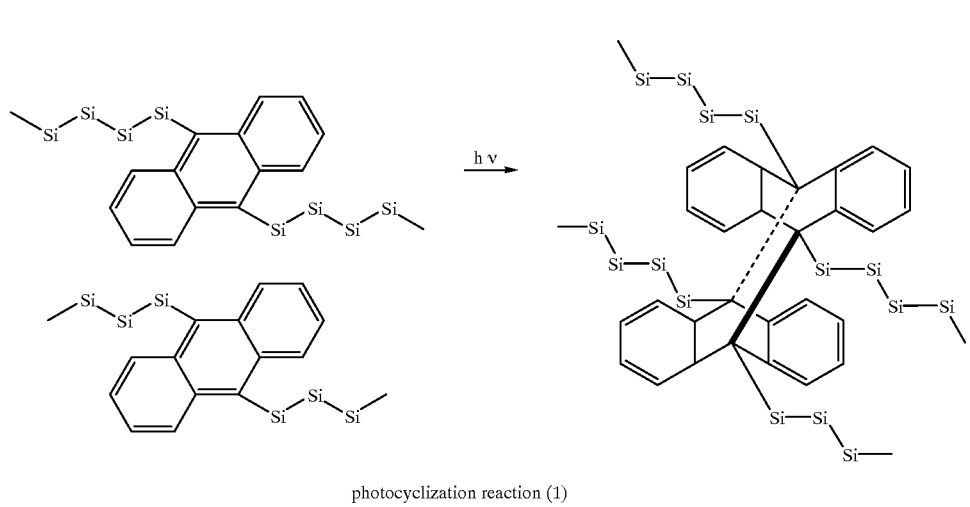

photocyclization reaction (1)

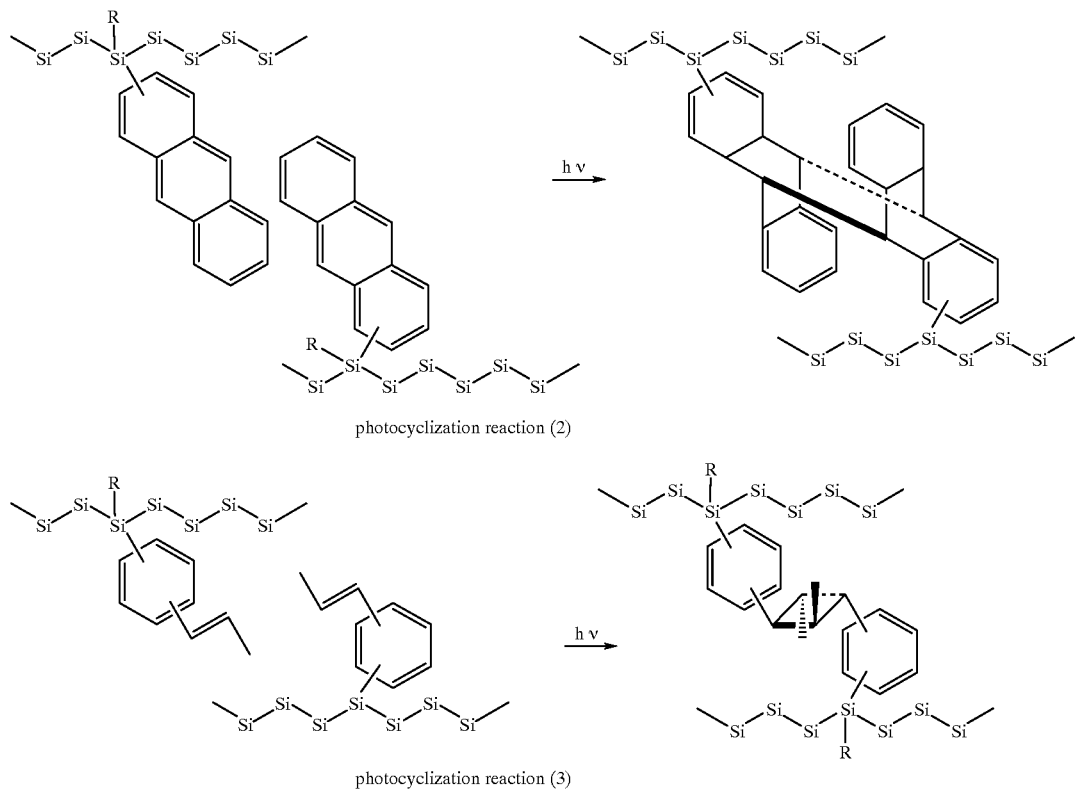
photocyclization reaction (2)
photocyclization reaction (3)
Followings are examples of polysilane having a chemical structure which is capable of generating the aforementioned photocyclization reaction.
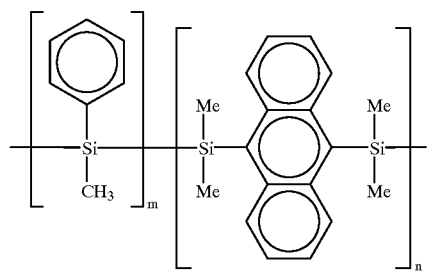
[PCPS-1]
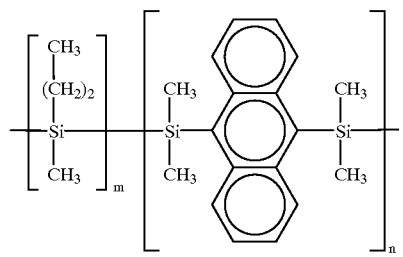
[PCPS-2]

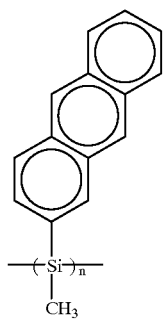
[PCPS-3]
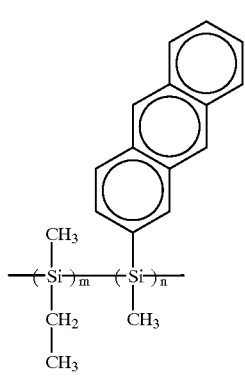
[PCPS-4]
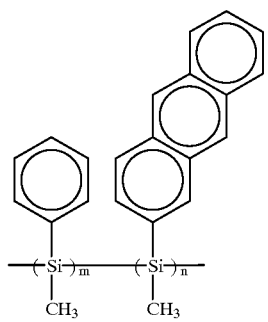
[PCPS-5]
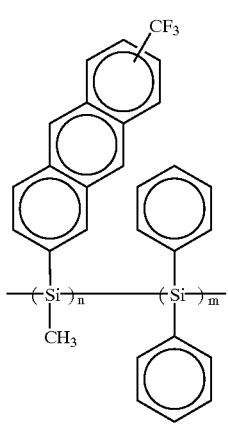
[PCPS-6]

-continued
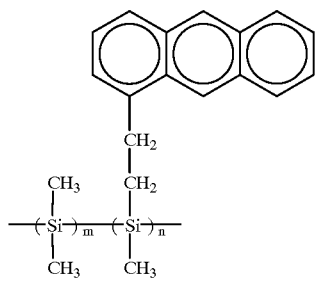
[PCPS-7]
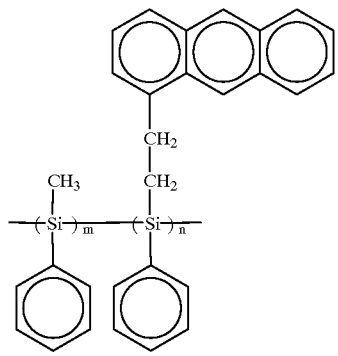
[PCPS-8]
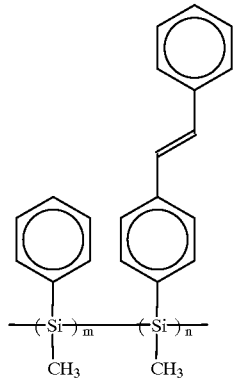
[PCPS-9]
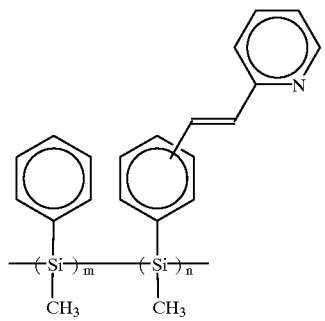
[PCPS-10]

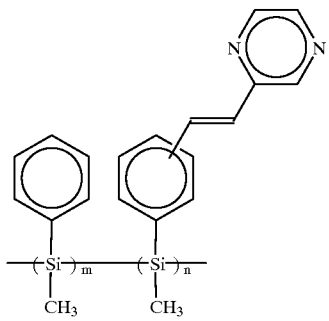
[PCPS-11]
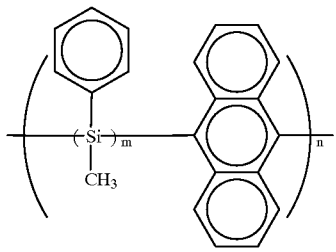
[PCPS-12]
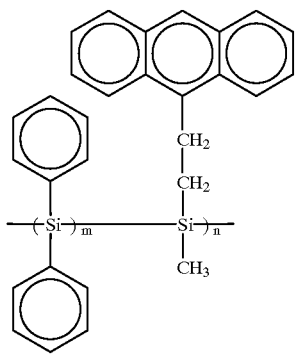
[PCPS-13]
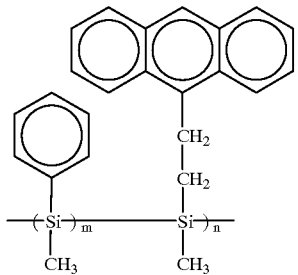
[PCPS-14]
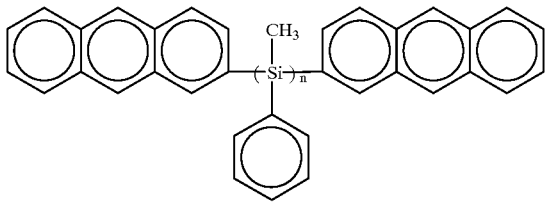
[PCPS-15]

-continued
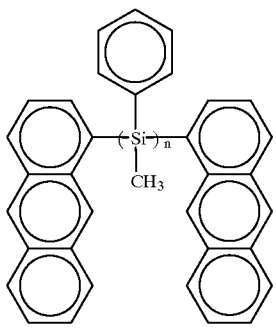
[PCPS-16]
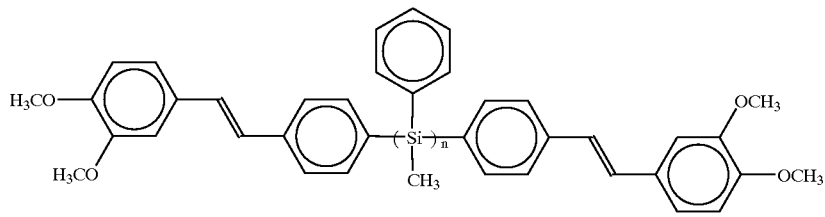
[PCPS-17]
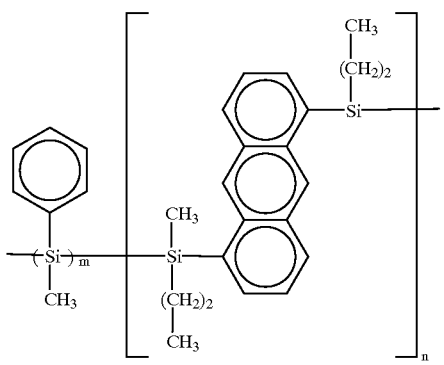
[PCPS-18]
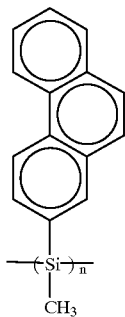
[PCPS-19]

[PCPS-20]

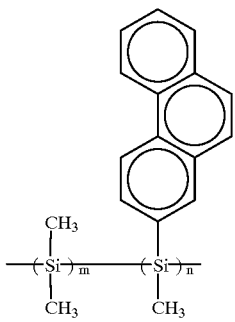

[PCPS-21]

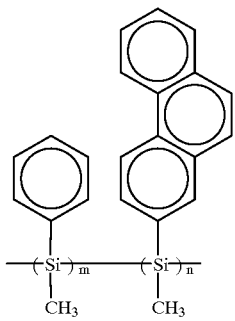

[PCPS-22]

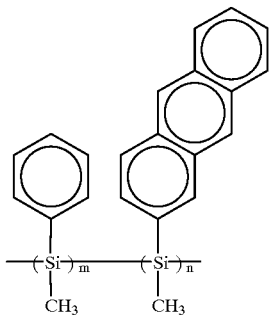

It is also possible in this invention to employ an organosilicon polymer having a highly reactive Si—H bond together with an organic compound having a functional group which is capable of reacting with the Si—H bond as a crosslinking agent, thereby allowing the organosilicon polymer to undergo a crosslinking reaction by means of light or heat. There is not any particular limitation regarding the crosslinking agent. For example, an organic compound having a multiple bond may be employed. By the term, a crosslinking agent having a multiple bond, it means a compound having a double bond or a triple bond. Specific examples of crosslinking agent having a multiple bond are compounds having any one of vinyl group, acryl group, aryl group, imide group, acetylenyl group, etc. The organic compound having a multiple bond may be a monomer, an oligomer or a polymer. These crosslinking agents having a multiple bond are capable of generating an addition reaction with an Si—H bond of the organosilicon polymer under an influence of heat or light, whereby allowing a crosslinking reaction to take place. These crosslinking agents may undergo a self-polymerization. Specific examples of a crosslinking agent having a multiple bond are those represented by the following chemical formulas (MB-1) to (MB-90).

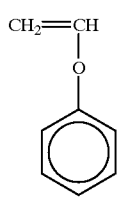
[MB-1]
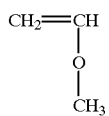
[MB-2]
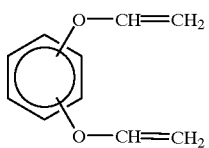
[MB-3]
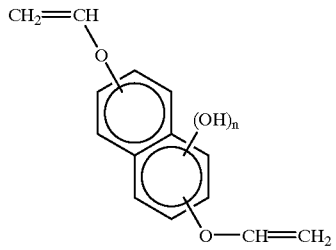
[MB-4]
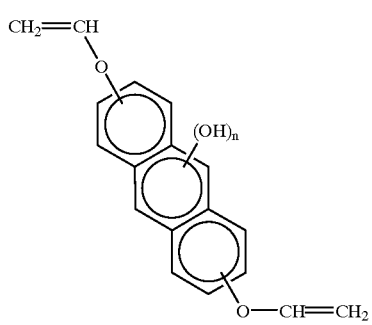
[MB-5]
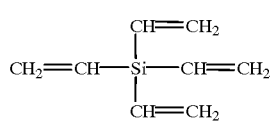
[MB-6]
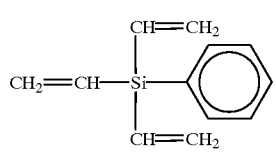
[MB-7]
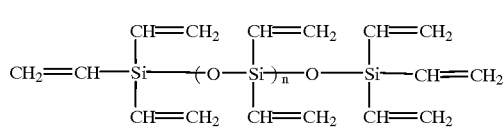
[MB-8]

-continued
[MB-9]
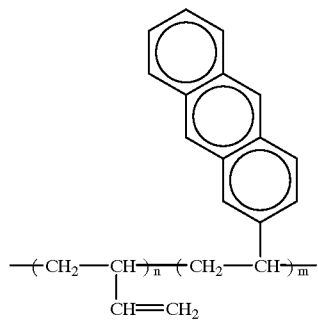
[MB-10]
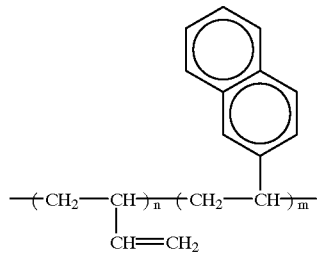
[MB-11]
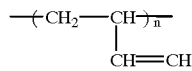
[MB-12]
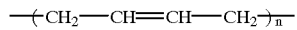
[MB-13]
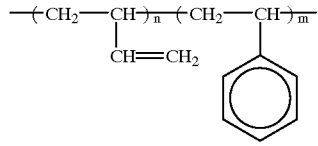
[MB-14]
$CH_2\!\!=\!\!CHCOOCH_2CH(CH_3)_3$
[MB-15]
$CH_2\!\!=\!\!CHCOOC(CH_3)_3$
[MB-16]
$CH_2\!\!=\!\!CHCOOC_{12}H_{25}$
[MB-17]
$CH_2\!\!=\!\!CHCOOC_nH_{2n+1}$   (n = 12, 13)
[MB-18]
$CH_2\!\!=\!\!CHCOOC_{16}H_{33}$
[MB-19]
$CH_2\!\!=\!\!CHCOOC_{18}H_{37}$
[MB-20]
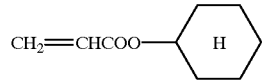

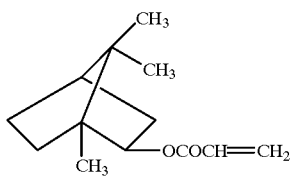
[MB-21]
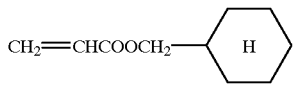
[MB-22]
[MB-23]
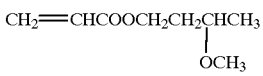
[MB-24]
[MB-25]
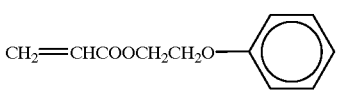
[MB-26]
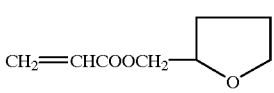
[MB-27]
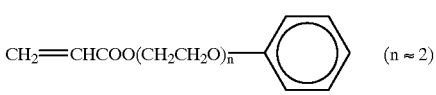
(n ≈ 2)   [MB-28]
[MB-29]
[MB-30]
[MB-31]
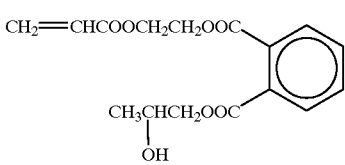
[MB-32]
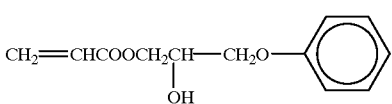
[MB-33]

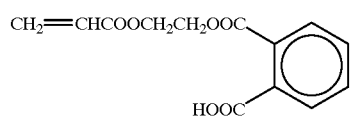
[MB-34]
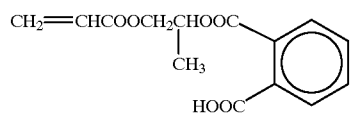
[MB-35]
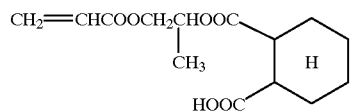
[MB-36]
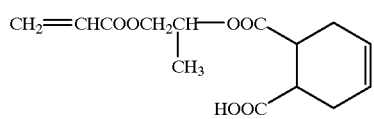
[MB-37]
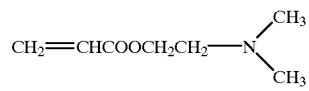
[MB-38]
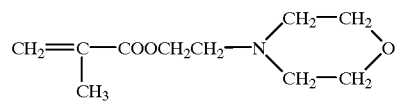
[MB-39]
[MB-40]
CH$_2$=CHCOOCH$_2$CF$_3$
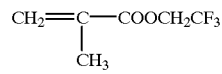
[MB-41]
[MB-42]
CH$_2$=CHCOOCH$_2$(CF$_2$)$_2$H
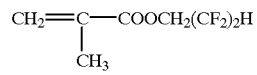
[MB-43]
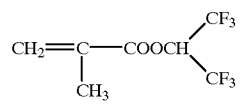
[MB-44]
[MB-45]
CH$_2$=CHCOOCH$_2$(CF$_2$)$_4$H
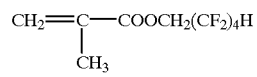
[MB-46]
[MB-47]

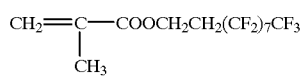
[MB-48]
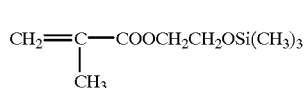
[MB-49]
[MB-50]
[MB-51]
[MB-52]
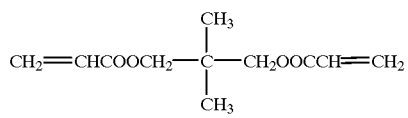
[MB-53]
[MB-54]
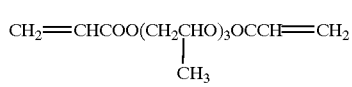
[MB-55]
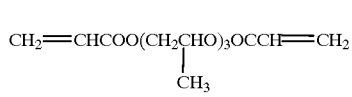
[MB-56]
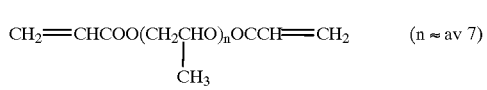 (n ≈ av 7)
[MB-57]
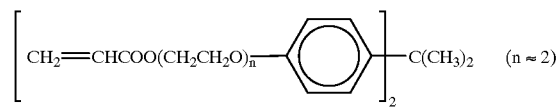 (n ≈ 2)
[MB-58]
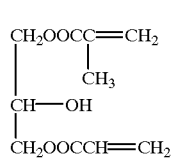
[MB-59]
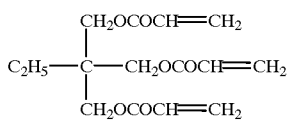
[MB-60]
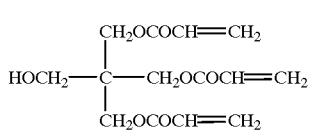
[MB-61]

[MB-62]
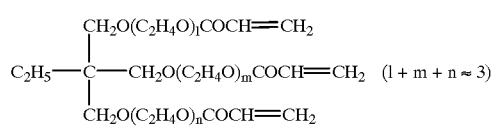
[MB-63]
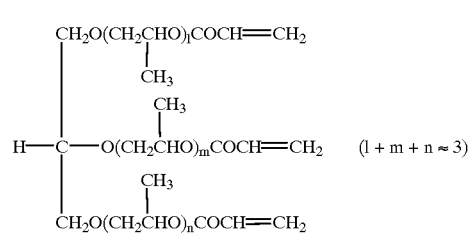
[MB-64]
[MB-65]
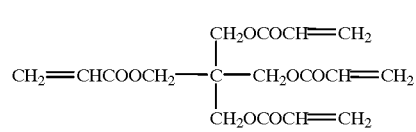
[MB-66]
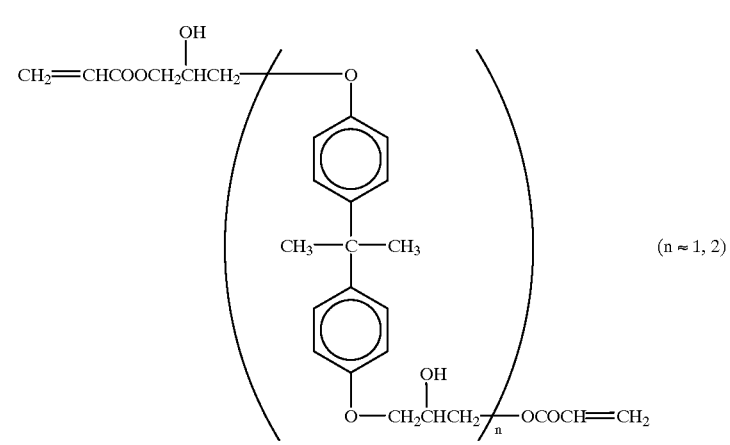
[MB-67]
[MB-68]
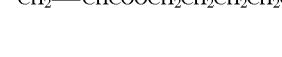
[MB-69]
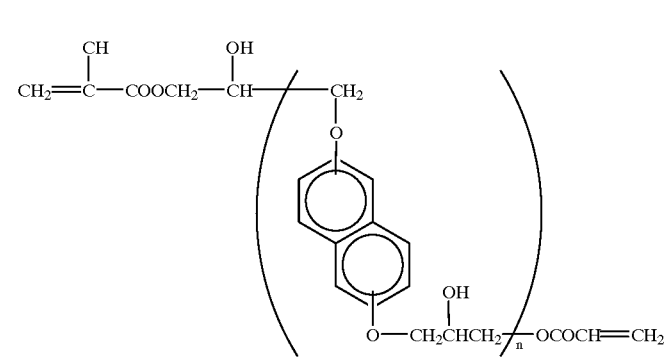

-continued
[MB-70]
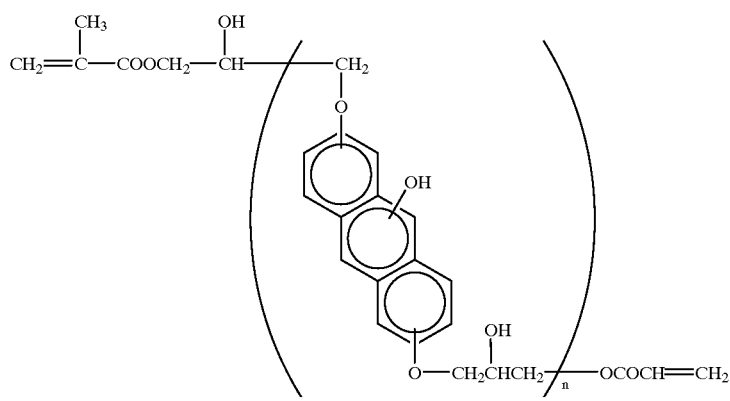
[MB-71]
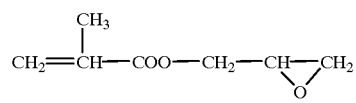
[MB-72]
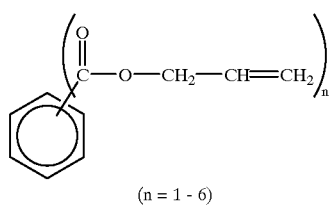
(n = 1 - 6)
[MB-73]
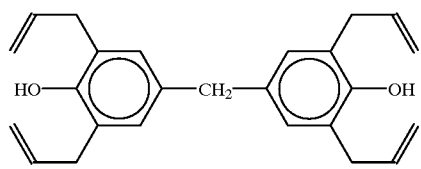
[MB-74]
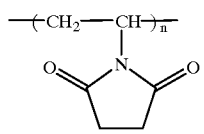
[MB-75]
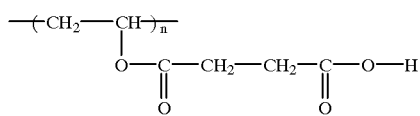
[MB-76]
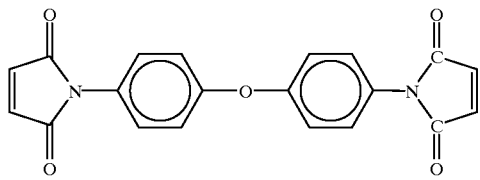

-continued
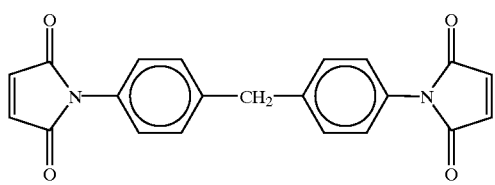
[MB-77]
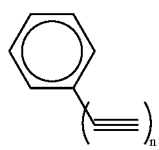
(n = 1–6)
[MB-78]
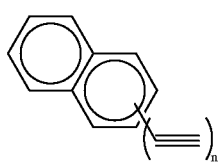
(n = 1–8)
[MB-79]
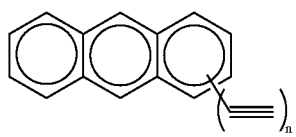
(n = 1–10)
[MB-80]
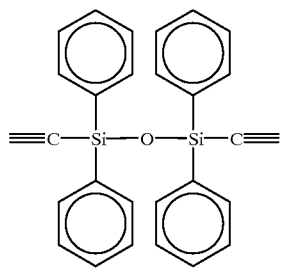
[MB-81]
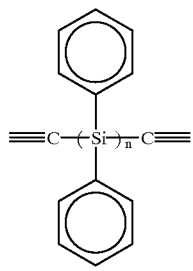
[MB-82]

-continued

[MB-83]

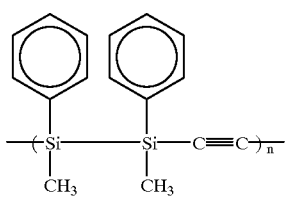

[MB-84]

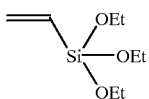

[MB-85]

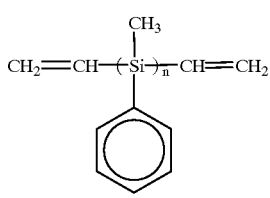

[MB-86]

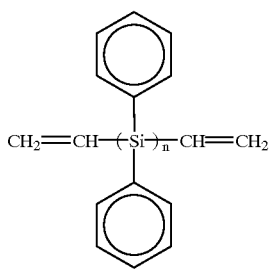

[MB-87]

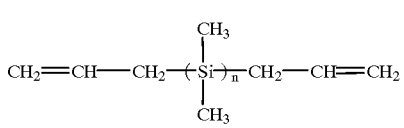

[MB-88]

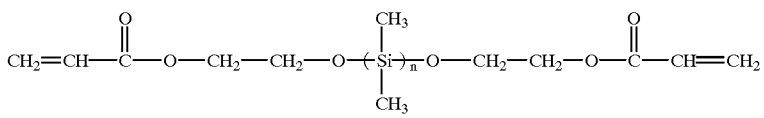

[MB-89]

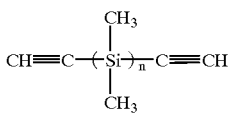

[MB-90]

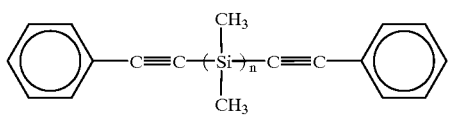

It is also possible to add a radical generator or an acid generator as a catalyst to a mixture of an organosilicon polymer and an organic compound having a multiple bond. These radical generator and acid generator function to promote the aforementioned addition reaction between the organic compound having a multiple bond and the Si—H bond, or to promote the aforementioned self-polymerization.

As for the radical generator, an azo compound (for example, azobisisobutyronitrile), a peroxide, alkylaryl ketone, silylperoxide and an organic halide may be employed. The radical generator is capable of generating radicals through a decomposition of O—O bond or C—C bond in its molecule under an influence of light or heat. Specific examples of such a radical generator are those represented by the following chemical formulas (RG-1) to (RG-24).

| | |
|---|---|
| benzoyl peroxide | [RG-1] |
| di-tertiarybutyl peroxide | [RG-2] |
| benzoin | [RG-3] |
| benzoin alkylether | [RG-4] |
| benzoin alkylarylether | [RG-5] |
| benzoyl arylether | [RG-6] |
| benzyl alkylarylthioether | [RG-7] |
| benzyl aralkylethanol | [RG-8] |
| phenyl glyoxalalkylacetal | [RG-9] |
| benzoyl oxime | [RG-10] |
| tripheryl-t-butylsilyl peroxide | [RG-11] |

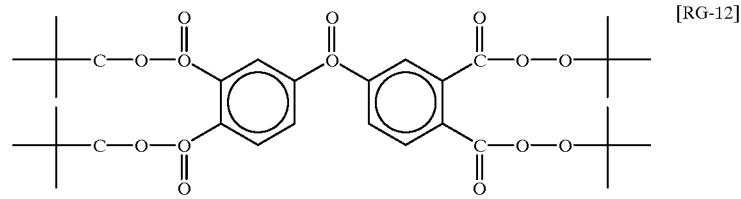

[RG-12]

[RG-13]

[RG-14]

[RG-15]

[RG-16]

[RG-17]

[RG-18]

-continued

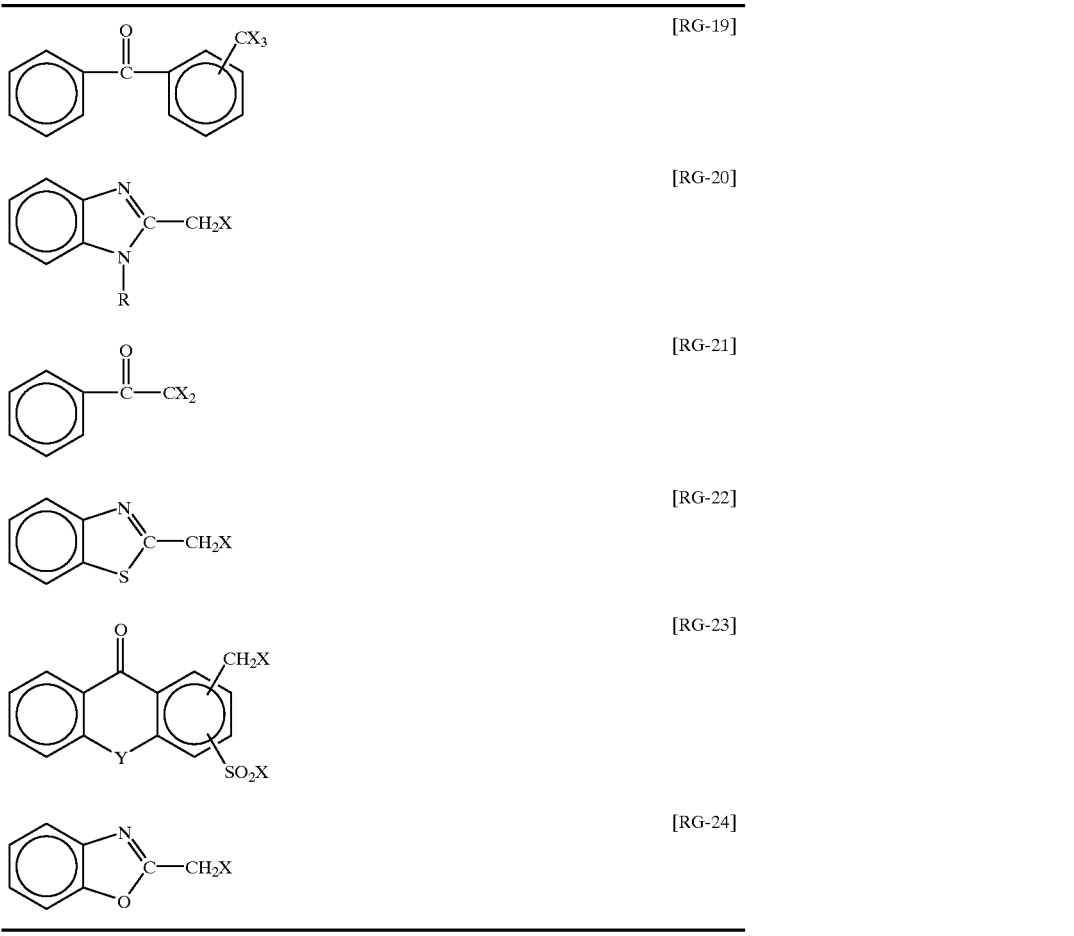

(Y = O, CH$_2$, CHX, S, C = O; X = Cl, Br, I)

Under certain circumstances, the radical generator is capable of allowing a crosslinking reaction to take place in a polysilane under an influence of light or heat without employing a compound having a multiple bond. For example, when phenyl radicals or alkyl radicals generated from the radical generator recombine, they may cause crosslinking between polysilane chains. In this case, a multifunctional radical generator such as (Rg-12) is particularly effective. Among these radical generators, an organic halide represented by the general formula (RG-18), i.e. trihalomethyl-s-triazine (for example, U.S. Pat. No. 3,779,778) is preferable for use.

In the general formula (RG-18), Q is bromine atom or chlorine atom; R$^{11}$ is —CQ$_3$, —NH$_2$, —NHR$^{13}$, —N(R$^{13}$)$_2$, —OR$^{13}$, or a substituted or unsubstituted phenyl; R$^{12}$ is —CQ$_3$, —NH$_2$, —NHR$^{13}$, —N(R$^{13}$)$_2$, —OR$^{13}$, —(CH=CH)$_n$—W, or a substituted or unsubstituted phenyl, wherein R$^{13}$ is phenyl group, naphthyl group or a lower alkyl having not more than six carbon atoms; n is an integer of 1 to 3; and W is an aromatic ring, a heterocyclic ring or a group represented by the following general formula.

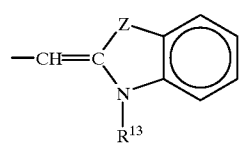

wherein Z is oxygen atom or sulfur atom; and R$^{14}$ is a lower alkyl group or phenyl group.

Among trihalomethyl-s-triazine represented by the general formula (RG-18), the compound where R$^{12}$ is formed of —(CH=CH)$_n$—W, i.e., vinyltrihalomethyl-s-triazine (for example, U.S. Pat. No. 3,987,037) is particularly preferable. This vinyltrihalomethyl-s-triazine contains trihalomethyl group and an ethylenic unsaturated bond conjugated with triazine ring, and is photo-decomposable. The aromatic ring or hetrocyclic ring, represented by W, may contain a substituent group, such as chlorine atom, bromine atom, phenyl group, a lower alkyl group having not more than six carbon atoms, nitro group, phenoxy group, alkoxyl group, acetoxy group, acetyl group, amino group or alkylamino group.

Specific examples of trihalomethyl-s-triazine represented by the general formula (RG-18) are the compounds represented by the following chemical formulas (RG-25) to (RG-34). Specific examples of other kinds of radical generator are also shown as follows by chemical formulas (RG-35) to (RG-39).

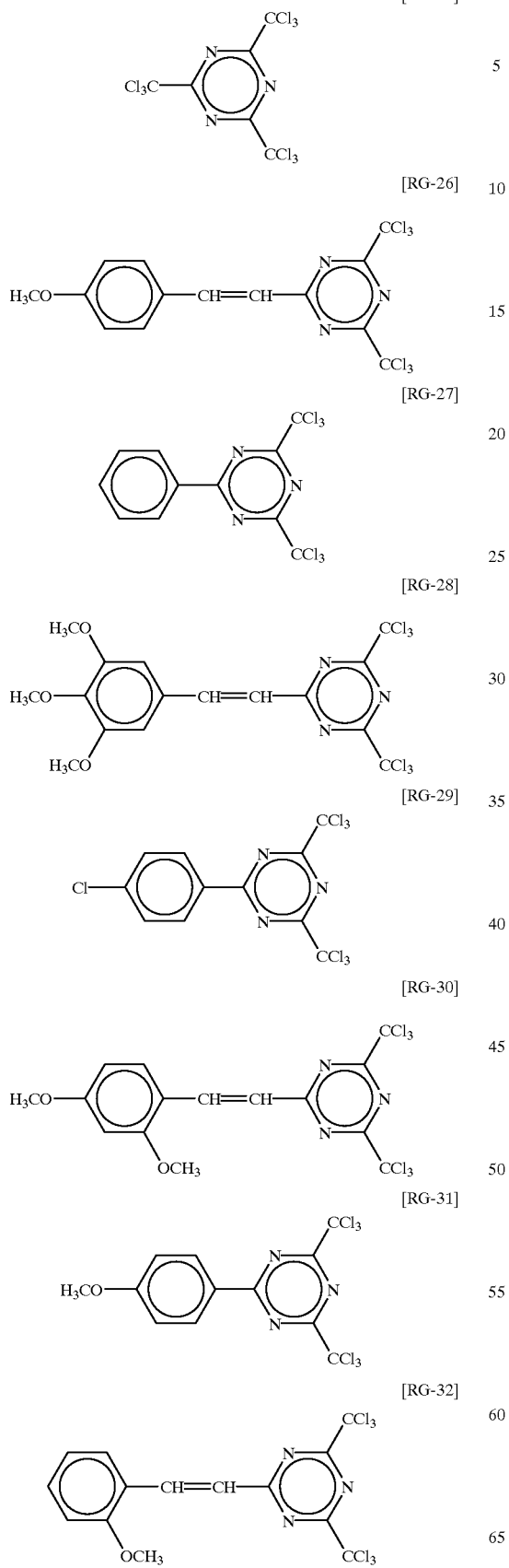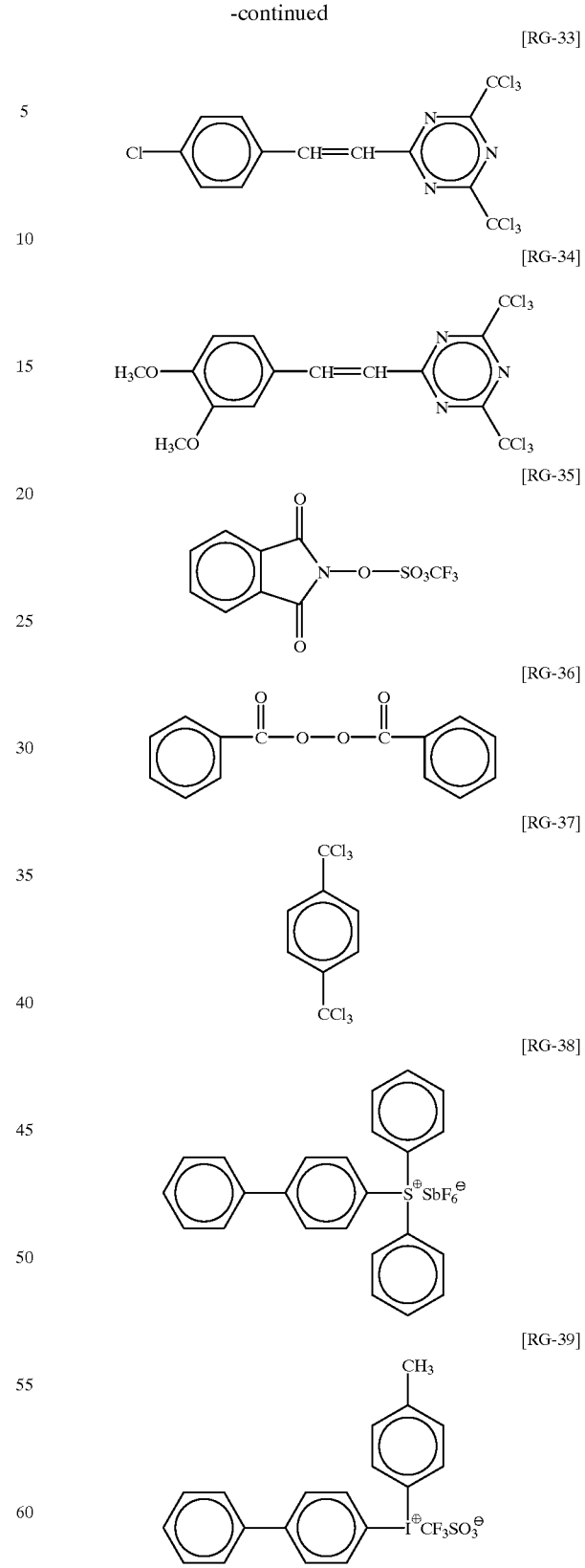
As for the acid generator, an onium salt, a halogen-containing compound, an orthoquinonediazide compound, sulfone compound, sulfonic acid compound and nitrobenzyl compound can be employed. Among them, the onium salt and orthoquinonediazide compound are preferable for use.

Specific examples of the onium salt are iodonium salt, sulfonium salt, phosphonium salt, diazonium salt and ammonium salt. Preferable examples of the onium salt are the compounds represented by the chemical formulas (AG-1) to (AG-3).

With respect to the halogen-containing compound, haloalkyl-containing hydrocarbon compounds and haloalkyl-containing heterocyclic compounds can be used. In particular, the compounds represented by the following chemical formulas (AG-4) to (AG-5) are preferable for use.

As for the quinonediazide compound, a compound such as diazobenzoquinone compound or diazonaphthoquinone compound can be used. In particular, the compounds represented by the chemical formulas (AG-6) to (AG-9) are preferable for use.

As for the sulfone compound, a compound such as β-ketosulfone or β-sulfonyl sulfone may be used. In particular, the compound represented by the chemical formula (AG-10) is preferable.

As for the nitrobenzyl compound, a compound such as nitrobenzyl sulfonate compound or dinitrobenzyl sulfonate compound can be used. In particular, the compound represented by the chemical formula (AG-11) is preferable for use.

As for the sulfonic acid compound, a compound such as alkyl sulfonate, haloalkyl sulfonate, aryl sulfonate or iminosulfonate can be used. In particular, the compounds represented by the chemical formulas (AG-12) to (AG-14) are preferable for use.

Examples of the acid-generating agent useful in this case are onium salt, a halogen-containing compound, an orthoquinodiazide compound, a sulfone compound, sulfonic acid compound and nitrobenzyl compound. Among them, onium salt and an orthoquinodiazide compound are preferable. Specific examples of onium salt are iodonium salt, sulfonium salt, phosphonium salt, diazonium salt and ammonium salt. Preferable examples of onium salt are the compounds represented by the following general formulas (AG-1) to (AG-3).

Specific examples of the halogen-containing compound are a haloalkyl-containing hydrocarbon compound and a haloalkyl-containing heterocyclic compound. Preferable examples of the halogen-containing compound are the compounds represented by the following general formulas (AG-4) and (AG-5).

Specific examples of the orthoquinodiazide compound are a diazobenzoquinone compound and a diazonaphthoquinone compound. Preferable examples of the orthoquinodiazide compound are the compounds represented by the following general formulas (AG-6) to (AG-9).

Specific examples of the sulfone compound are β-ketosulfone and β-sulfonylsulfone. Preferable examples of the sulfone compound are the compounds represented by the following general formula (AG-10).

Specific examples of the nitrobenzyl compound are a nitrobenzyl sulfonate compound and a dinitrobenzyl sulfonate compound. Preferable examples of the nitrobenzyl compound are the compounds represented by the following general formula (AG-11).

Specific examples of the sulfonic acid compound are alkylsulfonate, haloalkylsulfonate, arylsulfonate and iminosulfonate. Preferable examples of the sulfonic acid compound are the compounds represented by the following general formulas (AG-12) to (AG-14).

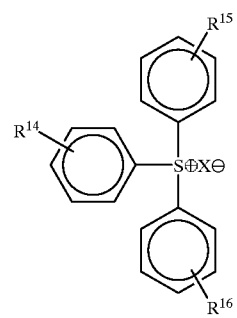
[AG-1]

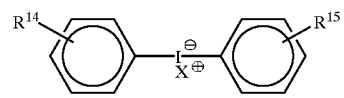
[AG-2]

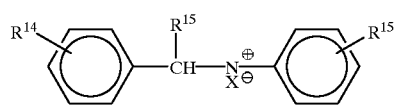
[AG-3]

wherein $R^{14}$ to $R^{16}$ may be the same or different and are individually a hydrogen atom, amino group, nitro group, cyano group, or a substituted or unsubstituted alkyl or alkoxy group; X is $SbF_6$, $AsF_6$, $PF_6$, $BF_4$, $CF_3CO_2$, $ClO_4$, $CF_3SO_3$,

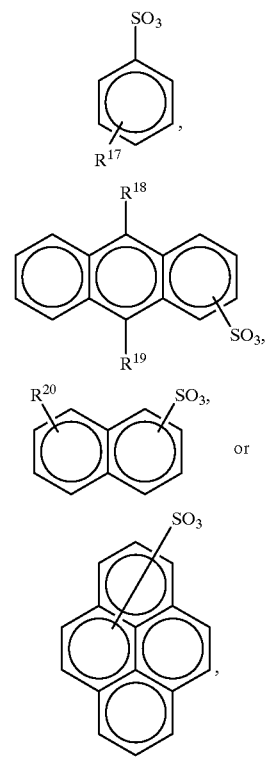

or $R^{17}$ is hydrogen atom, amino group, anilino group, or a substituted or unsubstituted alkyl or alkoxyl group; $R^{18}$ to $R^{19}$ may be the same or different and are individually a substituted or unsubstituted alkoxyl group; and $R^{20}$ is hydrogen atom, amino group, anilino group, or a substituted or unsubstitutued alkyl or alkoxyl group.

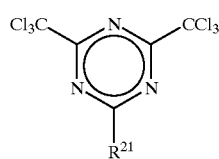
[AG-4]

wherein $R^{21}$ is trichloromethyl group, phenyl group, methoxyphenyl group, naphthnyl group or methoxynaphthyl group.

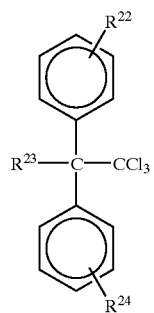
[AG-5]

wherein $R^{22}$ to $R^{24}$ may be the same or different and are individually hydrogen atom, halogen atom, methyl, methoxy or hydroxyl group.

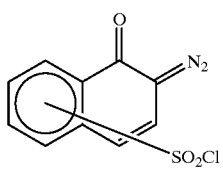
[AG-6]

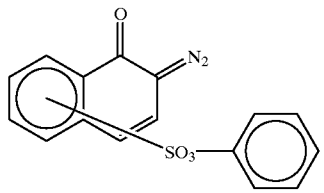
[AG-7]

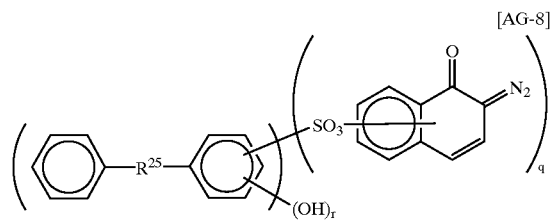
[AG-8]

wherein $R^{25}$ is —$CH_2$—, —$C(CH_3)_2$—, —C— or —$SO_2$—; q an integer of 1 to 6; and r is an integer of 0 to 5 with proviso that the total of q+r is 1 to 6.

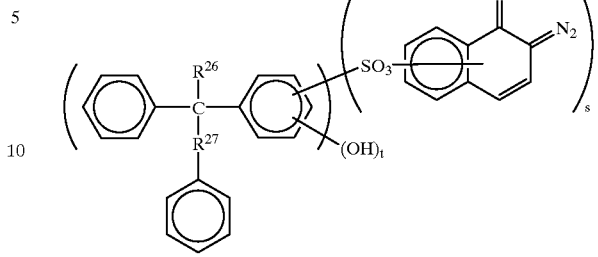
[AG-9]

wherein $R^{26}$ is hydrogen atom or methyl; $R^{27}$ is —$CH_2$—, —$C(CH_3)_2$—,

of —$SO_2$—; s is an integer of 1 to 6; and t is an integer of 0 to 5 with proviso that the total of s+t is 1 to 6.

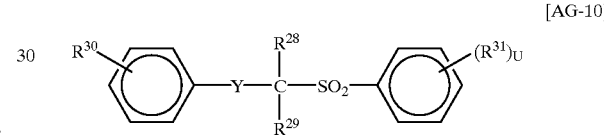
[AG-10]

wherein $R^{28}$ to $R^{31}$ may be the same or different and are individually a substituted or unsubstituted alkyl group, or halogen atom; Y is

or —$SO_2$—; and u is an integer of 0 to 3.

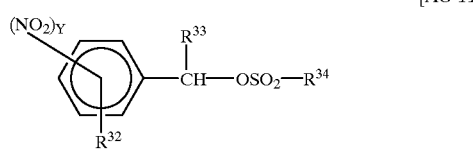
[AG-11]

wherein $R^{32}$ is a substituted or unsubstituted alkyl group; $R^{33}$ is hydrogen atom or methyl; $R^{34}$ is

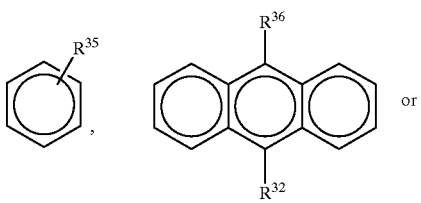

or

-continued

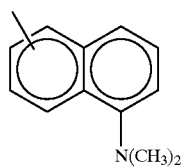

(herein $R^{35}$ is hydrogen atom or methyl; and $R^{36}$ and $R^{37}$ may be the same or different and are individually a substituted or unsubstituted alkoxyl group); and v is an integer of 1 to 3.

[AG-12]

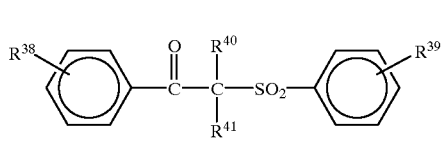

wherein $R^{38}$ and $R^{39}$ may be the same or different and are individually a substituted or unsubstituted alkyl group, $R^{40}$ and $R^{41}$ may be the same or different and are individually hydrogen atom or a substituted or unsubstituted alkyl or aryl group.

[AG-13]

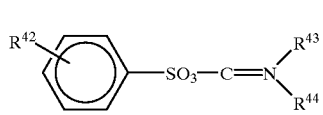

wherein $R^{42}$ is hydrogen atom or a substituted or unsubstituted alkyl group $R^{43}$ and $R^{44}$ may be the same or different and are individually a substituted or unsubstituted alkyl or aryl group; and $R^{43}$ and $R^{44}$ may be connected together to form a closed ring.

[AG-14]

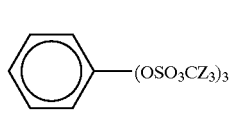

Wherein Z is fluorine atom or chlorine atom.

If the aforementioned organosilicon polymer is to be employed as a resist, the mixing ratio of the aforementioned radical generator and/or acid generator should preferably be 0.1 to 30 parts by weight, more preferably 1 to 10 parts by weight per 100 parts by weight of the organosilicon polymer. Namely, if the mixing ratio of the radical generator and/or acid generator is less than 0.1 part by weight, the conductivity of the resultant resist may become insufficient. On the other hand, if the mixing ratio of these radical generator and/or acid generator exceeds 30 parts by weight, the solubility of the light-exposed portion in an alkaline developing solution at the occasion of forming a positive type pattern may be lowered. However, if halomethyl-s-triazine is employed as a radical generator, it is possible to obtain a resist having a sufficient sensitivity even if the mixing ratio of halomethyl-s-triazine is as little as 0.01 to 3 parts by weight. Preferable mixing ratio of halomethyl-s-triazine is 1 to 2 parts by weight per 100 parts by weight of the organosilicon polymer.

As for the crosslinking agent for the organosilicon polymer, it is also possible according to this invention to employ, in addition to the aforementioned organic compound having a multiple bond, the following compounds. Namely, it is possible to employ an organic compound having hydroxyl group; an organic compound having epoxy group; an organic compound having amino group; pyridine oxide; a silicon compound having alkoxysilyl group, silylester group, oximesilyl group, phenoxysilyl group, aminosilyl group, amidesilyl group, aminoxysilyl group or halogen atom; an organometallic compound; or a compound containing halogen atom.

As for the compound having hydroxyl group, polyhydric alcohol, novolak resin, a compound having carboxyl group, or silanol can be employed. These compounds are capable of reacting with an Si—H bond of the organosilicon polymer under an influence of heat or light, whereby allowing a crosslinking reaction to take place. The chemical formulas (OH-1) to (OH-28) show specific examples of these compounds.

As for the compound having epoxy group, an epibis-type epoxy resin or alicyclic epoxy resin can be generally employed. These epoxy resins may comprise hydroxyl group which is attached to a portion of the molecule of the resin. These resins may be employed together with the aforementioned acid generator. The chemical formulas (EP-1) to (EP-12) show specific examples of these compounds.

As for the compound having amino group, the compounds represented by the chemical formulas (AM-1) to (AM-13) can be employed.

As for the pyridine oxide, the compounds represented by the chemical formulas (PO-1) to (PO-6) can be employed.

As for the silicon compound having alkoxysilyl group, silylester group, oximesilyl group, phenoxysilyl group, aminosilyl group, amidesilyl group, aminoxysilyl group or halogen atom, the compounds represented by the chemical formulas (SC-1) to (SC-52), wherein X stands for the aforementioned substituent groups, can be employed. These silicon compounds may be employed together with a metallic catalyst such as platinum and organotin compounds which are conventionally employed as a condensation catalyst for a silicone, or with a base.

The organometallic compound to be employed in this invention means metal salts or metal complexes having an organic substituent group. Specific examples of the metal to be employed in this case are B, Mg, Al, Ca, Ti, V, Mn, Fe, Co, Ni, Cu, Zn, Zr, Mo, Rh, Pd, Cd, In and Sn. The chemical formulas (OM-1) to (OM-8) show specific examples of these organometallic compounds.

As for the compound containing halogen, the compounds represented by the chemical formulas (HL-1) to (HL-9) can be employed.

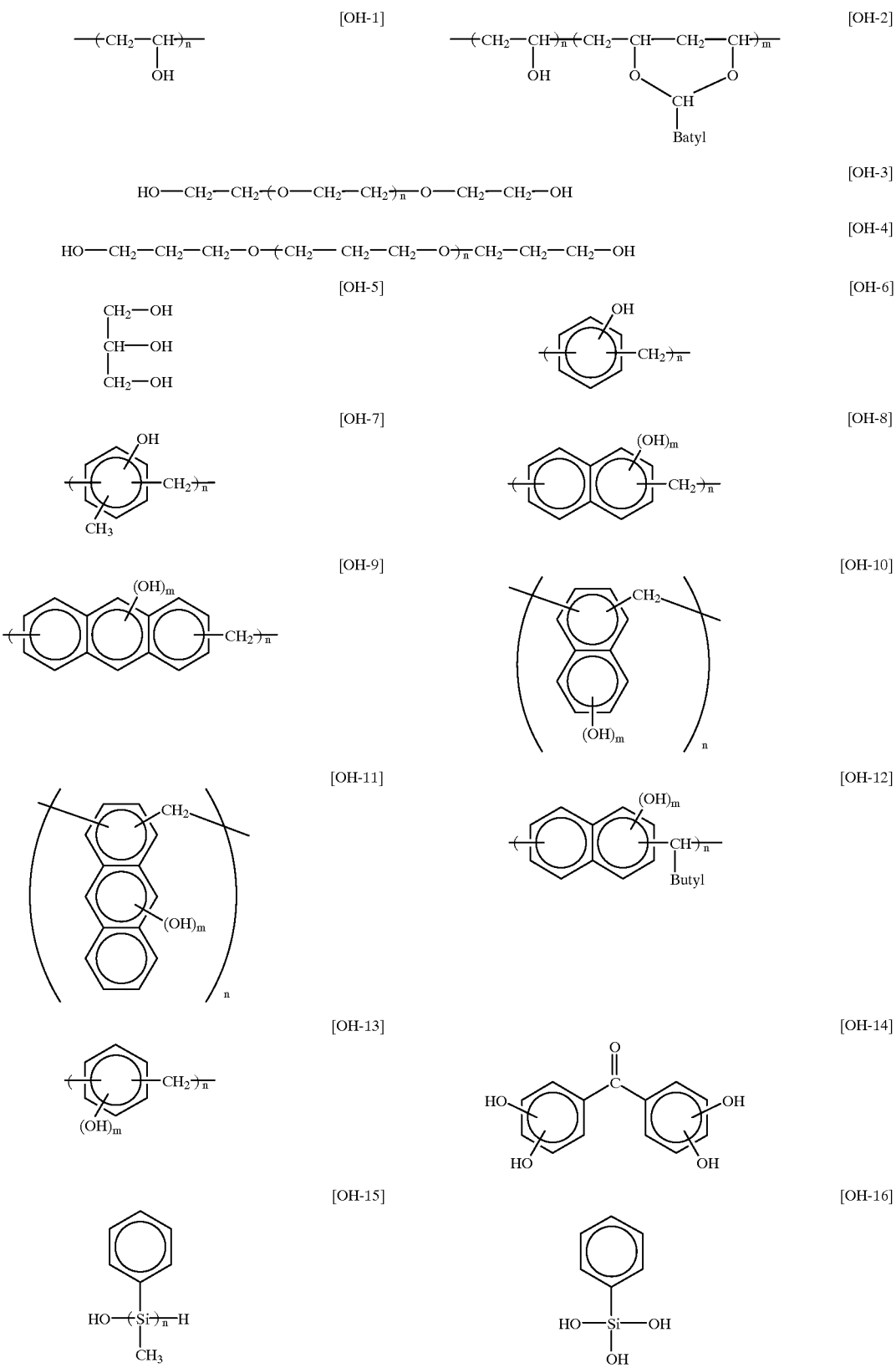

-continued
[OH-17] 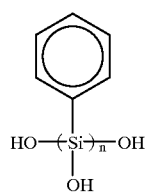
[OH-18] 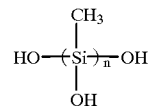
[OH-19] 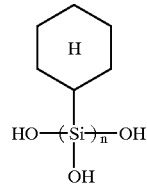
[OH-20] 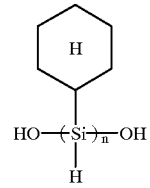
[OH-21] 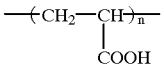
[OH-22] 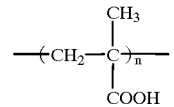
[OH-23] 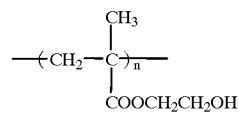
[OH-24] 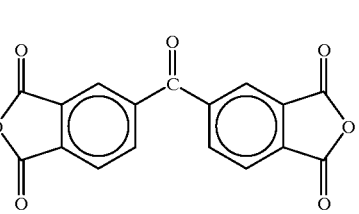
[OH-25] 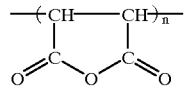
[OH-26] 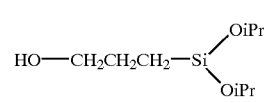
[OH-27] 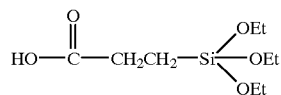
[OH-28] 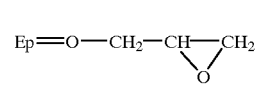
[EP-1] 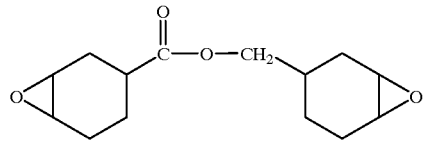
[EP-2] 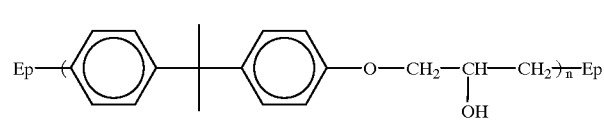
[EP-3] 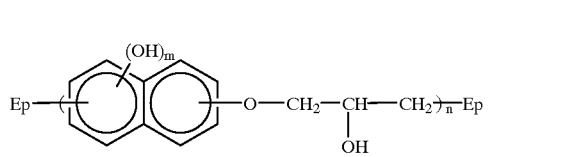
[EP-4] 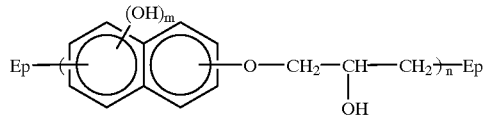
[EP-5] 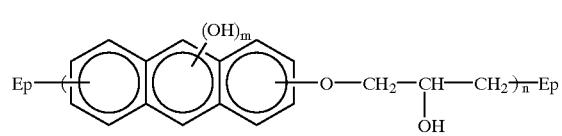

-continued
[EP-6]
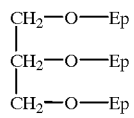
[EP-7]
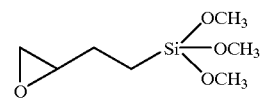
[EP-8]
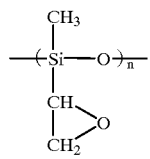
[EP-9]
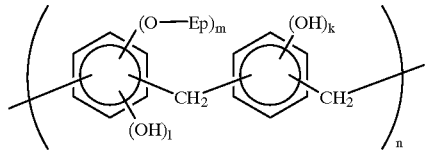
[EP-10]
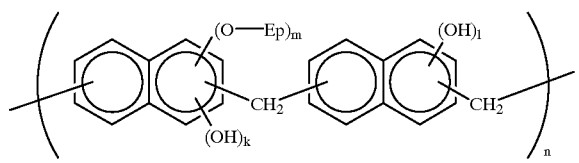
[EP-11]
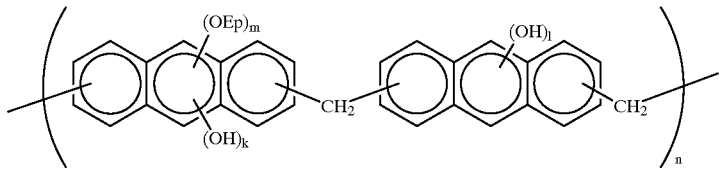
[EP-12]
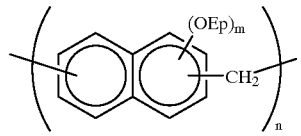
[AM-1]
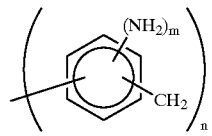
[AM-2]
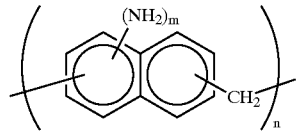
[AM-3]
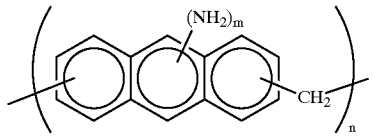
[AM-4]
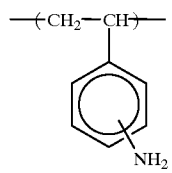
[AM-5]
$H_2N-(CH_2)_6-NH_2$
[AM-6]
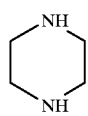
[AM-7]
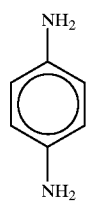
[AM-8]
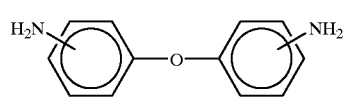
[AM-9]
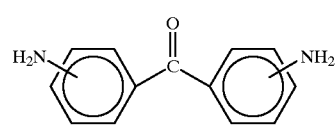

-continued
[AM-10] 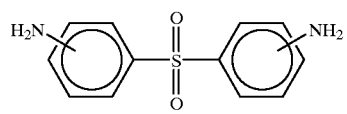
[AM-11] 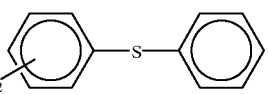
[AM-12] 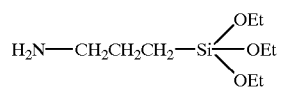
[AM-13] 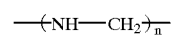
[PO-1] 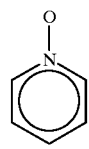
[PO-2] 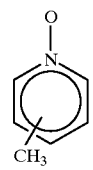
[PO-3] 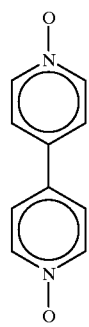
[PO-4] 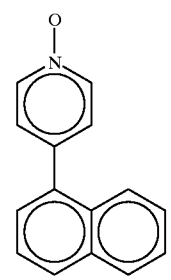
[PO-5] 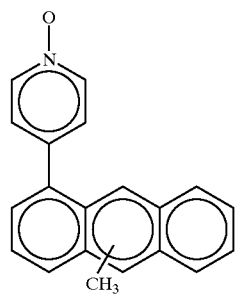
[PO-6] 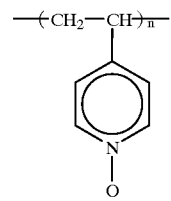
[SC-1] 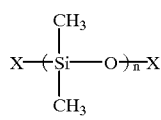
[SC-2] 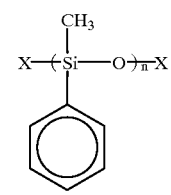
[SC-3] 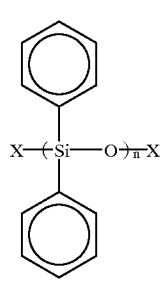
[SC-4] 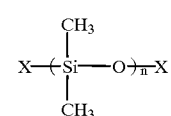

-continued
[SC-5]
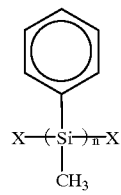
[SC-6]
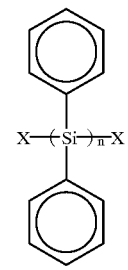
[SC-7]
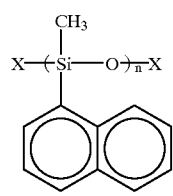
[SC-8]
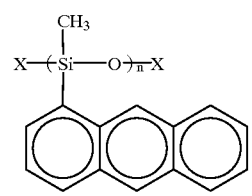
[SC-9]
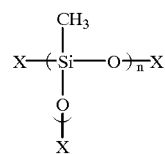
[SC-10]
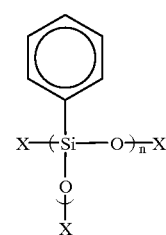
[SC-11]
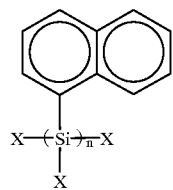
[SC-12]
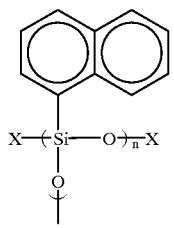
[SC-13]
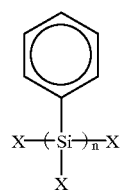
[SC-14]
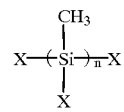
[SC-15]
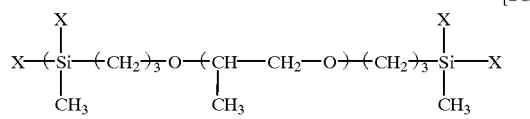
[SC-16]
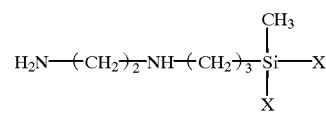
[SC-17]
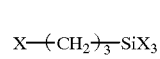
[SC-18]
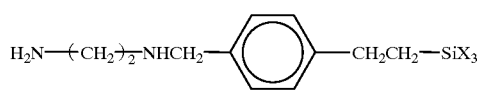

-continued

[SC-19] 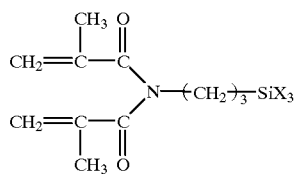

[SC-20] 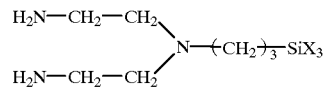

[SC-21] 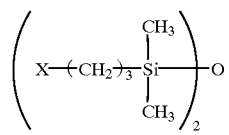

[SC-22] 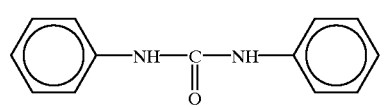

[SC-23] $(CH_3)_3Si-CN$

[SC-24] $(CH_3)_3SiH_3$

[SC-25] 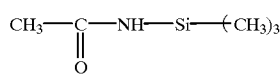

[SC-26] 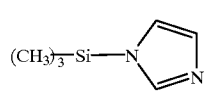

[SC-27] 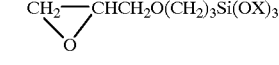

[SC-28] 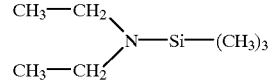

[SC-29] 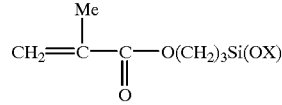

[SC-30] $-(SiH_2-NH)_n-$

[SC-31] $CH_2=CHSiX_3$

[SC-32] $CH_2=CHSi(OX)_3$

[SC-33] $Cl(CH_2)_3Si(OX)_3$

[SC-34] $Cl(CH_2)_3\overset{Me}{Si}X_2$

[SC-35] $Cl(CH_2)_3\overset{Me}{Si}(OX)_3$

[SC-36] $Cl(CH_2)_3\overset{Me}{Si}(OX)_2$

[SC-37] $H_2N(CH_2)_3Si(OX)_3$

[SC-38] $H_2N(CH_2)_2NH(CH_2)_3Si(OX)_3$

[SC-39] $H_2N(CH_2)_2NH(CH_2)_3\overset{Me}{Si}(OX)_3$

[SC-40] $HS(CH_2)_3Si(OX)_3$

[SC-41] 

[SC-42] 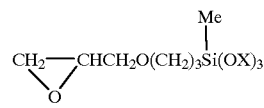

[SC-43] 

[SC-44] 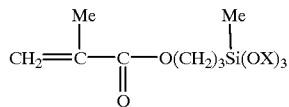

[SC-45] $Me_3SiNHSiMe_3$

[SC-46] $[Me_2SiNH]_n$

[SC-47] $Me_3SiNHCONHSiMe_3$

[SC-48] $CH_3CONHSiMe_3$

[SC-49] $Me_3NSiMe_3$

[SC-50] $Et_2NSiMe_3$

[SC-51] 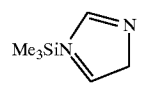

[SC-52] 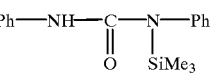

[OM-1] Al(acac)₃

[OM-2] Al(Etaa)₃

[OM-3] Al(SA)₃

[OM-4] 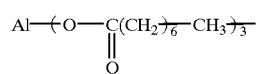

[OM-5] TiO(acac)₂

[OM-6] Zr(acac)₄

[OM-7] SnO(acac)₂

[OM-8] VO(acac)₂ acac = acetylacetonato
Etaa = ethylacetoacetato
SA = salicylaldehydato

[HL-1] 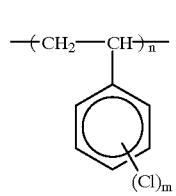

[HL-2] 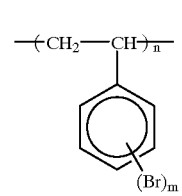

[HL-3] 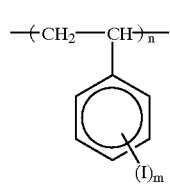

[HL-4] 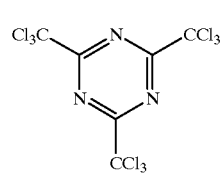

[HL-5] 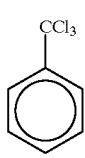

[HL-6] 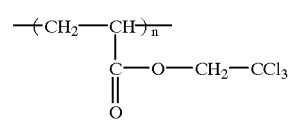

[HL-7] 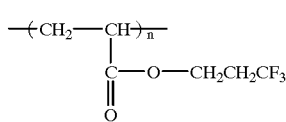

[HL-8] 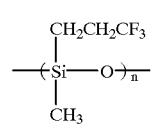

[HL-9] 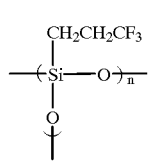

A linear organosilicon polymer can be also employed as an etching mask in this invention, provided that the linear organosilicon polymer is high in Tg, excellent in heat resistance, and is hardly soluble in a solvent for the resist.

A polysilane copolymer represented by the following general formula (ArPS-I) or (ArPS-II) show specific examples of such an organosilicon polymer having a high Tg.

[ArPs-I]

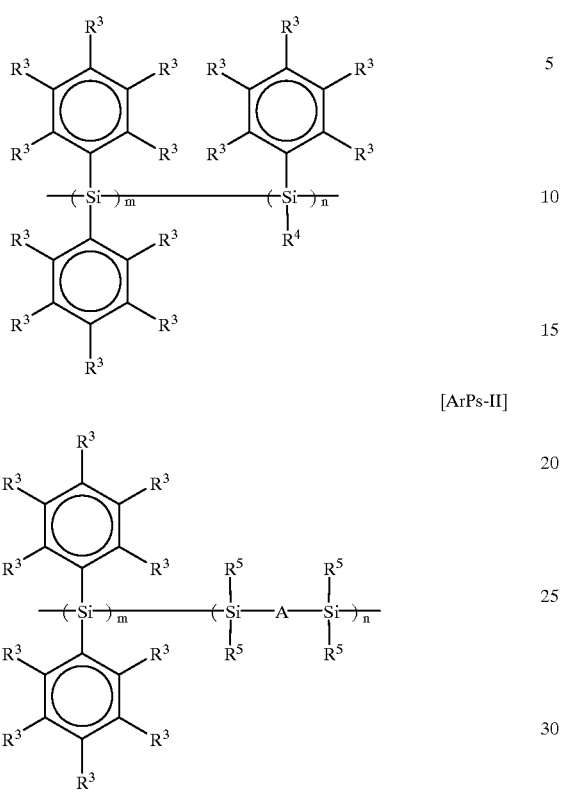

[ArPs-II]

wherein R³ substituents may be the same or different and are selected from hydrogen atom and a substituted or unsubstituted hydrocarbon group having not more than four carbon atoms, silyl group and alkoxyl group; R⁴ substituent is selected from hydrogen atom and a substituted or unsubstituted hydrocarbon group having not more than four carbon atoms, and silyl group; R⁵ substituents are may be the same or different and are selected from a substituted or unsubstituted aryl group and hydrogen atom and a hydrocarbon group having not more than four carbon atoms., and m and n are positive integers. Note that a polysilane copolymer having an Si—H bond can be crosslinked.

The chemical formulas (ArPS-1) to (ArPS-22) show specific examples of the polysilane copolymer represented by the general formula (ArPS-I). The chemical formulas (ArPS-23) to (ArPS-44) show specific examples of the polysilane copolymer represented by the general formula (ArPS-II).

[ArPS-1]

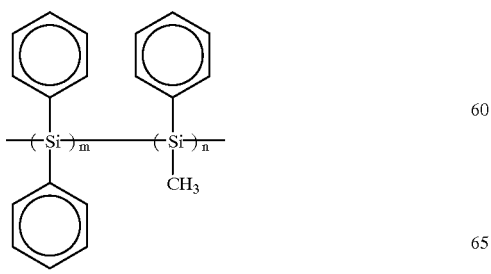

[ArPS-2]

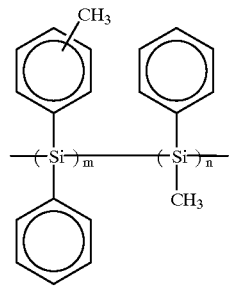

[ArPS-3]

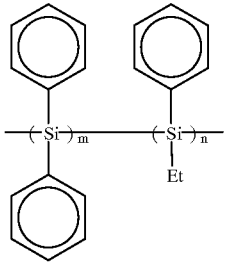

[ArPS-4]

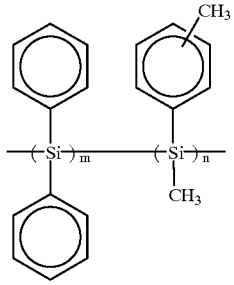

[ArPS-5]

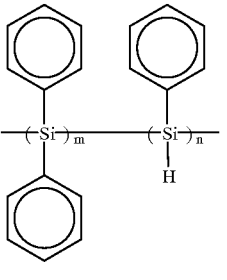

[ArPS-6]

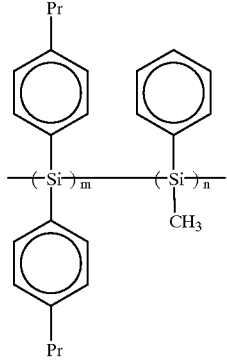

[ArPS-7]
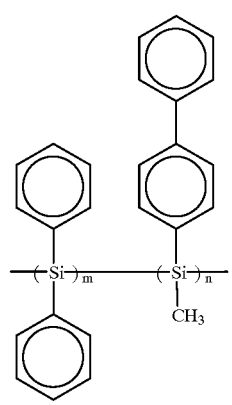
[ArPS-8]
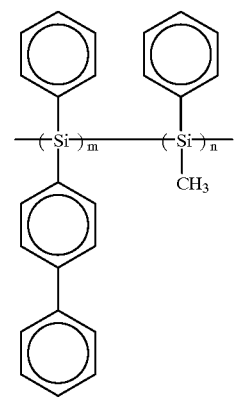
[ArPS-9]
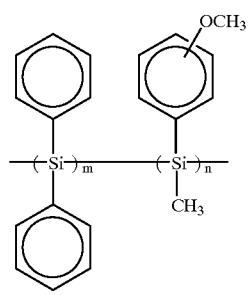
[ArPS-10]
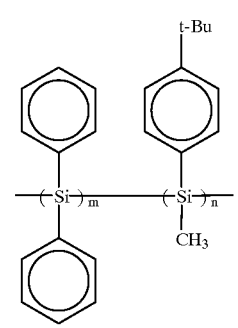
[ArPS-11]
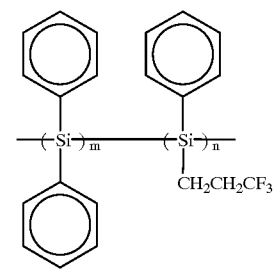
[ArPS-12]
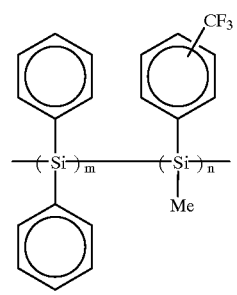
[ArPS-13]
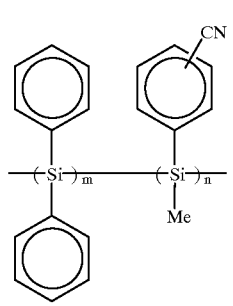
[ArPS-14]
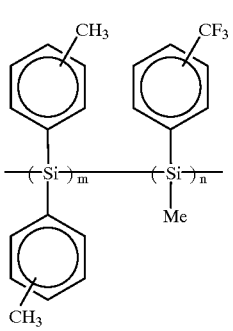
[ArPS-15]

[ArPS-16]
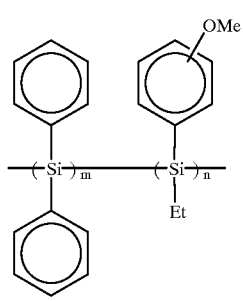
[ArPS-17]
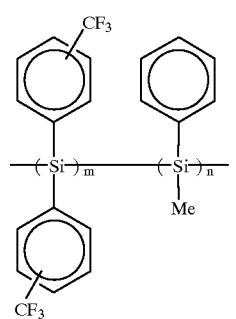
[ArPS-18]
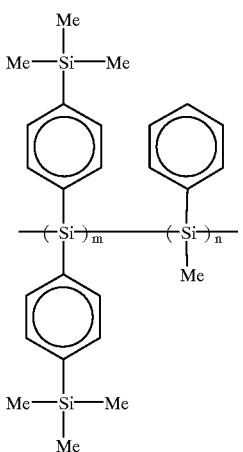
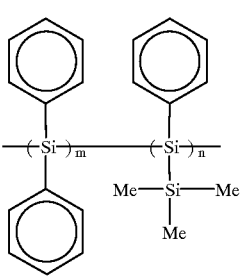
[ArPS-20]
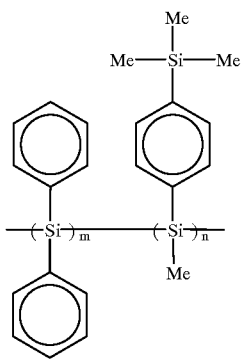
[ArPS-21]
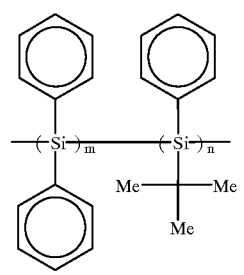
[ArPS-22]
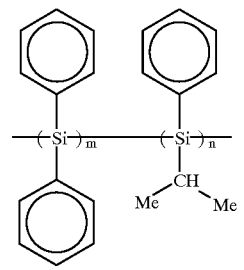
[ArPS-23]
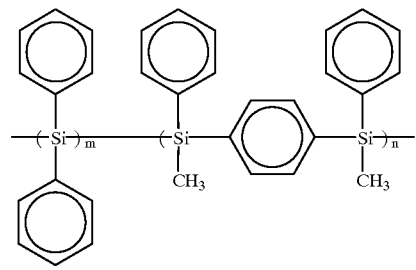
[ArPS-24]
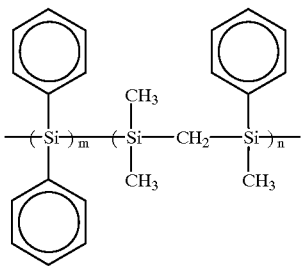

[ArPS-25]
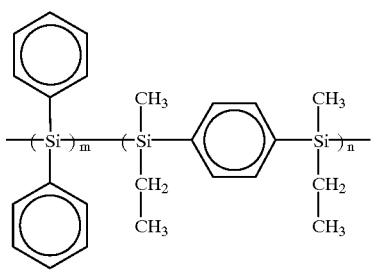
[ArPS-26]
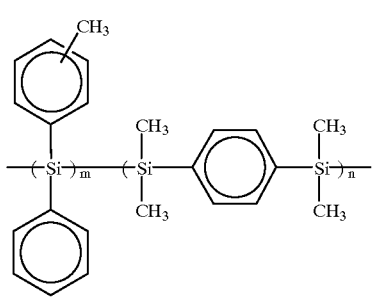
[ArPS-27]
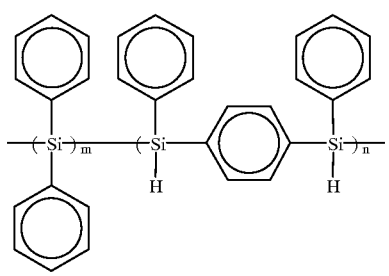
[ArPS-28]
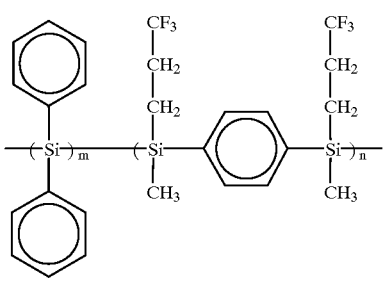
[ArPS-29]
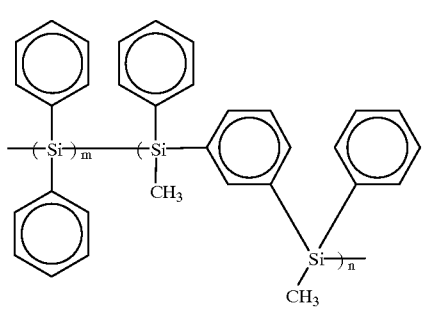
[ArPS-30]
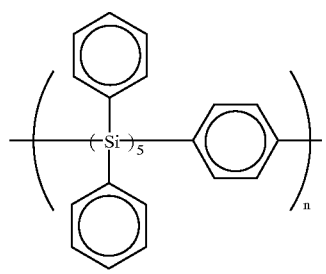
[ArPS-31]
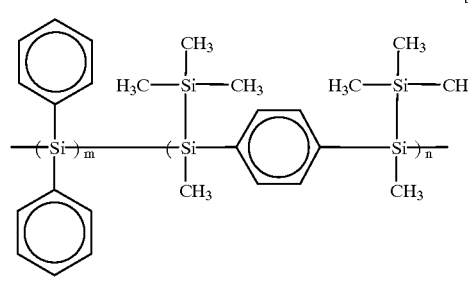
[ArPS-32]
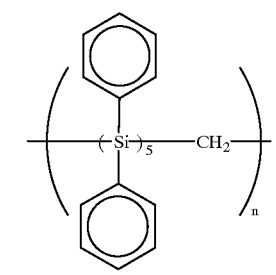
[ArPS-33]
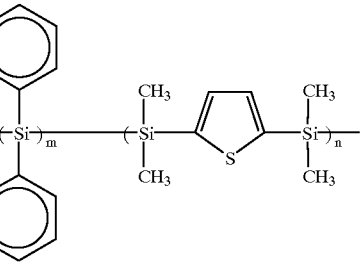
[ArPS-34]
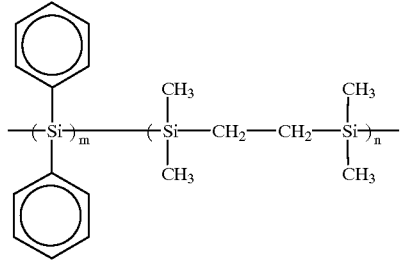

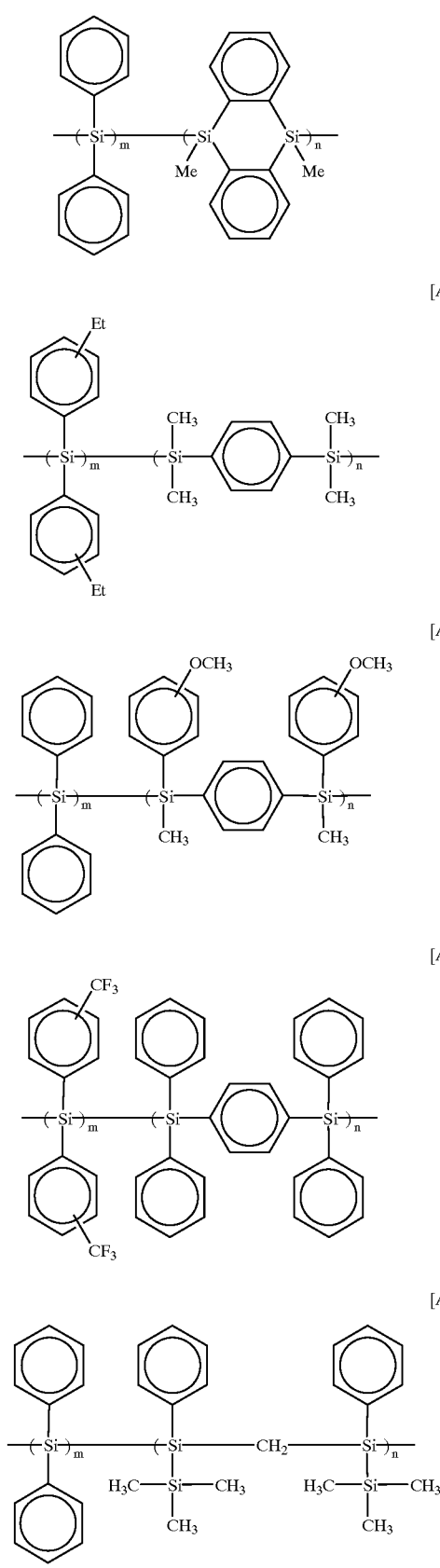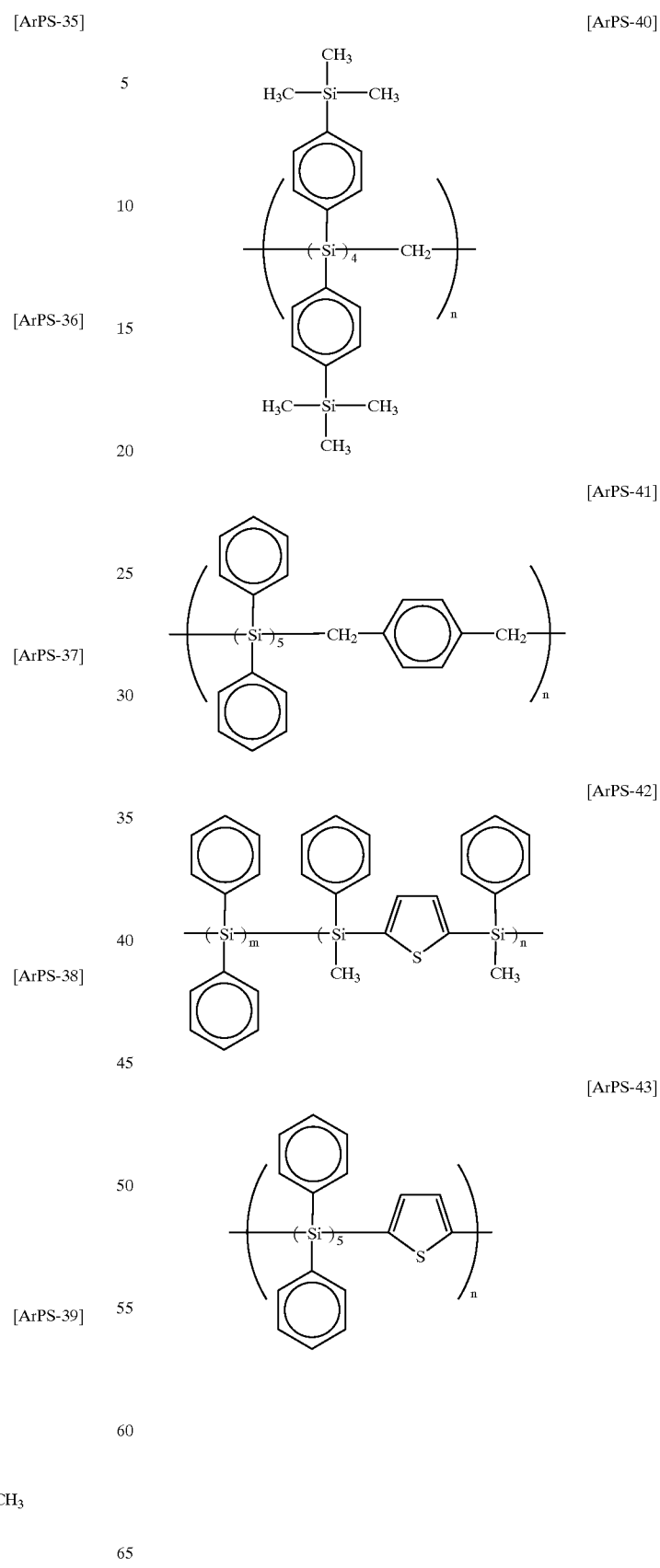

[ArPS-44]

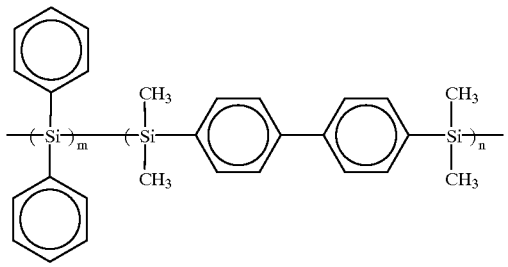

As for organosilicon polymer having a high Tg, the organosilicon polymers having silacyclopentadiene (silol ring) in its main chain and represented by the general formulas (SL-I) to (SL-VII) can be employed.

[SL-I]

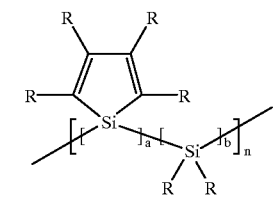

[SL-II]

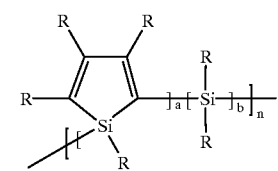

[SL-III]

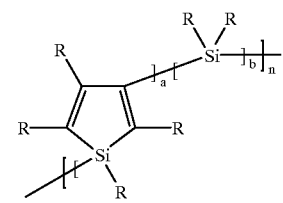

[SL-IV]

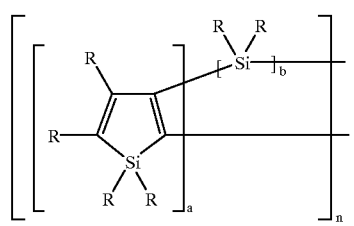

[SL-V]

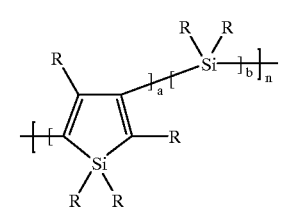

[SL-VI]

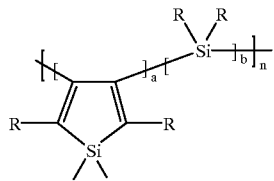

[SL-VII]

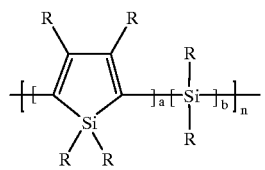

wherein a is an integer of 1 or more; b is an integer of 0 or more; n is an integer of 1 or more; R is substituted or unsubstituted hydrocarbon group, or silyl group which may be of a cyclic structure which is constituted by a couple of Rs.

The following compounds are specific examples of the organosilicon polymers represented by the general formulas (SL-I) to (SL-VII) having silol ring in their main chain.

[SL-I1]

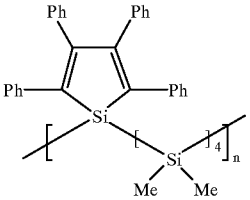

[SL-I2]

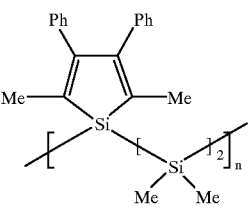

[SL-I3]

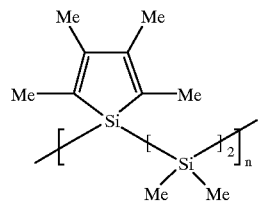

[SL-I4]

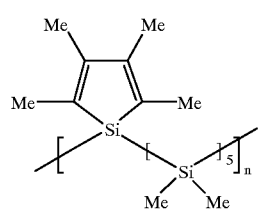

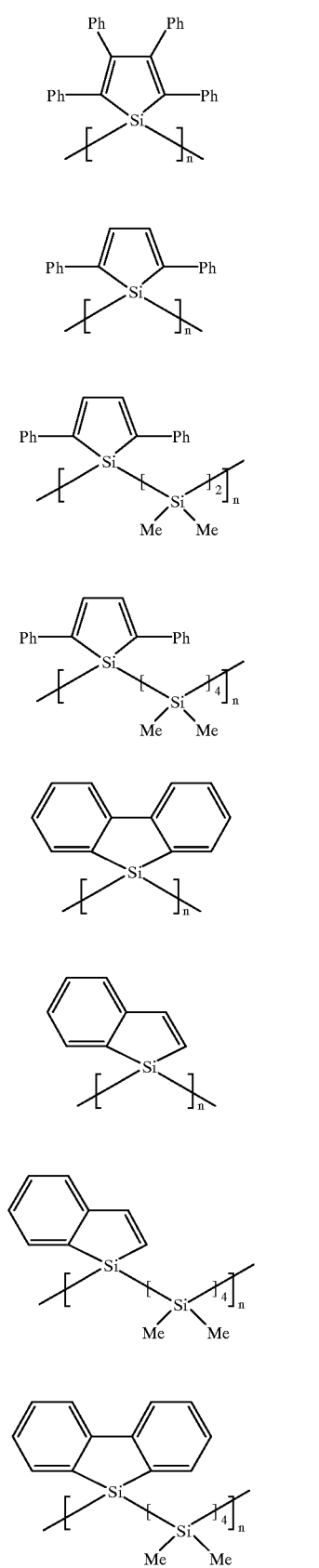
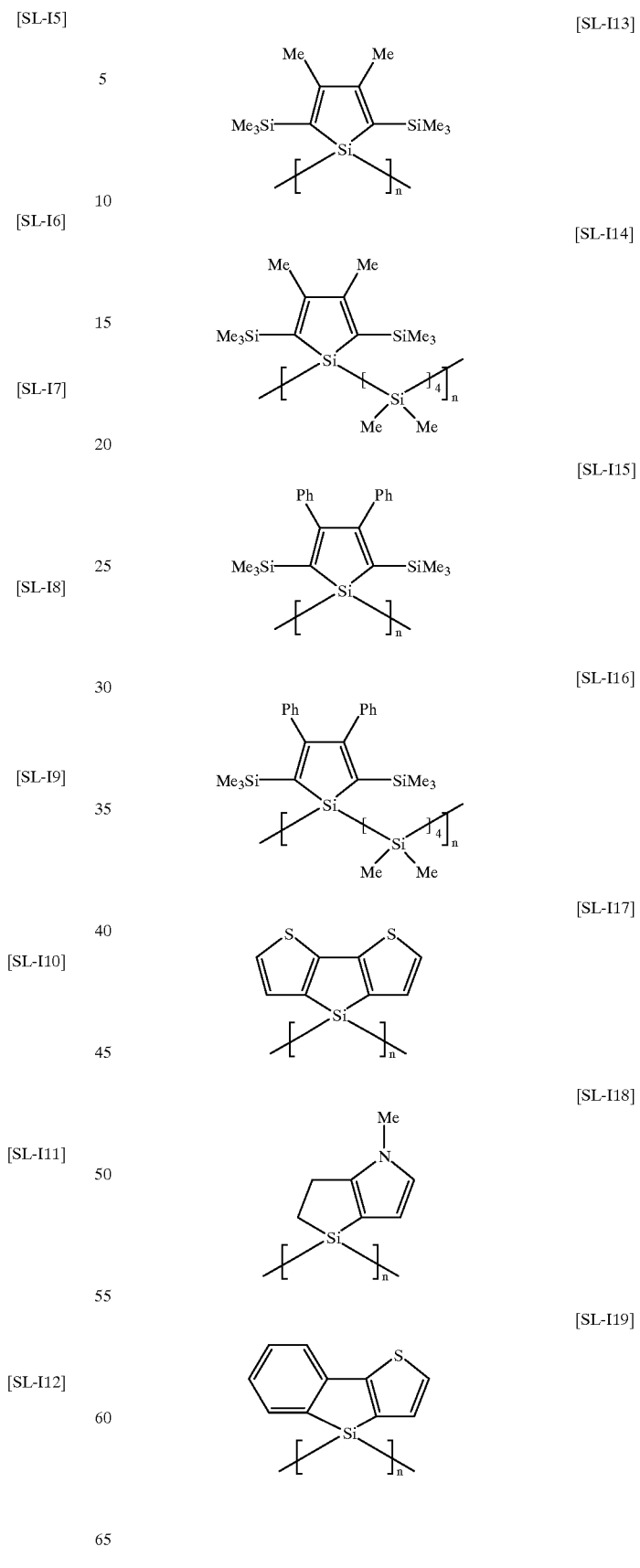

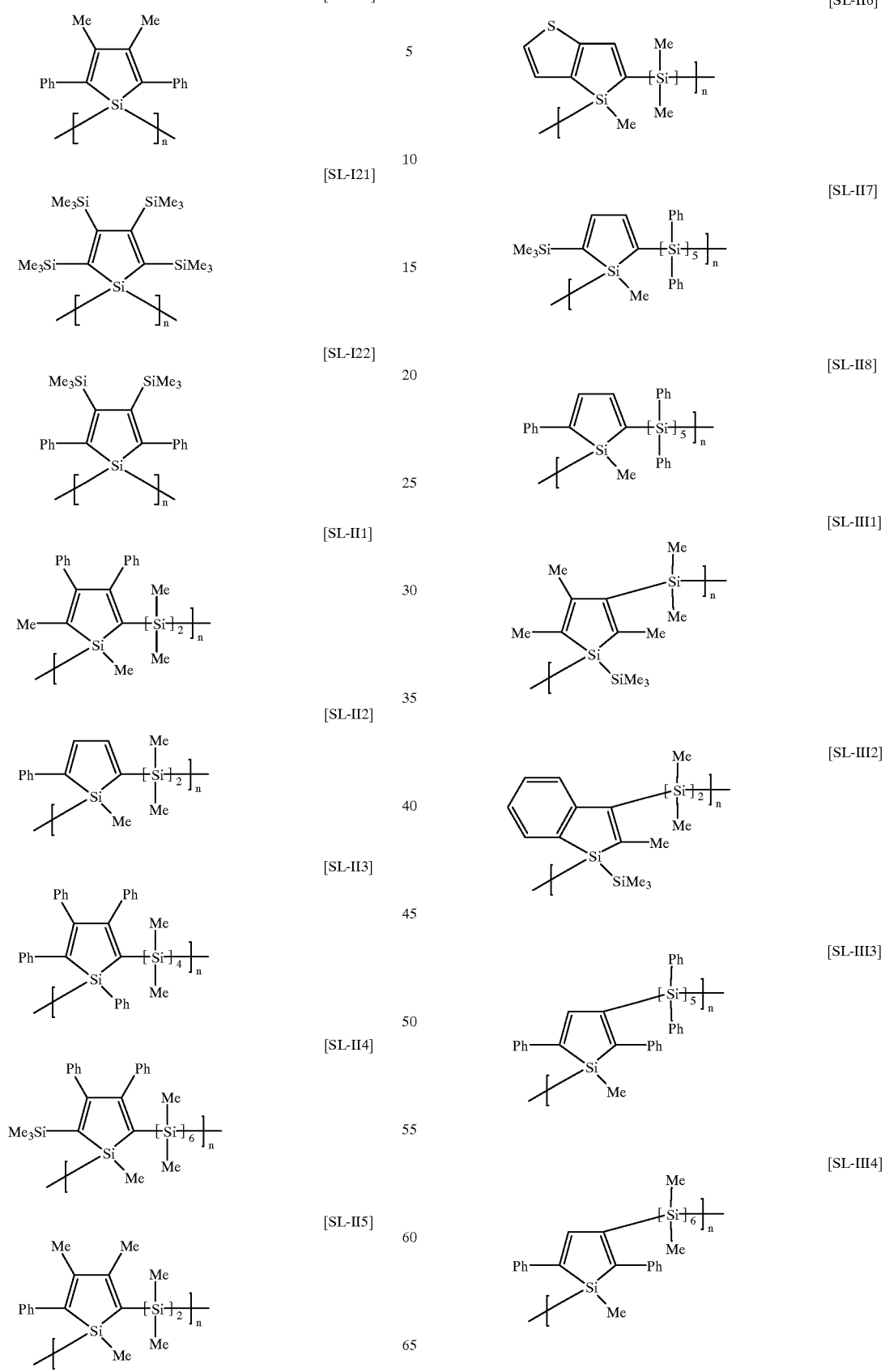

[SL-III5]
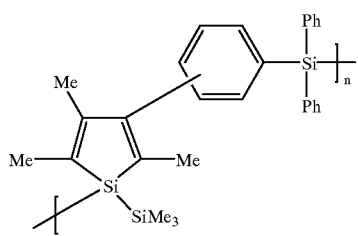
[SL-III6]
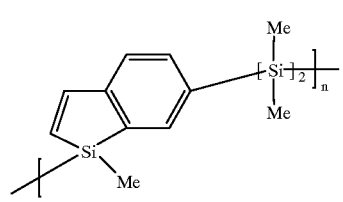
[SL-III7]
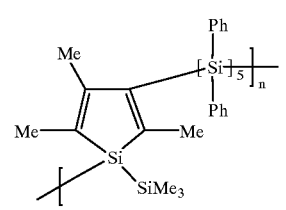
[SL-III8]
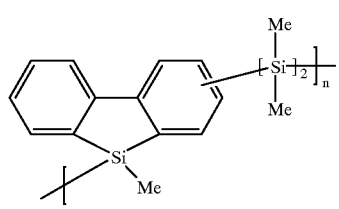
[SL-IV1]
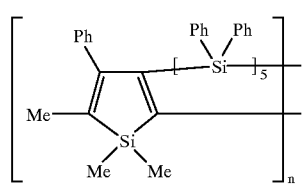
[SL-IV2]
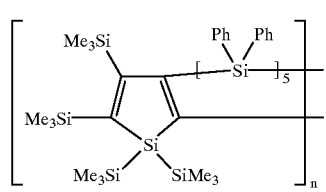
[SL-IV3]
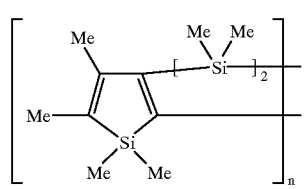
[SL-IV4]
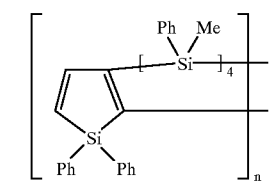
[SL-IV5]
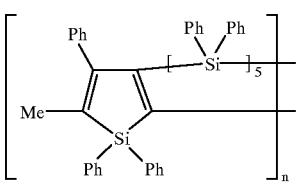
[SL-IV6]
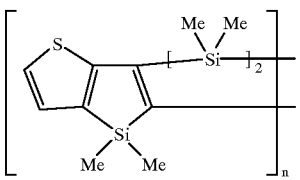
[SL-IV7]
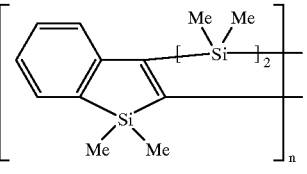
[SL-IV8]
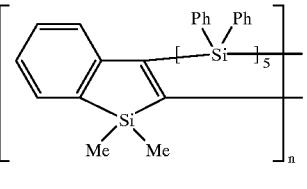
[SL-V1]
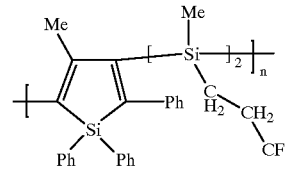
[SL-V2]
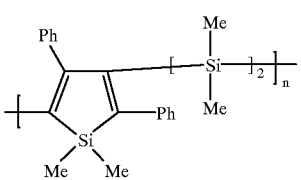

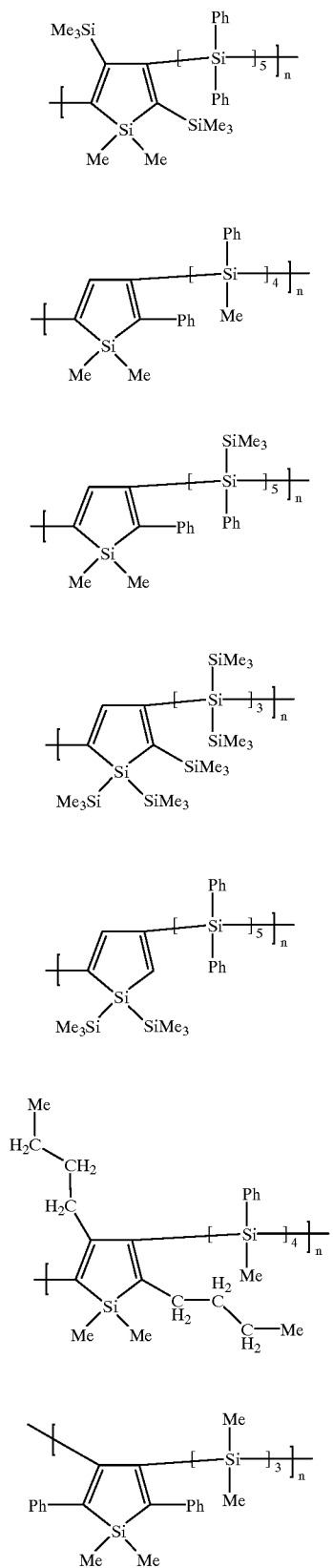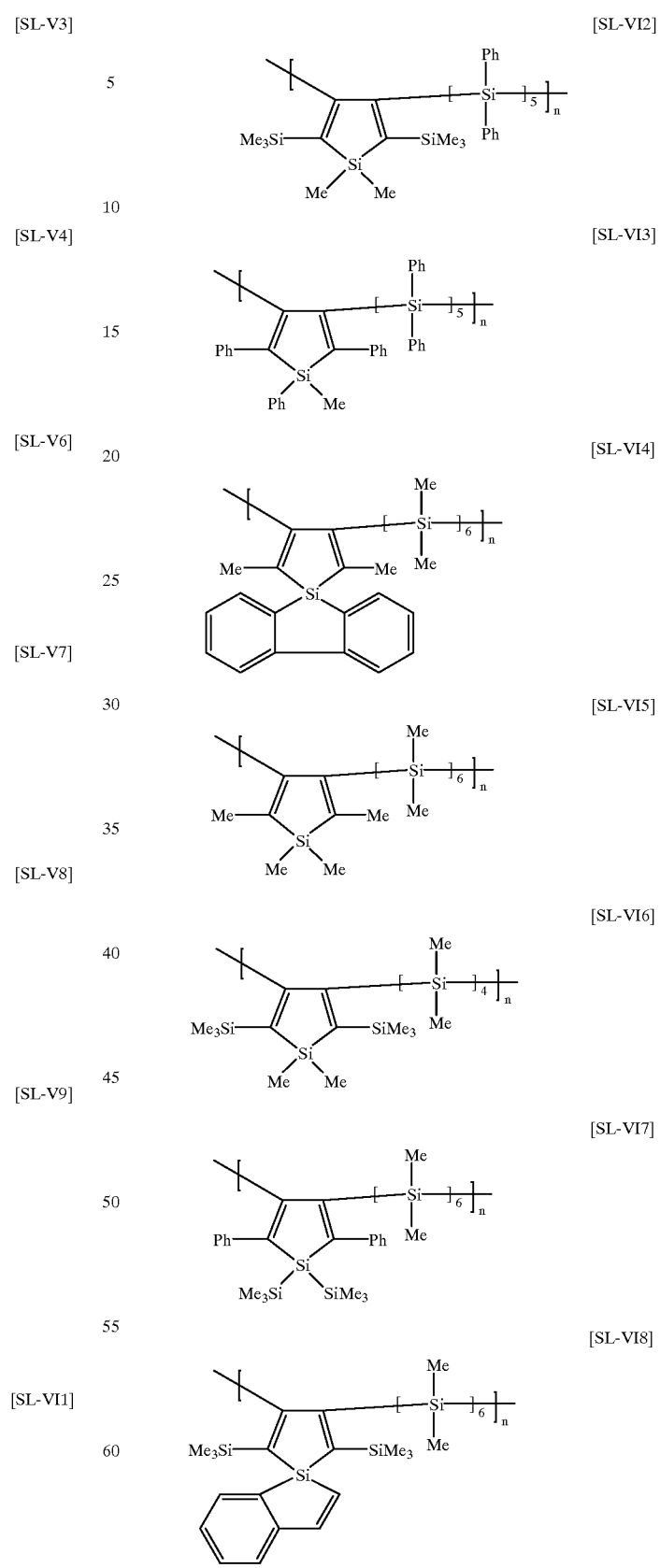

-continued
[SL-VII1]
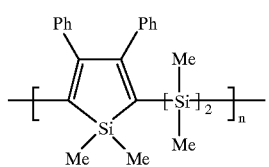
[SL-VII2]
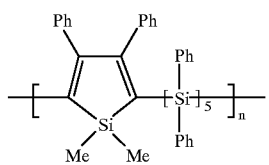
[SL-VII3]
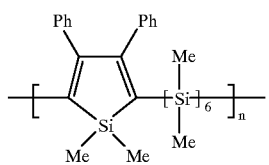
[SL-VII4]
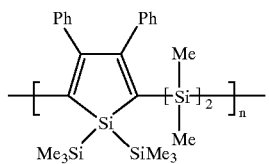
[SL-VII5]
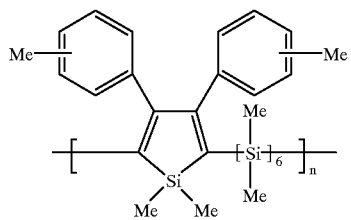
[SL-VII6]
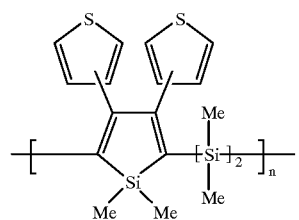
[SL-VII7]
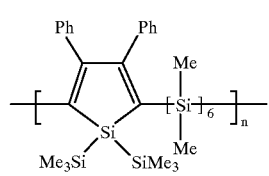
-continued
[SL-VII8]
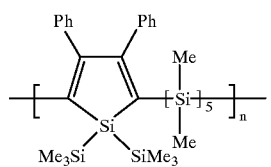
[SL-VII9]
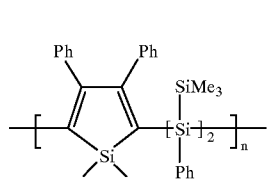
[SL-VII10]
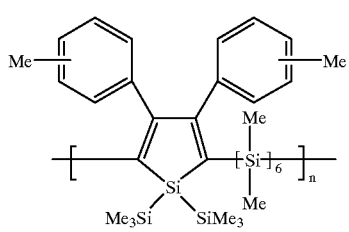
[SL-VII11]
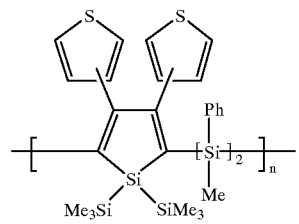
[SL-VII12]
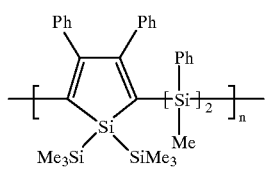
[SL-VII13]
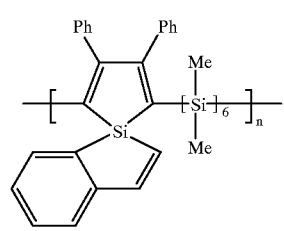

[SL-VII14]
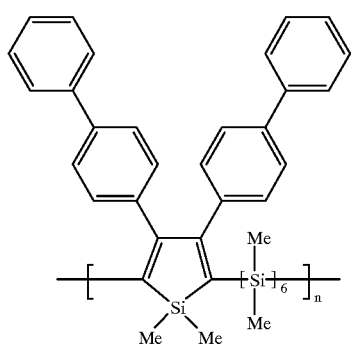

[SL-VII15]
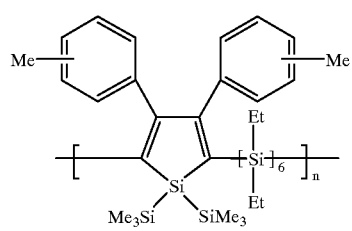

[SL-VII16]
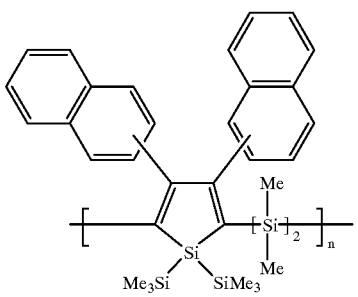

[SL-VII17]
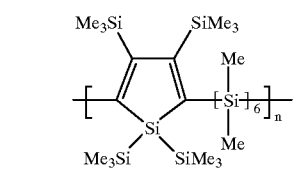

[SL-VII18]
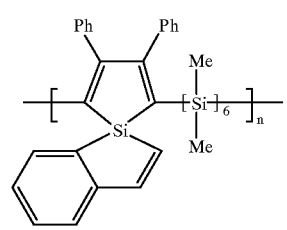

[SL-VII19]
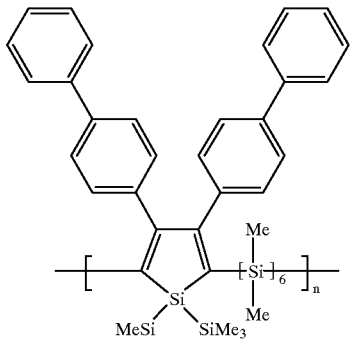

[SL-VII20]
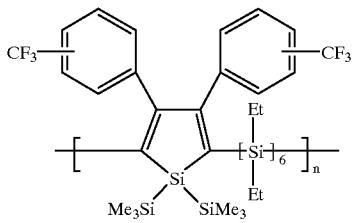

If a polysilane having an Si—H bond or a polisilane in which a hydroxymethylphenyl group or —CH$_2$XR group is introduced in a side chain is bonded to the abovementioned polysilane dendrimer, the resultant polymer can be crosslinked. In this case, a crosslinking agent mey be added to the resultant polymer, if desired. In a similar manner, the organosilicon polymer having a repeating unit represented by any of the general formulas (ArPS-I), (ArPS-II) and (SL-I) to (SL-VII) can be crosslinked.

Next, a method for preventing charge-up in a processing step using charged particles by providing an organosilicon polymer film with electric conductivity will be explained. In order to provide an organosilicon polymer film with electric conductivity, the following methods are employed.

(1) An organosilicon polymer solution containing a conductive material is employed as a coating material, thereby obtaining an organosilicon polymer film having conductivity.

(2) An organosilicon polymer solution containing a precursor compound which is capable of generating a conductive material under the influence of light or heat is employed as a coating material, thereby obtaining an organosilicon polymer film containing the precursor compound. In this case, the organosilicon polymer film can be rendered conductive in the following manners.

(2-A) After an organosilicon polymer film is formed by coating an organosilicon polymer solution containing a precursor compound, the organosilicon polymer film is irradiated with light or heated, whereby allowing the conductive material to generate.

(2-B) After an organosilicon polymer film is formed by coating an organosilicon polymer solution containing a precursor compound, a resist film is formed on the organosilicon polymer film, and then the organosilicon polymer film is irradiated, through the resist film, with light, whereby allowing the conductive material to generate. In this case, light having a wavelength which is capable of avoiding the resist film from being substantially affected by the light is employed.

(2-C) First of all, an organosilicon polymer film is formed by coating an organosilicon polymer solution containing a precursor compound, and then a resist film is formed on the organosilicon polymer film. Thereafter, the resist film is subjected to exposure and development by making use of ultraviolet rays. Subsequently, the exposed portion of the organosilicon polymer film is irradiated with an electron beam employed in EB exposure, or with ions or light generated in RIE, whereby allowing the conductive material to generate.

Alternatively, the aforementioned method may be modified in such a way that light may be irradiated concurrent with the EB exposure or RIE, whereby allowing the conductive material to generate. When the EB exposure and the irradiation of light are concurrently performed as mentioned above, light having a wavelength which is capable of avoiding the resist film from being substantially affected by the light is employed.

(3) After an organosilicon polymer film is formed, or after an resist film is subjected to development, the doping of conductive material from vapor phase is performed.

The abovementioned methods are also applicable to the case where an organosilicon polymer film is used as a resist and EB exposure is performed.

There is not any particular limitation to the kind of organosilicon polymer useful in these methods. For example, in addition to the aforementioned various kinds of organosilicon polymer such as polysilane, a polysilane represented by the general formula —(SiR$^6$R$^6$)—, wherein R$^6$ substituents may be the same or different and are selected from hydrogen atom and a substituted or unsubstituted aliphatic hydrocarbon group and aromatic hydrocarbon group having 1 to 20 carbon atoms, can be employed. The polysilane may be either a homopolymer of a copolymer. Further, the polysilane may be constructed such that two or more kinds of polisilanes are linked to each other through oxygen atom, nitrogen atom, aliphatic group or aromatic group. It is also possible to employ an organosilicon polymer whose repeating unit in the main chain is formed of —(Si—C)—. Followings are specific examples of the organosilicon polymer which are not set forth in the above description but useful in this invention.

[PS-1]

[PS-2]
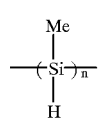

-continued

[PS-3]
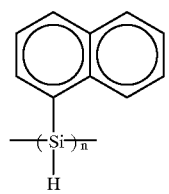

[PS-4]
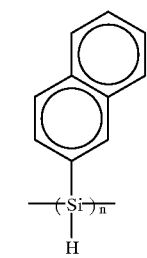

[PS-5]
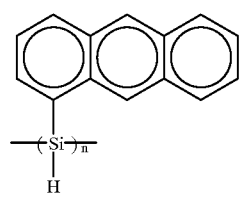

[PS-6]
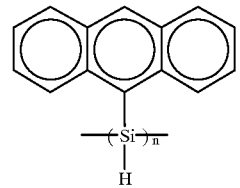

[PS-7]
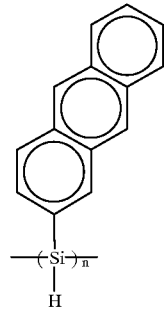

[PS-8]
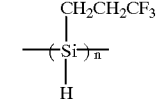

[PS-9]
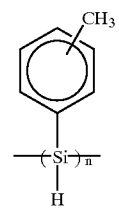

-continued
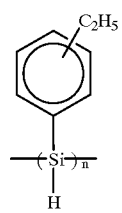 [PS-10]
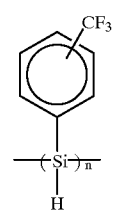 [PS-11]
 [PS-12]
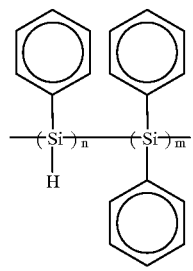 [PS-13]
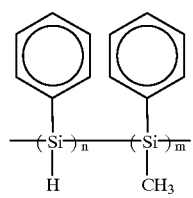 [PS-14]
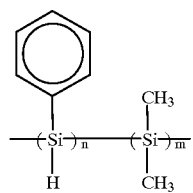 [PS-15]
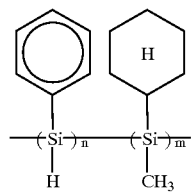 [PS-16]
-continued
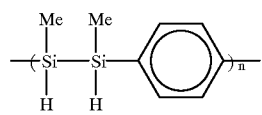 [PS-17]
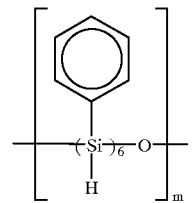 [PS-18]
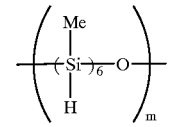 [PS-19]
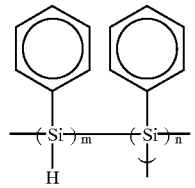 [PS-20]
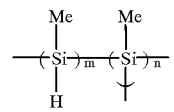 [PS-21]
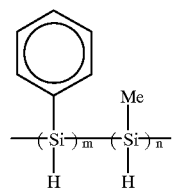 [PS-22]
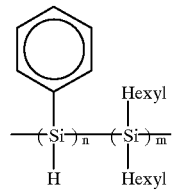 [PS-23]
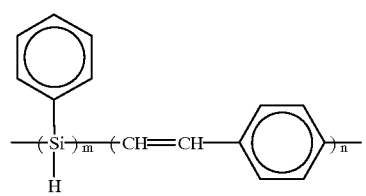 [PS-24]

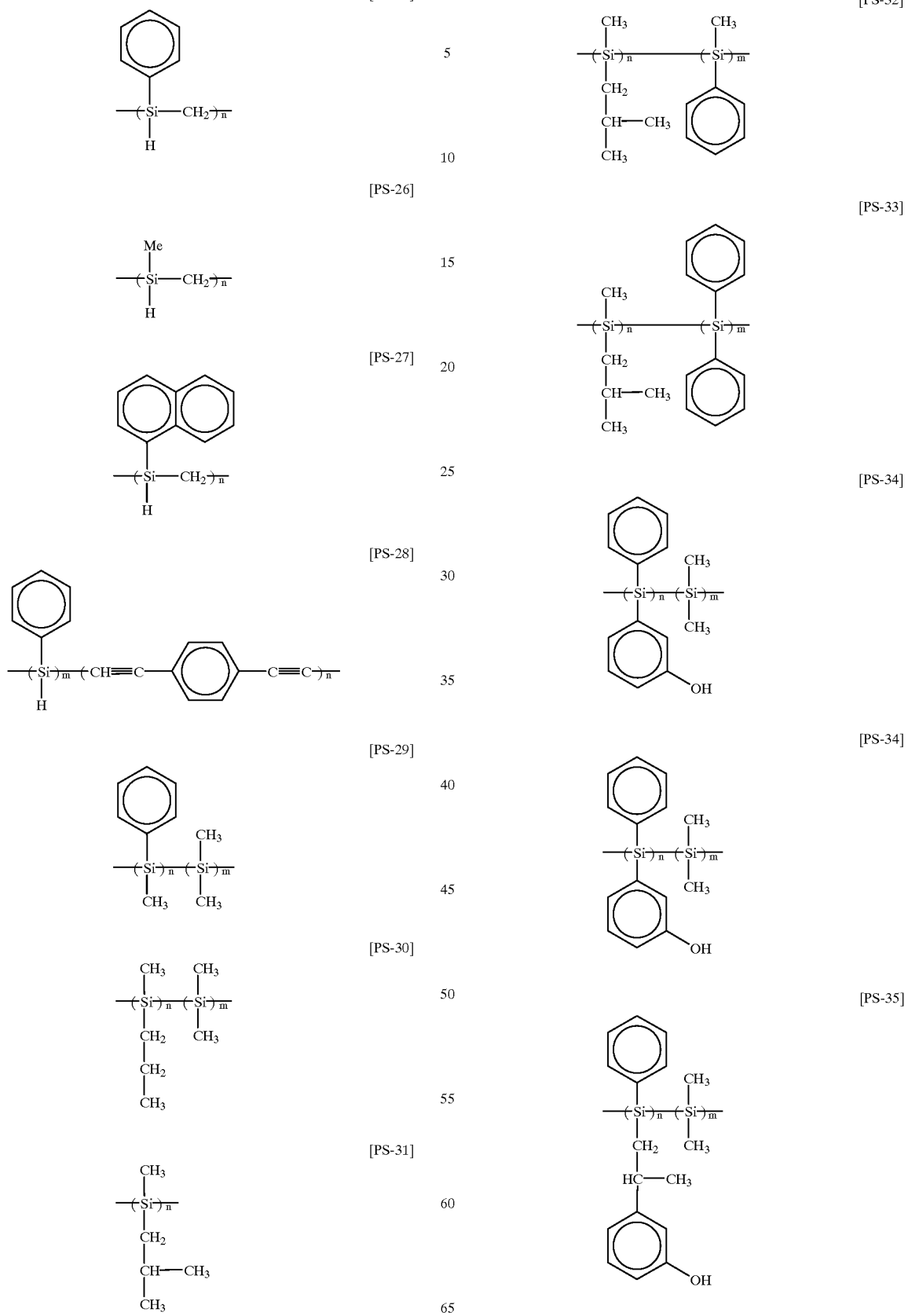

-continued
[PS-36]
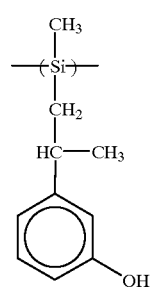
[PS-37]
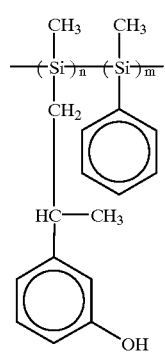
[PS-38]
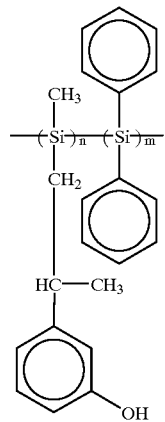
[PS-39]
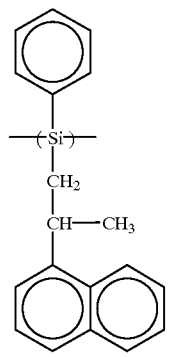
-continued
[PS-40]
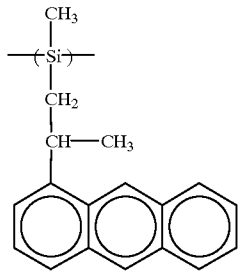
[PS-41]
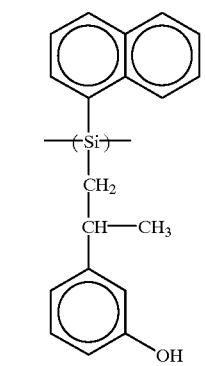
[PS-42]
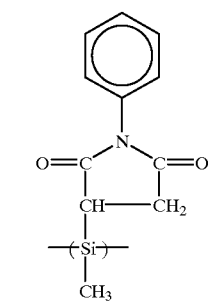
[PS-43]
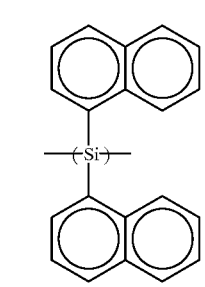
[PS-44]
[PS-45]
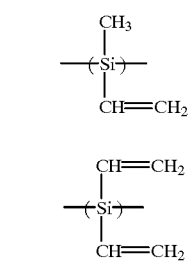

-continued
[PS-46]
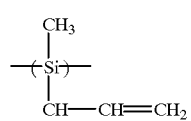
[PS-47]
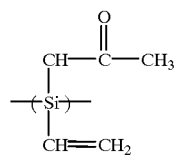
[PS-48]
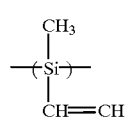
[PS-49]
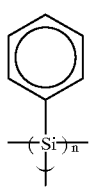
[PS-50]
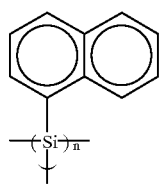
[PS-51]
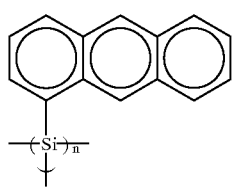
[PS-52]
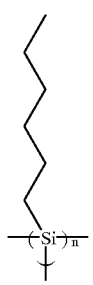
[PS-53]
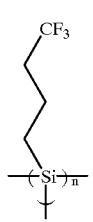
-continued
[PS-54]
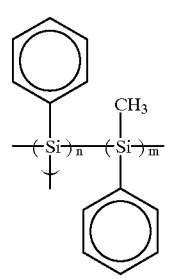
[PS-55]
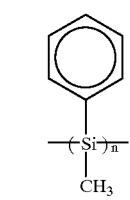
[PS-56]
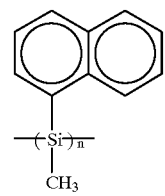
[PS-57]
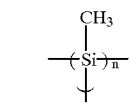
[PS-58]
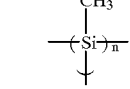
[PS-59]
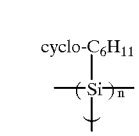
[PS-60]
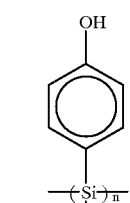
[PS-61]
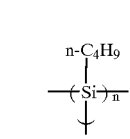
[PS-62]
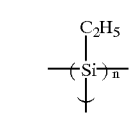

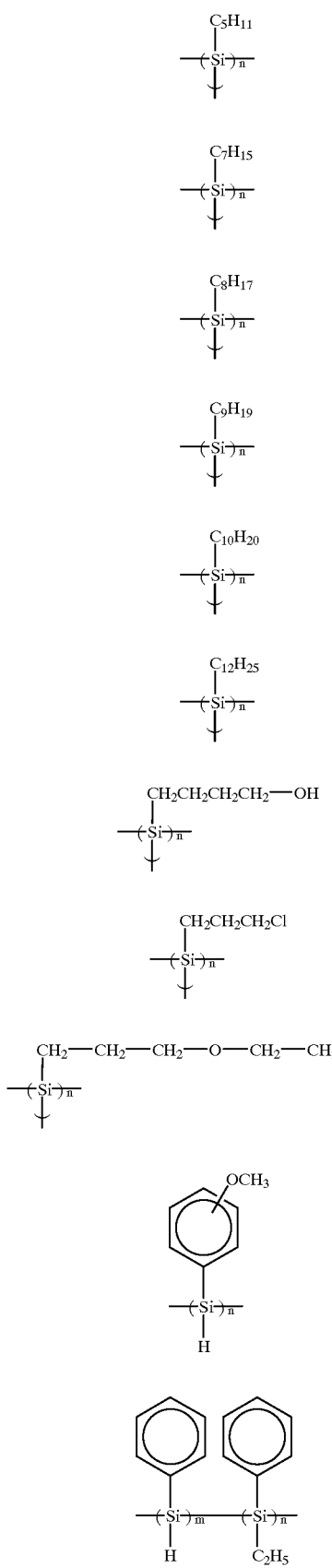
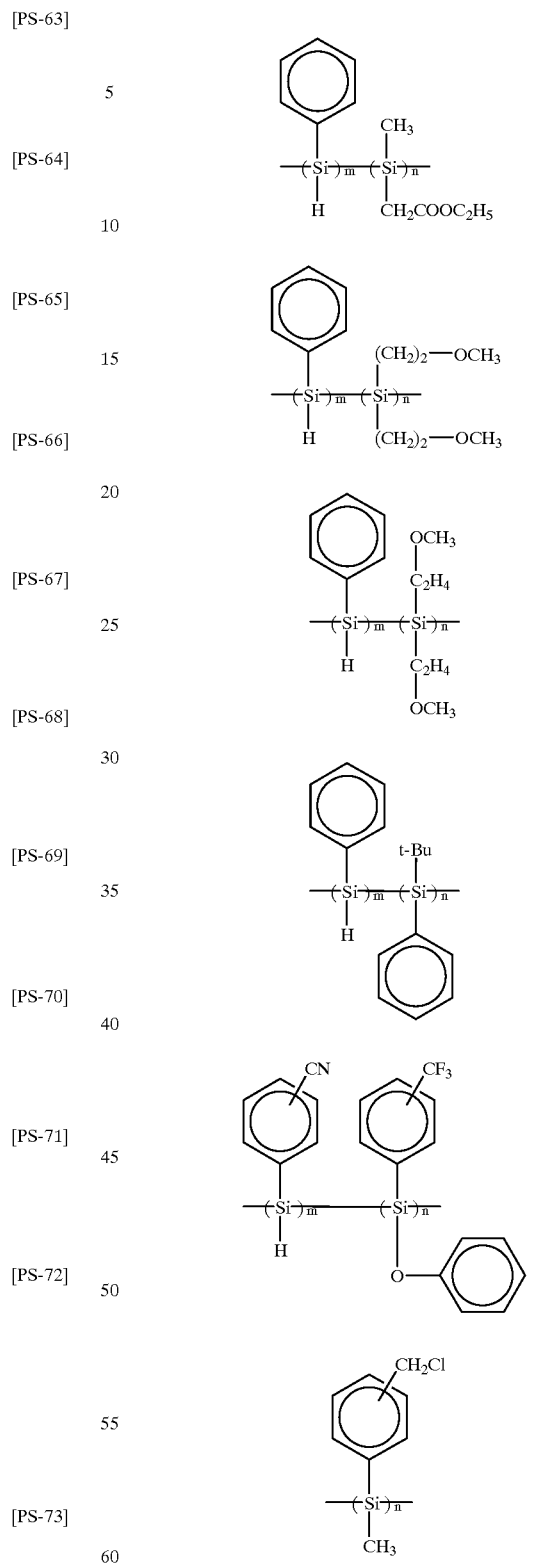
As for the conductive material, a material which is capable of bringing about an ionic conductivity, a material which is capable of bringing about an electronic conductivity, or a material which is capable of bringing about a photo-induced electron transfer with the organosilicon polymer can be employed. Among them, the material providing photoconductivity by means of photo-induced electron transfer is most preferable because of its stability. By the term, the precursor compound of conductive material, it is meant a material which can be decomposed under an influence of light or heat, whereby generating the conductive material.

Specific examples of a conductive material are organic sulfonic acid, organic carboxylic acid, polyhydric alcohol, polyhydric thiol, halogen (for example, iodine and bromine), $SbF_5$, $PF_5$, $BF_3$ and $SnF_5$. Specific examples of a precursor compound of conductive material are carbon cluster (for example, C60 and C70), cyanoanthracene, dicyanoanthracene, triphenylpyrylium, tetrafluoroborate, tetracyanoquinodimethane, tetracyanoethylene, phthalimidotriflate, perchloromethyltriazine, benzoylperoxide, and benzophenone tetracarboxyl acid t-butylperoxide, fluoroanthracene and difluoroanthracene. Since the carbon cluster is poor in solubility to solvent, the surface thereof may be modified with an organic group. Specific examples of these compounds are shown below.

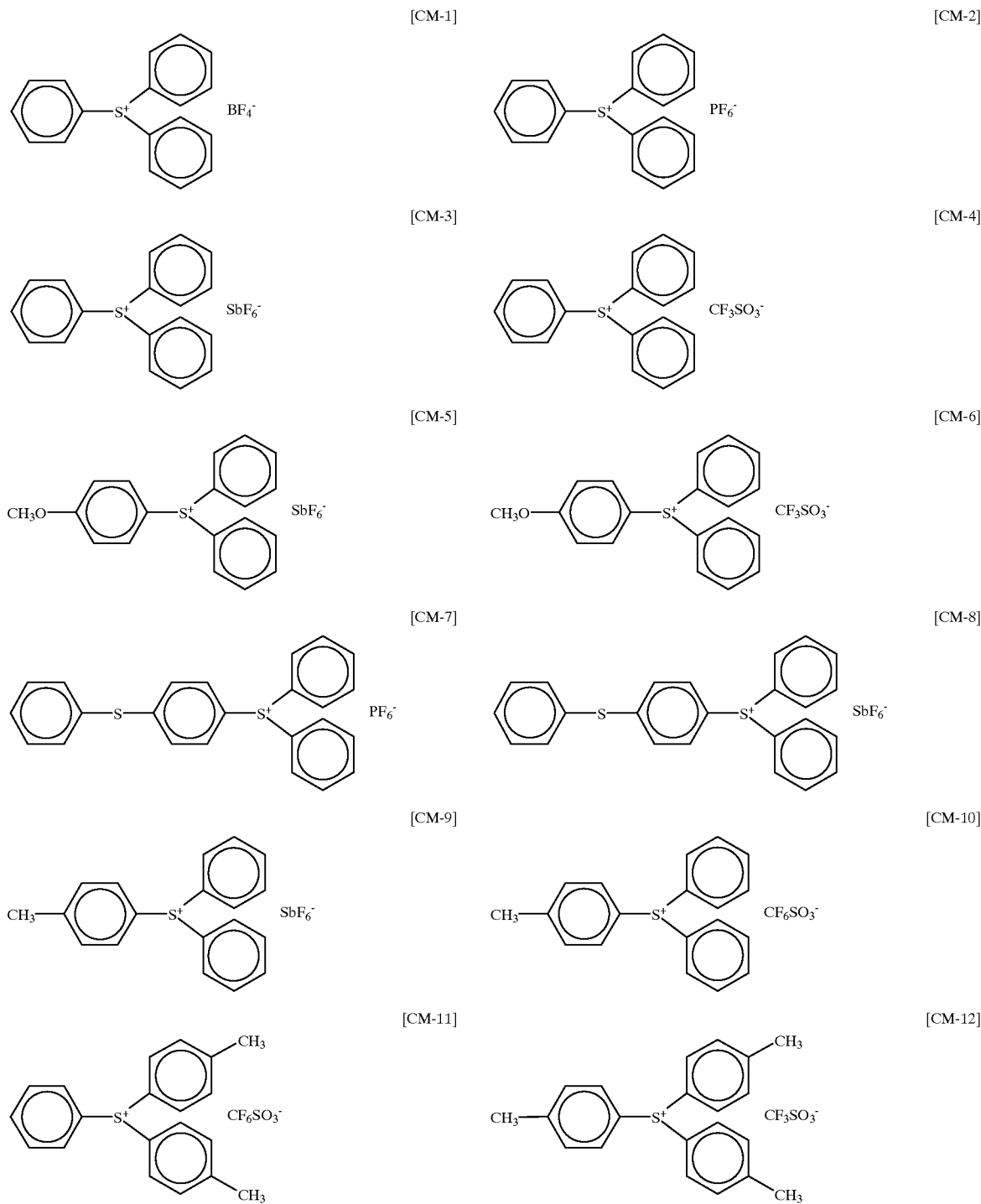

-continued
[CM-13]
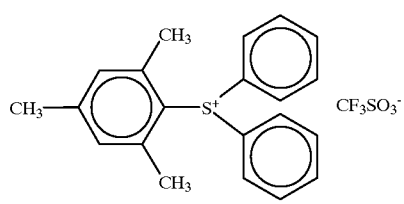
[CM-14]
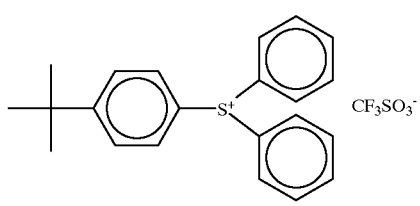
[CM-15]
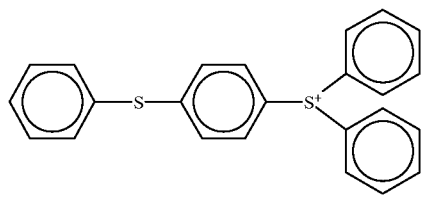
[CM-16]
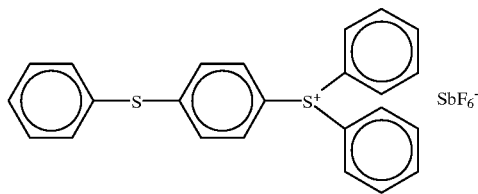
[CM-17]
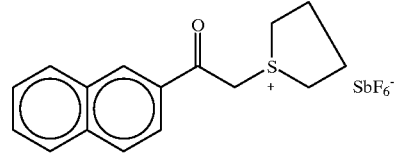
[CM-18]
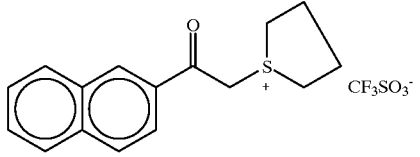
[CM-19]
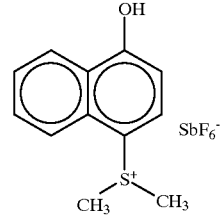
[CM-20]
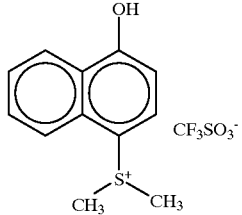
[CM-21]
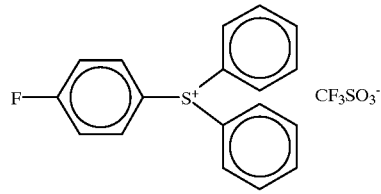
[CM-22]
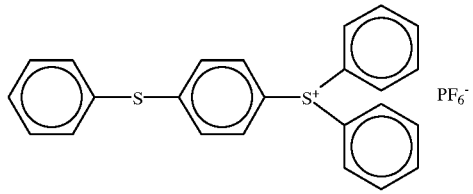
[CM-23]
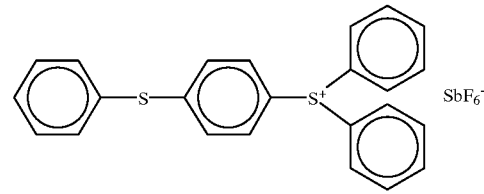
[CM-24]
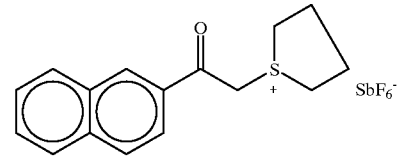
[CM-25]
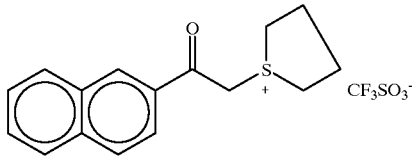

-continued
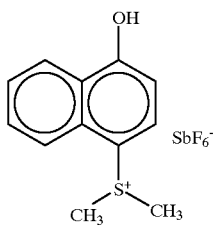  [CM-26]
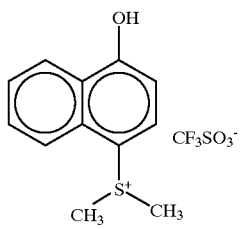  [CM-27]
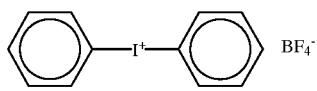  [CM-28]
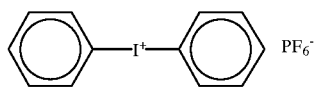  [CM-29]
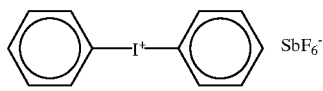  [CM-30]
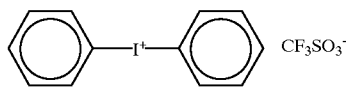  [CM-31]
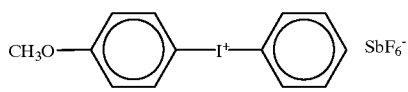  [CM-32]
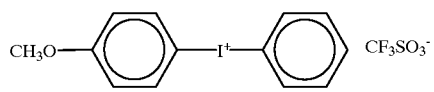  [CM-33]
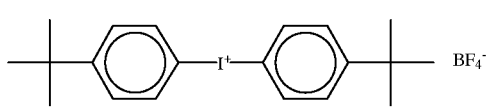  [CM-34]
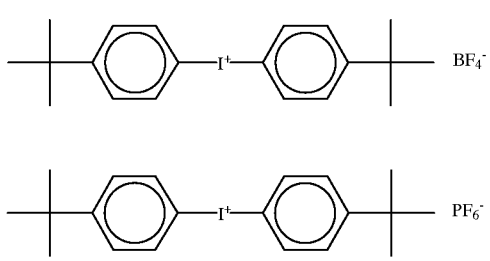  [CM-35]
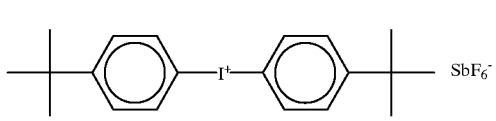  [CM-36]
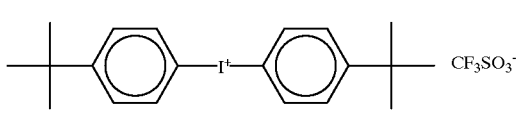  [CM-37]
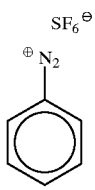  [CM-38]
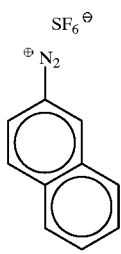  [CM-39]

-continued
[CM-40]
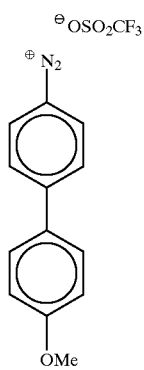
[CM-41]
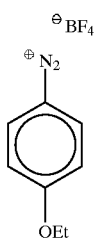
[CM-42]
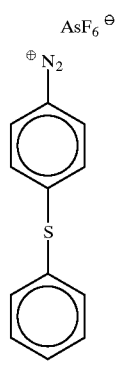
[CM-43]
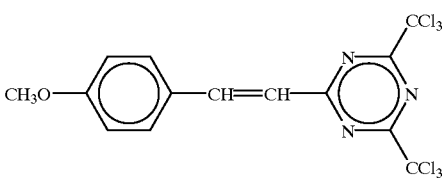
[CM-44]
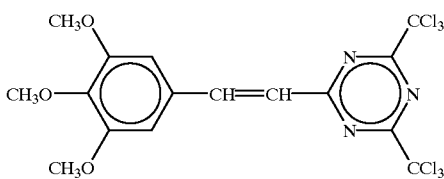
[CM-45]
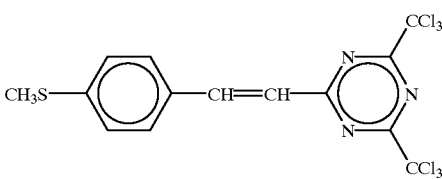
[CM-46]
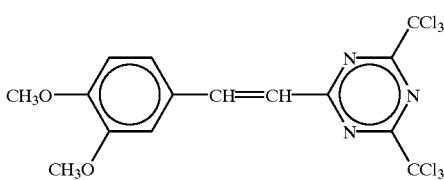
[CM-47]
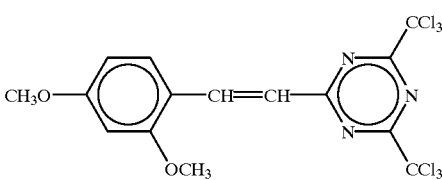
[CM-48]
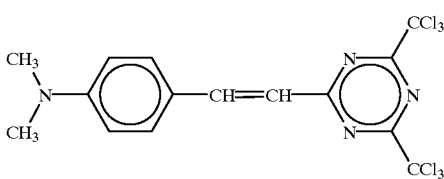
[CM-49]
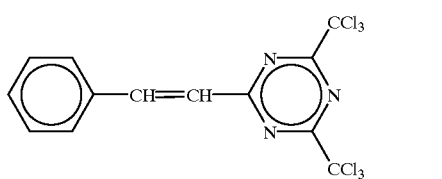
[CM-50]
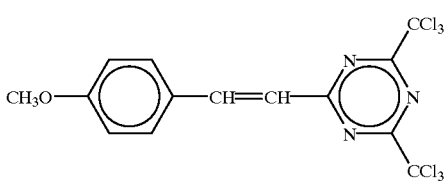
[CM-51]
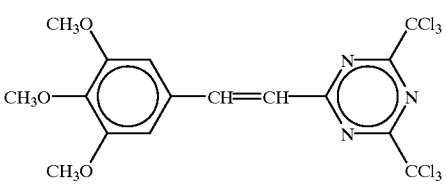

-continued
[CM-52]
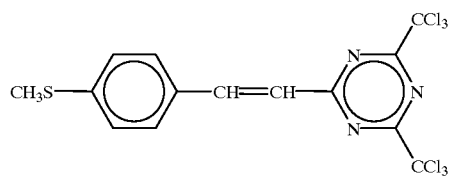
[CM-53]
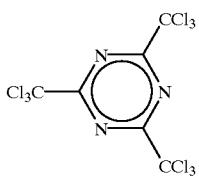
[CM-54]
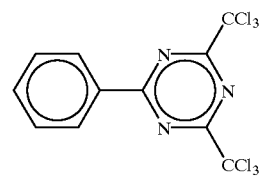
[CM-55]
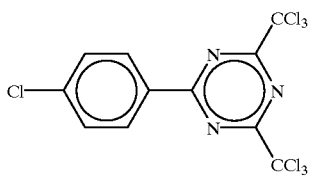
[CM-56]
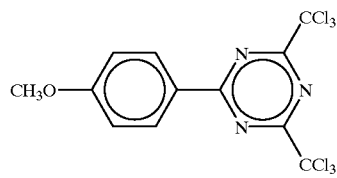
[CM-57]
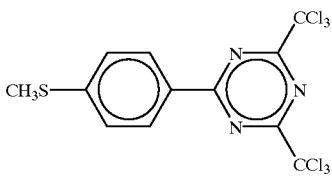
[CM-58]
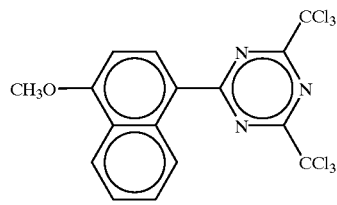
[CM-59]
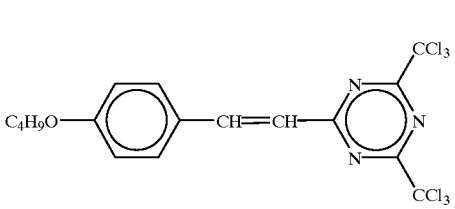
[CM-60]
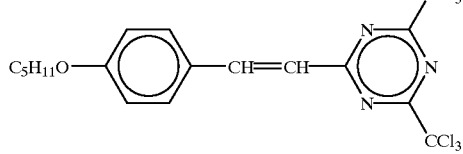
[CM-61]
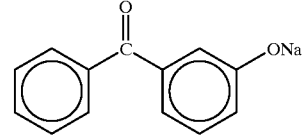
[CM-62]
[CM-63]
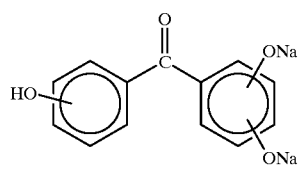
[CM-64]
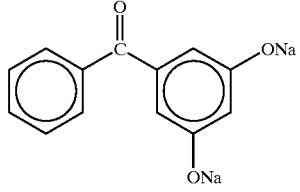
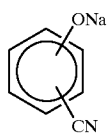

-continued
[CM-65]
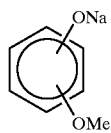
[CM-66]
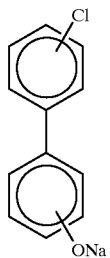
[CM-67]
C₂H₅ONa
[CM-68]
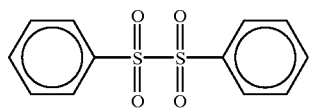
[CM-69]
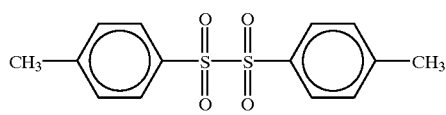
[CM-70]
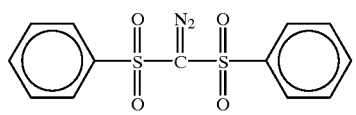
[CM-71]
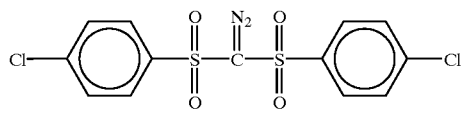
[CM-72]
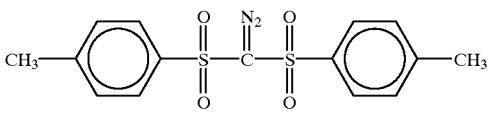
[CM-73]
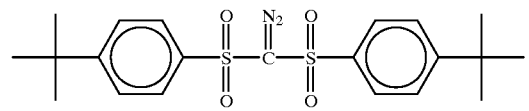
[CM-74]
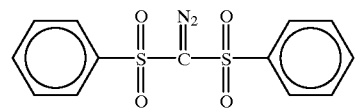
[CM-75]
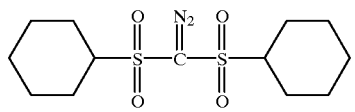
[CM-76]
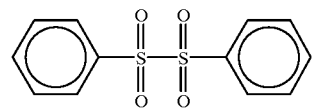
[CM-77]
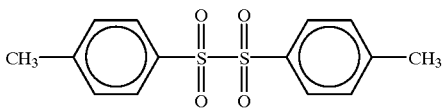
[CM-78]
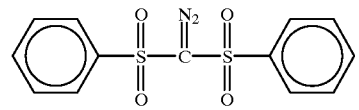
[CM-79]
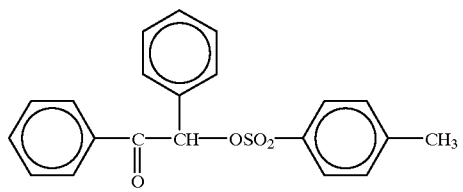
[CM-80]
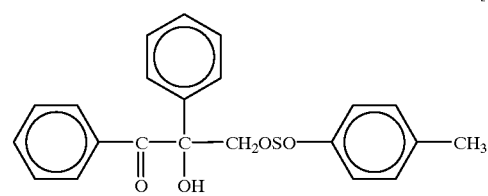
[CM-81]
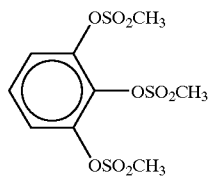

-continued
[CM-82]
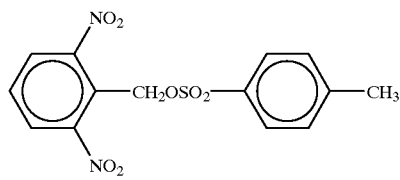
[CM-83]
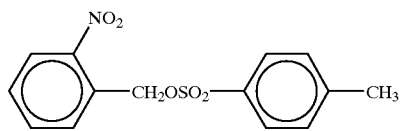
[CM-84]
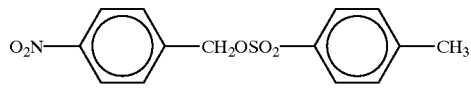
[CM-85]
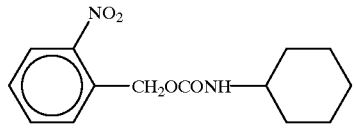
[CM-86]
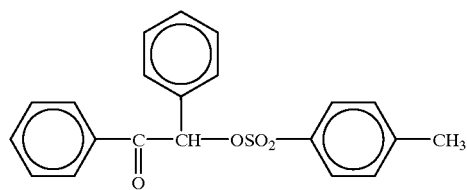
[CM-87]
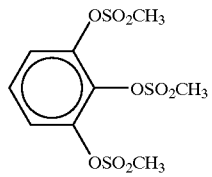
[CM-88]
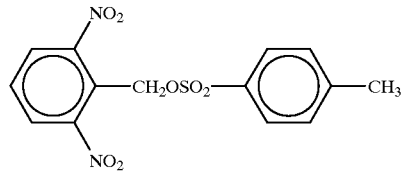
[CM-89]
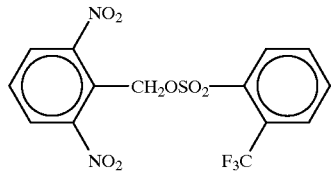
[CM-90]
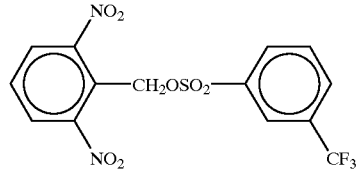
[CM-91]
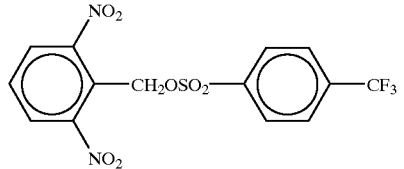
[CM-92]
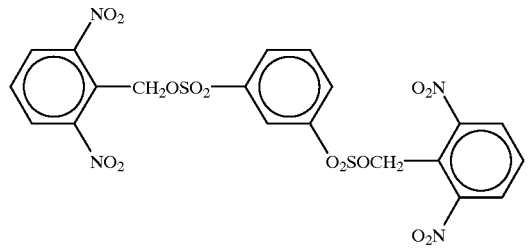
[CM-93]
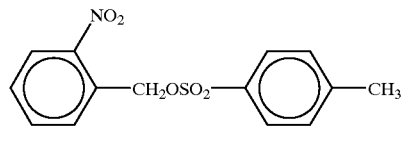
[CM-94]
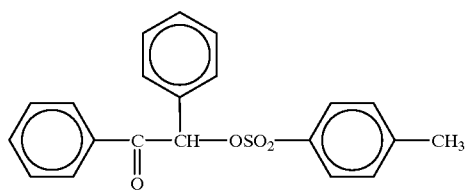

-continued
[CM-95]
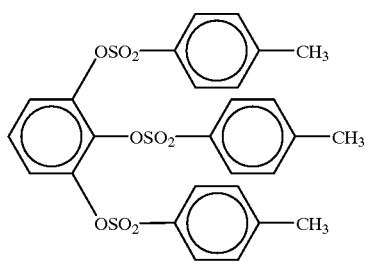
[CM-96]
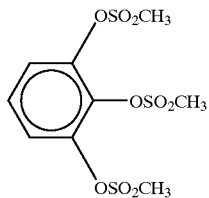
[CM-97]
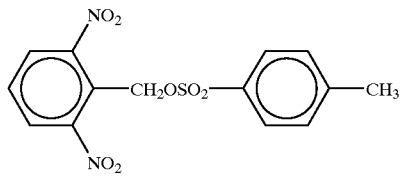
[CM-98]
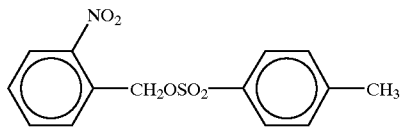
[CM-99]
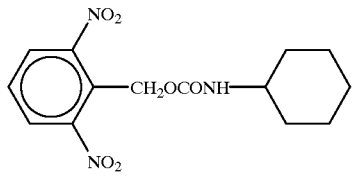
[CM-100]
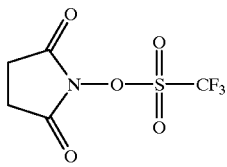
[CM-101]
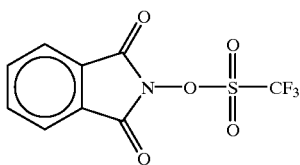
[CM-102]
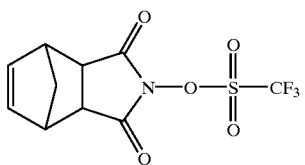
[CM-103]
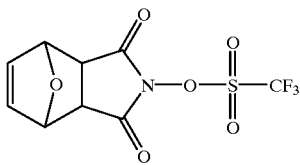
[CM-104]
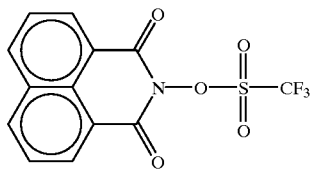
[CM-105]
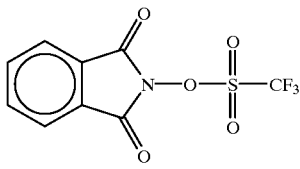
[CM-106]
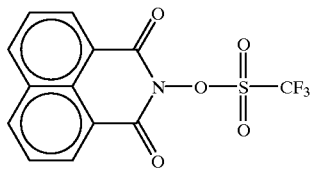
[CM-107]
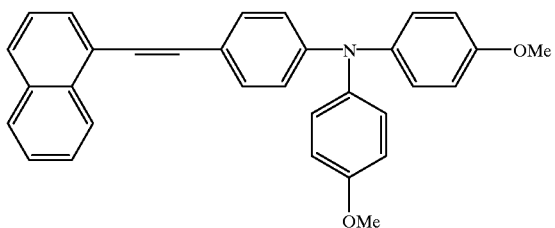

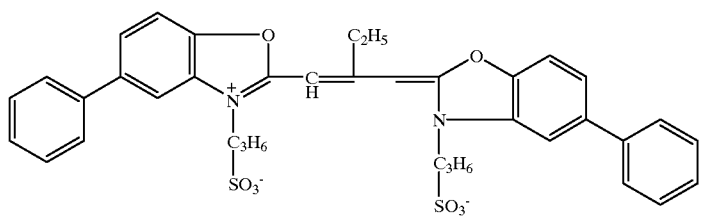
[CM-108]
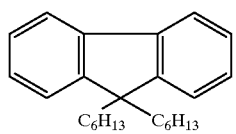
[CM-109]
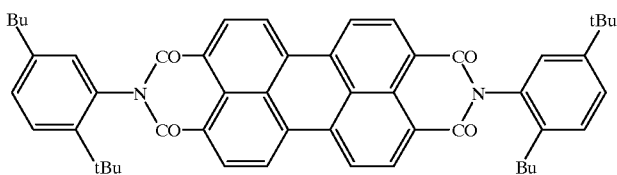
[CM-110]
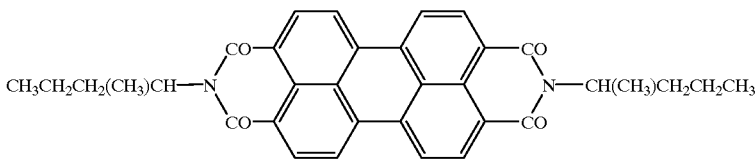
[CM-110]
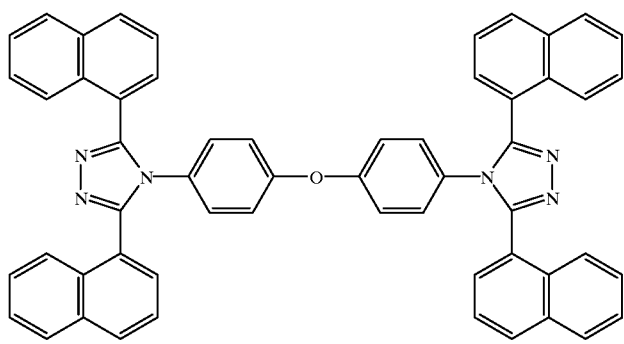
[CM-111]
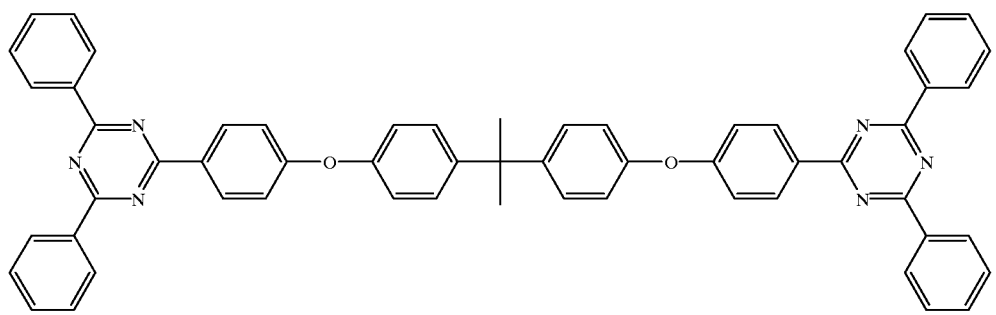
[CM-112]

-continued
[CM-113]
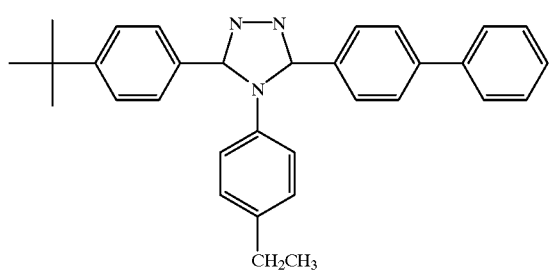
[CM-114]
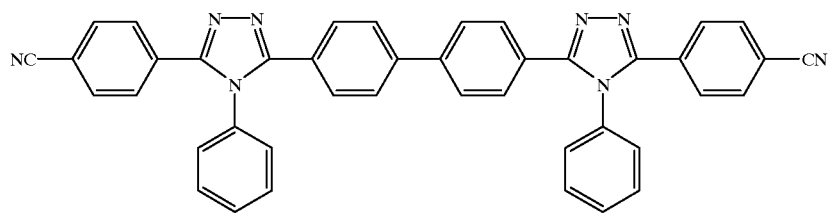
[CM-115]
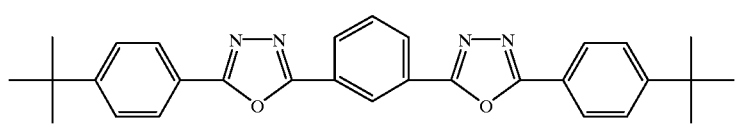
[CM-116]
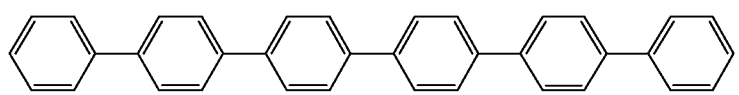
[CM-117]
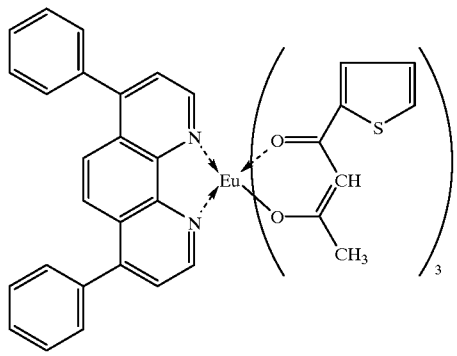
[CM-118]
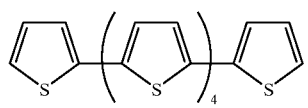
[CM-119]
Geq₃
q: 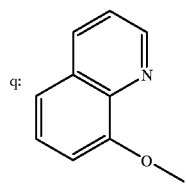

-continued
[CM-120]
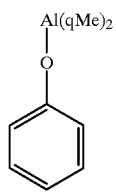
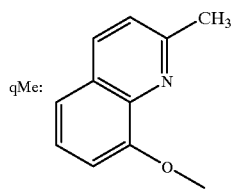
qMe:
[CM-121]
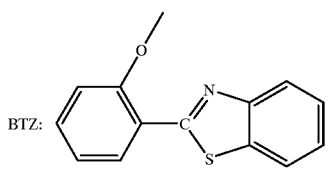
[CM-122]
Zn(OXZ)₂
OXZ:
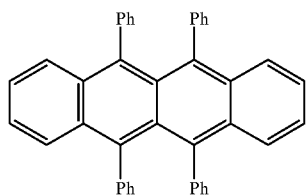
[CM-123]
Zn(BTZ)₂
BTZ:
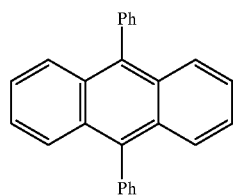
[CM-124]
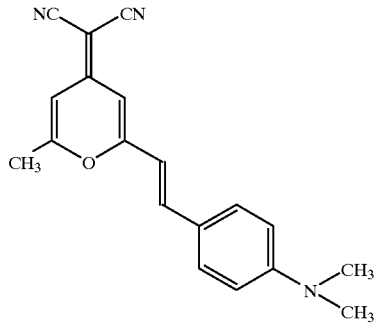
[CM-125]
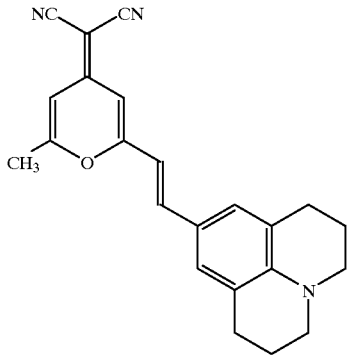
[CM-126]
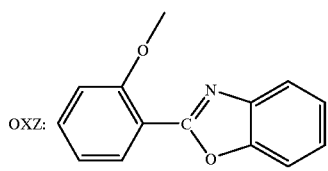
[CM-127]
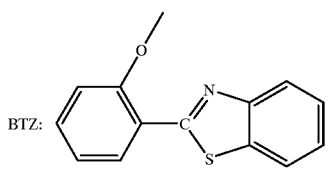

[CM-128]
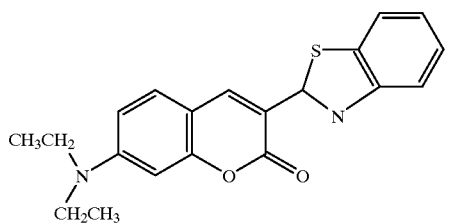
[CM-129]
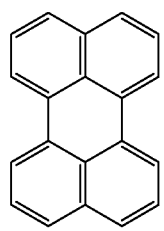

-continued
[CM-130]
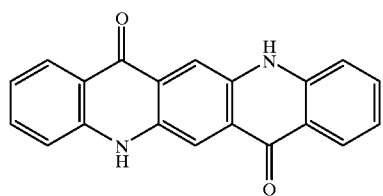
[CM-131]
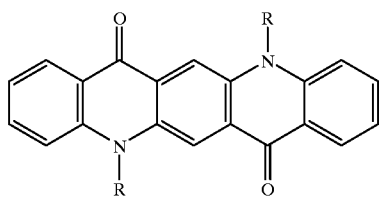
[CM-132]
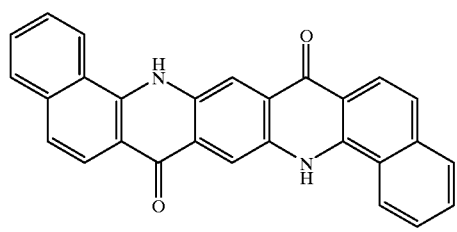
[CM-133]
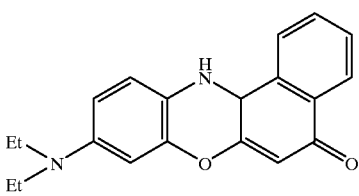
[CM-134]
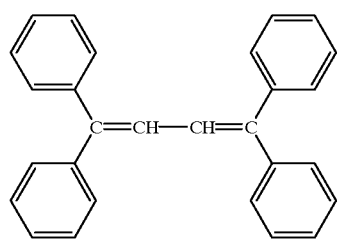
[CM-135]
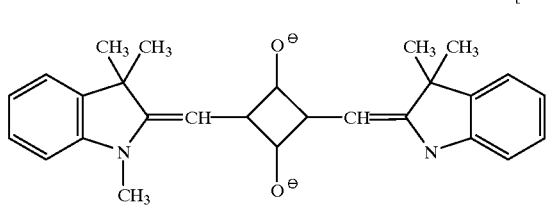
[CM-136]
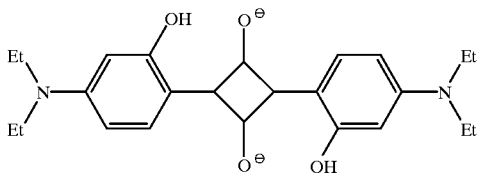
[CM-137]
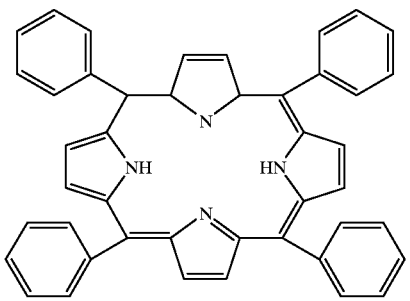
[CM-138]
$Al_{(q)}{}^3$
[CM-139]
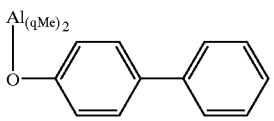
[CM-140]
$Be(q)_2$
[CM-141]
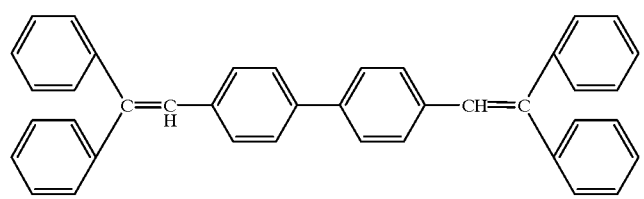

-continued
[CM-142]
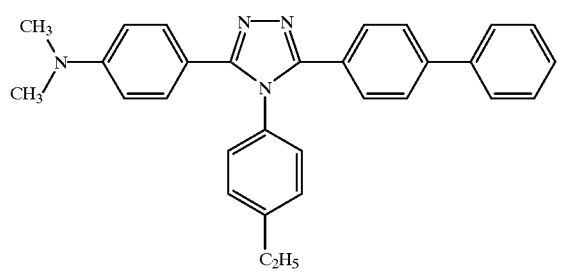
[CM-143]
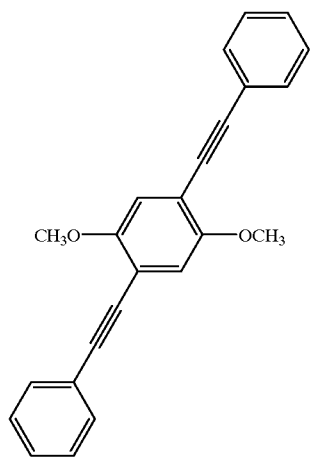
[CM-144]
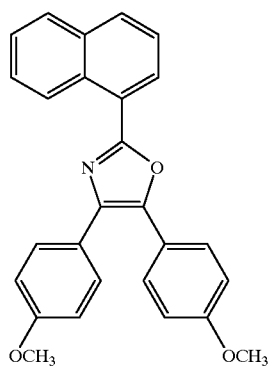
[CM-145]
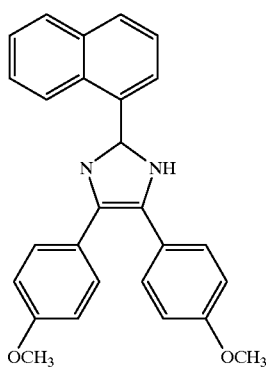
[CM-146]
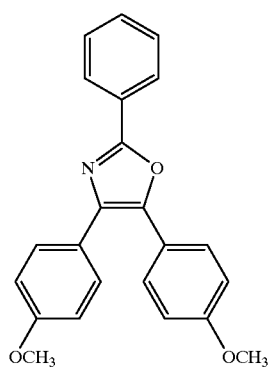
[CM-147]
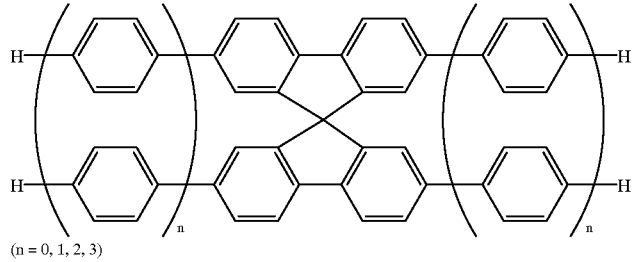
(n = 0, 1, 2, 3)

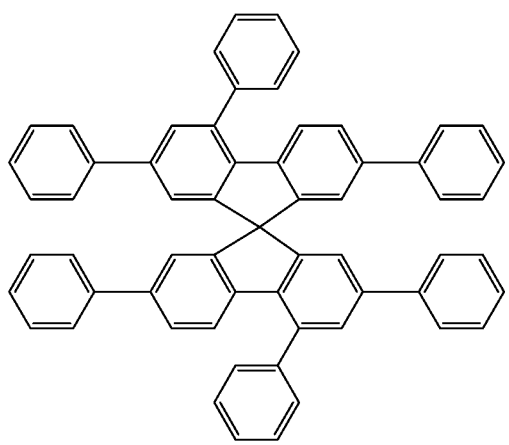
[CM-148]
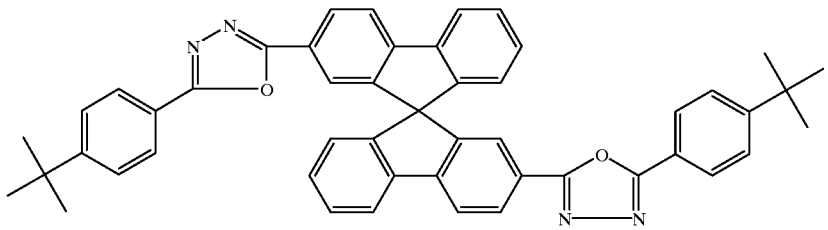
[CM-149]
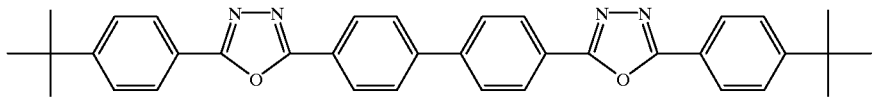
[CM-150]
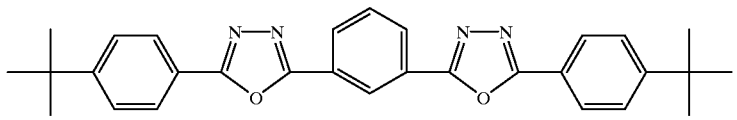
[CM-151]
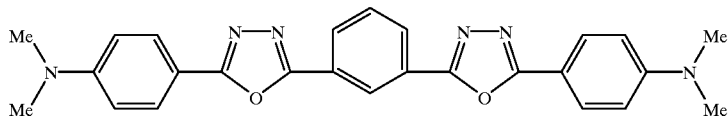
[CM-152]
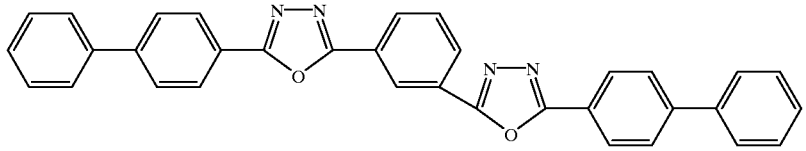
[CM-153]
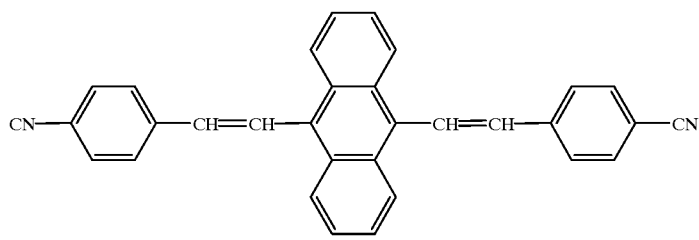
[CM-154]

[CM-155]
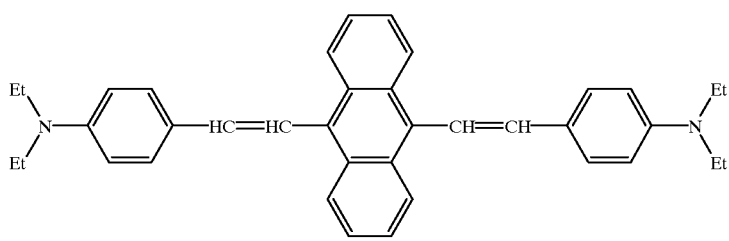
[CM-156]
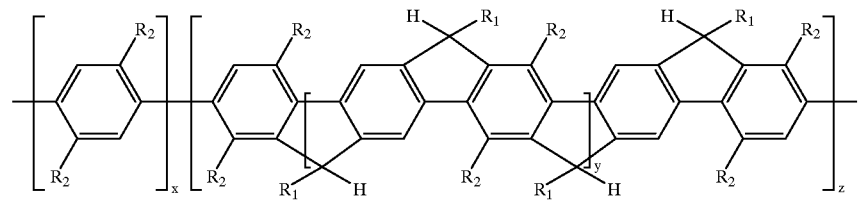
[CM-157]
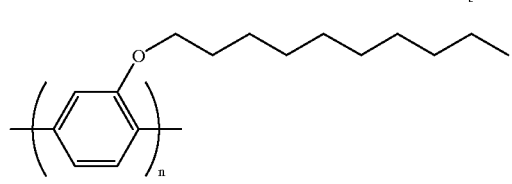
[CM-158]
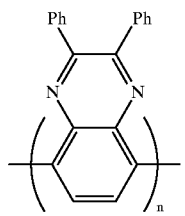
[CM-159]
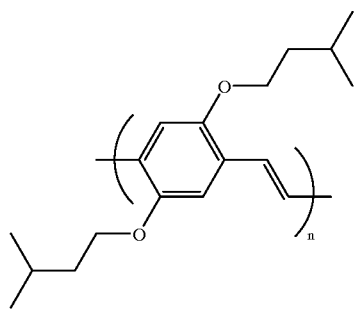
[CM-160]
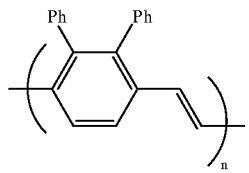
[CM-161]
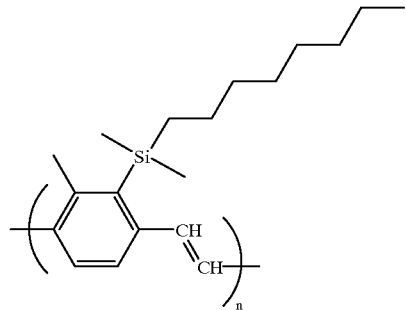
[CM-162]
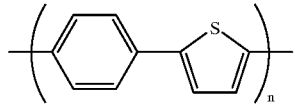

-continued
[CM-163]
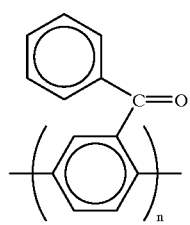
[CM-164]
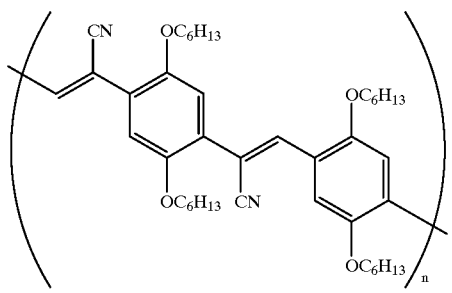
[CM-165]
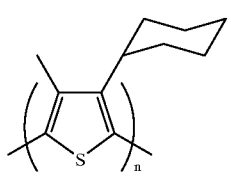
[CM-166]
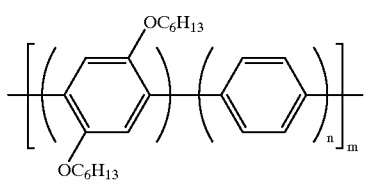
[CM-167]
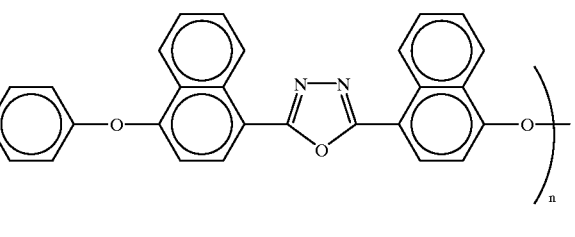
[CM-168]
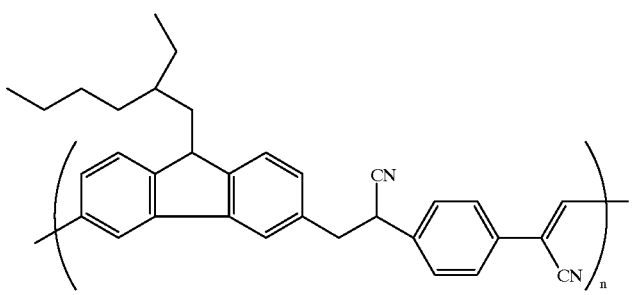
[CM-169]
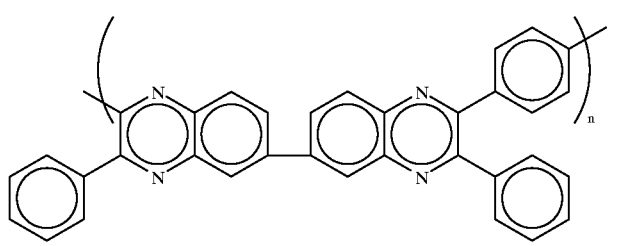
[CM-170]
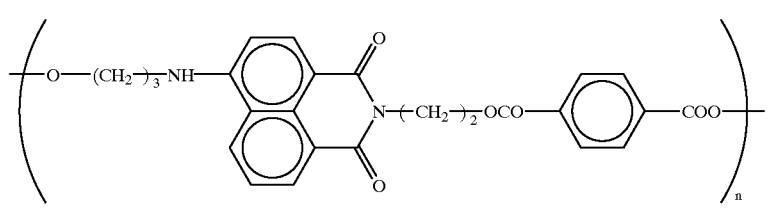

-continued

[CM-171]

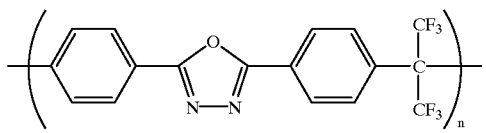

The steps of processing a silicon-based insulating film by making use of an organosilicon polymer of this invention as an etching mask will be explained below with reference to FIGS. 3A to 3D. By the way, an insulating film such as $TaO_2$ and $RuO_2$; or a conductive film such as AlSi, AlSiCu, Ti silicide, Co silicide and Cu may be processed in the same steps as discussed below.

Figure 3A:
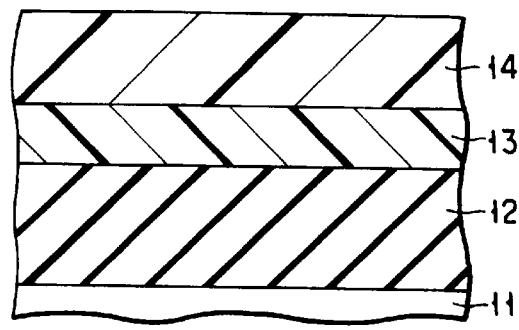
FIGS. 3A to 3D are sectional views illustrating the steps of processing a silicon oxide film by making use of an organosilicon polymer of this invention as an etching mask.

As shown in FIG. 3A, a silicon-based insulating film 12, an organosilicon polymer film 13 and a resist film 14 are successively formed on a silicon substrate 11. The thickness of the insulating film 12 should preferably be 10 μm or less, more preferably 0.5 to 1 μm. If the thickness of the insulating film 12 exceeds 10 μm, the aspect ratio of the resultant pattern becomes too high, so that a micro-loading effect such as an etching stop may become prominent.

The thickness of the organosilicon polymer film 13 should preferably be in the range of 20 to 500 nm. More specifically, the thickness of the organosilicon polymer film 13 should be determined so as to meet the following two conditions.

(1) The reflectance at the interface between the resist and the polysilane film is calculated by taking the multiple reflection of exposure light into consideration. Then, the thickness of the organo-silicon polymer film 13 is selected in such a way as to minimize the reflectance. The dependency of the reflectance at the interface between the resist and the polysilane film on the thickness of the polysilane film is calculated by making use of the complex index of refraction of the resist film, the polysilane film and the insulating film. Specific calculating method is described in the publications such as P. H. Berning, Physics of Thin Film, Vol. 1, pp. 69–121 (1963); A. E. Bell & F. W. Spong, IEEE Journal of Quantum Electronics, Vol. QE-14, pp. 487–495 (1978); and K. Ohta & H. Ishida, Applied Optics, Vol. 29, pp. 1952–1958 (1990).

(2) The thickness of the organosilicon polymer film 13 is required to be such a degree that it can be etched by making use of a resist pattern as a mask, and to be sufficiently thick enough to etch an insulating film by making use of the etched organosilicon polymer film as a mask.

The organosilicon polymer film can be formed by using a solution of an organosilicon polymer in an organic solvent for forming a coated layer, and by allowing the solvent to evaporate from a coated layer of the organosilicon polymer. Organic solvents useful in this case may be a polar solvent or nonpolar solvent. Examples of the polar solvent are an ether solvent (for example, diethyl ether, dibutyl ether, tetrahydrofuran and anisole); a cellosolve type solvent (for example, methyl cellosolve acetate, and ethyl cellosolve acetate); and an ester solvent (for example, ethyl acetate, butyl acetate and isoamyl acetate). Examples of the nonpolar solvent are toluene, xylene, hexane, octane, cumene, and solvent naphtha. Meanwhile, as a solvent for polysilane dendrimer, halogen-based solvents (methylene chloride, chlorobenzene, chloroform, etc.) may be employed.

The organosilicon polymer according to this invention is excellent in solubility to these solvents so that it can be formed into a film by means of a coating method such as a spin coating method. The weight average molecular weight (Mw) of the organosilicon polymer should preferably be in the range of 500 to 1,000,000, more preferably 2,000 to 100,000. If Mw is less than 500, the resultant organosilicon polymer film that can be formed by coating the solution thereof would be poor in mechanical strength. On the other hand, if Mw exceeds 1,000,000, the resultant organosilicon polymer film would become hardly soluble to a solvent. The organosilicon polymer may be employed singly or in combination of two or more kinds.

The organosilicon polymer film may contain, if desired, an adhesion improver for improving the adhesivity of the organosilicon polymer film to an underlying layer; an ultraviolet-absorbing dye or polymer (for example, polysulfone and polybenzimidazole) for preventing a resist film from being irradiated by the light reflected from an insulating film; or a surfactant for improving the wettability of the organosilicon polymer film to an underlying layer. In this case, the content of these additives should be adjusted in such a way that the content of silicon in the organosilicon polymer film containing any of these additives is in the range of 1 to 50% by weight after baking. If the content of silicon is less than 1% by weight, not only it would become impossible for the organosilicon polymer film to sufficiently absorb the exposure light, but also it would become impossible to assure a sufficient difference in etching rate between a resist pattern and the organosilicon polymer film when the organosilicon polymer film is etched using the resist pattern as a mask. On the other hand, if the content of silicon exceeds 50% by weight, a pin-hole is prone to generate in the coated film.

The resist film can be formed by coating a resist solution on the organosilicon polymer film and then by baking the coated layer. The thinner the thickness of the resist film is, the more it becomes possible to improve the exposure dose margin, the focus margin or the resolution in the exposure step. Therefore, the resist film should be formed as thin as possible as far as it is possible to perform the etching of the organosilicon polymer film in high dimensional controllability. Namely, the thickness of the resist film should preferably be 500 nm or less. As for the material for the resist, there is not any particular restriction as long as the resist can be patterned as it is exposed to ultraviolet rays or electron beam. Further, the type of the resist, i.e., positive type or negative type, can be suitably selected depending on the purpose. As for the positive resist, a resist comprising naphthoquinone diazide and novolak resin (IX-770, Nippon Synthetic Rubber Co., Ltd.), and a chemically amplified resist comprising polyvinylphenol resin protected by t-BOC group and an onium salt (APEX-E, Shipray Co., Ltd.) may be employed. As for the negative resist, a chemically amplified resist comprising polyvinylphenol, melamine resin and a photo-acid generator (XP-89131, Shipray Co., Ltd.), and a resist comprising polyvinylphenol and bisazide compound (RD-200D, Hitachi Chemicals Co., Ltd.) may be employed. For the purpose of preventing the dimensional controllability of the resist pattern from being deteriorated due to the standing wave to be generated in the resist film, a dye which is capable of absorbing ultraviolet rays such as coumarin and curcumin may be added to the resist so as to decrease the transparency of the resist.

Further, in order to effectively prevent reflection of exposure light from an underlying layer to the resist film, whereby to make the profile of the resist after development excellent in shape, a thin film having a thickness of about 10 to 150 nm may be interposed between the organosilicon polymer film and the resist film. In this case, the following materials and methods may be employed for forming this thin film. Namely, a silicon nitride film, a silicon oxide film, a silicon oxynitride film, a silicon carbide film or a carbon film may be employed for the thin film. A sputtering method or a CVD method may be employed for forming the thin film. Alternatively, a solution of polymer such as polysulfone, polyamide, novolak resin or polyhydroxystyrene in an organic solvent such as ethyl lactate or cyclohexanone may be spin-coated to form the thin film. In the latter case, a dye such as coumarin or curcumin may be added to the solution.

The inhibition of the standing wave in the resist film may be effected by forming an upper anti-reflection film on the resist film, whereby minimizing the reflection at the interface between the resist film and the air. For example, Aquatar (trademark, Hoechst Co., Ltd.) may be employed as an upper anti-reflective coating.

Figure 3B:
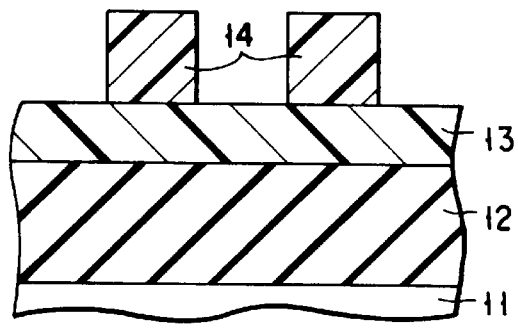

Then, as shown in FIG. 3B, ultraviolet rays are irradiated as an exposure light onto the resist film through a mask having a predetermined pattern, and the resist film is subjected to development thereby to obtain a resist pattern. As for the light source for irradiating ultraviolet rays, mercury lamp, or excimer laser such as XeF (wavelength=351 nm), XeCl (wavelength=308 nm), KrF (wavelength=248 nm), KrCl (wavelength=222 nm), ArF (wavelength=193 nm) and $F_2$ (wavelength=151 nm) may be employed. Since the organosilicon polymer according to this invention contains Si—Si bond and exhibits a high absorbence to ultraviolet rays having a wavelength ranging from 150 to 360 nm, the exposure light can be absorbed by the organosilicon polymer, thereby inhibiting the reflected light from entering into the resist film. As a result, it is possible to prevent the profile of the resist film, after the development thereof, from being corrugated in shape that might be resulted due to a standing wave. Furthermore, even if the thickness of the resist or of the insulating film is fluctuated, any fluctuation in dimension of the resist pattern can be inhibited.

As for the developing solution for the resist, an aqueous organic alkaline solution such as tetramethylammonium hydroxide; an aqueous inorganic alkaline solution such as sodium hydroxide and potassium hydroxide; and an organic solvent such as xylene and acetone can be employed.

Figure 3C:
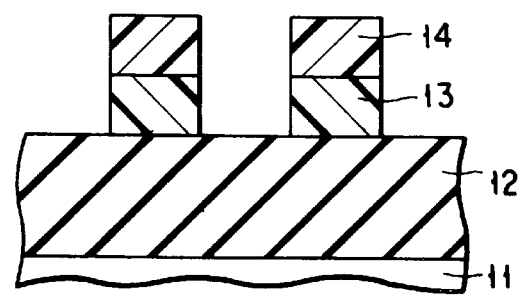

Then, as shown in FIG. 3C, etching of the organosilicon polymer film (etching mask) is carried out using the resist pattern as a mask. The etching methods useful in this case are a reactive plasma etching, a magnetron reactive plasma etching, an electron beam plasma etching, a TCP plasma etching, an ICP plasma etching and an ECR plasma etching. The source gas that can be employed in this case may be selected from $CF_4$, $CF_3Cl$, $CF_2Cl_2$, $CF_3Br$, $CCl_4$, $C_2F_5Cl_2$, $CF_4+H_2$, ($CF_4$, $C_2F_6$, $CHF_3$, $SiF_4$, $CF_3Br$)+($Cl_2$, $Br_2$), $Cl_2$ (+$H_2$), $SiCl_4$, $Br_2$, $I_2$, $Cl_2+Ar$, $SF_4(+N_2)$, HBr, HI, HCl, and $Cl_2$+He. If these source gases are employed, it is possible to enhance the difference in etching rate between the resist pattern and the organosilicon polymer film, thereby making it possible to perform the etching of the organosilicon polymer film with high dimensional controllability. The reason for this can be attributed to the fact that these etchants are hardly reactive to the atoms constituting the resist, thus hardly generating any volatile matters, whereas these etchants are highly reactive to silicon contained in the organosilicon polymer film, whereby generating volatile matters having a high vapor pressure. Particularly, if a source gas containing $Cl_2$ or HBr is employed, the organosilicon polymer film can be etched at a high etching rate in relative to the resist film. As a result, it is possible, even if the thickness of the resist film is relatively thin, to prevent the resist film from being etched away, or to avoid a deterioration in dimension controllability of the organosilicon polymer film pattern.

Figure 3D:
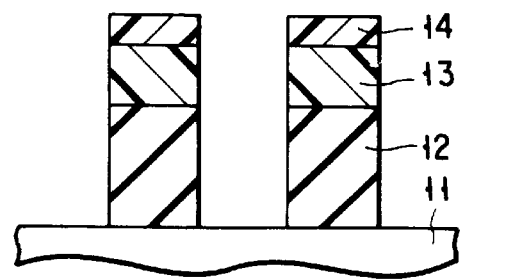

Finally, as shown in FIG. 3D, the insulating film is etched with the resist pattern and the organosilicon polymer film pattern being employed as a mask. The etching methods useful in this case are a reactive plasma etching, a magnetron reactive plasma etching, an electron beam plasma etching, a TCP plasma etching, an ICP plasma etching and an ECR plasma etching. The source gas preferably employed in this case can be selected from fluorine-containing gases such as $CHF_3$, $C_2F_6$, $CF_4+(H_2, C_2F_2)$, $C_4F_8$, $CHF_3+CO$, and $C_4F_8+CO$. If these source gases are employed, it is possible to enhance the etching rate of the silicon-based insulating film in relative to the mask materials. If the deposition of a polymer film on the resist pattern or of the organosilicon polymer film pattern is so prominent that the etched shape is badly affected by the deposition of the polymer film, it may be preferable to add argon or oxygen to the source gas so as to eliminate the deposited polymer film.

Figure 4A:
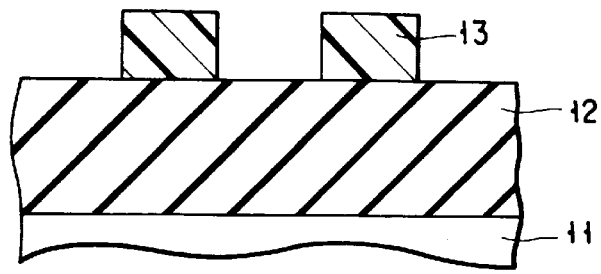
FIGS. 4A and 4B are sectional views illustrating the steps of processing a silicon oxide film by making use of an organosilicon polymer of this invention as an etching mask.
Figure 4B:
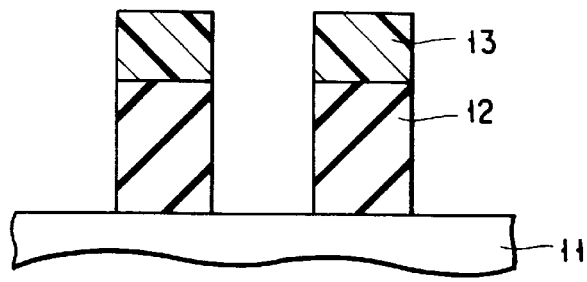

As shown in FIGS. 4A and 4B, the resist pattern remaining on the organosilicon polymer film pattern may be removed after the step of FIG. 3C, and then the insulating film is etched with only the organosilicon polymer film pattern being employed as a mask.

Since the organosilicon polymer according to this invention can be decomposed by a high energy beam such as electron beam and X-ray, the organosilicon polymer is expected to be employed as a resist material. In this case, depending on the combination of a specific kind of high energy beam and a specific kind of substituent group in the organosilicon polymer, the organosilicon polymer can be employed as a positive resist or as a negative resist. The reason is that, depending on the combination, a silane compound having a low molecular weight and exhibiting a high solubility to a developing solution may be generated through a decomposition of the organosilicon polymer as it is irradiated with a high energy beam thereby making it to function as a positive resist, or a new active species may be generated when the organosilicon polymer is irradiated with a high energy beam, and the organosilicon polymer is rendered to further proceed the crosslinking due to the reaction with this new active species, resulting in a decreased solubility thereof to a developing solution, thus making it to function as a negative resist.

The method for employing the organosilicon polymer of this invention as a resist will be explained below with reference to FIGS. 5A to 5C.

Figure 5A:
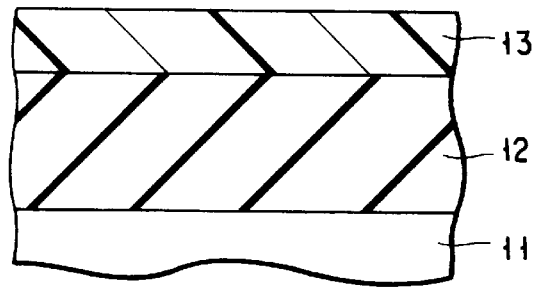
FIGS. 5A to 5C are sectional views illustrating the steps of processing a silicon oxide film by making use of an organosilicon polymer of this invention as a resist.

First of all, as shown in FIG. 5A, an insulating film 12 and an organosilicon polymer film 13 are successively formed on a silicon substrate 11. Each thickness of the insulating film 12 and the organosilicon polymer film 13 may be the same as explained with reference to FIG. 3A.

An anti-reflective film may be interposed between the insulating film 12 and the organosilicon polymer film 13 in order to inhibit the reflection of light from the insulating film 12 at the occasion of exposure to the organosilicon polymer film 13. There is not any particular restriction regarding the material and film-forming method of this anti-reflection film. For example, the following materials and methods can be employed.

(1) A silicon nitride film, a silicon oxide film, a silicon oxynitride film, a silicon carbide film or a carbon film may be formed by means of a sputtering method or a CVD method.

(2) A solution of polymer such as polysulfone, polyamide, novolak resin or polyhydroxystyrene in an organic solvent such as ethyl lactate or cyclohexanone may be prepared and then spin-coated to form a film. A dye such as coumarin or curcumin may be added to the solution.

The thickness of the anti-reflective film should preferably be 0.001 to 10 μm, more preferably 0.01 to 1 μm. If the thickness of the anti-reflection film is less than 0.001 μm, the exposure light cannot be sufficiently absorbed. On the other hand, if the thickness of the anti-reflective film exceeds 10 μm, a dimensional loss may become prominent after the anti-reflection film is etched.

Figure 5B:
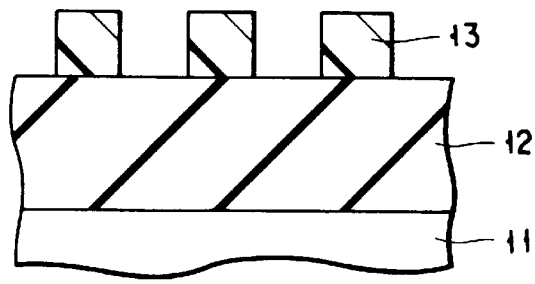

Then, as shown in FIG. 5B, the patterning of the organosilicon polymer film 13 is performed. Preferably, the patterning of the organosilicon polymer film 13 is performed by the following methods.

(1) Ultraviolet rays are irradiated onto the organosilicon polymer film 13 through a mask having a desired pattern thereby to oxidize the exposed portions, thus generating a siloxane bond. When the organosilicon polymer absorbs ultraviolet rays, the Si—Si bond thereof is clesved, thereby allowing silicon to combine with oxygen in the atmosphere to form a siloxane bond, thereby turning the polymer film into a silicon oxide-like film. Then, this exposure portion consisting of the silicon oxide-like film is selectively etched away by making use of a gas containing fluorine or a gas containing fluorocarbon, whereby forming an organosilicon polymer film pattern.

(2) Ultraviolet rays are irradiated onto the organosilicon polymer film 13 through a mask having a desired pattern thereby to generate a siloxane bond at the exposure portions. Then, unexposed portion is selectively etched away by making use of $Cl_2$ or HBr as a source gas, whereby forming an organosilicon polymer film pattern.

Figure 5C:
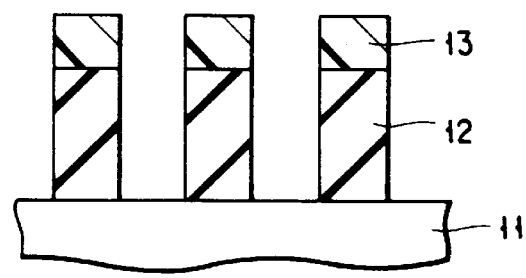

Finally, as shown in FIG. 5C, the insulating film 12 is etched with the organosilicon polymer film pattern being employed as a mask. The conditions for etching the insulating film 12 may be the same as explained with reference to FIG. 3D. When the aforementioned method (1) is employed in the step of FIG. 5B, the exposure portion of organosilicon polymer film 13 and a portion of the insulating film 12 which is disposed right below the exposure portion of organosilicon polymer film 13 can be concurrently etched away, so that the number of steps can be reduced.

EXAMPLES

Synthesis No. 1

0.3082 g of copper (I) chloride and 17.90 g (0.780 mol) of metallic sodium were added under argon gas atmosphere to a mixed solvent comprising 130 mL of dehydrated toluene and 20 mL of dehydrated diglyme in a four-necked flask equipped with a dropping funnel and a reflux condenser. Then, the resultant mixture was heated up to a reflux temperature of the solvent to prepare a sodium-dispersed solution. While keeping the reflux temperature of the solvent, a solution of 63.38 g (0.250 mol) of diphenyldichlorosilane and 15.18 g (0.0593 mol) of 1,2-bis (dichloromethylsilyl)ethane in 50 mL of dehydrated toluene was dripped from the dropping funnel into the sodium-dispersed solution about 20 minutes, and the resultant mixed solution was allowed to undergo a reaction for 3 hours. Then, a solution of 10.88 g (0.10 mol) of trimethylchlorosilane in 20 mL of dehydrated toluene was further added to the reaction mixture and allowed a reaction to take place for 30 minutes, and then the reaction mixture was cooled down to room temperature. 500 mL of toluene was further added to the reaction mixture, which was then filtered under pressure in a nitrogen atmosphere. Sediments formed were removed through filtration and the filtrate was concentrated. After 100 mL of toluene was added to the residual concentrate, 500 mL of ethanol was added to the residual concentrate thereby allowing a polymer to precipitate. The polymer thus precipitated was taken up and dissolved in toluene. The resultant solution was washed with an aqueous solution of sodium bicarbonate, and then with deionized water twice, and then dried over magnesium sulfuric anhydride. After the desiccating agent was removed, the solvents were allowed to evaporate under a reduced pressure. After 100 mL of toluene was added to the residual polymer to dissolve the polymer, the resultant solution was dripped into 500 mL of ethanol to allow the polymer to precipitate. The polymer thus precipitated was taken up through filtration, and vacuum dried at 80° C. to obtain a polysilane represented by the formula (LPS-1). The yield of the polysilane was 21.86 g (41.1%).

$^1$H-NMR (CDCl$_3$) δ–1.0–1.9 (br, aliphatic proton); 6.1–7.75 (br, aromatic proton); Integral ratio, aliphatic proton:aromatic proton=2.9:10

$^{13}$C-NMR (ppm) −5.25, −0.4, 1.0, 8.50, 10.20, 12.4, 127.5, 128.4, 134.4, 137.2

IR (KBr) 3075, 3040, 2980, 2930, 2860, 1605, 1495, 1470, 1430, 1265, 1095, 1070, 885, 780, 745, 730, 690

GPC (THF) Mw=4500

Synthesis No. 2

0.3056 g of copper (I) chloride and 17.92 g (0.781 mol) of metallic sodium were added under argon gas atmosphere to a mixed solvent comprising 130 mL of dehydrated toluene and 20 mL of dehydrated diglyme in a four-necked flask equipped with a dropping funnel and a reflux condenser. Then, the resultant mixture was heated up to a reflux temperature of the solvent to prepare a sodium-dispersed solution. While keeping the reflux temperature of the solvent, a solution of 63.41 g (0.250 mol) of diphenyldichlorosilane and 6.44 g (0.0251 mol) of 1,2-bis (dichloromethylsilyl)ethane in 50 mL of dehydrated toluene was dripped from the dropping funnel into the sodium-dispersed solution over about 15 minutes, and the resultant mixed solution was allowed to undergo a reaction for 3 hours. Then, a solution of 10.88 g (0.10 mol) of trimethylchlorosilane in 20 mL of dehydrated toluene was further added to the reaction mixture and allowed a reaction to take place for 30 minutes, and then the reaction mixture was cooled down to room temperature. 500 mL of toluene was further added to the reaction mixture, which was then filtered under pressure in a nitrogen atmosphere. Sediments formed were removed through filtration and the filtrate was concentrated. Then, 500 mL of ethanol was added to the residual concentrate thereby allowing a polymer to precipitate. The polymer thus precipitated was taken up and dissolved in toluene. The resultant solution was washed with an aqueous solution of sodium bicarbonate, and then with deionized water twice, and then dried over magnesium sulfuric anhydride. After the desiccating agent was removed, the solvents were allowed to evaporate under a reduced pressure. After 100 mL of toluene was added to the residual polymer to dissolve the polymer, the resultant solution was dripped into 1,000 mL of ethyl lactate to allow the polymer to precipitate. The polymer thus precipitated was taken up through filtration, and vacuum dried at 80° C. to obtain a polysilane represented by the formula (LPS-1). The yield of the polysilane was 1.58 g (3.3%).

$^1$H-NMR (CDCl$_3$) δ–1.0–1.9 (br, aliphatic proton); 6.1–7.75 (br, aromatic proton); Integral ratio, aliphatic proton:aromatic proton=1.1:10

$^{13}$C-NMR (ppm) –5.25, –0.4, 1.0, 8.50, 10.20, 12.4, 127.5, 128.4, 134.4, 137.2

IR (KBr) 3075, 3040, 2980, 2930, 2860, 1605, 1495, 1470, 1430, 1265, 1095, 1070, 885, 780, 745, 730, 690

GPC (THF) Mw=5600

Synthesis No. 3

0.3085 g of copper (I) chloride and 17.90 g (0.781 mol) of metallic sodium were added under argon gas atmosphere to a mixed solvent comprising 130 mL of dehydrated toluene and 20 mL of dehydrated diglyme in a four-necked flask equipped with a dropping funnel and a reflux condenser. Then, the resultant mixture was heated up to a reflux temperature of the solvent to prepare a sodium-dispersed solution. While keeping the reflux temperature of the solvent, a solution of 32.28 g (0.250 mol) of dimethyldichlorosilane and 15.22 g (0.0593 mol) of 1,2-bis(dichloromethylsilyl)ethane in 50 mL of dehydrated toluene was dripped from the dropping funnel into the sodium-dispersed solution over about 15 minutes, and the resultant mixed solution was allowed to undergo a reaction for 3 hours. Then, a solution of 10.89 g (0.10 mol) of trimethylchlorosilane in 20 mL of dehydrated toluene was further added to the reaction mixture and allowed a reaction to take place for 30 minutes, and then the reaction mixture was cooled down to room temperature. 500 mL of toluene was further added to the reaction mixture, which was then filtered under pressure in a nitrogen atmosphere. Sediments formed were removed through filtration and the filtrate was concentrated. After 100 mL of toluene was added to the residual concentrate, 500 mL of ethanol was added to the residual concentrate thereby allowing a polymer to precipitate. The polymer thus precipitated was taken up and dissolved in toluene. The resultant solution was washed with an aqueous solution of sodium bicarbonate, and then with deionized water twice, and then dried over magnesium sulfuric anhydride. After the desiccating agent was removed, the solvents were allowed to evaporate under a reduced pressure. After 100 mL of toluene was added to the residual polymer to dissolve the polymer, the resultant solution was dripped into 500 mL of ethanol to allow the polymer to precipitate. The polymer thus precipitated was taken up through filtration, and vacuum dried at 80° C. to obtain a polysilane represented by the formula (LPS-3). The yield of the polysilane was 1.05 g (4.5%).

$^1$H-NMR (CDCl$_3$) δ–1.0–1.9 (br, aliphatic proton)

$^{13}$C-NMR (ppm) ––5.25, –3.41, –0.4, 1.0, 8.50, 10.20, 12.4

IR (KBr) 2930, 2875, 2850, 1475, 1450, 1265, 1097, 780, 725, 685

GPC (THF) Mw=6000

Synthesis No. 4

0.9927 g of copper (I) chloride and 21.69 g (0.943 mol) of metallic sodium were added under argon gas atmosphere to a mixed solvent comprising 130 mL of dehydrated toluene and 20 mL of dehydrated diglyme in a four-necked flask equipped with a dropping funnel and a reflux condenser. Then, the resultant mixture was heated up to a reflux temperature of the solvent to prepare a sodium-dispersed solution. While keeping the reflux temperature of the solvent, a solution of 31.72 g (0.250 mol) of phenyltrichlorosilane and 15.22 g (0.0593 mol) of 1,2-bis(dichloromethylsilyl)ethane in 50 mL of dehydrated toluene was dripped from the dropping funnel into the sodium-dispersed solution over about 15 minutes, and the resultant mixed solution was allowed to undergo a reaction for 3 hours. Then, a dispersion of 6.54 g of sodium hydride (content: 60 to 72% by weight) in 100 mL of dehydrated toluene and 100 mL of THF was added to the reaction mixture, whereby allowing a reaction to take place for two hours. Then, a solution of 10.89 g (0.10 mol) of trimethylchlorosilane in 20 mL of dehydrated toluene was further added to the reaction mixture and allowed a reaction to take place for 30 minutes, and then the reaction mixture was cooled down to room temperature. 500 mL of toluene was further added to the reaction mixture, which was then filtered under pressure in a nitrogen atmosphere. Sediments formed were removed through filtration and the filtrate was concentrated. Then, 500 mL of ethanol was added to the residual concentrate thereby allowing a polymer to precipitate. The polymer thus precipitated was taken up and dissolved in toluene. The resultant solution was washed with an aqueous solution of sodium bicarbonate, and then with deionized water twice, and then dried over magnesium sulfuric anhydride. After the desiccating agent was removed, the solvents were allowed to evaporate under a reduced pressure. After 100 mL of toluene was added to the residual polymer to dissolve the polymer, the resultant solution was dripped into 500 mL of ethanol to allow the polymer to precipitate. The polymer thus precipitated was taken up through filtration, and vacuum dried at 80° C. to obtain a polysilane represented by the formula (LPS-23). The yield of the polysilane was 10.34 g (32.4%).

$^1$H-NMR (CDCl$_3$) δ–1.0–1.9 (br, aliphatic proton); 6.1–7.75 (br, aromatic proton); Integral ratio, aliphatic proton:aromatic proton=4.5:10

$^{13}$C-NMR (ppm) –5.25, –0.4, 1.0, 8.51, 10.20, 12.4, 127.1, 128.6, 134.1, 137.5

IR (KBr) 3075, 3040, 2980, 2930, 2860, 1605, 1495, 1470, 1430, 1265, 1095, 1065, 885, 780, 745, 730, 690

GPC (THF) Mw=4200

Synthesis No. 5

0.3053 g of copper (I) chloride and 17.92 g (0.781 mol) of metallic sodium were added under argon gas atmosphere to a mixed solvent comprising 130 mL of dehydrated toluene and 20 mL of dehydrated diglyme in a four-necked flask equipped with a dropping funnel and a reflux condenser. Then, the resultant mixture was heated up to a reflux temperature of the solvent to prepare a sodium-dispersed solution. While keeping the reflux temperature of the solvent, a solution of 49.34 g (0.250 mol) of cyclohexylmethyldichlorosilane and 15.20 g (0.0593 mol) of 1,2-bis(dichloromethylsilyl)ethane in 50 mL of dehydrated toluene was dripped from the dropping funnel into the sodium-dispersed solution over about 15 minutes, and the resultant mixed solution was allowed to undergo a reaction for 3 hours. Then, a solution of 10.88 g (0.10 mol) of trimethylchlorosilane in 20 mL of dehydrated toluene was further added to the reaction mixture and allowed a reaction to take place for 2 hours, and then the reaction mixture was cooled down to room temperature. 500 mL of toluene was further added to the reaction mixture, which was then filtered under pressure in a nitrogen atmosphere. Sediments formed were removed through filtration and the filtrate was concentrated. After 100 mL of toluene was added to the residual concentrate, 500 mL of ethanol was added to the residual concentrate thereby allowing a polymer to precipitate. The polymer thus precipitated was taken up and dissolved in toluene. The resultant solution was washed with an aqueous solution of sodium bicarbonate, and then with deionized water twice, and then dried over magnesium sulfuric anhydride. After the desiccating agent was removed, the solvents were allowed to evaporate under a reduced pressure. After 100 mL of toluene was added to the residual polymer to dissolve the polymer, the resultant solution was dripped into 500 mL of ethanol to allow the polymer to precipitate. The polymer thus precipitated was taken up through filtration, and vacuum dried at 80° C. to obtain a polysilane represented by the formula (LPS-5). The yield of the polysilane was 7.54 g (19.7%).

$^1$H-NMR (CDCl$_3$) δ–1.0–2.1 (br, aliphatic proton)

$^{13}$C-NMR (ppm) –5.25, –3.41, –0.4, 1.0, 8.50, 10.20, 12.4, 26.95, 28.50, 31.60

IR (KBr) 2930, 2875, 2850, 1475, 1450, 1265, 1250, 1097, 845, 780, 745, 725, 685

GPC (THF) Mw=15000

Synthesis No. 6

0.2661 g of copper (I) chloride and 18.911 g (0.787 mol) of metallic sodium were added under argon gas atmosphere to a mixed solvent comprising 114.4 mL of dehydrated toluene and 17.6 mL of dehydrated diglyme in a four-necked flask equipped with a dropping funnel and a reflux condenser. Then, the resultant mixture was heated up to a reflux temperature of the solvent to prepare a sodium-dispersed solution. While keeping the reflux temperature of the solvent, a solution of 52.96 g (0.220 mol) of naphthylmethyldichlorosilane and 13.55 g (0.0529 mol) of 1,2-bis(dichloromethylsilyl)ethane in 44 mL of dehydrated toluene was dripped from the dropping funnel into the sodium-dispersed solution over about 20 minutes, and the resultant mixed solution was allowed to undergo a reaction for 3 hours. Then, a solution of 9.58 g (0.082 mol) of trimethylchlorosilane in 20 mL of dehydrated toluene was further added to the reaction mixture and allowed a reaction to take place for 2 hours, and then the reaction mixture was cooled down to room temperature. 500 mL of toluene was further added to the reaction mixture, which was then filtered under pressure in a nitrogen atmosphere. Sediments formed were removed through filtration and the filtrate was concentrated. After 100 mL of toluene was added to the residual concentrate, 500 mL of ethanol was added to the residual concentrate thereby allowing a polymer to precipitate. The polymer thus precipitated was taken up and dissolved in toluene. The resultant solution was washed with an aqueous solution of sodium bicarbonate, and then with deionized water twice, and then dried over magnesium sulfuric anhydride. After the desiccating agent was removed, the solvents were allowed to evaporate under a reduced pressure. After 100 mL of toluene was added to the residual polymer to dissolve the polymer, the resultant solution was dripped into 500 mL of ethanol to allow the polymer to precipitate. The polymer thus precipitated was taken up through filtration, and vacuum dried at 80° C. to obtain a polysilane represented by the formula (LPS-7). The yield of the polysilane was 5.98 g (13.8%).

$^1$H-NMR (CDCl$_3$) δ–1.0–1.9 (br, aliphatic proton); 6.5–8.3 (br, aromatic proton); Integral ratio, aliphatic proton:aromatic proton=7.5:10

$^{13}$C-NMR (ppm) –5.25, –3.2, –0.4, 1.0, 8.50, 10.20, 12.4, 125.5, 126.1, 127.5, 128.4, 129.5, 131.3, 134.4, 136.8, 137.2, 138.8

IR (KBr) 3075, 3040, 2980, 2930, 2860, 1605, 1495, 1470, 1430, 1265, 1095, 1070, 885, 780, 745, 730, 690

GPC (THF) Mw=3400

Synthesis No. 7

0.1840 g of copper (I) chloride and 18.911 g (0.787 mol) of metallic sodium were added under argon gas atmosphere to a mixed solvent comprising 78 mL of dehydrated toluene and 12 mL of dehydrated diglyme in a four-necked flask equipped with a dropping funnel and a reflux condenser. Then, the resultant mixture was heated up to a reflux temperature of the solvent to prepare a sodium-dispersed solution. While keeping the reflux temperature of the solvent, a solution of 46.26 g (0.153 mol) of naphthylphenyldichlorosilane and 9.2 g (0.0359 mol) of 1,2-bis(dichloromethylsilyl)ethane in 50 mL of dehydrated toluene was dripped from the dropping funnel into the sodium-dispersed solution over about 20 minutes, and the resultant mixed solution was allowed to undergo a reaction for 3 hours. Then, a solution of 6.52 g (0.0882 mol) of trimethylchlorosilane in 12 mL of dehydrated toluene was further added to the reaction mixture and allowed a reaction to take place for 2 hours, and then the reaction mixture was cooled down to room temperature. 500 mL of toluene was further added to the reaction mixture, which was then filtered under pressure in a nitrogen atmosphere. Sediments formed were removed through filtration and the filtrate was concentrated. After 100 mL of toluene was added to the residual concentrate, 500 mL of ethanol was added to the residual concentrate thereby allowing a polymer to precipitate. The polymer thus precipitated was taken up and dissolved in toluene. The resultant solution was washed with an aqueous solution of sodium bicarbonate, and then with deionized water twice, and then dried over magnesium sulfuric anhydride. After the desiccating agent was removed, the solvents were allowed to evaporate under a reduced pressure. After 100 mL of toluene was added to the residual polymer to dissolve the polymer, the resultant solution was dripped into 500 mL of ethanol to allow the polymer to precipitate. The polymer thus precipitated was taken up through filtration, and vacuum dried at 80° C. to obtain a polysilane represented by the formula (LPS-4). The yield of the polysilane was 4.39 g (13.8%).

$^1$H-NMR (CDCl$_3$) δ–1.0–1.9 (br, aliphatic proton); 6.1–8.4 (br, aromatic proton); Integral ratio, aliphatic proton:aromatic proton=2:10

$^{13}$C-NMR (ppm) –5.25, –0.5, 1.0, 8.40, 10.10, 12.3, 125.5, 126.1, 126.6, 127.5, 128.1, 128.4, 129.5, 131.3, 134.4, 136.8, 137.2, 138.8

IR (KBr) 3075, 3040, 2980, 2930, 2860, 1605, 1495, 1470, 1430, 1265, 1095, 1070, 885, 780, 745, 730, 690

GPC (THF) Mw=2150

Synthesis No. 8

10 mL of dehydrated xylene and 70.55 g (0.500 mol) of methylvinyldichlorosilane were placed in a four-necked flask equipped with a dropping funnel and a reflux condenser under argon gas atmosphere, and then 30 mL of dehydrated xylene containing a platinum catalyst (Toshiba Silicone Co., Ltd.) was added to the solution in the flask. Then, the resultant mixture was heated by means of oil bath to 80 to 120° C. On the other hand, a solution of 106.28 g (0.600 mol) of phenyldichlorosilane in 10 mL of dehydrated xylene was placed in a dropping funnel and allowed to gradually drip over about 90 minutes. Then, the resultant mixture was allowed to undergo a reaction for 2 hours, and evaporated twice under a reduced pressure to obtain 134.0 g (84.2%) of 1-dichloromethylsilyl-2-dichlorophenylsilyl ethane. The melting point of this compound was 123.5 to 126.5° C. (10 mmHg).

0.359 g of copper (I) chloride and 20.5 g (0.896 mol) of metallic sodium were added under argon gas atmosphere to a mixed solvent comprising 140 mL of dehydrated xylene and 10 mL of dehydrated anisole in a four-necked flask equipped with a dropping funnel and a reflux condenser.

Then, the resultant mixture was heated up to a reflux temperature of the solvent to prepare a sodium-dispersed solution. While keeping the reflux temperature of the solvent, a solution of 63.34 g (0.250 mol) of diphenyldichlorosilane and 19.08 g (0.0599 mol) of 1-dichloromethylsilyl-2-dichlorophenylsilyl ethane in 50 mL of dehydrated toluene was dripped from the dropping funnel into the sodium-dispersed solution over about 20 minutes, and the resultant mixed solution was allowed to undergo a reaction for 3 hours. Then, a solution of 10.88 g (0.10 mol) of trimethylchlorosilane in 20 mL of dehydrated xylene was further added to the reaction mixture and allowed a reaction to take place for 2 hours, and then the reaction mixture was cooled down to room temperature. 500 mL of toluene was further added to the reaction mixture, which was then filtered under pressure in a nitrogen atmosphere. Sediments formed were removed through filtration and the filtrate was concentrated. After 100 mL of toluene was added to the residual concentrate, 500 mL of ethyl lactate was added to the residual concentrate thereby allowing a polymer to precipitate. The polymer thus precipitated was taken up and dissolved in toluene. The resultant solution was washed with an aqueous solution of sodium bicarbonate, and then with deionized water three times, and then dried over magnesium sulfuric anhydride. After the desiccating agent was removed, the solvents were allowed to evaporate under a reduced pressure. After 100 mL of toluene was added to the residual polymer to dissolve the polymer, the resultant solution was dripped into 500 mL of ethyl lactate to allow the polymer to precipitate. The polymer thus precipitated was taken up through filtration, and vacuum dried at 90° C. The yield of the polymer was 26.9 g (47.9%). Then, 25.01 g of this polymer was redissolved in 100 mL of toluene and poured into 1000 mL of PGMEA, thereby allowing the polymer to reprecipitate. The polymer thus precipitated was taken up through filtration, and vacuum dried at 90° C. to obtain a polysilane represented by the formula (LPS-24). The yield of the polysilane was 2.88 g (55.4%, total: 18.3%).

$^1$H-NMR (CDCl$_3$) δ–1.0–1.9 (br, aliphatic proton); 6.1–7.8 (br, aromatic proton); Integral ratio, aliphatic proton:aromatic proton=10:1.51

$^{13}$C-NMR (ppm) –5.25, –0.4, 1.0, 8.50, 10.2, 12.4, 127.6, 128.7, 128.4, 134.2, 137.4

IR (KBr) 3070, 3040, 2985, 2940, 2860, 1605, 1495, 1470, 1430, 1265, 1095, 1070, 885, 780, 745, 730, 690

GPC (THF) Mw=12000

Synthesis No. 9

Under an argon atmosphere, 5.34 g of zirconocenedichloride in 60 mL of diethyl ether which was dried at –20° C. was stirred, and then 1.5M diethyl ether was further added little by little, the resultant solution being further stirred for 70 minutes. After this solution was further stirred for 30 minutes at 0° C., diethyl ether was removed, and the resultant white solid was allowed to sublimate thereby to obtain zirconocenedimethyl. Subsequently, this zirconocenedimethyl was added to phenylsilane in a molar ratio of 50:1, whereby allowing 1,4-disilylbenzene to polymerize for 5 hours at room temperature to obtain a polymer. The polymer thus obtained was dissolved in toluene and poured into methanol with stirring, whereby allowing the polymer to reprecipitate. Reprecipitation of the polymer was repeated twice, the resultant polymer being subsequently taken up through filtration and dried under a reduced pressure at 80 to 90° C. to obtain a polysilane of (LPS-25). The weight average molecular weight of this polymer was about 12000.

Synthesis No. 10

70.54 g of vinylmethyldichlorosilane, 1.24 g of a platinum catalyst (X94A6270, Toshiba Silicone Co., Ltd.) and 40 mL of dehydrated xylene were placed in a four-necked flask equipped with a dropping funnel and a reflux condenser under argon gas atmosphere, and then heated by means of oil bath to 80 to 120° C. On the other hand, a solution of 56.78 g of dimethylchlorosilane in 10 mL of dehydrated xylene was placed in a dropping funnel and allowed to gradually drip over about 50 minutes. Then, the resultant mixture was allowed to undergo a reaction for 3 hours, and evaporated under a reduced pressure to obtain 75.72 g of 1-dichloromethylsilyl-2-dimethylchlorosilyl ethane. The boiling point of this compound was 74 to 77° C. (4000 Pa).

0.3509 g of copper (I) chloride and 20.60 g (0.896 mol) of metallic sodium were added under argon gas atmosphere to a mixed solvent comprising 140 mL of dehydrated toluene and 10 mL of dehydrated anisole in a four-necked flask equipped with a dropping funnel and a reflux condenser. Then, the resultant mixture was heated up to a reflux temperature of the solvent to prepare a sodium-dispersed solution. While keeping the reflux temperature of the solvent, a solution of 63.38 g (0.250 mol) of diphenyldichlorosilane and 14.18 g (0.0602 mol) of 1-dichloromethylsilyl-2-dimethylchlorosilyl ethane in 50 mL of dehydrated xylene was dripped from the dropping funnel into the sodium-dispersed solution over about 20 minutes, and the resultant mixed solution was allowed to undergo a reaction for 3 hours. Then, a solution of 10.88 g (0.10 mol) of trimethylchlorosilane in 20 mL of dehydrated toluene was further added to the reaction mixture and allowed a reaction to take place for 2 hours, and then the reaction mixture was cooled down to room temperature. 500 mL of toluene was further added to the reaction mixture, which was then filtered under pressure in a nitrogen atmosphere. Sediments formed were removed through filtration and the filtrate was concentrated. After 100 mL of toluene was added to the residual concentrate, the resultant mixed solution was poured into 500 mL of ethyl lactate, thereby allowing a polymer to precipitate. The polymer thus precipitated was taken up and dissolved in toluene. The resultant solution was washed with an aqueous solution of sodium bicarbonate, and then with deionized water twice, and then dried over magnesium sulfuric anhydride. After the desiccating agent was removed, the solvents were allowed to evaporate under a reduced pressure. After 100 mL of toluene was added to the residual polymer to dissolve the polymer, the resultant solution was poured into 500 mL of ethyl lactate to allow the polymer to precipitate. The polymer thus precipitated was taken up through filtration, and vacuum dried at 80° C. to obtain a polysilane represented by the formula (LPS-40). The yield of the polysilane was 2.30 g.

$^1$H-NMR (CDCl$_3$) δ–1.0–2.1 (br, aliphatic proton); 6.1–7.75 (br, aromatic proton); Integral ratio, aliphatic proton:aromatic proton=5.1:10

GPC (THF) Mw=9800

Synthesis No. 11

0.3056 g of copper (I) chloride and 20.42 g (0.888 mol) of metallic sodium were added under argon gas atmosphere to a mixed solvent comprising 140 mL of dehydrated xylene and 10 mL of dehydrated anisole in a four-necked flask equipped with a dropping funnel and a reflux condenser. Then, the resultant mixture was heated up to a reflux temperature of the solvent to prepare a sodium-dispersed solution. While keeping the reflux temperature of the solvent, a solution of 63.4 g (0.250 mol) of diphenyldichlorosilane and 5.89 g (0.0250 mol) of 1-dichloromethylsilyl- 2-dimethylchlorosilyl ethane in 50 mL of dehydrated xylene was dripped from the dropping funnel into the sodium-dispersed solution over about 15 minutes, and the resultant mixed solution was allowed to undergo a reaction for 3 hours. Then, a solution of 10.88 g (0.10 mol) of trimethylchlorosilane in 20 mL of dehydrated toluene was further added to the reaction mixture and allowed a reaction to take place for 2 hours, and then the reaction mixture was cooled down to room temperature. 500 mL of toluene was further added to the reaction mixture, which was then filtered under pressure in a nitrogen atmosphere. Sediments formed were removed through filtration and the filtrate was concentrated. Thereafter, 500 mL of ethyl lactate was added to the residual concentrate, thereby allowing a polymer to precipitate. The polymer thus precipitated was taken up through filtration and dissolved in toluene. The resultant solution was washed with an aqueous solution of sodium bicarbonate, and then with deionized water twice, and then dried over magnesium sulfuric anhydride. After the desiccating agent was removed, the solvents were allowed to evaporate under a reduced pressure. After 100 mL of toluene was added to the residual polymer to dissolve the polymer, the resultant solution was poured into 1,000 mL of ethyl lactate to allow the polymer to precipitate. The polymer thus precipitated was taken up through filtration, and vacuum dried at 80° C. to obtain a polysilane represented by the formula (LPS-40). The yield of the polysilane was 1.58 g.

$^1$H-NMR (CDCl$_3$) δ–1.0–2.1 (br, aliphatic proton); 6.1–7.75 (br, aromatic proton)

Synthesis No. 12

0.3085 g of copper (I) chloride and 17.90 g (0.781 mol) of metallic sodium were added under argon gas atmosphere to a mixed solvent comprising 140 mL of dehydrated xylene and 10 mL of dehydrated anisole in a four-necked flask equipped with a dropping funnel and a reflux condenser. Then, the resultant mixture was heated up to a reflux temperature of the solvent to prepare a sodium-dispersed solution. While keeping the reflux temperature of the solvent, a solution of 32.28 g (0.250 mol) of dimethyldichlorosilane and 14.18 g of 1-dichloromethylsilyl-2-dimethylchlorosilyl ethane in 50 mL of dehydrated xylene was dripped from the dropping funnel into the sodium-dispersed solution over about 20 minutes, and the resultant mixed solution was allowed to undergo a reaction for 3 hours. Then, a solution of 10.89 g (0.10 mol) of trimethylchlorosilane in 20 mL of dehydrated toluene was further added to the reaction mixture and allowed a reaction to take place for 2 hours, and then the reaction mixture was cooled down to room temperature. 500 mL of toluene was further added to the reaction mixture, which was then filtered under pressure in a nitrogen atmosphere. Sediments formed were removed through filtration and the filtrate was concentrated. Thereafter, 100 mL of toluene was added to the concentrated residue to dissolve the concentrated residue, and then 500 mL of ethyl lactate was added to the solution, thereby allowing a polymer to precipitate. The polymer thus precipitated was taken up through filtration and dissolved in toluene. The resultant solution was washed with an aqueous solution of sodium bicarbonate, and then with deionized water twice, and then dried over magnesium sulfuric anhydride. After the desiccating agent was removed, the solvents were allowed to evaporate under a reduced pressure. After 100 mL of toluene was added to the residual polymer to dissolve the polymer, the resultant solution was poured into 500 mL of ethyl lactate to allow the polymer to precipitate. The polymer thus precipitated was taken up through filtration, and vacuum dried at 80° C. to obtain a polysilane represented by the formula (LPS-43). The yield of the polysilane was 5.45 g.

$^1$H-NMR (CDCl$_3$) δ–1.0–1.9 (br, aliphatic proton); 6.1–7.75 (br, aromatic proton)

IR (KBr) 2930, 2875, 2850, 1475, 1450, 1265, 1250, 1097, 780, 725, 685

GPC (THF) Mw=4500

Synthesis No. 13

0.9927 g of copper (I) chloride and 21.69 g (0.943 mol) of metallic sodium were added under argon gas atmosphere to a mixed solvent comprising 140 mL of dehydrated xylene and 10 mL of dehydrated anisole in a four-necked flask equipped with a dropping funnel and a reflux condenser. Then, the resultant mixture was heated up to a reflux temperature of the solvent to prepare a sodium-dispersed solution. While keeping the reflux temperature of the solvent, a solution of 31.72 g (0.250 mol) of phenyltrichlorosilane and 14.18 g of 1-dichloromethylsilyl-2-dimethylchlorosilyl ethane in 50 mL of dehydrated xylene was dripped from the dropping funnel into the sodium-dispersed solution over about 20 minutes, and the resultant mixed solution was allowed to undergo a reaction for 3 hours. Then, a solution of 6.54 g (content: 60 to 72% by weight) of sodium hydroxide in a mixed solvent comprising 100 mL of dehydrated xylene and 100 mL of THF was further added to the reaction mixture and allowed a reaction to take place for 2 hours. Thereafter, a solution of 10.89 g (0.10 mol) of trimethylchlorosilane in 20 mL of dehydrated toluene was further added to the reaction mixture and allowed a reaction to take place for 30 minutes, and then the reaction mixture was cooled down to room temperature. After 500 mL of toluene was further added to the reaction mixture, the reaction mixture was filtered under pressure in a nitrogen atmosphere to remove the sediments through filtration, and the filtrate was concentrated. Thereafter, 500 mL of ethanol was added to the concentrated residue, thereby allowing a polymer to precipitate. The polymer thus precipitated was taken up through filtration and dissolved in toluene. The resultant solution was washed with an aqueous solution of sodium bicarbonate and then with deionized water twice, and then dried over magnesium sulfuric anhydride. After the desiccating agent was removed, the solvents were allowed to evaporate under a reduced pressure. After 100 mL of toluene was added to the residual polymer to dissolve the polymer, the resultant solution was poured into 500 mL of ethanol to allow the polymer to precipitate. The polymer thus precipitated was taken up through filtration, and vacuum dried at 80° C. to obtain a polysilane represented by the formula (LPS-72). The yield of the polysilane was 2.05 g.

$^1$H-NMR (CDCl$_3$) δ–1.0–1.9 (br, aliphatic proton); 6.1–7.75 (br, aromatic proton)

Synthesis No. 14

0.3509 g of copper (I) chloride and 20.60 g (0.896 mol) of metallic sodium were added under argon gas atmosphere to a mixed solvent comprising 140 mL of dehydrated xylene and 10 mL of dehydrated anisole in a four-necked flask equipped with a dropping funnel and a reflux condenser. Then, the resultant mixture was heated up to a reflux temperature of the solvent to prepare a sodium-dispersed solution. While keeping the reflux temperature of the solvent, a solution of 49.35 g (0.250 mol) of cyclohexylmethyldichlorosilane and 14.18 g (0.0602 mol) of 1-dichloromethylsilyl-2-dimethylchlorosilyl ethane in 50 mL of dehydrated xylene was dripped from the dropping funnel into the sodium-dispersed solution over about 20 minutes, and the resultant mixed solution was allowed to undergo a reaction for 3 hours. Then, a solution of 10.88 g (0.10 mol) of trimethylchlorosilane in 20 mL of dehydrated toluene was further added to the reaction mixture and allowed a reaction to take place for 2 hours, and then the reaction mixture was cooled down to room temperature. 500 mL of toluene was further added to the reaction mixture, which was then filtered under pressure in a nitrogen atmosphere. Sediments formed were removed through filtration and the filtrate was concentrated. Thereafter, 100 mL of toluene was added to the concentrated residue to dissolve the concentrated residue, and then 500 mL of ethyl lactate was added to the solution, thereby allowing a polymer to precipitate. The polymer thus precipitated was taken up through filtration and dissolved in toluene. The resultant solution was washed with an aqueous solution of sodium bicarbonate, and then with deionized water twice, and then dried over magnesium sulfuric anhydride. After the desiccating agent was removed, the solvents were allowed to evaporate under a reduced pressure. After 100 mL of toluene was added to the residual polymer to dissolve the polymer, the resultant solution was poured into 500 mL of ethyl lactate to allow the polymer to precipitate. The polymer thus precipitated was taken up through filtration, and vacuum dried at 80° C. to obtain a polysilane represented by the formula (LPS-46). The yield of the polysilane was 4.30 g.

$^1$H-NMR (CDCl$_3$) δ–1.0–1.9 (br, aliphatic proton)

Synthesis No. 15

0.3509 g of copper (I) chloride and 20.60 g (0.896 mol) of metallic sodium were added under argon gas atmosphere to a mixed solvent comprising 140 mL of dehydrated xylene and 10 mL of dehydrated anisole in a four-necked flask equipped with a dropping funnel and a reflux condenser. Then, the resultant mixture was heated up to a reflux temperature of the solvent to prepare a sodium-dispersed solution. While keeping the reflux temperature of the solvent, a solution of 60.18 g (0.250 mol) of diphenyldichlorosilane and 14.18 g (0.0602 mol) of 1-dichloromethylsilyl-2-dimethylchlorosilyl ethane in 50 mL of dehydrated xylene was dripped from the dropping funnel into the sodium-dispersed solution over about 20 minutes, and the resultant mixed solution was allowed to undergo a reaction for 3 hours. Then, a solution of 10.88 g (0.10 mol) of trimethylchlorosilane in 20 mL of dehydrated toluene was further added to the reaction mixture and allowed a reaction to take place for 2 hours, and then the reaction mixture was cooled down to room temperature. 500 mL of toluene was further added to the reaction mixture, which was then filtered under pressure in a nitrogen atmosphere. Sediments formed were removed through filtration and the filtrate was concentrated. Thereafter, 100 mL of toluene was added to the concentrated residue to dissolve the concentrated residue, and then 500 mL of ethyl lactate was added to the solution, thereby allowing a polymer to precipitate. The polymer thus precipitated was taken up through filtration and dissolved in toluene. The resultant solution was washed with an aqueous solution of sodium bicarbonate, and then with deionized water twice, and then dried over magnesium sulfuric anhydride. After the desiccating agent was removed, the solvents were allowed to evaporate under a reduced pressure. After 100 mL of toluene was added to the residual polymer to dissolve the polymer, the resultant solution was poured into 500 mL of ethyl lactate to allow the polymer to precipitate. The polymer thus precipitated was taken up through filtration, and vacuum dried at 80° C. to obtain a polysilane represented by the formula (LPS-40). The yield of the polysilane was 8.30 g.

$^1$H-NMR (CDCl$_3$) δ–1.0–1.9 (br, aliphatic proton); 6.1–8.55 (br, aromatic proton); Integral ratio, aliphatic proton:aromatic proton=5.1:7

Synthesis No. 16

31.47 g (0.1 mol) of 1,3-diphenyl-1,1,2,3,3-pentamethyltrisilane was dissolved in 100 mL of heptane in a four-necked flask equipped with a dropping funnel and a reflux condenser under argon gas atmosphere to obtain a solution. Then, under reflux while heating, 60 mL of a solution of t-butyl mercury/heptane (about 1 mol/L) was gradually dripped from the dropping funnel to the solution. Thereafter, the solution was further refluxed while heating for 3 hours, and, while allowing heptane to evaporate, 200 mL of toluene was added to the solution to perform the exchange of solvents. Then, 6.94 g (1 mol) of lithium was added to this reaction mixture to allow a reaction to take place for 100 hours thereby to prepare a toluene solution of 1,3-diphenyl-1,1,2,3,3-pentamethyl-2-lithiotrisilane. This toluene solution was filtered through a glass filter to remove an excessive lithium.

17.0 g (0.1 mol) of diphenylmethylchlorosilane was dissolved in 100 mL of toluene in a four-necked flask equipped with a dropping funnel and a reflux condenser under argon gas atmosphere to obtain a solution. Then, a toluene solution of 1,3-diphenyl-1,1,2,3,3-pentamethyl-2-lithiotrisilane was gradually dripped from the dropping funnel to the solution. Thereafter, the solution was further refluxed while heating for 3 hours, and then allowed to cool down to room temperature. After an addition of methanol to the solution, a dilute hydrochloric acid was added to this solution to acidify the solution, and the resultant solution was washed with water. This reaction solution was dried over magnesium sulfate and then the solvent was removed. The product was recrystallized from a toluene/methanol solution to obtain 15.7 g (35%) of 1,3-diphenyl-1,1,2,3,3-pentamethyl-2-dimethylphenylsilyl trisilane.

13.5 g (0.03 mol) of 1,3-diphenyl-1,1,2,3,3-pentamethyl-2-dimethylphenylsilyl trisilane was dissolved in 100 mL of methylene chloride in a four-necked flask equipped with a dropping funnel and a reflux condenser under argon gas atmosphere to obtain a solution. Then, while keeping this solution to 0° C., a solution of 13.5 g (0.09 mol) of trifluoromethane sulfonic acid in 30 mL of methylene chloride was gradually dripped from the dropping funnel to the solution. Thereafter, the solution was refluxed while heating for one hour, and then allowed to cool down to room temperature. The solvent was then completely evaporated under a reduced pressure from the solution. After 100 mL of dried toluene was added to the residue to dissolve it, a toluene solution of 1,3-diphenyl-1,1,2,3,3-pentamethyl-2-lithiotrisilane was gradually added to this solution. Thereafter, the solution was refluxed while heating for 3 hours, and then allowed to cool down to room temperature. After an addition of methanol to the solution, a dilute hydrochloric acid was added to this solution to acidify the solution, and the resultant solution was washed with water. This reaction solution was dried over magnesium sulfate and then the solvent was removed. The product was recrystallized from a toluene/methanol solution to obtain 15 g of polysilane dendrimer.

Synthesis No. 17

0.9913 g of copper (I) chloride and 55.53 g of metallic sodium were added under argon gas atmosphere to a mixed solvent comprising 600 mL of dehydrated toluene and 40 mL of dehydrated diglyme in a four-necked flask equipped with a dropping funnel and a reflux condenser. Then, the resultant mixture was heated up to a reflux temperature of the solvent to prepare a sodium-dispersed solution. While keeping the reflux temperature of the solvent, a solution of 126.61 g (0.500 mol) of diphenyldichlorosilane and 95.60 g (0.500 mol) of phenylmethyldichlorosilane in 160 mL of dehydrated toluene was dripped from the dropping funnel into the sodium-dispersed solution over about 20 minutes, and the resultant mixed solution was allowed to undergo a reaction for 3 hours. Then, a solution of 10.88 g (0.10 mol) of trimethylchlorosilane in 20 mL of dehydrated xylene was further added to the reaction mixture and allowed a reaction to take place for 2 hours, and then the reaction mixture was cooled down to room temperature by the addition of 500 mL of toluene. The reaction mixture was then filtered under pressure in a nitrogen atmosphere. Sediments formed were removed through filtration and the filtrate was concentrated. Thereafter, 400 mL of toluene was added to the concentrated residue to dissolve the concentrated residue, and then 200 mL of ethanol was added to the solution, thereby allowing a polymer to precipitate. The polymer thus precipitated was taken up through filtration and dissolved in toluene. The resultant solution was washed with deionized water three times, and then dried over magnesium sulfuric anhydride. After the desiccating agent was removed, the solvents were allowed to evaporate under a reduced pressure. After 400 mL of toluene was added to the residual polymer to dissolve the polymer, the resultant solution was poured into 1600 mL of ethanol to allow the polymer to precipitate. The polymer thus precipitated was taken up through filtration, and vacuum dried at 50° C. The yield of the polymer was 37.8 g (25.0%). Then, 9.25 g of this polymer was redissolved in 50 mL of toluene and poured into 500 mL of PGMEA, thereby allowing the polymer to reprecipitate. Reprecipitation was repeated once more. The polymer thus reprecipitated was taken up through filtration, and vacuum-dried at 90° C. to obtain a polysilane represented by the formula (ArPS-1). The yield of the polysilane was 1.54 g (16.7%, total: 4.2%; weight average molecular weight: 15000).

Synthesis No. 18

0.9913 g of copper (I) chloride and 55.53 g of metallic sodium were added under argon gas atmosphere to a mixed solvent comprising 600 mL of dehydrated toluene and 40 mL of dehydrated diglyme in a four-necked flask equipped with a dropping funnel and a reflux condenser. Then, the resultant mixture was heated up to a reflux temperature of the solvent to prepare a sodium-dispersed solution. While keeping the reflux temperature of the solvent, a solution of 202.56 g (0.500 mol) of diphenyldichlorosilane and 77.49 g (0.200 mol) of 1,4-bis(methylphenylchlorosilyl) benzene in 160 mL of dehydrated toluene was dripped from the dropping funnel into the sodium-dispersed solution over about 20 minutes, and the resultant mixed solution was allowed to undergo a reaction for 3 hours. Then, a solution of 10.88 g (0.10 mol) of trimethylchlorosilane in 12 mL of dehydrated toluene was further added to the reaction mixture and allowed a reaction to take place for 2 hours, and then the reaction mixture was cooled down to room temperature by the addition of 500 mL of toluene. The reaction mixture was then filtered under pressure in a nitrogen atmosphere. Sediments formed were removed through filtration and the filtrate was concentrated. Thereafter, 400 mL of toluene was added to the concentrated residue to dissolve the concentrated residue, and then 2000 mL of ethanol was added to the solution, thereby allowing a polymer to precipitate. The polymer thus precipitated was taken up through filtration and dissolved in toluene. The resultant solution was washed with deionized water three times, and then dried over magnesium sulfuric anhydride. After the desiccating agent was removed, the solvents were allowed to evaporate under a reduced pressure. After 400 mL of toluene was added to the residual polymer to dissolve the polymer, the resultant solution was poured into 1600 mL of ethanol to allow the polymer to precipitate. The polymer thus precipitated was taken up through filtration, and vacuum dried at 50° C. The yield of the polymer was 45.8 g (21.9%). Then, 10.05 g of this polymer was redissolved in 50 mL of toluene and poured into 500 mL of PGMEA, thereby allowing the polymer to reprecipitate. The polymer thus reprecipitated was taken up through filtration, and vacuum-dried at 90° C. to obtain a polysilane represented by the formula (ArPS-23). The yield of the polysilane was 3.83 g (38.1%, total: 8.4%; weight average molecular weight: 17000).

Synthesis No. 19

A solution of 22.8 g (0.05 mol) of 1,1-dichloro-2,3,4,5-tetraphenyl-1-silacyclopentadiene in 100 mL of tetrahydrofran and 0.70 g (0.1 mol) of lithium was placed, under an argon gas atmosphere, in a four-necked flask equipped with a reflux condenser, a stirrer, a dropping funnel and an ultrasonic wave generator. Then, the mixed solution in the flask was allowed to undergo a reaction for 5 hours under application of ultrasonic, and then a solution of 15.2 g (0.05 mol) of 1,1,2,2,3,3,4,4-octamethyl-1,4-dichlorotetrasilane in 50 mL of tetrahydrofran was gradually dripped from the dropping funnel to the mixed solution. Thereafter, the solution was refluxed while heating for 3 hours, and then cooled down to room temperature. Then, after an addition of methanol to the mixed solution, a dilute hydrochloric acid was added to this solution to acidify the solution, and, after an addition of toluene, the resultant solution was washed with water. The resultant solution was then dried over magnesium sulfuric anhydride, and the solvents were allowed to evaporate. As a result, it was possible through a recrystallization from toluene/methanol to obtain 13.9 g (45%) of 1,1-spiro-1,1,2,2,3,3,4,4-octamethyl-1,4-tetrasilanylene-2,3,4,5-tetraphenyl-1-silacyclopentadiene.

A solution of 6.2 g (0.01 mol) of 1,1-spiro-1,1,2,2,3,3,4,4-octamethyl-1,4-tetrasilanylene-2,3,4,5-tetraphenyl-1-silacyclopentadiene in 100 mL of THF was placed in a four-necked flask equipped with a reflux condenser, a stirrer and a dropping funnel. Then, the mixed solution in the flask was allowed to cool down to about –40° C. Thereafter, 2 mL of a solution of n-butyl lithium/hexane (1.6 mol/L) was added to the solution to undergo a reaction for one hour and then cooled down to room temperature. Then, after an addition of methanol to the mixed solution, a dilute hydrochloric acid was added to this mixed solution to acidify the solution, and, after an addition of toluene, the resultant solution was washed with water. The resultant solution was then dried over magnesium sulfuric anhydride, and the solvents were allowed to evaporate. As a result, it was possible through a recrystallization from toluene/methanol to obtain 1.5 g (yield: 24%) of polysilane represented by the formula (SL-I 1) having a silol ring and a weight average molecular weight of 18,000.

Synthesis No. 20

A solution of 29.21 g (1.202 mol) of metallic magnesium and 15.9 g (0.0602 mol) of 18-crown-6-ether in 200 mL of anhydrous tetrahydrofran was placed, under an argon gas atmosphere, in a four-necked flask equipped with a dropping funnel and a reflux condenser. Then, a solution of 84.97 g (0.50 mol) of tetrachlorosilane in 50 mL of anhydrous tetrahydrofran was dripped from the dropping funnel into the solution over about 30 minutes. During this dripping, although a reflux of the solvent due to the heat of reaction was admitted, the reaction mixture was not cooled. The solution was allowed to continue the reaction at reflux temperature of the solvent. Then, a solution of 41.17 g (0.300 mol) of n-butyl bromide in 100 mL of anhydrous tetrahydrofran was added to the above reaction mixture and allowed to undergo a reaction for 4 hours. To this reaction mixture was added 1,000 mL of toluene, and the resultant solution was allowed to cool down to room temperature. The reaction mixture was then filtered under pressure in a nitrogen atmosphere to remove sediments formed therein, and the filtrate was concentrated. Thereafter, 100 mL of toluene was added to the concentrated residue to dissolve the concentrated residue, and then 1000 mL of methanol was added to the solution, thereby allowing a polymer to precipitate. The polymer thus precipitated was taken up through filtration and dissolved in toluene. The resultant solution was washed with deionized water once and then with an aqueous solution of ammonium chloride once. After being washed further with deionized water three times, the solution was dried over magnesium sulfuric anhydride. After the desiccating agent was removed, the solvents were allowed to evaporate under a reduced pressure. After 1,000 mL of toluene was added to the residual polymer to dissolve the polymer, the resultant solution was poured into 1,000 mL of methanol to allow the polymer to reprecipitate. The polymer thus precipitated was taken up through filtration, and vacuum-dried at 90° C. to obtain 8.60 g of polymer as a solid of yellowish orange color. Then, 8.0 g of this polymer was redissolved in 40 mL of toluene and poured into 1,000 mL of PGMEA, thereby allowing the polymer to reprecipitate. The polymer thus reprecipitated was taken up through filtration, and vacuum-dried at 90° C. to obtain 1.02 g of a polymer. This polymer was a polysilane having an organosilicon nanocluster structure.

EXAMPLE 1

In this example, a polysilane having a repeating unit represented by the general formula (LPS-I) was employed to perform the experiment.

A resist film, an etching mask consisting of the polysilane according to this invention, an etching mask consisting of carbon according to the prior art, and an $SiO_2$ film were separately formed on a silicon wafer to measure the etching rate of each film under a predetermined etching condition.

As for the resist, the following three kinds of materials were employed. Each of these resists was spin-coated on the silicon wafer and then baked to form a resist film having a thickness of 500 nm.

R1: A positive type chemically amplified resist mainly consisting of polyhydroxy styrene (APEX-E, Shiplay Co., Ltd.).

R2: A negative type chemically amplified resist (XP89131, Shiplay Co., Ltd.).

R3: A positive type resist mainly consisting of novolak (IX-770, Nippon Synthetic Rubber Co., Ltd.).

As for the etching mask consisting of the polysilane according to this invention, 12 kinds of polysilanes shown in Table 1 were employed. Namely, each polysilane solution was spin-coated on a silicon wafer, and baked at 160° C. for 60 seconds to form a resist film having a thickness of 500 nm. The cross-sections of these polysilane films were observed by making use of a SEM, finding that the generation of crack was not admitted at all in these films.

TABLE 1

| sample | polysilane | additive | solvent |
|---|---|---|---|
| 1-1 | [LPS-1] Mw = 9200 10 g | — | anisole 90 g |
| 1-2 | [LPS-2] Mw = 8000 10 g | — | anisole 90 g |
| 1-3 | [LPS-3] Mw = 5000 10 g | — | anisole 90 g |
| 1-4 | [LPS-4] Mw = 7500 10 g | — | anisole 90 g |
| 1-5 | [LPS-5] Mw = 5000 10 g | — | anisole 90 g |
| 1-6 | [LPS-6] Mw = 6000 10 g | — | anisole 90 g |
| 1-7 | [LPS-7] Mw = 4800 10 g | — | anisole 90 g |
| 1-8 | [LPS-8] Mw = 3000 10 g | — | anisole 90 g |
| 1-9 | [LPS-9] Mw = 4500 10 g | — | anisole 90 g |
| 1-10 | [LPS-10] Mw = 5000 10 g [LPS-1] Mw = 9200 5 g | — | anisole 85 g |
| 1-11 | [LPS-1] Mw = 9200 10 g | polysulfone 10 g | xylene 85 g |
| 1-12 | [LPS-1] Mw = 9200 10 g | coumarin dye 5 g | anisole 85 g |

The etching mask consisting carbon which was employed for the purpose of comparison was formed as follows. A silicon wafer as a substrate, and a graphite plate as a target were respectively placed in a DC magnetron sputtering apparatus, and the sputtering was performed in an Ar atmosphere, whereby forming a carbon film having a thickness of 500 nm on the silicon wafer. The conditions for sputtering were selected to be; 250° C. in substrate temperature; 40 sccm in argon flow rate; $4 \times 10^{-3}$ Torr in pressure; and 3.5 $W/cm^2$ in current density.

An $SiO_2$ film having 500 nm in thickness was formed on the silicon wafer by means of a CVD method.

These various kinds of films formed on the silicon wafer were subjected to etching under the following five different conditions (E-1) to (E-5) to respectively measure the etching rate.

First of all, the etching rates of the resist films and etching masks (polysilane and carbon) were compared with each other under the conditions of (E-1) to (E-3). These conditions were determined supposing that the etching masks were etched with the resist patterns being employed as a mask.

(E-1): The resist films and polysilane films were etched by making use of a magnetron RIE apparatus under the conditions of; 50 sccm in HBr flow rate; 8 mTorr in vacuum degree; and 200 W in induction power. The results are shown in Table 2.

(E-2): The resist films and polysilane films were etched by making use of a magnetron RIE apparatus under the conditions of; 50 sccm in $Cl_2$ flow rate; 30 mTorr in vacuum degree; and 200 W in induction power. The results are shown in Table 2.

(E-3): The resist films and carbon film were etched by making use of a magnetron RIE apparatus under the conditions of; 80 sccm in $CF_4$ flow rate; 8 sccm in $O_2$ flow rate; 20 sccm in Ar flow rate; 10 mTorr in vacuum degree; and 200 W in induction power. The results are shown in Table 2.

The followings can be seen from the results shown in Table 2. Namely, under the conditions of (E-1) and (E-2), the etching rate of the polysilane films indicated as high as not less than 3.5 times and not less than 3.7 times that of the resist films. These results demonstrate that the polysilane of this invention can be etched at a high etch rate ratio while employing the resist pattern as a mask. On the other hand, under the condition of (E-3), the etch rate ratio of the carbon film relative to the resist film was at most 0.42. Therefore, it is expected that when the carbon film is etched using the resist pattern as a mask, the resist film may be disappeared in the etching step.

TABLE 2

| | etch rate [nm/min] | | |
|---|---|---|---|
| | E-1 | E-2 | E-3 |
| R1 | 25 | 28 | 1680 |
| R2 | 30 | 32 | 1850 |
| R3 | 27 | 30 | 1420 |
| 1-1 | 364 | 345 | — |
| 1-2 | 160 | 180 | — |
| 1-3 | 400 | 385 | — |
| 1-4 | 150 | 165 | — |
| 1-5 | 182 | 175 | — |
| 1-6 | 120 | 118 | — |
| 1-7 | 385 | 365 | — |
| 1-8 | 135 | 143 | — |
| 1-9 | 150 | 156 | — |
| 1-10 | 190 | 178 | — |
| 1-11 | 105 | 130 | — |
| 1-12 | 120 | 128 | — |
| carbon | — | — | 600 |

Then, the etching rates of the resist films, the etching masks (polysilanes) and $SiO_2$ films were compared with each other under the conditions of (E-4) and (E-5). These conditions were determined supposing that the $SiO_2$ films were etched with the resist patterns and polysilane film patterns being employed as a mask.

(E-4): The resist films, polysilane films and $SiO_2$ films were etched by making use of a magnetron RIE apparatus under the conditions of; 50 sccm in $CHF_3$ flow rate; 10 mTorr in vacuum degree; and 200 W in induction power. The results are shown in Table 3.

(E-5): The resist films, polysilane films and $SiO_2$ films were etched by making use of a magnetron RIE apparatus under the conditions of; 50 sccm in $CF_4$ flow rate; 20 sccm in $H_2$ flow rate; 12 mTorr in vacuum degree; 200 W in induction power; and 60° C. in substrate temperature. The results are shown in Table 3.

The followings can be seen from the results shown in Table 3. Namely, under the conditions of (E-4), the etching rate of the $SiO_2$ films indicated as high as not less than 3.7 times that of any of the resist films and polysilane films. On the other hand, under the condition of (E-5), the etch rate ratio of the $SiO_2$ films relative to the resist film was at most 1.8, whereas the etch rate ratio of the $SiO_2$ films relative to the polysilane film was 5.1 or more. These results demonstrate that the polysilane of this invention can be employed as an effective etching mask for an $SiO_2$ film.

TABLE 3

| | etch rate [nm/min] | |
|---|---|---|
| | E-4 | E-5 |
| R1 | 42 | 205 |
| R2 | 48 | 242 |

TABLE 3-continued

| | etch rate [nm/min] | |
|---|---|---|
| | E-4 | E-5 |
| R3 | 58 | 185 |
| 1-1 | 35 | 42 |
| 1-2 | 42 | 48 |
| 1-3 | 52 | 59 |
| 1-4 | 40 | 44 |
| 1-5 | 42 | 48 |
| 1-6 | 38 | 44 |
| 1-7 | 62 | 65 |
| 1-8 | 32 | 35 |
| 1-9 | 48 | 51 |
| 1-10 | 46 | 49 |
| 1-11 | 52 | 55 |
| 1-12 | 48 | 55 |
| $SiO_2$ | 230 | 330 |

EXAMPLE 2

An $SiO_2$ film having a thickness of 500 nm was formed on a silicon wafer by means of a CVD method. Then, a solution of the polysilane of Example 1-1 (LPS-1/anisole) was coated on the $SiO_2$ film and baked at 160° C. for 120 seconds to form a polysilane film.

When the complex refractive index of the polysilane film was measured at a wavelength of 248 nm by means of spectroellipsometry, complex refractive indexes of; n=2.10, k=0.30 were obtained. As for the complex refractive indexes at a wavelength of 248 nm of each of the resist film, the $SiO_2$ film and the silicon substrate, the following values were employed.

| | n | k |
|---|---|---|
| Resist | 1.72 | 0.02 |
| $SiO_2$ | 1.52 | 0.02 |
| Silicon substrate | 1.50 | 3.42 |

Then, supposing that a chemically amplified positive type resist (TDUR-P007, Tokyo Ohka Kogyo Co., Ltd.) was to be formed on the polysilane film, the reflectance at the interface of resist/polysilane in relative to the thickness of the polysilane film was calculated based on the aforementioned values of complex refractive index. The results are shown in FIG. 6.

Figure 6:
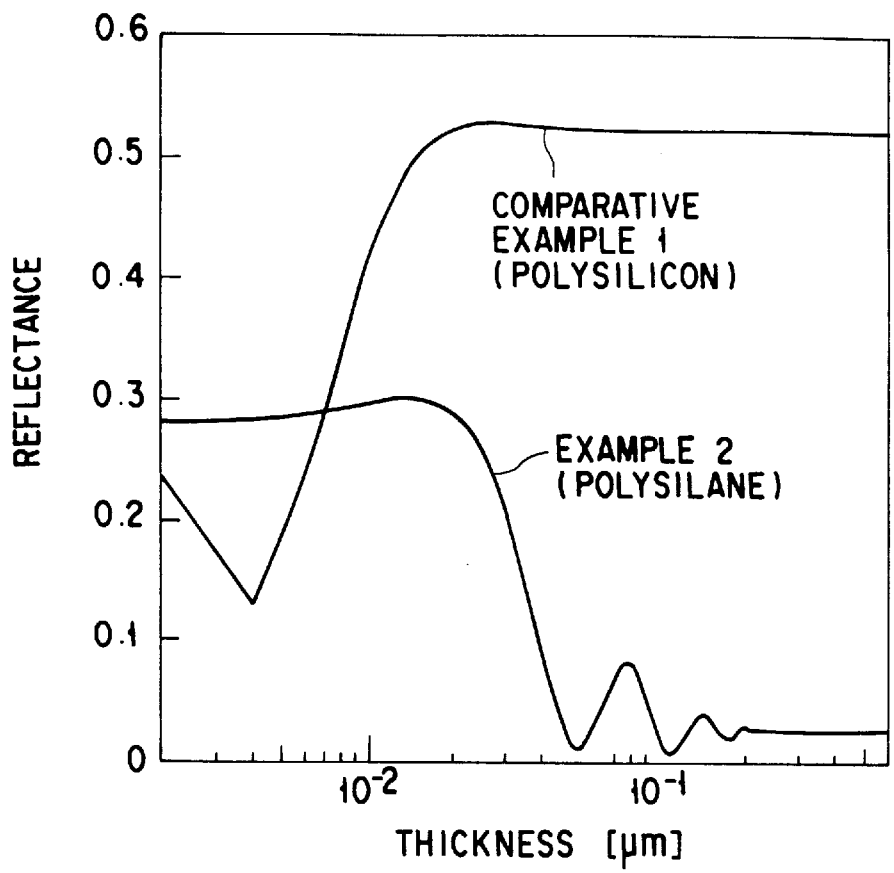
FIG. 6 is a graph illustrating a reflectance at an interface between the resist and polysilane in Example 2.

As seen from FIG. 6, when a polysilane film and a resist film are to be formed on an $SiO_2$ film having a thickness of 500 nm, if the thickness of the polysilane film is increased in some degree, the reflectance at the interface of resist/polysilane is expected to be extremely minimized so that the generation of the standing wave in the resist film at the occasion of exposure can be prevented.

Likewise, the complex refractive index of other polysilanes was measured, the results being shown in Table 4. The calculated results on the reflectance at the interface of resist/polysilane in relative to the thickness of polysilane film for other kinds of polysilane were the same as those shown in FIG. 6.

TABLE 4

| polysilane | Mw | n | k |
|---|---|---|---|
| LPS-2 | 3400 | 2.10 | 0.40 |
| LPS-4 | 2150 | 2.10 | 0.55 |
| LPS-5 | 15000 | 2.0 | 0.20 |
| LPS-23 | 4200 | 2.10 | 0.35 |

Based on the aforementioned results, an $SiO_2$ film, a polysilane film and a resist film were successively formed on a silicon wafer, and then the exposure and development of the resist film were performed to obtain a resist pattern.

An $SiO_2$ film having a thickness of 500 nm was formed on a silicon wafer by means of a CVD method. A solution of polysilane of Example 1-1 was coated on this $SiO_2$ film and then baked at 160° C. for 120 seconds to form a polysilane film having a thickness of 250 nm. Then, a chemically amplified positive resist (TDUR-P007) was coated on this polysilane film and baked at 98° C. for 120 seconds to form a resist film having a thickness of 200 nm. Then, the resist film was exposed through a mask to light with a dosage of 30 mJ/cm$^2$, which was effected from a reduction projection stepper employing KrF excimer laser (wavelength: 248 nm) as a light source. Subsequently, the resist was subjected to post-baking at 98° C. for 120 seconds, and then to development with a 0.21N TMAH developing solution thereby to form a line-and-space pattern having a line width of 0.18 $\mu$m. At this moment, the thickness of the resist pattern had been reduced to 180 nm. When the cross-section of the resist pattern thus obtained was observed by means of an SEM, the formation of corrugation due to a standing wave was not recognized on the side wall of the resist pattern.

Figure 7:
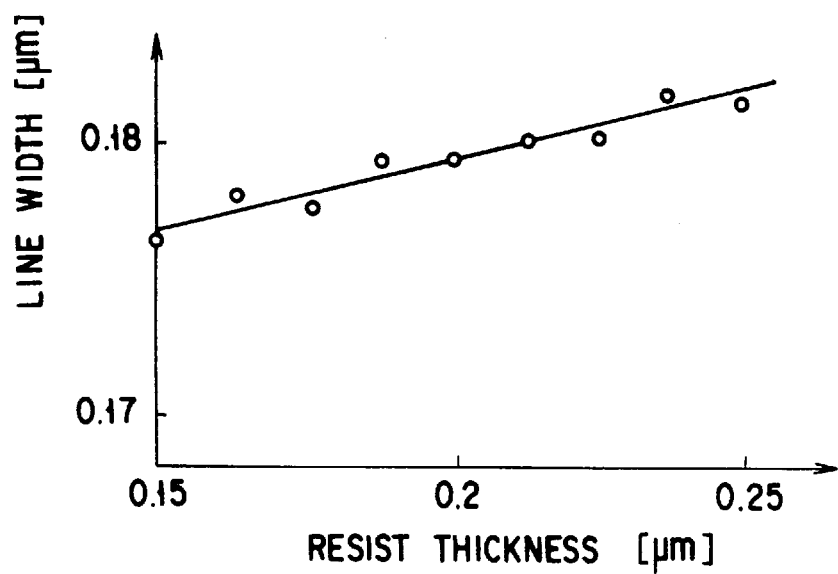
FIG. 7 is a graph illustrating the dependency of the dimension of resist pattern on the thickness of resist film in Example 2.

Additionally, a resist pattern was formed under the same conditions as described above except that the thickness of the resist film was varied within the range of from 150 to 250 nm (the thickness of the $SiO_2$ film was fixed to 500 nm), and the dimension of the resultant resist pattern was measured to obtain the results shown in FIG. 7. Likewise, a resist pattern was formed under the same conditions as described above except that the thickness of the $SiO_2$ film was varied within the range of from 450 to 550 nm (the thickness of the resist film was fixed to 200 nm), and the dimension of the resultant resist pattern was measured to obtain the results shown in FIG. 8. It will be seen from these results that the fluctuation in dimension of the resist pattern due to the changes in thickness of the resist film or $SiO_2$ film is minimal. This may be attributed to the fact that the reflecting light at the interface of resist film/polysilane film as well as the reflecting light from the $SiO_2$ film to the resist film was suppressed. Further, when the focus margin was examined with an optimum exposure dosage, it was found as being 1.0 $\mu$m, indicating that it was possible to assure a sufficient process margin.

Next, an $SiO_2$ film, a polysilane film and a resist film were successively formed on a silicon wafer, and then exposure and development of the resist film were performed to obtain a resist pattern. Then, by making use of the resist pattern, the polysilane film and $SiO_2$ film were etched.

Namely, after the resist film was treated in the same manner as described above to obtain a line-and-space pattern having a line width of 0.18 $\mu$m, the polysilane film was etched through this resist pattern (mask) using a magnetron RIE apparatus under the conditions of; 20 sccm in $Cl_2$ flow rate; 30 mTorr in vacuum degree; and 300 W in induction power. As a result, the phenomenon that the resist pattern was disappeared in the middle of etching was not recognized at all. The profile of the side wall of the polysilane film after etching was vertical (i.e. tapering was not recognized), and the discrepancy in dimension thereof in relative to the dimension of the resist pattern before etching was not recognized at all. The thickness of the resist film remaining after the etching was 100 $\mu$m.

Meanwhile, when the resist film and polysilane film were individually formed, and the etching rates thereof were measured under the same conditions as described above, the etching rate of the resist film was 25 nm/min, that of the polysilane film was 165 nm/min, and the etch rate ratio of polysilane/resist was 6.6.

Next, the $SiO_2$ film was etched through the resist pattern and the polysilane pattern (both being used as a mask) using a magnetron RIE apparatus under the conditions of; 30 sccm in $C_4H_8$ flow rate; 160 sccm in Ar flow rate; 3 mTorr in vacuum degree; and 350 W in induction power. As a result, the phenomenon that the polysilane pattern was disappeared in the middle of etching was not recognized at all. The profile of the side wall of the $SiO_2$ film after etching was vertical (i.e. tapering was not recognized), and the discrepancy in dimension thereof in relative to the dimension before etching of the resist pattern was not recognized at all.

Meanwhile, when the resist film, polysilane film and $SiO_2$ film were individually formed, and the etching rates thereof were measured under the same conditions as described above, the etching rate of the resist film was 45 nm/min, that of the polysilane film was 34 nm/min, and that of the $SiO_2$ film was 230 nm/min. The etch rate ratio of $SiO_2$/polysilane was 6.8 and the etch rate ratio of $SiO_2$/resist was 5.1, indicating that the resist and polysilane functioned excellently as an etching mask for the $SiO_2$ film.

When peeling of the resist was performed after the processing of the $SiO_2$ film, using a downflow etching apparatus under the conditions of; 20 sccm in $O_2$ flow rate; 8 mTorr in vacuum degree; and 200 W in induction power, it was possible to completely remove the resist film. When the infrared absorption spectrum of the polysilane film was measured after the removal of the resist film, an absorption by the Si—O—Si bond was observed at 1000 to 1200 cm$^{-1}$, indicating a vitrification of the polysilane due to its exposure to the oxygen plasma.

Finally, when the silicon wafer bearing these patterns was immersed in a dilute aqueous solution of hydrofluoric acid (hydrofluoric acid:pure water=1:500) for 90 seconds, the vitrified polysilane film could be selectively peeled off without inviting the etching of the $SiO_2$ film. Alternatively, if the vitrified polysilane film was subjected to an etching under the conditions of; 30 sccm in $CF_4$ flow rate; 40 sccm in $O_2$ flow rate; 35 mTorr in vacuum degree; and 800 W in induction power, it was possible to selectively peel off the vitrified polysilane film without inviting the etching of the $SiO_2$ film.

EXAMPLE 3

In this example, a polysilane having a repeating unit represented by the general formula (LPS-III) was employed to perform the experiment.

A resist film, an etching mask and an insulating film were separately formed on a silicon wafer. Then, the optical characteristics of the etching mask was measured. Furthermore, the etching rate of each film formed separately was measured under a predetermined etching condition.

As for the resist, the same materials as in Example 1, i.e., R1, R2 and R3 were employed. Each of these resists was spin-coated on the silicon wafer and then baked to form a resist film having a thickness of 500 nm.

Among these etching masks, those consisted of the polysilane films according to this invention were formed by making use of 7 kinds of polysilane solutions shown in Table 5. Namely, each polysilane solution was spin-coated on a silicon wafer, and baked at 160° C. for 60 seconds to form a resist film having a thickness of 500 nm.

TABLE 5

| sample | polysilane | additive | solvent |
|---|---|---|---|
| 3-1 | [LPS-25] Mw = 12000 10 g | — | anisole 90 g |
| 3-2 | [LPS-26] Mw = 9500 10 g | — | xylene 90 g |
| 3-3 | [LPS-27] Mw = 8500 10 g | — | xylene 90 g |
| 3-4 | [LPS-30] Mw = 7000 10 g | — | xylene 90 g |
| 3-5 | [LPS-35] Mw = 9000 5 g [LPS-25] Mw = 12000 10 g | — | xylene 85 g |
| 3-6 | [LPS-37] Mw = 8000 10 g | polysulfone 10 g | 85 g |
| 3-7 | [LPS-25] Mw = 12000 10 g | coumarin dye 5 g | xylene 85 g |

As for the etching masks to be employed as comparative examples, a polysilane film using the conventional polysilane, a carbon film, a novolak resin film, a polysulfone film, a polyimide film and a polysilicon film were respectively formed.

The polysilane films using the conventional polysilanes were formed as described below. Namely, the PS-C1 film was formed by coating a solution of poly (cyclohexylmethylsilane) represented by the following chemical formula (PS-C1), having an average molecular weight of 18000 and dissolved in xylene on a silicon wafer, and by baking it for 2 minutes at 160° C. The PS-C2 film was formed by coating a solution of poly (cyclohexylmethylsilane-diphenylsilane) represented by the following chemical formula (PS-C2) and dissolved in xylene on a silicon wafer, and by baking it for 2 minutes at 160° C.

[PS-C1]

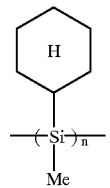

-continued

[PS-C2]

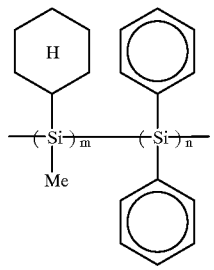

The carbon film was formed in the same manner as described in Example 1.

The novolak resin film was formed by spin-coating a solution of novolak resin having a molecular weight of 6000 and dissolved in ethyl lactate on the silicon wafer, and by baking it for 180 seconds at 320° C.

The polysulfone film was formed by spin-coating a solution of polysulfone resin having a molecular weight of 5000 and dissolved in cyclohexanone on the silicon wafer, and by baking it for 90 seconds at 220° C.

The polyimide film was formed by spin-coating a solution of polyimide resin having a molecular weight of 5000 and dissolved in cyclohexanone on the silicon wafer, and by baking it for 90 seconds at 220° C.

The polysilicon film was deposited by means of a CVD method on the silicon wafer to a thickness of 500 nm.

The insulating film employed was formed of an $SiO_2$ film or an SiN film and deposited by means of a CVD method on the silicon wafer to a thickness of 500 nm.

As for the optical characteristics of various kinds of etching mask, the complex refractive index and surface reflectance of these etching masks were measured. The measurement of these characteristics was performed by making use of laser beams having a wavelength of 248 nm or 193 nm. The results of the measurement are shown in Table 6.

The followings can be said from Table 6. Namely, the surface reflectances of the polysilane films of Examples 3-1 to 3-7 which comprise the polysilanes of this invention as well as the surface reflectances of the polysilane films employing the polysilanes of the prior art were 5% or less. However, the PS-C1 film and PS-C2 film are inadvantageous in terms of reflection-preventing function, since the value of k in these films is relatively low. The surface reflectances of the carbon film, novolak resin film, polysulfone film and polyimide film of the prior art were 7% or less. However, the surface reflectance of the polysilicon film was as high as 45%. Therefore, if a resist film is formed on a polysilicon film and exposed to light, a strong standing wave may be generated inside the resist film, thereby giving rise to the problem that the side wall of the resist pattern to be formed after developing treatment thereof may become corrugated in shape.

TABLE 6

| sample | Complex index of refraction at 248 nm n | k | Reflectance at 248 nm [%] | Complex index of refraction at 193 nm n | k | Reflectance at 193 nm [%] |
|---|---|---|---|---|---|---|
| 3-1 | 2.01 | 0.45 | 2 | 2.03 | 0.70 | 3 |
| 3-2 | 2.03 | 0.50 | 3 | 2.04 | 0.75 | 4 |
| 3-3 | 1.98 | 0.48 | 2 | 2.00 | 0.73 | 3 |
| 3-4 | 2.00 | 0.47 | 2 | 2.01 | 0.71 | 3 |
| 3-5 | 2.00 | 0.46 | 2 | 2.01 | 0.71 | 3 |
| 3-6 | 1.95 | 0.51 | 2 | 1.97 | 0.68 | 3 |
| 3-7 | 1.98 | 0.50 | 2 | 2.00 | 0.75 | 3 |
| PS-C1 | 1.62 | 0.13 | 2 | 1.59 | 0.24 | 3 |
| PS-C2 | 1.65 | 0.19 | 3 | 1.62 | 0.35 | 4 |
| carbon | 1.49 | 0.69 | 6 | 1.72 | 0.78 | 7 |
| novolak | 1.60 | 3.61 | 5 | 1.42 | 0.59 | 6 |
| polysulfone | 1.78 | 0.24 | 6 | 1.35 | 0.62 | 7 |
| polyimide | 1.64 | 0.48 | 6 | 1.45 | 0.79 | 7 |
| polysilicon | 1.60 | 3.61 | 45 | 1.32 | 4.02 | 47 |

The etching rates of the resist film, polysilane film and polysilicon film were measured under the etching conditions of the aforementioned (E-1) on the assumption that the polysilane film and polysilicon film were etched with the resist pattern being employed as a mask. Further, the etching rates of the resist film, carbon film, novolak resin film, polysulfone film and polyimide film were measured under the etching conditions of the aforementioned (E-3) on the assumption that the carbon film, novolak resin film, polysulfone film and polyimide film were etched with the resist pattern being employed as a mask. The results measured are shown in Table 7.

The followings can be said from the results shown in Table 7. Namely, under the conditions of (E-1), the etching rate of the polysilane films according to Examples 3-1 to 3-7 was at least 3.5 times higher than that of the resist films. Therefore, the polysilanes of this invention can be etched at a high etch rate ratio even in the case where the resist pattern is employed as a mask. Whereas, the etching rate of the PS-C1 film and PS-C2 film in relative to the resist film was as low as 2 or so. Furthermore, a deterioration in quality of the film due to the etching was recognized in both PS-C1 film and PS-C2 film. Since the surface reflectance of the polysilicon film is fairly high, the film is not suited for use as an etching mask. On the other hand, under the condition of (E-3), the etch rate ratio of the carbon film, novolak resin film, polysulfone film and polyimide film in relative to the resist film was at most 0.37, 0.91, 1.39 and 1.33, respectively. Since the etch rate ratio of these films is low as described above, it would be impossible to suitably etch these films with the resist pattern being employed as a mask.

TABLE 7

| | etch rate under [E-1] condition (nm/min) | etch rate under [E-3] condition (nm/min) |
|---|---|---|
| R1 | 25 | 3252 |
| R2 | 30 | 3058 |
| R3 | 27 | 2853 |
| 3-1 | 182 | — |
| 3-2 | 115 | — |
| 3-3 | 195 | — |
| 3-4 | 215 | — |
| 3-5 | 152 | — |

TABLE 7-continued

| | etch rate under [E-1] condition (nm/min) | etch rate under [E-3] condition (nm/min) |
|---|---|---|
| 3-6 | 110 | — |
| 3-7 | 120 | — |
| PS-C1 | 50 | — |
| PS-C2 | 62 | — |
| carbon | — | 1053 |
| novolak | — | 2605 |
| polysulfone | — | 3952 |
| polyimide | — | 3800 |
| polysilicon | 400 | — |

Supposing that the insulation film was etched with the resist patterns and the etching mask pattern being employed as a mask, each film was etched under the conditions of (E-6) set forth below.

(E-6): Each film was etched by making use of a magnetron RIE apparatus under the conditions of; 50 sccm in $C_4H_8$ flow rate; 10 sccm in CO flow rate; 100 sccm in Ar flow rate; 3 sccm in $O_2$ flow rate; 10 mTorr in vacuum degree; and 200 W in induction power. The results are shown in Table 8.

The followings can be said from the results shown in Table 8. Namely, the etching rate of the $SiO_2$ film was at least 13 times higher than that of the polysilane films, while the etching rate of the SiN film was at least 12 times higher than that of the polysilane films. These results demonstrate that the polysilane films of this invention can be suitably employed as an etching mask for these insulating films. The etch rate ratio of the $SiO_2$ film and SiN film in relative to the carbon film is also relatively excellent. However, since the etch rate ratio of the carbon film in relative to the resist film is relatively low, the employment of the carbon film for this purpose is not preferable. Likewise, although the etch rate ratio of the $SiO_2$ film and SiN film in relative to the polysilicon film is relatively excellent, the polysilicon film is disadvantageous as mentioned above in terms of optical characteristics. On the other hand, the etch rate ratio of the $SiO_2$ film and SiN film in relative to the novolak resin film, polysulfone film and polyimide film is relatively low, and moreover the etch rate ratio of the novolak resin film, polysulfone film and polyimide film in relative to the resist film is also relatively low as mentioned above, so that the employment of these novolak resin film, polysulfone film and polyimide film is not preferable.

TABLE 8

| | etch rate under [E-6] condition (nm/min) |
|---|---|
| R1 | 102 |
| R2 | 108 |
| R3 | 188 |
| 3-1 | 16 |
| 3-2 | 15 |
| 3-3 | 10 |
| 3-4 | 14 |
| 3-5 | 15 |
| 3-6 | 18 |
| 3-7 | 17 |
| PS-C1 | 16 |
| PS-C2 | 15 |
| carbon | 25 |
| novolak | 85 |
| polysulfone | 152 |

TABLE 8-continued

|  | etch rate under [E-6] condition (nm/min) |
|---|---|
| polyimide | 123 |
| polysilicon | 15 |
| $SiO_2$ | 240 |
| SiN | 225 |

It will be seen that when the results shown in Tables 6 to 8 are totally examined, the polysilane films according to Examples 3-1 to 3-7 are excellent for use as an etching mask material.

EXAMPLE 4

An $SiO_2$ film having a thickness of 500 nm was formed on a silicon substrate by means of a CVD method. Then, a solution of 10 g of polysilane (LPS-25) (average molecular weight: 12000) in 90 g of xylene was coated on the $SiO_2$ film and baked at 160° C. for 120 seconds to form a polysilane film having a thickness of 250 nm.

When the complex refractive index of the polysilane film was measured at a wavelength of 248 nm by means of spectroellipsometry, complex refractive indexes of; n=2.01, k=0.45 were obtained. Then, a chemically amplified positive resist (APEX-E) was coated on the polysilane film and baked at 98° C. for 120 seconds to form a resist film having a thickness of 200 nm.

When the reflectance at the interface of resist/polysilane was calculated, almost the same curve as that (FIG. 6) in Example 2 was obtained. It will be seen that it was also possible in this case to reduce the magnitude of light reflecting to the resist film by forming a polysilane film on the $SiO_2$ film.

Then, the resist film was exposed through a mask to light with a dosage of 30 mJ/cm$^2$, which was effected from a reduction projection stepper employing KrF excimer laser as a light source. Subsequently, the resist was subjected to post-baking at 98° C. for 120 seconds, and then to development with a 0.21N TMAH developing solution thereby to form a line-and-space pattern having a line width of 0.18 µm. At this moment, the thickness of the resist pattern had been reduced to 180 nm. When the cross-section of the resist pattern thus obtained was observed by means of an SEM, the formation of corrugation due to a standing wave was not recognized on the side wall of the resist pattern.

Figure 8:
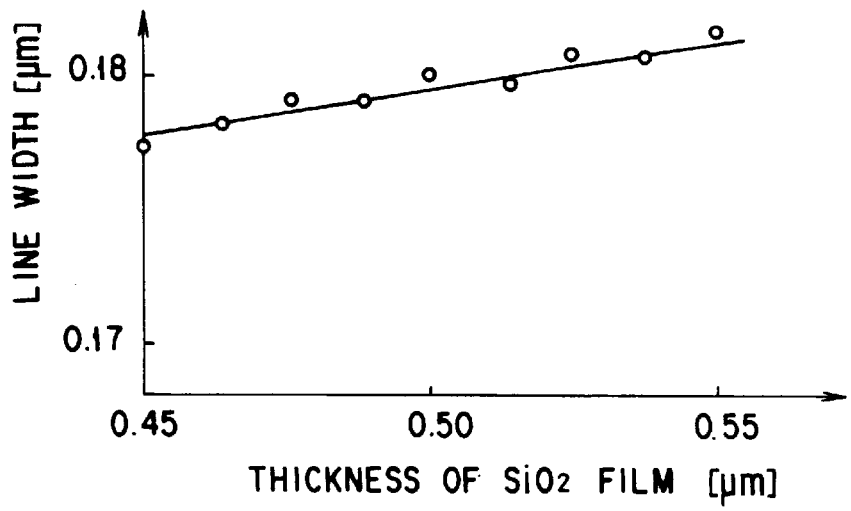
FIG. 8 is a graph illustrating the dependency of the dimension of resist pattern on the thickness of silicon oxide film in Example 2.
Figure 9:
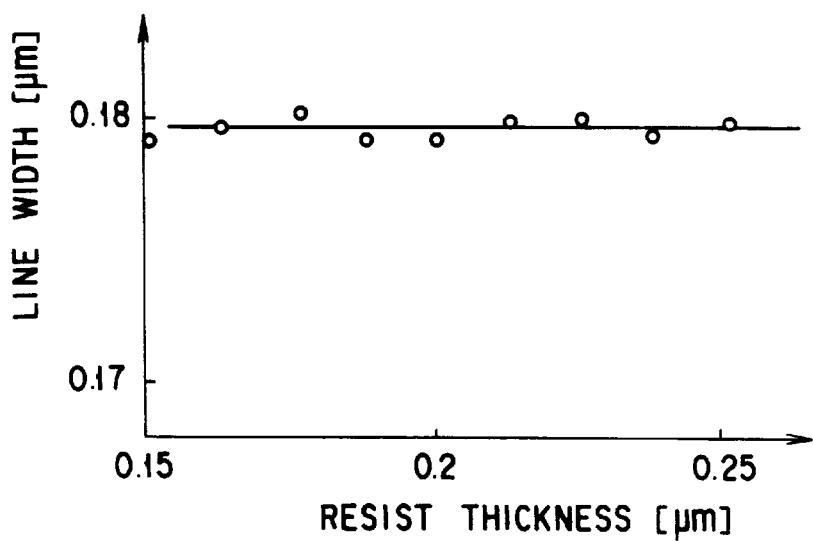
FIG. 9 is a graph illustrating the dependency of the dimension of resist pattern on the thickness of resist film in Example 4.

Additionally, a resist pattern was formed under the same conditions as described above except that the thickness of the resist film was varied within the range of from 150 to 250 nm, and the dimension of the resultant resist pattern was measured to obtain the results shown in FIG. 9. Likewise, a resist pattern was formed under the same conditions as described above except that the thickness of the $SiO_2$ film was varied within the range of from 450 to 550 nm, and the dimension of the resultant resist pattern was measured to obtain almost the same results as shown in FIG. 8. It will be seen from these results that it is also possible in this case to minimize the fluctuation in dimension of the resist pattern. Further, when the focus margin was examined with an optimum exposure dosage, it was found as being 1.0 µm.

When the polysilane film was etched through the resist film (mask) thus formed by means of a magnetron RIE apparatus under the conditions of; 20 sccm in $Cl_2$ flow rate; 30 mTorr in vacuum degree; and 300 W in induction power.

As a result, the phenomenon that the resist pattern was disappeared in the middle of etching was not recognized at all.

When the profile of the side wall of the polysilane film after etching was examined, the profile was vertical, and the discrepancy in dimension thereof in relative to the dimension before etching of the resist pattern was not recognized at all. The thickness of the resist film remaining after the etching was 100 nm.

Meanwhile, when the resist film and polysilane film were individually formed, and the etching rates thereof were measured under the same conditions as described above, the etching rate of the resist film was 25 nm/min, that of the polysilane film was 165 nm/min.

Next, the $SiO_2$ film was etched through the resist pattern and the polysilane pattern (both being used as a mask) using a magnetron RIE apparatus under the conditions of; 30 sccm in $C_4H_8$ flow rate; 160 sccm in Ar flow rate; 3 sccm in $O_2$ flow rate; 3 mTorr in vacuum degree; and 350 W in induction power. As a result, the phenomenon that the polysilane pattern was disappeared in the middle of etching was not recognized at all.

The profile of the side wall of the $SiO_2$ film after etching was vertical, thus indicating excellent anisotropy thereof, and the discrepancy between the dimension X of the bottom of the polysilane film before the etching and the dimension Y of the $SiO_2$ pattern after etching was 5 nm or less, thus indicating a very small discrepancy in dimension.

When the etching rates of the resist film, polysilane film and $SiO_2$ film were individually measured under the same conditions as described above, the etching rate of the resist film was 72 nm/min, that of the polysilane film was 9 nm/min, and that of the $SiO_2$ film was 230 nm/min, indicating that the dry etching resistance of the polysilane film at the occasion of etching the $SiO_2$ film was higher than that of the resist film. It is considered that because of this excellent dry etching resistance of the polysilane film, it was possible to perform the etching of the $SiO_2$ film in a desirable manner, i.e. excellent in perpendicularity and anisotropy without generating a dimensional discrepancy in relative to the dimension of the resist pattern before etching.

When peeling of the resist was performed after the processing of the $SiO_2$ film, using a downflow etching apparatus under the conditions of; 20 sccm in $O_2$ flow rate; 8 mTorr in vacuum degree; and 200 W in induction power, it was possible to completely remove the resist film. When the infrared absorption spectrum of the polysilane film was measured after the removal of the resist film, an absorption by the Si—O—Si bond was observed at 1000 to 1200 cm$^{-1}$, indicating a vitrification of the polysilane due to its exposure to the oxygen plasma.

Finally, when the silicon wafer bearing these patterns was immersed in a dilute aqueous solution of hydrofluoric acid (hydrofluoric acid:pure water=1:500) for 90 seconds, the vitrified polysilane film could be selectively peeled off without inviting the etching of the $SiO_2$ film. Alternatively, if the vitrified polysilane film was subjected to an etching under the conditions of; 30 sccm in $CF_4$ flow rate; 40 sccm in $O_2$ flow rate; 35 mTorr in vacuum degree; and 800 W in induction power, it was possible to selectively peel off the vitrified polysilane film without inviting the etching of the $SiO_2$ film.

EXAMPLE 5

In this example, a polysilane having a repeating unit represented by the general formula (LPS-V) was employed to perform the experiment.

Polysilane films each having a thickness of 500 nm were formed on a silicon wafer by making use of 12 kinds of polysilanes shown in Table 9, and the complex refractive index and surface reflectance of these polysilane films were measured, the results being shown in Table 10. Then, these polysilane films were subjected to etching under the conditions of the aforementioned (E-1) to measure the etching rates of them, the results being shown in Table 11. Furthermore, these polysilane films were subjected to etching under the conditions of the aforementioned (E-6) to measure the etching rates of them, the results being shown in Table 12. It will be seen from these results that the polysilane films according to Examples 5-1 to 5-12 were excellent for use as a material for etching mask.

TABLE 9

| sample | polysilane | additive | solvent |
|---|---|---|---|
| 5-1 | [LPS-40] Mw = 12000 10 g | — | anisole 90 g |
| 5-2 | [LPS-41] Mw = 7000 10 g | — | anisole 90 g |
| 5-3 | [LPS-43] Mw = 5000 10 g | — | anisole 90 g |
| 5-4 | [LPS-44] Mw = 6200 10 g | — | anisole 90 g |
| 5-5 | [LPS-46] Mw = 15000 10 g | — | xylene 90 g |
| 5-6 | [LPS-47] Mw = 5000 10 g | — | xylene 90 g |
| 5-7 | [LPS-48] Mw = 8000 10 g | — | xylene 90 g |
| 5-8 | [LPS-50] Mw = 2000 10 g | — | xylene 90 g |
| 5-9 | [LPS-52] Mw = 4500 10 g | — | xylene 90 g |
| 5-10 | [LPS-53] Mw = 5000 5 g [LPS-40] Mw = 12000 10 g | — | xylene 85 g |
| 5-11 | [LPS-60] Mw = 9000 5 g | polysulfone 10 g | xylene 85 g |
| 5-12 | [LPS-71] Mw = 8000 10 g | coumarin dye 5 g | xylene 85 g |

TABLE 10

| | Complex index of refraction at 248 nm | | Reflectance at 248 nm | Complex index of refraction at 193 nm | | Reflectance at 193 nm |
|---|---|---|---|---|---|---|
| sample | n | k | [%] | n | k | [%] |
| 5-1 | 2.01 | 0.30 | 2 | 1.92 | 0.26 | 3 |
| 5-2 | 1.98 | 0.32 | 3 | 1.92 | 0.35 | 4 |
| 5-3 | 1.92 | 0.35 | 2 | 1.88 | 0.37 | 3 |
| 5-4 | 2.15 | 0.52 | 2 | 2.08 | 0.53 | 3 |
| 5-5 | 2.08 | 0.52 | 5 | 2.02 | 0.53 | 5 |
| 5-6 | 1.82 | 0.48 | 4 | 1.80 | 0.51 | 5 |
| 5-7 | 2.05 | 0.69 | 5 | 2.03 | 0.71 | 5 |
| 5-8 | 1.92 | 0.42 | 3 | 1.90 | 0.45 | 4 |
| 5-9 | 1.82 | 0.35 | 4 | 1.80 | 0.38 | 5 |
| 5-10 | 1.92 | 0.28 | 2 | 1.80 | 0.31 | 3 |
| 5-11 | 2.08 | 0.38 | 2 | 2.06 | 0.41 | 3 |
| 5-12 | 2.15 | 0.28 | 2 | 2.13 | 0.31 | 3 |
| PS-C1 | 1.62 | 0.13 | 2 | 1.59 | 0.24 | 3 |
| PS-C2 | 1.65 | 0.19 | 3 | 1.62 | 0.35 | 4 |
| carbon | 1.49 | 0.69 | 6 | 1.72 | 0.78 | 7 |
| novolak | 1.60 | 3.61 | 5 | 1.42 | 0.59 | 6 |
| polysulfone | 1.78 | 0.24 | 6 | 1.35 | 0.62 | 7 |
| polyimide | 1.64 | 0.48 | 6 | 1.45 | 0.79 | 7 |
| polysilicon | 1.60 | 3.61 | 45 | 1.32 | 4.02 | 47 |

TABLE 11

| sample | etch rate under [E-1] condition (nm/min) |
|---|---|
| R1 | 25 |
| R2 | 30 |
| R3 | 27 |
| 5-1 | 364 |
| 5-2 | 160 |
| 5-3 | 400 |
| 5-4 | 150 |
| 5-5 | 182 |
| 5-6 | 120 |
| 5-7 | 385 |
| 5-8 | 135 |
| 5-9 | 150 |
| 5-10 | 190 |
| 5-11 | 105 |
| 5-12 | 120 |
| PS-C1 | 50 |
| PS-C2 | 62 |
| polysilicon | 400 |

TABLE 12

| sample | etch rate under [E-6] condition (nm/min) |
|---|---|
| R1 | 102 |
| R2 | 108 |
| R3 | 188 |
| 5-1 | 10 |
| 5-2 | 12 |
| 5-3 | 15 |
| 5-4 | 11 |
| 5-5 | 10 |
| 5-6 | 15 |
| 5-7 | 16 |
| 5-8 | 10 |
| 5-9 | 14 |
| 5-10 | 14 |
| 5-11 | 15 |
| 5-12 | 13 |
| PS-C1 | 16 |
| PS-C2 | 15 |
| carbon | 25 |
| novolak | 85 |
| polysulfone | 152 |
| polyimide | 123 |
| polysilicon | 15 |
| $SiO_2$ | 240 |
| SiN | 225 |

EXAMPLE 6

An $SiO_2$ film having a thickness of 500 nm was formed on a silicon substrate by means of a CVD method. Then, a solution of 10 g of polysilane (LPS-40) (average molecular weight: 12000) in 90 g of anisole was coated on the $SiO_2$ film and baked at 100° C. for 120 seconds to form a polysilane film having a thickness of 250 nm.

When the complex refractive index of the polysilane film was measured at a wavelength of 248 nm by means of spectroellipsometry, complex refractive indexes of; n=2.01, k=0.30 were obtained. Then, a chemically amplified positive resist (TDUR-P007) was coated on the polysilane film and baked at 98° C. for 120 seconds to form a resist film having a thickness of 200 nm. When the reflectance at the interface of resist/polysilane was calculated, almost the same curve as that (FIG. 6) in Example 2 was obtained.

Then, the resist film was exposed through a mask to light with a dosage of 30 mJ/cm$^2$, which was effected from a reduction projection stepper employing KrF excimer laser as a light source. Subsequently, the resist was subjected to post-baking at 98° C. for 120 seconds, and then to development with a 0.21N TMAH developing solution thereby to form a line-and-space pattern having a line width of 0.18 µm. At this moment, the thickness of the resist pattern had been reduced to 180 nm. When the cross-section of the resist pattern thus obtained was observed by means of an SEM, the formation of corrugation due to a standing wave was not recognized on the side wall of the resist pattern.

Figure 10:
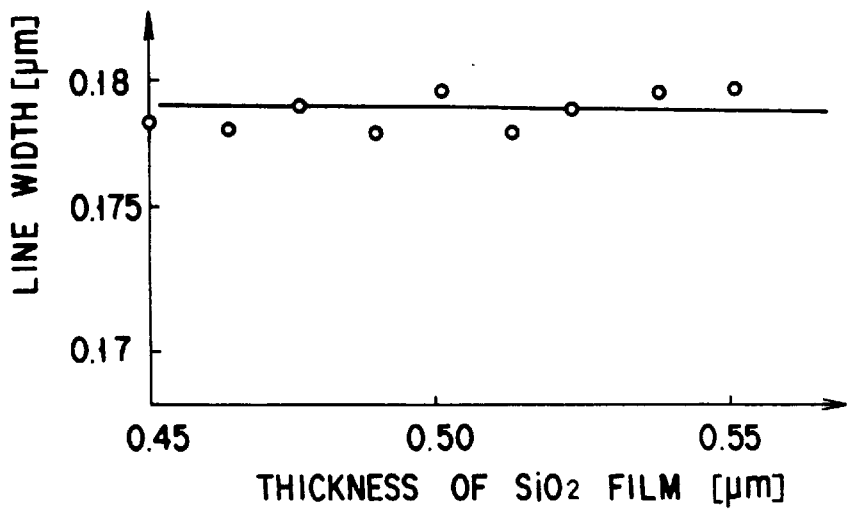
FIG. 10 is a graph illustrating the dependency of the dimension of resist pattern on the thickness of silicon oxide film in Example 6.

Additionally, a resist pattern was formed under the same conditions as described above except that the thickness of the resist film was varied within the range of from 150 to 250 nm, and the dimension of the resultant resist pattern was measured to obtain almost the same results shown in FIG. 7. Likewise, a resist pattern was formed under the same conditions as described above except that the thickness of the SiO$_2$ film was varied within the range of from 450 to 550 nm, and the dimension of the resultant resist pattern was measured to obtain the results shown in FIG. 10. It will be seen from these results that it is also possible in this case to minimize the fluctuation in dimension of the resist pattern. Further, when the focus margin was examined with an optimum exposure dosage, it was found as being 1.0 µm.

When the etching of the polysilane film and of the SiO$_2$ film was performed in the same manner as in Example 4, it was possible to obtain excellent patterns of them.

EXAMPLE 7

In this example, the polysilane dendrimers represented by the general formulas (PSD-I) and (PSD-II) were employed to perform the experiment.

Polysilane dendrimer films each having a thickness of 500 nm were formed on a silicon wafer by making use of 12 kinds of polysilane dendrimers shown in Table 13, and the complex refractive index and surface reflectance of these polysilane dendrimer films were measured, the results being shown in Table 14. Then, these polysilane dendrimer films were subjected to etching under the conditions of the aforementioned (E-1) to measure the etching rates of them, the results being shown in Table 15. Furthermore, these polysilane dendrimer films were subjected to etching under the conditions of the aforementioned (E-6) to measure the etching rates of them, the results being shown in Table 16. It will be seen from these results that the polysilane dendrimer films according to Examples 7-1 to 7-12 were excellent for use as a material for etching mask.

TABLE 13

| sample | polysilane | additive | solvent |
|---|---|---|---|
| 7-1 | [PSD-2] Mw = 1158 10 g | — | 90 g |
| 7-2 | [PSD-3] Mw = 1014 10 g | — | xylene 90 g |
| 7-3 | [PSD-4] Mw = 1614 10 g | — | xylene 90 g |
| 7-4 | [PSD-5] Mw = 6200 10 g | — | xylene 90 g |
| 7-5 | [PSD-7] Mw = 2227 10 g | — | xylene 90 g |
| 7-6 | [PSD-13] Mw = 1828 10 g | — | xylene 90 g |
| 7-7 | [PSD-14] Mw = 2512 10 g | — | xylene 90 g |
| 7-8 | [PSD-17] Mw = 3376 10 g | — | xylene 90 g |
| 7-9 | [PSD-18] Mw = 3376 10 g | — | xylene 90 g |
| 7-10 | [PSD-19] Mw = 2902 5 g [PSD-2] Mw = 1158 10 g | — | xylene 85 g |
| 7-11 | [PSD-20] Mw = 4012 5 g | polysulfone 10 g | xylene 85 g |
| 7-12 | [PSD-20] Mw = 4012 10 g | coumarin dye 5 g | xylene 85 g |

TABLE 14

| | Complex index of refraction at 248 nm | | Reflectance at 248 nm | Complex index of refraction at 193 nm | | Reflectance at 193 nm |
|---|---|---|---|---|---|---|
| sample | n | k | [%] | n | k | [%] |
| 7-1 | 1.92 | 0.25 | 2 | 1.94 | 0.58 | 3 |
| 7-2 | 1.95 | 0.28 | 3 | 1.96 | 0.60 | 4 |
| 7-3 | 1.98 | 0.28 | 2 | 2.00 | 0.62 | 3 |
| 7-4 | 1.96 | 0.26 | 2 | 1.98 | 0.58 | 3 |
| 7-5 | 2.01 | 0.30 | 5 | 2.05 | 0.65 | 5 |
| 7-6 | 1.90 | 0.21 | 4 | 1.93 | 0.54 | 5 |
| 7-7 | 1.95 | 0.28 | 5 | 1.96 | 0.57 | 5 |
| 7-8 | 1.92 | 0.31 | 3 | 1.94 | 0.63 | 4 |
| 7-9 | 1.94 | 0.30 | 4 | 1.95 | 0.61 | 5 |
| 7-10 | 1.94 | 0.29 | 2 | 1.91 | 0.60 | 3 |
| 7-11 | 1.90 | 0.31 | 2 | 1.92 | 0.62 | 3 |
| 7-12 | 1.92 | 0.32 | 2 | 1.94 | 0.64 | 3 |
| PS-C1 | 1.62 | 0.13 | 2 | 1.59 | 0.24 | 3 |
| PS-C2 | 1.65 | 0.19 | 3 | 1.62 | 0.35 | 4 |
| carbon | 1.49 | 0.69 | 6 | 1.72 | 0.78 | 7 |
| novolak | 1.60 | 3.61 | 5 | 1.42 | 0.59 | 6 |
| polysulfone | 1.78 | 0.24 | 6 | 1.35 | 0.62 | 7 |
| polyimide | 1.64 | 0.48 | 6 | 1.45 | 0.79 | 7 |
| polysilicon | 1.60 | 3.61 | 45 | 1.32 | 4.02 | 47 |

TABLE 15

| | etch rate under [E-1] condition (nm/min) |
|---|---|
| R1 | 25 |
| R2 | 30 |
| R3 | 27 |
| 7-1 | 215 |
| 7-2 | 140 |
| 7-3 | 135 |
| 7-4 | 232 |
| 7-5 | 245 |

TABLE 15-continued

| | etch rate under [E-1] condition (nm/min) |
|---|---|
| 7-6 | 280 |
| 7-7 | 255 |
| 7-8 | 134 |
| 7-9 | 120 |
| 7-10 | 160 |
| 7-11 | 125 |
| 7-12 | 140 |
| PS-C1 | 50 |
| PS-C2 | 62 |
| polysilicon | 400 |

TABLE 16

| | etch rate under [E-6] condition (nm/min) |
|---|---|
| R1 | 102 |
| R2 | 108 |
| R3 | 188 |
| 7-1 | 15 |
| 7-2 | 12 |
| 7-3 | 13 |
| 7-4 | 15 |
| 7-5 | 16 |
| 7-6 | 11 |
| 7-7 | 14 |
| 7-8 | 11 |
| 7-9 | 15 |
| 7-10 | 13 |
| 7-11 | 15 |
| 7-12 | 13 |
| PS-C1 | 16 |
| PS-C2 | 15 |
| carbon | 25 |
| novolak | 85 |
| polysulfone | 152 |
| polyimide | 123 |
| polysilicon | 15 |
| $SiO_2$ | 240 |
| SiN | 225 |

EXAMPLE 8

An $SiO_2$ film having a thickness of 500 nm was formed on a silicon substrate by means of a CVD method. Then, a solution of 10 g of the polysilane dendrimer (PSD-14) (average molecular weight: 2512) in 90 g of xylene was coated on the $SiO_2$ film and baked at 160° C. for 120 seconds to form a polysilane dendrimer film having a thickness of 250 nm.

When the complex refractive index of the polysilane dendrimer film was measured at a wavelength of 248 nm by means of spectroellipsometry, complex refractive indexes of; n=1.95, k=0.28 were obtained. Then, a chemically amplified positive resist (APEX-E) was coated on the polysilane dendrimer film and baked at 98° C. for 120 seconds to form a resist film having a thickness of 200 nm. When the reflectance at the interface of resist/polysilane dendrimer was calculated, almost the same curve as that (FIG. 6) in Example 2 was obtained.

Then, the resist film was exposed through a mask to light with a dosage of 30 mJ/cm$^2$, which was effected from a reduction projection stepper employing KrF excimer laser as a light source. Subsequently, the resist was subjected to baking at 98° C. for 120 seconds, and then to development with a 0.21N TMAH developing solution thereby to form a line-and-space pattern having a line width of 0.18 μm. At this moment, the thickness of the resist pattern had been reduced to 180 nm. When the cross-section of the resist pattern thus obtained was observed by means of an SEM, the formation of corrugation due to a standing wave was not recognized on the side wall of the resist pattern.

Additionally, a resist pattern was formed under the same conditions as described above except that the thickness of the resist film was varied within the range of from 150 to 250 nm, and the dimension of the resultant resist pattern was measured to obtain almost the same results shown in FIG. 9. Likewise, a resist pattern was formed under the same conditions as described above except that the thickness of the $SiO_2$ film was varied within the range of from 450 to 550 nm, and the dimension of the resultant resist pattern was measured to obtain the results shown in FIG. 8. It will be seen from these results that it is also possible in this case to minimize the fluctuation in dimension of the resist pattern. Further, when the focus margin was examined with an optimum exposure dosage, it was found as being 1.0 μm.

When the etching of the polysilane dendrimer film and of the $SiO_2$ film was performed in the same manner as in Example 4, it was possible to obtain excellent patterns of them.

EXAMPLE 9

In this example, the polysilane copolymer represented by the general formula (ArPS-I) was employed to perform the experiment.

Polysilane films each having a thickness of 500 nm were formed on a silicon wafer by making use of 12 kinds of polysilane shown in Table 17, and the complex refractive index and surface reflectance of these polysilane films were measured, the results being shown in Table 18. Then, these polysilane films were subjected to etching under the conditions of the aforementioned (E-1) to measure the etching rates of them, the results being shown in Table 19. Furthermore, these polysilane films were subjected to etching under the conditions of the aforementioned (E-6) to measure the etching rates of them, the results being shown in Table 20. It will be seen from these results that the polysilane films according to Examples 9-1 to 9-12 were excellent for use as a material for etching mask.

TABLE 17

| sample | polysilane | additive | solvent |
|---|---|---|---|
| 9-1 | [ArPS-1] Mw = 15000<br>10 g | — | anisole<br>90 g |
| 9-2 | [ArPS-3] Mw = 20000<br>10 g | — | xylene<br>90 g |
| 9-3 | [ArPS-4] Mw = 14000<br>10 g | — | xylene<br>90 g |
| 9-4 | [ArPS-7] Mw = 18000<br>10 g | — | xylene<br>90 g |
| 9-5 | [ArPS-9] Mw = 12000<br>10 g | — | xylene<br>90 g |
| 9-6 | [ArPS-10] Mw = 13000<br>10 g | — | xylene<br>90 g |
| 9-7 | [ArPS-11] Mw = 17000<br>10 g | — | xylene<br>90 g |
| 9-8 | [ArPS-12] Mw = 11000<br>10 g | — | xylene<br>90 g |
| 9-9 | [ArPS-14] Mw = 12000<br>10 g | — | xylene<br>90 g |
| 9-10 | [ArPS-16] Mw = 18000 | — | xylene |

TABLE 17-continued

| sample | polysilane | additive | solvent |
|---|---|---|---|
|  | 5 g |  | 85 g |
|  | [ArPS-1] Mw = 15000 |  |  |
|  | 10 g |  |  |
| 9-11 | [ArPS-19] Mw = 8000 | polysulfone | xylene |
|  | 5 g | 10 g | 85 g |
| 9-12 | [ArPS-19] Mw = 12000 | coumarin | xylene |
|  | 10 g | dye | 85 g |
|  |  | 5 g |  |

TABLE 18

| sample | Complex index of refraction at 248 nm | | Reflectance at 248 nm | Complex index of refraction at 193 nm | | Reflectance at 193 nm |
|---|---|---|---|---|---|---|
|  | n | k | [%] | n | k | [%] |
| 9-1 | 1.82 | 0.25 | 2 | 1.84 | 0.55 | 3 |
| 9-2 | 1.78 | 0.23 | 3 | 1.75 | 0.54 | 4 |
| 9-3 | 1.75 | 0.23 | 2 | 1.77 | 0.53 | 3 |
| 9-4 | 1.68 | 0.35 | 2 | 1.70 | 0.60 | 3 |
| 9-5 | 1.73 | 0.26 | 5 | 1.74 | 0.57 | 5 |
| 9-6 | 1.65 | 0.24 | 4 | 1.66 | 0.52 | 5 |
| 9-7 | 1.78 | 0.24 | 5 | 1.79 | 0.59 | 5 |
| 9-8 | 1.74 | 0.23 | 3 | 1.75 | 0.54 | 4 |
| 9-9 | 1.68 | 0.26 | 4 | 1.70 | 0.59 | 5 |
| 9-10 | 1.70 | 0.23 | 2 | 1.71 | 0.50 | 3 |
| 9-11 | 1.73 | 0.29 | 2 | 1.74 | 0.60 | 3 |
| 9-12 | 1.72 | 0.30 | 2 | 1.74 | 0.58 | 3 |
| PS-C1 | 1.62 | 0.13 | 2 | 1.59 | 0.24 | 3 |
| PS-C2 | 1.65 | 0.19 | 3 | 1.62 | 0.35 | 4 |
| carbon | 1.49 | 0.69 | 6 | 1.72 | 0.78 | 7 |
| novolak | 1.60 | 3.61 | 5 | 1.42 | 0.59 | 6 |
| polysulfone | 1.78 | 0.24 | 6 | 1.35 | 0.62 | 7 |
| polyimide | 1.64 | 0.48 | 6 | 1.45 | 0.79 | 7 |
| polysilicon | 1.60 | 3.61 | 45 | 1.32 | 4.02 | 47 |

TABLE 19

|  | etch rate under [E-1] condition (nm/min) |
|---|---|
| R1 | 25 |
| R2 | 30 |
| R3 | 27 |
| 9-1 | 343 |
| 9-2 | 180 |
| 9-3 | 267 |
| 9-4 | 160 |
| 9-5 | 248 |
| 9-6 | 300 |
| 9-7 | 145 |
| 9-8 | 215 |
| 9-9 | 120 |
| 9-10 | 112 |
| 9-11 | 120 |
| 9-12 | 132 |
| PS-C1 | 50 |
| PS-C2 | 62 |
| polysilicon | 400 |

TABLE 20

|  | etch rate under [E-6] condition (nm/min) |
|---|---|
| R1 | 102 |
| R2 | 108 |
| R3 | 188 |
| 9-1 | 11 |
| 9-2 | 15 |
| 9-3 | 14 |
| 9-4 | 11 |
| 9-5 | 18 |
| 9-6 | 16 |
| 9-7 | 11 |
| 9-8 | 14 |
| 9-9 | 13 |
| 9-10 | 10 |
| 9-11 | 14 |
| 9-12 | 12 |
| PS-C1 | 16 |
| PS-C2 | 15 |
| carbon | 25 |
| novolak | 85 |
| polysulfone | 152 |
| polyimide | 123 |
| polysilicon | 15 |
| $SiO_2$ | 240 |
| SiN | 225 |

EXAMPLE 10

An $SiO_2$ film having a thickness of 500 nm was formed on a silicon substrate by means of a CVD method. Then, a solution of 10 g of the polysilane (ArPS-1) (average molecular weight: 15000) in 90 g of xylene was coated on the $SiO_2$ film and baked at 160° C. for 120 seconds to form a polysilane film having a thickness of 250 nm.

When the complex refractive index of the polysilane film was measured at a wavelength of 248 nm by means of spectroellipsometry, complex refractive indexes of; n=1.82, k=0.25 were obtained. Then, a chemically amplified positive resist (APEX-E) was coated on the polysilane film and baked at 98° C. for 120 seconds to form a resist film having a thickness of 200 nm. When the reflectance at the interface of resist/polysilane was calculated, almost the same curve as that (FIG. 6) in Example 2 was obtained.

Then, the resist film was exposed through a mask to light with a dosage of 30 mJ/cm$^2$, which was effected from a reduction projection stepper employing KrF excimer laser as a light source. Subsequently, the resist was subjected to baking at 98° C. for 120 seconds, and then to development with a 0.21N TMAH developing solution thereby to form a line-and-space pattern having a line width of 0.18 μm. At this moment, the thickness of the resist pattern had been reduced to 180 nm. When the cross-section of the resist pattern thus obtained was observed by means of an SEM, the formation of corrugation due to a standing wave was not recognized on the side wall of the resist pattern.

Additionally, a resist pattern was formed under the same conditions as described above except that the thickness of the resist film was varied within the range of from 150 to 250 nm, and the dimension of the resultant resist pattern was measured to obtain almost the same results shown in FIG. 9. Likewise, a resist pattern was formed under the same conditions as described above except that the thickness of the $SiO_2$ film was varied within the range of from 450 to 550 nm, and the dimension of the resultant resist pattern was measured to obtain the results shown in FIG. 8. It will be seen from these results that it is also possible in this case to minimize the fluctuation in dimension of the resist pattern. Further, when the focus margin was examined with an optimum exposure dosage, it was found as being 1.0 μm.

When the etching of the polysilane film and of the SiO$_2$ film was performed in the same manner as in Example 4, it was possible to obtain excellent patterns of them.

EXAMPLE 11

In this example, the polysilane copolymer represented by the general formula (ArPS-II) was employed to perform the experiment.

Polysilane films each having a thickness of 500 nm were formed on a silicon wafer by making use of 12 kinds of polysilane shown in Table 21, and the complex refractive index and surface reflectance of these polysilane films were measured, the results being shown in Table 22. Then, these polysilane films were subjected to etching under the conditions of the aforementioned (E-1) to measure the etching rates of them, the results being shown in Table 23. Furthermore, these polysilane films were subjected to etching under the conditions of the aforementioned (E-6) to measure the etching rates of them, the results being shown in Table 24. It will be seen from these results that the polysilane films according to Examples 11-1 to 11-12 were excellent for use as a material for etching mask.

TABLE 21

| sample | polysilane | additive | solvent |
|---|---|---|---|
| 11-1 | [ArPS-23] Mw = 17000 10 g | — | anisole 90 g |
| 11-2 | [ArPS-24] Mw = 20000 10 g | — | xylene 90 g |
| 11-3 | [ArPS-25] Mw = 14000 10 g | — | xylene 90 g |
| 11-4 | [ArPS-27] Mw = 18000 10 g | — | xylene 90 g |
| 11-5 | [ArPS-31] Mw = 12000 10 g | — | xylene 90 g |
| 11-6 | [ArPS-32] Mw = 13000 10 g | — | xylene 90 g |
| 11-7 | [ArPS-33] Mw = 17000 10 g | — | xylene 90 g |
| 11-8 | [ArPS-34] Mw = 11000 10 g | — | xylene 90 g |
| 11-9 | [ArPS-36] Mw = 12000 10 g | — | xylene 90 g |
| 11-10 | [ArPS-43] Mw = 18000 5 g [ArPS-23] Mw = 15000 10 g | — | xylene 85 g |
| 11-11 | [ArPS-44] Mw = 9000 5 g | polysulfone 10 g | xylene 85 g |
| 11-12 | [ArPS-44] Mw = 9000 10 g | coumarin dye 5 g | xylene 85 g |

TABLE 22

| sample | Complex index of refraction at 248 nm | | Reflectance at 248 nm [%] | Complex index of refraction at 193 nm | | Reflectance at 193 nm [%] |
|---|---|---|---|---|---|---|
| | n | k | | n | k | |
| 11-1 | 2.00 | 0.30 | 2 | 2.05 | 0.60 | 3 |
| 11-2 | 1.85 | 0.23 | 3 | 1.85 | 0.54 | 4 |
| 11-3 | 1.95 | 0.25 | 2 | 2.00 | 0.58 | 3 |
| 11-4 | 2.10 | 0.35 | 2 | 2.11 | 0.63 | 3 |
| 11-5 | 2.05 | 0.32 | 5 | 2.08 | 0.68 | 5 |
| 11-6 | 1.98 | 0.26 | 4 | 2.00 | 0..54 | 5 |
| 11-7 | 1.95 | 0.29 | 5 | 1.98 | 0.60 | 5 |
| 11-8 | 1.85 | 0.23 | 3 | 1.86 | 0.54 | 4 |
| 11-9 | 1.90 | 0.26 | 4 | 1.91 | 0.59 | 5 |
| 11-10 | 2.00 | 0.30 | 2 | 2.01 | 0.65 | 3 |
| 11-11 | 2.05 | 0.35 | 2 | 2.10 | 0.70 | 3 |
| 11-12 | 3.01 | 0.37 | 2 | 2.03 | 0.72 | 3 |
| PS-C1 | 1.62 | 0.13 | 2 | 1.59 | 0.24 | 3 |
| PS-C2 | 1.65 | 0.19 | 3 | 1.62 | 0.35 | 4 |
| carbon | 1.49 | 0.69 | 6 | 1.72 | 0.78 | 7 |
| novolak | 1.60 | 3.61 | 5 | 1.42 | 0.59 | 6 |
| polysulfone | 1.78 | 0.24 | 6 | 1.35 | 0.62 | 7 |
| polyimide | 1.64 | 0.48 | 6 | 1.45 | 0.79 | 7 |
| polysilicon | 1.60 | 3.61 | 45 | 1.32 | 4.02 | 47 |

TABLE 23

| | etch rate under [E-1] condition (nm/min) |
|---|---|
| R1 | 25 |
| R2 | 30 |
| R3 | 27 |
| 11-1 | 265 |
| 11-2 | 190 |
| 11-3 | 212 |
| 11-4 | 280 |
| 11-5 | 198 |
| 11-6 | 150 |
| 11-7 | 165 |
| 11-8 | 120 |
| 11-9 | 115 |
| 11-10 | 145 |
| 11-11 | 110 |
| 11-12 | 105 |
| PS-C1 | 50 |
| PS-C2 | 62 |
| polysilicon | 400 |

TABLE 24

| | etch rate under [E-6] condition (nm/min) |
|---|---|
| R1 | 102 |
| R2 | 108 |
| R3 | 188 |
| 11-1 | 10 |
| 11-2 | 16 |
| 11-3 | 12 |
| 11-4 | 13 |
| 11-5 | 10 |
| 11-6 | 11 |
| 11-7 | 14 |
| 11-8 | 18 |
| 11-9 | 12 |
| 11-10 | 15 |
| 11-11 | 13 |
| 11-12 | 12 |
| PS-C1 | 16 |
| PS-C2 | 15 |
| carbon | 25 |

TABLE 24-continued

|  | etch rate under [E-6] condition (nm/min) |
|---|---|
| novolak | 85 |
| polysulfone | 152 |
| polyimide | 123 |
| polysilicon | 15 |
| SiO$_2$ | 240 |
| SiN | 225 |

EXAMPLE 12

An SiO$_2$ film having a thickness of 500 nm was formed on a silicon substrate by means of a CVD method. Then, a solution of 10 g of polysilane (ArPS-23) (average molecular weight: 17000) in 90 g of xylene was coated on the SiO$_2$ film and baked at 160° C. for 120 seconds to form a polysilane film having a thickness of 250 nm.

When the complex refractive index of the polysilane film was measured at a wavelength of 248 nm by means of spectroellipsometry, complex refractive indexes of; n=1.82, k=0.25 were obtained. Then, a chemically amplified positive resist (APEX-E) was coated on the polysilane film and baked at 98° C. for 120 seconds to form a resist film having a thickness of 200 nm. When the reflectance at the interface of resist/polysilane was calculated, almost the same curve as that (FIG. 6) in Example 2 was obtained.

Then, the resist film was exposed through a mask to light with a dosage of 30 mJ/cm$^2$, which was effected from a reduction projection stepper employing KrF excimer laser as a light source. Subsequently, the resist was subjected to baking at 98° C. for 120 seconds, and then to development with a 0.21N TMAH developing solution thereby to form a line-and-space pattern having a line width of 0.18 μm. At this moment, the thickness of the resist pattern had been reduced to 180 nm. When the cross-section of the resist pattern thus obtained was observed by means of an SEM, the formation of corrugation due to a standing wave was not recognized on the side wall of the resist pattern.

Additionally, a resist pattern was formed under the same conditions as described above except that the thickness of the resist film was varied within the range of from 150 to 250 nm, and the dimension of the resultant resist pattern was measured to obtain almost the same results shown in FIG. 9. Likewise, a resist pattern was formed under the same conditions as described above except that the thickness of the SiO$_2$ film was varied within the range of from 450 to 550 nm, and the dimension of the resultant resist pattern was measured to obtain the results shown in FIG. 8. It will be seen from these results that it is also possible in this case to minimize the fluctuation in dimension of the resist pattern. Further, when the focus margin was examined with an optimum exposure dosage, it was found as being 1.0 μm.

When the etching of the polysilane film and of the SiO$_2$ film was performed in the same manner as in Example 4, it was possible to obtain excellent patterns of them.

EXAMPLE 13

In this example, an organosilicon polymer having silacyclopentadiene (silol ring) in the main chain was employed to perform the experiment.

Organosilicon polymer films each having a thickness of 500 nm were formed on a silicon wafer by making use of 12 kinds of organosilicon polymer shown in Table 25, and the complex refractive index and surface reflectance of these organosilicon polymer films were measured, the results being shown in Table 26. Then, these organosilicon polymer films were subjected to etching under the conditions of the aforementioned (E-1) to measure the etching rates of them, the results being shown in Table 27. Furthermore, these organosilicon polymer films were subjected to etching under the conditions of the aforementioned (E-6) to measure the etching rates of them, the results being shown in Table 28. It will be seen from these results that the organosilicon polymer films according to Examples 13-1 to 13-12 were excellent for use as a material for etching mask.

TABLE 25

| sample | polysilane | additive | solvent |
|---|---|---|---|
| 13-1 | [SL-I1] Mw = 18000 10 g | — | anisole 90 g |
| 13-2 | [SL-I2] Mw = 15000 10 g | — | xylene 90 g |
| 13-3 | [SL-I4] Mw = 17000 10 g | — | xylene 90 g |
| 13-4 | [SL-I7] Mw = 18000 10 g | — | xylene 90 g |
| 13-5 | [SL-I14] Mw = 8000 10 g | — | xylene 90 g |
| 13-6 | [SL-IV3] Mw = 20000 10 g | — | xylene 90 g |
| 13-7 | [SL-VI1] Mw = 17000 10 g | — | xylene 90 g |
| 13-8 | [SL-VII1] Mw = 11000 10 g | — | xylene 90 g |
| 13-9 | [SL-V112) Mw = 12000 10 g | — | xylene 90 g |
| 13-10 | [SL-I1) Mw = 18000 5 g [SL-VII1) Mw = 15000 10 g | — | xylene 85 g |
| 13-11 | [SL-V113) Mw = 8000 5 g | polysulfone 10 g | xylene 85 g |
| 13-12 | [SL-V118) Mw = 12000 10 g | coumarin dye 5 g | xylene 85 g |

TABLE 26

| | Complex index of refraction at 248 nm | | Reflectance at 248 nm | Complex index of refraction at 193 nm | | Reflectance at 193 nm |
|---|---|---|---|---|---|---|
| sample | n | k | [%] | n | k | [%] |
| 13-1 | 1.92 | 0.28 | 3 | 1.93 | 0.58 | 4 |
| 13-2 | 1.95 | 0.27 | 4 | 1.96 | 0.60 | 5 |
| 13-3 | 1.98 | 0.29 | 2 | 1.99 | 0.59 | 2 |
| 13-4 | 1.95 | 0.24 | 3 | 1.96 | 0.55 | 3 |
| 13-5 | 1.92 | 0.30 | 4 | 1.93 | 0.65 | 5 |
| 13-6 | 1.89 | 0.21 | 5 | 1.90 | 0.51 | 4 |
| 13-7 | 1.91 | 0.24 | 4 | 1.92 | 0.55 | 5 |
| 13-8 | 1.94 | 0.25 | 2 | 1.95 | 0.56 | 3 |
| 13-9 | 1.92 | 0.32 | 3 | 1.93 | 0.65 | 3 |
| 13-10 | 1.92 | 0.28 | 2 | 1.92 | 0.65 | 3 |
| 13-11 | 1.89 | 0.32 | 2 | 1.91 | 0.65 | 3 |
| 13-12 | 1.95 | 0.35 | 2 | 1.96 | 0.70 | 3 |
| PS-C1 | 1.62 | 0.13 | 2 | 1.59 | 0.24 | 3 |
| PS-C2 | 1.65 | 0.19 | 3 | 1.62 | 0.35 | 4 |
| carbon | 1.49 | 0.69 | 6 | 1.72 | 0.78 | 7 |
| novolak | 1.60 | 3.61 | 5 | 1.42 | 0.59 | 6 |
| polysulfone | 1.78 | 0.24 | 6 | 1.35 | 0.62 | 7 |

TABLE 26-continued

| sample | Complex index of refraction at 248 nm | | Reflectance at 248 nm [%] | Complex index of refraction at 193 nm | | Reflectance at 193 nm [%] |
|---|---|---|---|---|---|---|
| | n | k | | n | k | |
| polyimide | 1.64 | 0.48 | 6 | 1.45 | 0.79 | 7 |
| polysilicon | 1.60 | 3.61 | 45 | 1.32 | 4.02 | 47 |

TABLE 27

| | etch rate under [E-1] condition (nm/min) |
|---|---|
| R1 | 25 |
| R2 | 30 |
| R3 | 27 |
| 13-1 | 180 |
| 13-2 | 195 |
| 13-3 | 115 |
| 13-4 | 150 |
| 13-5 | 145 |
| 13-6 | 180 |
| 13-7 | 141 |
| 13-8 | 155 |
| 13-9 | 135 |
| 13-10 | 120 |
| 13-11 | 145 |
| 13-12 | 180 |
| PS-C1 | 50 |
| PS-C2 | 62 |
| polysilicon | 400 |

TABLE 28

| | etch rate under [E-6] condition (nm/min) |
|---|---|
| R1 | 102 |
| R2 | 108 |
| R3 | 188 |
| 13-1 | 18 |
| 13-2 | 14 |
| 13-3 | 10 |
| 13-4 | 12 |
| 13-5 | 16 |
| 13-6 | 13 |
| 13-7 | 17 |
| 13-8 | 11 |
| 13-9 | 10 |
| 13-10 | 12 |
| 13-11 | 18 |
| 13-12 | 14 |
| PS-C1 | 16 |
| PS-C2 | 15 |
| carbon | 25 |
| novolak | 85 |
| polysulfone | 152 |
| polyimide | 123 |
| polysilicon | 15 |
| $SiO_2$ | 240 |
| SiN | 225 |

EXAMPLE 14

An $SiO_2$ film having a thickness of 500 nm was formed on a silicon substrate by means of a CVD method. Then, a solution of 10 g of the organosilicon polymer (SL-I 1) (average molecular weight: 18000) in 90 g of xylene was coated on the $SiO_2$ film and baked at 160° C. for 120 seconds to form a organosilicon polymer film having a thickness of 250 nm.

When the complex refractive index of the organosilicon polymer film was measured at a wavelength of 248 nm by means of spectroellipsometry, complex refractive indexes of; n=1.92, k=0.28 were obtained. Then, a chemically amplified positive resist (APEX-E) was coated on the organosilicon polymer film and baked at 98° C. for 120 seconds to form a resist film having a thickness of 200 nm. When the reflectance at the interface of resist/organosilicon polymer was calculated, almost the same curve as that (FIG. 6) in Example 2 was obtained.

Then, the resist film was exposed through a mask to light with a dosage of 30 mJ/cm², which was effected from a reduction projection stepper employing KrF excimer laser as a light source. Subsequently, the resist was subjected to baking at 98° C. for 120 seconds, and then to development with a 0.21N TMAH developing solution thereby to form a line-and-space pattern having a line width of 0.18 ||m. At this moment, the thickness of the resist pattern had been reduced to 180 nm. When the cross-section of the resist pattern thus obtained was observed by means of an SEM, the formation of corrugation due to a standing wave was not recognized on the side wall of the resist pattern.

Additionally, a resist pattern was formed under the same conditions as described above except that the thickness of the resist film was varied within the range of from 150 to 250 nm, and the dimension of the resultant resist pattern was measured to obtain almost the same results shown in FIG. 9. Likewise, a resist pattern was formed under the same conditions as described above except that the thickness of the $SiO_2$ film was varied within the range of from 450 to 550 nm, and the dimension of the resultant resist pattern was measured to obtain the results shown in FIG. 8. It will be seen from these results that it is also possible in this case to minimize the fluctuation in dimension of the resist pattern. Further, when the focus margin was examined with an optimum exposure dosage, it was found as being 1.0 μm.

When the etching of the organosilicon polymer film and of the $SiO_2$ film was performed in the same manner as in Example 4, it was possible to obtain excellent patterns of them.

Comparative Example 1

An $SiO_2$ film having a thickness of 500 nm and a polysilicon film having a thickness of 200 nm were successively formed on a silicon substrate by means of a CVD method. The thickness of the polysilicon film was set to be a necessary thickness for performing etching of the $SiO_2$ film.

The complex refractive indexes of the polysilicon film as measured at a wavelength of 248 nm were; n=1.82, k=0.25. Assuming that a chemically amplified positive resist (TDUR-P007) having a thickness of 200 nm was coated on the polysilicon film, the reflectance at the interface of resist/polysilicon in relative to the thickness of the polysilicon film was calculated to obtain the results shown in FIG. 6. As would be clear from the results shown in FIG. 6, when the resist was formed via the polysilicon film having a thickness of 200 nm on the $SiO_2$ film having a thickness of 500 nm, the reflectance at the interface of resist/polysilicon became as very high as 52.5%, thus implying that it would be impossible to avoid the generation of standing wave in the exposure step.

Then, the chemically amplified positive resist (TDUR-P007) was coated on the polysilicon film and baked at 98°

C. for 120 seconds to obtain a resist film having a thickness of 300 nm. Subsequently, the resist film was subjected to exposure and developing treatments thereby to form a line-and-space pattern having a line width of 0.18 μm. When the cross-section of the resist pattern thus obtained was observed by means of an SEM, the formation of corrugation due to a standing wave was recognized on the side wall of the resist pattern, thus failing to obtain a pattern of excellent shape.

When the APEX-E was substituted for the TDUR-P007 as a resist, the formation of corrugation was also recognized on the side wall of the resist pattern, thus failing to obtain a pattern of excellent shape.

Comparative Example 2

An $SiO_2$ film having a thickness of 500 nm was formed on a silicon substrate by means of a CVD method, and then a carbon film having a thickness of 200 nm was formed on this $SiO_2$ film. The thickness of the carbon film was set to be a necessary thickness for performing etching of the $SiO_2$ film. Then, the chemically amplified positive resist (TDUR-P007) was coated on the carbon film and baked at 98° C. for 120 seconds to obtain a resist film having a thickness of 200 nm. Subsequently, the resist film was subjected to exposure and developing treatments thereby to form a line-and-space pattern having a line width of 0.18 μm. In this case, it was possible to obtain a resist pattern of excellent profile, since the reflectance at the interface of resist/carbon was low.

Then, the carbon film was etched, using the resist pattern as a mask, under the conditions of; 80 sccm in $CF_4$ flow rate; 8 sccm in $O_2$ flow rate; 20 sccm in Ar flow rate; 10 mTorr in vacuum degree; and 200 W in induction power. In this case, the resist pattern was disappeared in the middle of etching step of the carbon film, thus failing obtain a carbon film pattern of desired dimension.

The resist film and the carbon film were separately formed to measure the etching rates of these films under the same conditions as mentioned above, finding that the etching rate of the resist film was 185 nm/min, the etching rate of the carbon film was 65 nm/min, and the etch rate ratio between carbon/resist was 0.35.

When the APEX-E was substituted for the TDUR-P007 as a resist, the resist pattern was disappeared in the middle of etching step of the carbon film, thus failing obtain a carbon film pattern of desired dimension.

Comparative Example 3

An $SiO_2$ film having a thickness of 500 nm was formed on a silicon substrate by means of a CVD method, and then a carbon film having a thickness of 200 nm was formed on this $SiO_2$ film. Then, the chemically amplified positive resist (TDUR-P007) was coated on the carbon film and baked at 98° C. for 120 seconds to obtain a resist film having a thickness of 500 nm. Subsequently, the resist film was subjected to exposure and developing treatments thereby to form a line-and-space pattern having a line width of 0.18 μm. In this case, since the thickness of the resist film was too thick, the focus margin at an optimum exposure dosage was as narrow as 0.3 μm, so that it was impossible to attain a value of 1.0 μm which is generally required in the process of manufacturing a device.

Then, the carbon film was etched, using the resist pattern as a mask, under the conditions of; 80 sccm in $CF_4$ flow rate; 8 sccm in $O_2$ flow rate; 20 sccm in Ar flow rate; 10 mTorr in vacuum degree; and 200 W in induction power. In this case, since the thickness of the resist was thick enough, it was possible to etch the carbon film. However, the profile of the carbon film pattern obtained was of a tapered shape.

When the APEX-E having a thickness of 700 nm was substituted for the TDUR-P007 as a resist, the profile of the carbon film pattern obtained was also of a tapered shape. Furthermore, since the thickness of the resist was too thick, the focus margin at an optimum exposure dosage was as narrow as 0.3 μm, so that it was impossible to attain a value of 1.0 μm which is generally required in the process for manufacturing a device.

Comparative Example 4

An $SiO_2$ film 2 having a thickness of 500 nm was formed on a silicon wafer 1. Then, a solution of polysulfone having an average molecular weight of 6000 in cyclohexanone was spin-coated on the $SiO_2$ film 2, and baked at 225° C. for 90 seconds to obtain a polysulfone film 3 functioning as an anti-reflective coating. The complex refractive indexes of the polysulfone film 3 as measured at a wavelength of 248 nm were; n=1.74, k=0.24. Based on a calculation using these values, the thickness of the polysulfone film 3 was set to 115 nm so as to minimize the reflectance at the interface between resist/polysulfone. Then, the chemically amplified positive resist (APEX-E) was coated on the polysulfone film 3 and baked at 98° C. for 120 seconds to obtain a resist film 4 having a thickness of 300 nm. Subsequently, the resist film 3 was subjected to exposure and developing treatments thereby to form a line-and-space pattern having a line width of 0.18 μm.

Figure 11A:
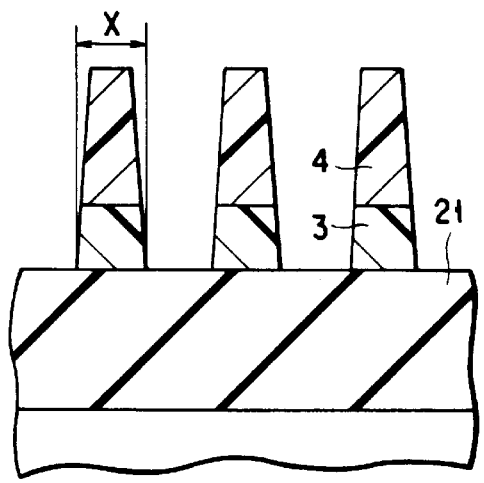
FIGS. 11A and 11B are sectional views illustrating the steps of processing a silicon oxide film by making use of polysulfone as an etching mask.

Then, etching of the polysulfone film was performed, with this resist pattern being employed as a mask, under the conditions of the aforementioned (E-3), the resultant state thereof being shown in FIG. 11A. The pattern of the polysulfone film 3 was relatively excellent in profile. This can be ascribed to the fact that the etching rate of the polysulfone film 3 was relatively high and that the thickness of the polysulfone film 3 was relatively thin.

Figure 11B:
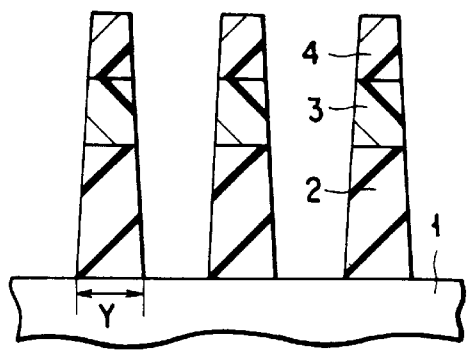

Then, etching of the $SiO_2$ film 2 was performed, with this resist pattern 4 and the polysulfone film pattern 3 being employed as a mask, under the conditions of the aforementioned (E-6), the resultant state thereof being shown in FIG. 11B. As a result, the dimension (Y) of the pattern of $SiO_2$ film 2 after etching was reduced by 20 nm as compared with the dimension (X) of the bottom of the polysulfone film 3 before etching, thus indicating a poor dimension controllability of the resist pattern 4. Furthermore, the profile of the pattern of $SiO_2$ film 2 became tapered.

As for the etching rates of these films under this etching condition were; 152 nm/min in the case of polysulfone, and 102 nm/min in the case of resist, indicating that the dry etching resistance of polysulfone is relatively poor as compared with that of resist. For this reason, the dimension of polysulfone film pattern 3 became reduced during the etching process of the $SiO_2$ film 2, and at the same time, the dimension of the $SiO_2$ film 2 was also reduced and the etched shape thereof became tapered.

EXAMPLE 15

An $SiO_2$ film having a thickness of 500 nm was formed on a silicon substrate by means of a CVD method. Then, a solution of polysilane of Example 1–3 (LPS-3/anisole) was coated on the $SiO_2$ film and baked at 160° C. for 120 seconds to form a polysilane film having a thickness of 350 nm.

The complex refractive indexes of the polysilane film measured at a wavelength of 248 nm were; n=1.92, k=0.28.

Then, a chemically amplified positive resist (TDUR-P007) was coated on the polysilane film and baked at 98° C. for 120 seconds to form a resist film having a thickness of 150 nm.

Then, the resist film was exposed through a mask to light with a dosage of 30 mJ/cm$^2$, which was effected from a reduction projection stepper employing KrF excimer laser as a light source. Subsequently, the resist was subjected to post-baking at 98° C. for 120 seconds, and then to development with a 0.21N TMAH developing solution thereby to form a line-and-space pattern having a line width of 0.18 μm. At this moment, the thickness of the resist pattern had been reduced to 130 nm. When the cross-section of the resist pattern thus obtained was observed by means of an SEM, the formation of corrugation due to a standing wave was not recognized on the side wall of the resist pattern.

Then, the polysilane film was etched through this resist pattern (mask) using a magnetron RIE apparatus under the conditions of; 20 sccm in Cl$_2$ flow rate; 25 mTorr in vacuum degree; and 200 W in induction power. As a result, the phenomenon that the resist pattern was disappeared in the middle of etching was not recognized at all. The profile of the side wall of the polysilane film after etching was vertical (i.e., tapering was not recognized), and the discrepancy in dimension thereof in relative to the dimension of the resist pattern before etching was not recognized at all. The thickness of the resist film remaining after the etching was 80 μm.

Meanwhile, when the resist film and polysilane film were individually formed, and the etching rates thereof were measured under the same conditions as described above, the etching rate of the resist film was 23 nm/min, that of the polysilane film was 210 nm/min, and the etch rate ratio of polysilane/resist was 9.1.

Next, the SiO$_2$ film was etched through the resist pattern and the polysilane pattern (both being used as a mask) using a magnetron RIE apparatus under the conditions of; 30 sccm in CHF$_3$ flow rate; 15 mTorr in vacuum degree; and 280 W in induction power. As a result, the phenomenon that the polysilane pattern was disappeared in the middle of etching was not recognized at all. The profile of the side wall of the SiO$_2$ film after etching was vertical (i.e., tapering was not recognized), and the discrepancy in dimension thereof in relative to the dimension of the resist pattern before etching was not recognized at all.

Meanwhile, when the resist film, polysilane film and SiO$_2$ film were individually formed, and the etching rates thereof were measured under the same conditions as described above, the etching rate of the resist film was 201 nm/min, that of the polysilane film was 56 nm/min, and that of the SiO$_2$ film was 368 nm/min. The etch rate ratio of SiO$_2$/polysilane was 6.6.

EXAMPLE 16

A TEOS oxide film having a thickness of 600 nm was formed on a silicon wafer by means of a plasma CVD method. Then, a solution of 13 g of polysilane (LPS-2) (weight average molecular weight: 8000) in 87 g of anisole was coated on the TEOS oxide film and baked at 180° C. for 180 seconds to form a polysilane film having a thickness of 400 nm.

The complex refractive indexes of the polysilane film measured at a wavelength of 248 nm were; n=2.16, k=0.35. Then, a chemically amplified positive resist (APEX-E) was coated on the polysilane film and baked at 98° C. for 120 seconds to form a resist film having a thickness of 100 nm. Additionally, an upper anti-reflective coating (Aquatar, Hoechst Co., Ltd.) having a thickness of 42 nm was coated on this resist film.

Then, the resist film was exposed through a mask to light with a dosage of 30 mJ/cm$^2$, which was effected from a reduction projection stepper employing KrF excimer laser as a light source. Subsequently, the resist film was subjected to post-baking at 98° C. for 120 seconds, and then to development with a 0.21N TMAH developing solution thereby to form a line-and-space pattern having a line width of 0.25 μm. Since this upper anti-reflective coating was water-soluble, the film was removed at the time of development process. When the cross-section of the resist pattern thus obtained was observed by means of an SEM, the formation of corrugation due to a standing wave was not recognized on the side wall of the resist pattern. Then, the etching of the polysilane film and TEOS oxide film was performed. As a result, it was possible to process the TEOS oxide film without inviting a discrepancy in dimension thereof in relative to the dimension of the resist pattern before etching.

In the same manner as described above, a solution of 10 μg of polysilane (LPS-24) (weight average molecular weight: 12000) in 90 g of anisole was coated on a TEOS oxide film formed on a silicon wafer and baked to form a polysilane film having a thickness of 400 nm.

The complex refractive indexes of this polysilane film measured at a wavelength of 248 nm were; n=2.05, k=0.30. Then, a chemically amplified positive resist film (APEX-E) having a thickness of 100 nm and an upper anti-reflective coating (Aquatar, Hoechst Co., Ltd.) having a thickness of 42 nm were successively formed on this polysilane film.

Then, the resist film was subjected to exposure and development treatments to obtain a line-and-space pattern having a line width of 0.25 μm. Then, the etching of the polysilane film and TEOS oxide film was performed. As a result, it was also possible to suitably process the TEOS oxide film.

EXAMPLE 17

A spin-on-glass (OCD Type-10, Tokyo Ohka Kogyo Co., Ltd.) was formed on a silicon wafer and then baked by gradually raising the temperature thereof, i.e. for one minute at 80° C., for one minute at 150° C. and for one minute at 200° C. Thereafter, the coated layer was further heated for 30 minute at 400° C. under purging with nitrogen gas, thereby obtaining a spin-on-glass film having a thickness of 500 nm. Then, a polysilane solution of Example 1-6 (LPS-6/anisole) was coated on the spin-on-glass film and baked at 160° C. for 60 seconds to form a polysilane film having a thickness of 300 nm.

Figure 12:
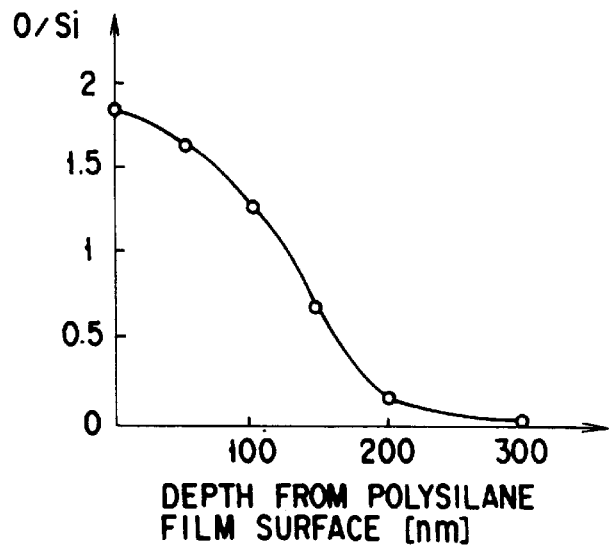
FIG. 12 is a graph illustrating the O/Si ratio in thickness direction of the polysilane film of Example 17.

The O/Si ratio in thickness direction of the polysilane film was measured by means of an XPS spectrometry, the results obtained being shown in FIG. 12. It will be clear from FIG. 12 that the top surface side of the polysilane film was oxidized. The reason for this can be attributed to that the Si—H site was oxidized. The polysilane of this kind is effective in inhibiting the reflectance of exposure light at the occasion of exposure, since the extinction coefficient increases toward the surface of the film.

Then, a chemically amplified positive resist (APEX-E) was coated on this polysilane film and baked at 98° C. for 120 seconds to form a resist film having a thickness of 100 nm. Then, the resist film was exposed through a mask to light with a dosage of 28 mJ/cm$^2$, which was effected from a reduction projection stepper employing KrF excimer laser as a light source. Subsequently, the resist film was subjected to postbaking at 98° C. for 120 seconds, and then to development with a 0.21N TMAH developing solution thereby to form a line-and-space pattern having a line width of 0.25 μm. When the cross-section of the resist pattern thus obtained was observed by means of an SEM, the formation of corrugation due to a standing wave was not recognized on the side wall of the resist pattern. Then, the polysilane film and the spin-on-glass film were subjected to etching. As a result, it was possible to work the spin-on-glass film without inviting a discrepancy in dimension thereof in relative to the dimension of the resist pattern before etching.

When a polysilane (LPS-47) was substituted for the polysilane (LPS-6), almost the same results were obtained.

EXAMPLE 18

A TEOS oxide film having a thickness of 600 nm was formed on a silicon wafer by means of a plasma CVD method. Then, a polysilane solution of Example 1–5 (LPS-5/anisole) was coated on the TEOS oxide film and baked at 160° C. for 180 seconds to form a polysilane film having a thickness of 250 nm.

The complex refractive indexes of the polysilane film measured at a wavelength of 248 nm were; n=1.87, k=0.28. Then, a chemically amplified positive resist comprising 10 g of a solubility-inhibiting resin consisting of polyhydroxystyrene (molecular weight: 3000), 50% of hydroxyl group of which being substituted by tertiary butoxycarbonyl (t-BOC), 0.1 g of sulfoneimide (acid generator) and 0.05 g of coumarin dye which were dissolved in 88.95 g of ethyl lactate was coated on the polysilane film. The reason for incorporating the coumarin dye is to lower the transmittance of the resist thereby to inhibit the generation of standing wave in the resist and to prevent the dimensional fluctuation of the resist pattern that might be resulted from the fluctuation in thickness of the resist. After the coating of the resist solution, the coated layer was baked at 98° C. for 120 seconds to form a resist film having a thickness of 200 nm.

Figure 13A:
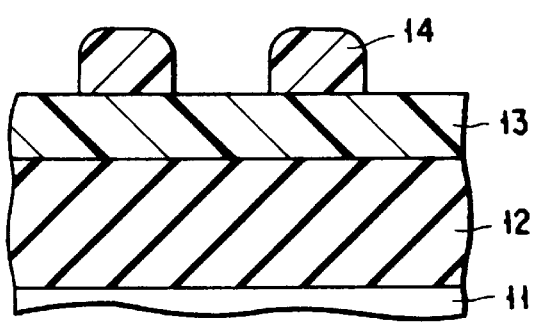
FIGS. 13A and 13B are sectional views illustrating the steps of processing a silicon oxide film by making use of polysilane of Example 18 as an etching mask.

Then, the resist film was exposed through a mask to light with a dosage of 28 mJ/cm$^2$, which was effected from a reduction projection stepper employing KrF excimer laser as a light source. Subsequently, the resist film was subjected to post-baking at 98° C. for 120 seconds, and then to development with a 0.21N TMAH developing solution thereby to form a line-and-space pattern having a line width of 0.25 μm. When the cross-section of the resist pattern thus obtained was observed by means of an SEM, the formation of corrugation due to a standing wave was not recognized on the side wall of the resist pattern. However, as shown in FIG. 13A, a tapering of the resist pattern was admitted. The reason for this phenomenon may be assumably attributed to the low transmittance of the resist.

Figure 13B:
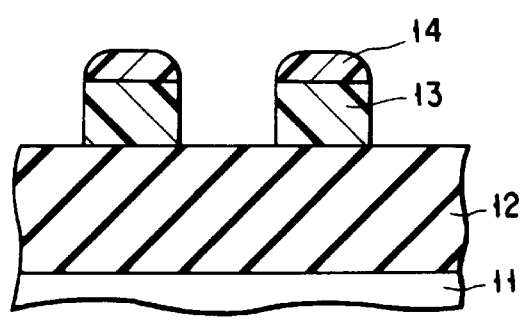

Then, the polysilane film was etched through this resist pattern (mask) using a magnetron RIE apparatus under the conditions of; 20 sccm in Cl$_2$ flow rate; 25 mTorr in vacuum degree; and 300 W in induction power. As a result, the phenomenon that the resist pattern was disappeared in the middle of etching was not recognized at all. The profile of the side wall of the polysilane film after etching was vertical (i.e. tapering was not recognized) as shown in FIG. 13B, and the discrepancy in dimension thereof in relative to the dimension of the bottom of the resist pattern was not recognized at all. The thickness of the resist film remaining after the etching was 100 nm.

Meanwhile, when the resist film and polysilane film were individually formed, and the etching rates thereof were measured under the same conditions as described above, the etching rate of the resist film was 35 nm/min, that of the polysilane film was 186 nm/min, and the etch rate ratio of polysilane/resist was 5.3. The reason for enabling the etching of the polysilane film to be performed with excellent anisotropy and without inviting a disappearance of the resist pattern, even though the resist pattern was tapered, can be attributed to the high etch rate ratio as described above.

Next, the TEOS oxide film was etched through the resist pattern and the polysilane pattern (both being used as a mask) using a magnetron RIE apparatus under the conditions of; 30 sccm in CHF$_3$ flow rate; 10 mTorr in vacuum degree; and 300 W in induction power. As a result, the phenomenon that the polysilane pattern was disappeared in the middle of etching was not recognized at all. The profile of the side wall of the TEOS oxide film after etching was vertical (i.e. tapering was not recognized), and the discrepancy in dimension thereof in relative to the dimension of the resist pattern before etching was not recognized at all.

EXAMPLE 19

A BPSG film having a thickness of 500 nm was formed on a silicon wafer by means of a plasma CVD method. Then, a polysilane solution of Example 1–10 (LPS-10+LPS-1/anisole) was coated on the BPSG film and baked at 150° C. for 180 seconds to form a polysilane film having a thickness of 150 nm.

The complex refractive indexes of the polysilane film measured at a wavelength of 248 nm were; n=1.85, k=0.28. Then, a solution of 10 g of polysulfone in 90 g of cyclohexanone was coated on this polysilane film and baked at 220° C. for 180 seconds to obtain an anti-reflective coating having a thickness of 30 nm. Thereafter, a chemically amplified negative resist (TDUR-N908, Tokyo Ohka Kogyo Co., Ltd.) was coated on the anti-reflective coating, and baked at 98° C. for 120 seconds to obtain a resist film having a thickness of 300 nm. Additionally, an upper anti-reflective coating (Aquatar) having a thickness of 42 nm was coated on this resist film. Then, the resist film was exposed through a mask to light with a dosage of 38 mJ/cm$^2$, which was effected from a reduction projection stepper employing KrF excimer laser as a light source. Subsequently, the resist film was subjected to post-baking at 98° C. for 120 seconds, and then to development with a 0.21N TMAH developing solution thereby to form a line-and-space pattern having a line width of 0.18 μm. When the cross-section of the resist pattern thus obtained was observed by means of an SEM, the formation of corrugation due to a standing wave was not recognized on the side wall of the resist pattern. Then, the polysilane film and BPSG film were subjected to etching. As a result, it was possible to work the BPSG film without inviting a discrepancy in dimension thereof in relative to the dimension of the resist pattern before etching.

EXAMPLE 20

A fluorine-containing SiO$_2$ film having a thickness of 500 nm was formed on a silicon wafer by means of a low pressure CVD (LPCVD) method. Then, a polysilane solution of Example 1–7 (LPS-7/anisole) was coated on the fluorine-containing SiO$_2$ film and baked at 150° C. for 100 seconds to form a polysilane film having a thickness of 180 nm. Then, a solution of 10 g of polymethylmethacrylate in 90 g of ethyl lactate was coated on this polysilane film and baked at 98° C. for 120 seconds to obtain a resist film having a thickness of 200 nm. Thereafter, the resist film was exposed through a mask to light with a dosage of 800 mJ/cm$^2$, which was effected from a reduction projection stepper employing ArF excimer laser as a light source.

Subsequently, the resist film was subjected to postbaking at 98° C. for 120 seconds, and then to development with a 0.21N TMAH developing solution thereby to form a line-and-space pattern having a line width of 0.18 μm. When the cross-section of the resist pattern thus obtained was observed by means of an SEM, the formation of corrugation due to a standing wave was not recognized on the side wall of the resist pattern. Then, the polysilane film and fluorine-containing $SiO_2$ film were subjected to etching. As a result, it was possible to work the fluorine-containing $SiO_2$ film without inviting a discrepancy in dimension thereof in relative to the dimension of the resist pattern before etching.

EXAMPLE 21

A fluorine-containing $SiO_2$ film having a thickness of 500 nm was formed on a silicon wafer by means of an LPCVD method. Then, a solution of 10 g of polysilane (LPS-1) in 90 g of cyclohexanone was coated on the fluorine-containing $SiO_2$ film and baked in a nitrogen atmosphere at 180° C. for 100 seconds to form a polysilane film having a thickness of 300 nm. The complex refractive indexes of the polysilane film measured at a wavelength of 193 nm were; n=2.10, k=0.57. Then, a solution of 10 g of polymethylmethacrylate in 90 g of ethyl lactate was coated on this polysilane film and baked at 98° C. for 120 seconds to obtain a resist film having a thickness of 200 nm. Thereafter, the resist film was exposed through a mask to light with a dosage of 800 $mJ/cm^2$, which was effected from a reduction projection stepper employing ArF excimer laser as a light source. Subsequently, the resist film was subjected to post-baking at 98° C. for 120 seconds, and then to development with a 0.21N TMAH developing solution thereby to form a line-and-space pattern having a line width of 0.18 μm. When the cross-section of the resist pattern thus obtained was observed by means of an SEM, the formation of corrugation due to a standing wave was not recognized on the side wall of the resist pattern. Then, the polysilane film and fluorine-containing $SiO_2$ film were subjected to etching. As a result, it was possible to process the fluorine-containing $SiO_2$ film without inviting a discrepancy in dimension thereof in relative to the dimension of the resist pattern before etching.

EXAMPLE 22

An SiN film having a thickness of 500 nm was formed on a silicon wafer by means of an LPCVD method. Then, a solution of 10 g of polysilane (LPS-25) (average molecular weight: 12000) in 90 g of anisole was coated on the SiN film and baked at 160° C. for 120 seconds to form a polysilane film having a thickness of 250 nm. The complex refractive indexes of the polysilane film measured at a wavelength of 248 nm by means of spectroellipsometry were; n=2.01, k=0.45. Then, a chemically amplified positive resist (APEX-E) was coated on the polysilane film and baked at 98° C. for 120 seconds to form a resist film having a thickness of 250 nm.

Thereafter, the resist film was subjected to exposure with a dosage of 30 $mJ/cm^2$, which was effected from a reduction projection stepper employing KrF excimer laser as a light source. Subsequently, the resist film was subjected to post-baking at 98° C. for 120 seconds, and then to development with a 0.21N TMAH developing solution thereby to form a line-and-space pattern having a line width of 0.18 μm. The thickness of the resist pattern obtained was 230 nm. When the profile of the resist pattern thus obtained was observed by means of an SEM, the formation of corrugation due to a standing wave was not recognized on the side wall of the resist pattern.

Then, the polysilane film was etched through this resist pattern (mask) using a magnetron RIE apparatus under the conditions of; 20 sccm in HBr flow rate; 30 mTorr in vacuum degree; and 300 W in induction power. As a result, the phenomenon that the resist pattern was disappeared in the middle of etching was not recognized at all. The profile of the side wall of the polysilane film after etching was vertical (i.e. tapering was not recognized) and excellent in anisotropy, and the discrepancy in dimension thereof in relative to the dimension of the resist pattern before etching was not recognized at all. The thickness of the resist film remaining after the etching was 100 nm.

Meanwhile, when the resist film and polysilane film were individually formed, and the etching rates thereof were measured under the same conditions as described above, the etching rate of the resist film was 25 nm/min, that of the polysilane film was 200 nm/min, and thus the etching rate of polysilane was 8.0 times as high as that of the resist film.

Next, the SiN film was etched through the resist pattern and the polysilane pattern (both being used as a mask) using a magnetron RIE apparatus under the conditions of; 30 sccm in $CF_4$ flow rate; 160 sccm in Ar flow rate; 3 mTorr in vacuum degree; and 350 W in induction power. As a result, the phenomenon that the polysilane pattern was disappeared in the middle of etching was not recognized at all. The profile of the side wall of the SiN film after etching was vertical (i.e. tapering was not recognized) and excellent in anisotropy, and the discrepancy in dimension thereof in relative to the dimension of the resist pattern before etching was not recognized at all.

Meanwhile, when the resist film, polysilane film and SiN film were individually formed, and the etching rates thereof were measured under the same conditions as described above, the etching rate of the resist film was 45 nm/min, that of the polysilane film was 17 nm/min and that of the SiN film was 230 nm/min. The etching rate of SiN film was 13.3 times higher than that of the polysilane film, and 5.1 times higher than that of the resist film, indicating that the dry etching resistance of the polysilane film was higher than that of the resist film. It is considered that because of this excellent dry etching resistance of the polysilane film, it was possible to perform the etching of the SiN film in a desirable manner, i.e. excellent in perpendicularity and anisotropy without generating a dimensional discrepancy in relative to the dimension of the resist pattern before etching.

When the polysilane (LPS-40) was substituted for the polysilane (LPS-25) in the above experiment, the complex refractive indexes of the polysilane film measured at a wavelength of 248 nm were; n=2.01, k=0.30. In this case, almost the same results as mentioned above were obtained.

When a polysilane dendrimer (LPS-14) (molecular weight: 2512)/xylene solution was substituted for the polysilane (LPS-25)/anisole solution in the above experiment, the complex refractive indexes of the polysilane dendrimer film measured at a wavelength of 248 nm were; n=1.95, k=0.28. In this case also, almost the same results as mentioned above were obtained.

When the polysilane (ArPS-1) (average molecular weight: 15000) was substituted for the polysilane (LPS25) in the above experiment, the complex refractive indexes of the polysilane film measured at a wavelength of 248 nm were; n=1.82, k=0.25. In this case also, almost the same results as mentioned above were obtained.

When the polysilane (ArPS-33) (average molecular weight: 17000) was substituted for the polysilane (LPS25) in the above experiment, the complex refractive indexes of the polysilane film measured at a wavelength of 248 nm were; n=1.94, k=0.29. In this case also, almost the same results as mentioned above were obtained.

When the organosilicon polymer (SL-I 1) (average molecular weight: 18000) was substituted for the polysilane (LPS-25) in the above experiment, the complex refractive indexes of the organosilicon polymer film measured at a wavelength of 248 nm were; n=1.92, k=0.28. In this case also, almost the same results as mentioned above were obtained.

EXAMPLE 23

An $SiO_2$ film having a thickness of 500 nm was formed on a silicon wafer by means of an LPCVD method. Then, a solution of 10 g of polysilane (LPS-27) (average molecular weight: 17000) in 90 g of xylene was coated on the $SiO_2$ film and baked at 160° C. for 120 seconds to form a polysilane film having a thickness of 350 nm. The complex refractive indexes of the polysilane film measured at a wavelength of 248 nm were; n=1.98, k=0.48. Then, a chemically amplified positive resist (APEX-E) was coated on the polysilane film and baked at 98° C. for 120 seconds to form a resist film having a thickness of 150 nm.

Thereafter, the resist film was subjected to exposure with a dosage of 30 $mJ/cm^2$, which was effected from a reduction projection stepper employing KrF excimer laser as a light source. Subsequently, the resist film was subjected to post-baking at 98° C. for 120 seconds, and then to development with a 0.21N TMAH developing solution thereby to form a line-and-space pattern having a line width of 0.18 μm. The thickness of the resist pattern obtained was 130 nm. When the profile of the resist pattern thus obtained was observed by means of an SEM, the formation of corrugation due to a standing wave was not recognized on the side wall of the resist pattern.

Then, the polysilane film was etched through this resist pattern (mask) using a magnetron RIE apparatus under the conditions of; 20 sccm in $Cl_2$ flow rate; 25 mTorr in vacuum degree; and 200 W in induction power. As a result, the phenomenon that the resist pattern was disappeared in the middle of etching was not recognized at all. The profile of the side wall of the polysilane film after etching was vertical (i.e. tapering was not recognized) and excellent in anisotropy, and the discrepancy in dimension thereof in relative to the dimension of the resist pattern before etching was not recognized at all. The thickness of the resist film remaining after the etching was 80 nm.

Meanwhile, when the resist film and polysilane film were individually formed, and the etching rates thereof were measured under the same conditions as described above, the etching rate of the resist film was 23 nm/min, and that of the polysilane film was 210 nm/min.

The resist pattern was removed using a magnetron RIE apparatus under the conditions of; 20 sccm in $O_2$ flow rate; 30 mTorr in vacuum degree; and 200 W in induction power. Next, the $SiO_2$ film was subjected to etching in the same chamber but under a different etching condition, i.e. under the conditions of; 20 sccm in $CHF_3$ flow rate; 15 mTorr in vacuum degree; and 280 W in induction power. As a result, the phenomenon that the polysilane pattern was disappeared in the middle of etching was not recognized at all. The profile of the side wall of the $SiO_2$ film after etching was vertical and excellent in anisotropy, and the discrepancy in dimension thereof in relative to the dimension of the resist pattern before etching was not recognized at all.

Meanwhile, when the polysilane film and $SiO_2$ film were individually formed, and the etching rates thereof were measured under the same conditions as described above, the etching rate of the polysilane film was 56 nm/min, and that of the $SiO_2$ film was 368 nm/min, indicating that the dry etching resistance of the polysilane was higher than that of the resist.

When the polysilane dendrimer (PSD-2) (molecular weight: 1158) was substituted for the polysilane (LPS-27) in the above experiment, the complex refractive indexes of the polysilane film measured at a wavelength of 248 nm were; n=1.92, k=0.25. In this case, almost the same results as mentioned above were obtained.

When the polysilane (ArPS-11) (average molecular weight: 17000) was substituted for the polysilane (LPS-27) in the above experiment, the complex refractive indexes of the polysilane film measured at a wavelength of 248 nm were; n=1.78, k=0.24. In this case also, almost the same results as mentioned above were obtained.

When the polysilane (ArPS-33) (average molecular weight: 17000) was substituted for the polysilane (LPS-27) in the above experiment, almost the same results as mentioned above were obtained.

When the organosilicon polymer (SL-VII 1) (average molecular weight: 11000) was substituted for the polysilane (LPS-27) in the above experiment, the complex refractive indexes of the organosilicon polymer film measured at a wavelength of 248 nm were; n=1.94, k=0.25. In this case also, almost the same results as mentioned above were obtained.

EXAMPLE 24

An SiN film having a thickness of 500 nm was formed on a silicon wafer by means of an LPCVD method. Then, a solution of 10 g of polysilane (LPS-27) (average molecular weight: 17000) in 90 g of xylene was coated on the SiN film and baked at 160° C. for 120 seconds to form a polysilane film having a thickness of 350 nm. The complex refractive indexes of the polysilane film measured at a wavelength of 248 nm were; n=1.78, k=0.24. Then, a chemically amplified positive resist (APEX-E) was coated on the polysilane film and baked at 98° C. for 120 seconds to form a resist film having a thickness of 150 nm.

Thereafter, the resist film was subjected to exposure with a dosage of 30 $mJ/cm^2$, which was effected from a reduction projection stepper employing KrF excimer laser as a light source. Subsequently, the resist film was subjected to post-baking at 98° C. for 120 seconds, and then to development with a 0.21N TMAH developing solution thereby to form a line-and-space pattern having a line width of 0.18 μm. The thickness of the resist pattern obtained was 130 nm. When the profile of the resist pattern thus obtained was observed by means of an SEM, the formation of corrugation due to a standing wave was not recognized on the side wall of the resist pattern.

Then, the polysilane film was etched through this resist pattern (mask) using a magnetron RIE apparatus under the conditions of; 20 sccm in $Cl_2$ flow rate; 25 mTorr in vacuum degree; and 200 W in induction power. As a result, the phenomenon that the resist pattern was disappeared in the middle of etching was not recognized at all. The profile of the side wall of the polysilane film after etching was vertical and excellent in anisotropy, and the discrepancy in dimension thereof in relative to the dimension of the resist pattern before etching was not recognized at all. The thickness of the resist film remaining after the etching was 80 nm.

Meanwhile, when the resist film and polysilane film were individually formed, and the etching rates thereof were measured under the same conditions as described above, the etching rate of the resist film was 23 nm/min, and that of the polysilane film was 210 nm/min.

The resist pattern was removed using a magnetron RIE apparatus under the conditions of; 30 sccm in $O_2$ flow rate; 30 mTorr in vacuum degree; and 200 W in induction power. Next, the SiN film was subjected to etching in the same chamber but under a different etching condition, i.e. under the conditions of; 30 sccm in $CHF_3$ flow rate; 15 mTorr in vacuum degree; and 280 W in induction power. As a result, the phenomenon that the polysilane pattern was disappeared in the middle of etching was not recognized at all. The profile of the side wall of the SiN film after etching was vertical and excellent in anisotropy, and the discrepancy in dimension thereof in relative to the dimension of the resist pattern before etching was not recognized at all.

Meanwhile, when the polysilane film and SiN film were individually formed, and the etching rates thereof were measured under the same conditions as described above, the etching rate of the polysilane film was 56 nm/min, and that of the SiN film was 368 nm/min, indicating that the dry etching resistance of the polysilane was higher than that of SiN.

When the polysilane (LPS-71) (average molecular weight: 8000) was substituted for the polysilane (LPS-27) in the above experiment, almost the same results as mentioned above were obtained.

When the polysilane dendrimer (PSD-2) (molecular weight: 1158) was substituted for the polysilane (LPS-27) in the above experiment, almost the same results as mentioned above were obtained.

When the polysilane (ArPS-11) (average molecular weight: 17000) was substituted for the polysilane (LPS-27) in the above experiment, almost the same results as mentioned above were obtained.

When the polysilane (ArPS-33) (average molecular weight: 17000) was substituted for the polysilane (LPS-27) in the above experiment, almost the same results as mentioned above were obtained.

When the organosilicon polymer (SL-VII 1) (average molecular weight: 11000) was substituted for the polysilane (LPS-27) in the above experiment, almost the same results as mentioned above were obtained.

EXAMPLE 25

A TEOS oxide film having a thickness of 600 nm was formed on a silicon wafer by means of a plasma CVD method. Then, a solution of 13 g of polysilane (LPS-30) (average molecular weight: 7000) in 87 g of xylene was coated on the TEOS oxide film and baked at 160° C. for 180 seconds to form a polysilane film having a thickness of 400 nm. The complex refractive indexes of the polysilane film measured at a wavelength of 248 nm were; n=2.00, k=0.47. Then, a chemically amplified positive resist (APEX-E) was coated on the polysilane film and baked at 98° C. for 120 seconds to form a resist film having a thickness of 100 nm. Additionally, an upper anti-reflective coating (Aquatar) having a thickness of 42 nm was coated on this resist film.

Thereafter, the resist film was subjected to exposure with a dosage of 28 $mJ/cm^2$, which was effected from a reduction projection stepper employing KrF excimer laser as a light source. Subsequently, the resist film was subjected to postbaking at 98° C. for 120 seconds, and then to development with a 0.21N TMAH developing solution thereby to form a line-and-space pattern having a line width of 0.25 μm. Since this upper anti-reflective coating was water-soluble, the film was removed in the development step. When the cross-section of the resist pattern thus obtained was observed by means of an SEM, the formation of corrugation due to a standing wave was not recognized on the side wall of the resist pattern.

Then, the etching of the polysilane film and TEOS oxide film was performed. As a result, it was possible to obtain TEOS oxide film pattern without inviting a discrepancy in dimension thereof in relative to the dimension of the resist pattern before etching.

When a polysilane (LPS-45)/anisole solution was substituted for the polysilane (LPS-30)/xylene solution in the above experiment, almost the same results as mentioned above were obtained.

When the polysilane dendrimer (LPS-7) (molecular weight: 2227) was substituted for the polysilane (LPS-30) in the above experiment, the complex refractive indexes of the polysilane dendrimer film measured at a wavelength of 248 nm were; n=2.01, k=0.30. In this case also, almost the same results as mentioned above were obtained.

When the polysilane (ArPS-12) (average molecular weight: 11000) was substituted for the polysilane (LPS-30) in the above experiment, the complex refractive indexes of the polysilane film measured at a wavelength of 248 nm were; n=1.85, k=0.21. In this case also, almost the same results as mentioned above were obtained.

When the polysilane (ArPS-34) (average molecular weight: 11000) was substituted for the polysilane (LPS30) in the above experiment, the complex refractive indexes of the polysilane film measured at a wavelength of 248 nm were; n=1.85, k=0.23. In this case also, almost the same results as mentioned above were obtained.

When the organosilicon polymer (SL-VII 2) (average molecular weight: 12000) was substituted for the polysilane (LPS-30) in the above experiment, the complex refractive indexes of the organosilicon polymer film measured at a wavelength of 248 nm were; n=1.92, k=0.32. In this case also, almost the same results as mentioned above were obtained.

EXAMPLE 26

A spin-on-glass film (OCD Type-10) was spin-coated on a silicon wafer and then baked by gradually raising the temperature thereof, i.e. for one minute at 80° C., for one minute at 150° C. and for one minute at 200° C. Thereafter, the coated layer was further heated for 30 minute at 400° C. under purging with nitrogen gas, thereby obtaining a spin-on-glass film having a thickness of 500 nm.

Then, a solution of 10 g of polysilane (LPS-35) (average molecular weight: 9000) in 90 g of xylene was coated on the spin-on-glass film and baked at 180° C. for 60 seconds to form a polysilane film having a thickness of 300 nm.

Then, a chemically amplified positive resist (APEX-E) was coated on the polysilane film and baked at 98° C. for 120 seconds to form a resist film having a thickness of 100 nm. Thereafter, the resist film was subjected to exposure with a dosage of 28 $mJ/cm^2$, which was effected from a reduction projection stepper employing KrF excimer laser as a light source. Subsequently, the resist film was subjected to postbaking at 98° C. for 120 seconds, and then to development with a 0.21N TMAH developing solution thereby to form a line-and-space pattern having a line width of 0.25 μm. When the profile of the resist pattern thus obtained was observed by means of an SEM, the formation of corrugation due to a standing wave was not recognized on the side wall of the resist pattern.

Then, etching of the polysilane film was performed with this resist pattern being employed as a mask. Thereafter, the spin-on-glass film was subjected to etching. As a result, it was possible to obtain the spin-on-glass film pattern without inviting a discrepancy in dimension thereof in relative to the dimension of the resist pattern before etching.

When the polysilane dendrimer (LPS-20) (molecular weight: 4012) was substituted for the polysilane (LPS-35) in the above experiment, almost the same results as mentioned above were obtained.

When the polysilane (ArPS-4) (average molecular weight: 14000) was substituted for the polysilane (LPS-35) in the above experiment, almost the same results as mentioned above were obtained.

When the polysilane (ArPS-26) (average molecular weight: 14000) was substituted for the polysilane (LPS-35) in the above experiment, almost the same results as mentioned above were obtained.

When the organosilicon polymer (SL-I 4) (average molecular weight: 17000) was substituted for the polysilane (LPS-35) in the above experiment, almost the same results as mentioned above were obtained.

EXAMPLE 27

A BPSG film having a thickness of 500 nm was formed on a silicon wafer by means of a plasma CVD method. Then, 10 g of polysilane (LPS-25) (average molecular weight: 12000) and 5 g of polysilane (LPS-35) (average molecular weight: 9000) were dissolved in 85 g of xylene to prepare a solution, which was then coated on the BPSG film and baked at 160° C. for 180 seconds to form a polysilane film having a thickness of 150 nm. The complex refractive indexes of the polysilane film measured at a wavelength of 248 nm were; n=2.00, k=0.46. Then, a solution of 10 g of polysulfone in 90 g of cyclohexane was coated on the polysilane film and baked at 220° C. for 180 seconds to form an underlying film having a thickness of 30 nm. The purpose of this underlying film was to improve the profile of the resist pattern. Then, a chemically amplified negative resist (XP-89131, Shiplay Co., Ltd.) was coated on the underlying film and baked at 98° C. for 120 seconds to form a resist film having a thickness of 300 nm. Thereafter, the resist film was subjected to exposure with a dosage of 38 mJ/cm$^2$, which was effected from a reduction projection stepper employing KrF excimer laser as a light source. Subsequently, the resist film was subjected to post-baking at 98° C. for 120 seconds, and then to development with a 0.21N TMAH developing solution thereby to form a line-and-space pattern having a line width of 0.18 μm. When the profile of the resist pattern thus obtained was observed by means of an SEM, the formation of corrugation due to a standing wave was not recognized on the side wall of the resist pattern.

Then, the patterning of the polysilane film was performed by making use of the resist pattern as a mask, and the BPSG film was subjected to etching. As a result, it was possible to obtain BPSG film pattern without inviting a discrepancy in dimension thereof in relative to the dimension of the resist pattern before etching.

When 10 g of polysilane (LPS-44) and 5 g of polysilane (LPS-42) were employed in place of 10 g of polysilane (LPS-25) and 5 g of polysilane (LPS-35) were employed in the above experiment, almost the same results as mentioned above were obtained.

When 10 g of polysilane dendrimer (PSD-2) (molecular weight: 1158) and 5 g of polysilane dendrimer (PSD-19) (molecular weight: 2902) were employed in place of 10 g of polysilane (LPS-25) and 5 g of polysilane (LPS-35) in the above experiment, the complex refractive indexes of the polysilane dendrimer film measured at a wavelength of 248 nm were; n=1.94, k=0.29. In this case also, almost the same results as mentioned above were obtained.

When 10 g of polysilane (ArPS-4) (average molecular weight: 14000) and 5 g of polysilane (ArPS-11) (molecular weight: 17000) were employed in place of 10 g of polysilane (LPS-25) and 5 g of polysilane (LPS-35) in the above experiment, the complex refractive indexes of the polysilane film measured at a wavelength of 248 nm were; n=1.77, k=0.24. In this case also, almost the same results as mentioned above were obtained.

When 10 g of polysilane (ArPS-26) (average molecular weight: 14000) and 5 g of polysilane (ArPS-33) (molecular weight: 17000) were employed in place of 10 g of polysilane (LPS-25) and 5 g of polysilane (LPS-35) in the above experiment, the complex refractive indexes of the polysilane film measured at a wavelength of 248 nm were; n=2.00, k=0.28. In this case also, almost the same results as mentioned above were obtained.

When 10 g of organosilicon polymer (SL-VII 1) (average molecular weight: 11000) and 5 g of organosilicon polymer (SL-I 14) (molecular weight: 8000) were employed in place of 10 g of polysilane (LPS-25) and 5 g of polysilane (LPS-35) in the above experiment, the complex refractive indexes of the organosilicon polymer film measured at a wavelength of 248 nm were; n=1.92, k=0.28. In this case also, almost the same results as mentioned above were obtained.

EXAMPLE 28

A fluorine-containing SiO$_2$ film having a thickness of 500 nm was formed on a silicon wafer by means of an LPCVD method. Then, a solution of 10 g of polysilane (LPS-30) (average molecular weight: 7000) in 90 g of xylene was coated on the fluorine-containing SiO$_2$ film and baked at 160° C. for 100 seconds to form a polysilane film having a thickness of 180 nm.

Then, a resist solution which was prepared by dissolving 10 g of polymethylmethacrylate in 90 g of ethyl lactate was coated on the polysilane film and baked at 98° C. for 120 seconds to form a resist film having a thickness of 200 nm. Thereafter, the resist film was subjected to exposure with a dosage of 800 mJ/cm$^2$, which was effected from a reduction projection stepper employing ArF excimer laser (wavelength: 193 nm) as a light source. Subsequently, the resist film was subjected to post-baking at 98° C. for 120 seconds, and then to development with a 0.21N TMAH developing solution thereby to form a line-and-space pattern having a line width of 0.18 μm. When the profile of the resist pattern thus obtained was observed by means of an SEM, the formation of corrugation due to a standing wave was not recognized on the side wall of the resist pattern.

Then, the polysilane film was etched through this resist pattern (mask) to form a polysilane film pattern, and then fluorine-containing SiO$_2$ film was etched to obtain a fluorine-containing SiO$_2$ film pattern without generating a discrepancy in dimension thereof in relative to the dimension of the resist pattern before etching.

When the polysilane (LPS-53) (average molecular weight: 5000) was substituted for the polysilane (LPS-30) in the above experiment, almost the same results as mentioned above were obtained.

When the polysilane dendrimer (PSD-17) (molecular weight: 3376) was substituted for the polysilane (LPS-30) in the above experiment, almost the same results as mentioned above were obtained.

When the polysilane (ArPS-16) (average molecular weight: 18000) was substituted for the polysilane (LPS-30) in the above experiment, the complex refractive indexes of the polysilane film measured were; n=1.70, k=0.60. In this case also, almost the same results as mentioned above were obtained.

When the polysilane (ArPS-38) (average molecular weight: 18000) was substituted for the polysilane (LPS-30) in the above experiment, almost the same results as mentioned above were obtained.

When the organosilicon polymer (SL-VII 8) (average molecular weight: 12000) was substituted for the polysilane (LPS-30) in the above experiment, almost the same results as mentioned above were obtained.

EXAMPLE 29

A fluorine-containing $SiO_2$ film having a thickness of 500 nm was formed on a silicon wafer by means of an LPCVD method. Then, a solution of 10 g of polysilane (LPS-31) in 90 g of xylene was coated on the fluorine-containing $SiO_2$ film and baked in a nitrogen atmosphere and at 180° C. for 100 seconds to form a polysilane film having a thickness of 300 nm. The complex refractive indexes of this polysilane film measured at a wavelength of 193 nm were; n=2.01, k=0.68.

Then, a resist solution which was prepared by dissolving 10 g of polymethylmethacrylate in 90 g of ethyl lactate was coated on the polysilane film and baked at 98° C. for 120 seconds to form a resist film having a thickness of 200 nm. Thereafter, the resist film was subjected to exposure with a dosage of 800 mJ/cm$^2$, which was effected from a reduction projection stepper employing ArF excimer laser as a light source. Subsequently, the resist film was subjected to post-baking at 98° C. for 120 seconds, and then to development with a 0.21N TMAH developing solution thereby to form a line-and-space pattern having a line width of 0.18 μm. When the profile of the resist pattern thus obtained was observed by means of an SEM, the formation of corrugation due to a standing wave was not recognized on the side wall of the resist pattern.

Then, the polysilane film was etched through this resist pattern (mask) to form a polysilane film pattern, and then fluorine-containing $SiO_2$ film was etched to obtain a fluorine-containing $SiO_2$ film pattern without generating a discrepancy in dimension thereof in relative to the dimension of the resist pattern before etching.

When a polysilane (LPS-60)/anisole solution was substituted for the polysilane (LPS-31)/xylene solution in the above experiment, almost the same results as mentioned above were obtained.

When the polysilane dendrimer (PSD-4) was substituted for the polysilane (LPS-31) in the above experiment, the complex refractive indexes of the polysilane dendrimer film measured at a wavelength of 193 nm were; n=2.00, k=0.62. In this case also, almost the same results as mentioned above were obtained.

When the polysilane (ArPS-7) was substituted for the polysilane (LPS-31) in the above experiment, the complex refractive indexes of the polysilane film measured at a wavelength of 193 nm were; n=1.70, k=0.60. In this case also, almost the same results as mentioned above were obtained.

When the polysilane (ArPS-29) was substituted for the polysilane (LPS-31) in the above experiment, the complex refractive indexes of the polysilane film measured at a wavelength of 193 nm were; n=2.06, k=0.62. In this case also, almost the same results as mentioned above were obtained.

When the organosilicon polymer (SL-I 7) was substituted for the polysilane (LPS-31) in the above experiment, the complex refractive indexes of the organosilicon polymer film measured at a wavelength of 193 nm were; n=1.96, k=0.55. In this case also, almost the same results as mentioned above were obtained.

EXAMPLE 30

An $SiO_2$ film was formed on a silicon wafer. Then, a solution of 10 g of polysilane (LPS-25) in 90 g of anisole was coated on the $SiO_2$ film and baked at 160° C. for 60 seconds to form a polysilane film having a thickness of 250 nm. Then, a chemically amplified positive resist (APEX-E) was coated on the polysilane film and baked to form a resist film, which was subjected to exposure and development treatments thereby to form a resist pattern.

Then, the polysilane film was etched through this resist pattern (mask) to form a polysilane film pattern, and then the $SiO_2$ film was etched to obtain an $SiO_2$ film pattern having a desired dimension.

When the polysilane dendrimer synthsized in No. 16 was substituted for the polysilane (LPS-25) in the above experiment, almost the same results as mentioned above were obtained.

When the polysilane (ArPS-1) (average molecular weight: 15000) was substituted for the polysilane (LPS-25) in the above experiment, almost the same results as mentioned above were obtained.

When the polysilane (ArPS-23) (average molecular weight: 17000) was substituted for the polysilane (LPS-25) in the above experiment, almost the same results as mentioned above were obtained.

EXAMPLE 31

Figure 14A:
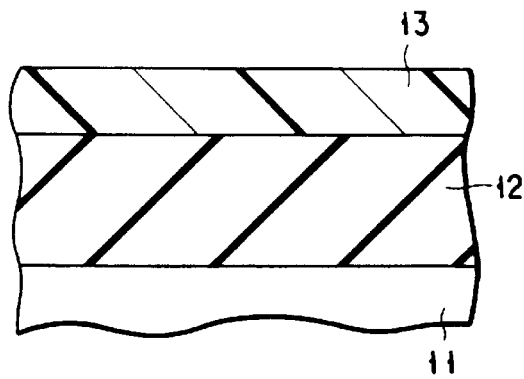
FIGS. 14A to 14C are sectional views illustrating the steps of processing a silicon oxide film by making use of the polysilane of Example 31 as a resist.

A fluorine-containing $SiO_2$ film 12 having a thickness of 500 nm was formed on a silicon wafer 11 by means of an LPCVD method. Then, a solution of 10 g of polysilane (LPS-25) in 90 g of anisole was coated on the fluorine-containing $SiO_2$ film 12 and baked in a nitrogen atmosphere and at 180° C. for 100 seconds to form a polysilane film 13 having a thickness of 150 nm which was capable of functioning as a resist (FIG. 14A).

Figure 14B:
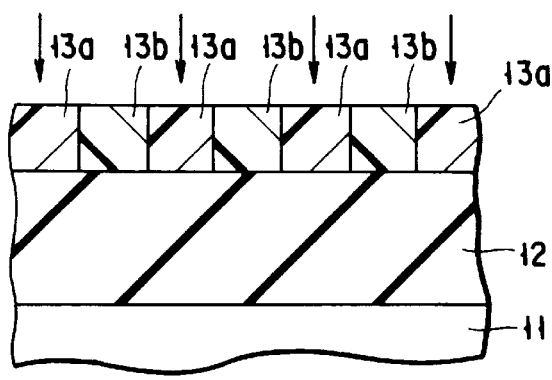

Then, the polysilane film 13 was subjected to exposure with a dosage of 800 mJ/cm$^2$, which was effected from a reduction projection stepper employing ArF excimer laser as a light source. When the infrared absorption spectrum of the polysilane film 13 was measured, an absorption band of 1000 to 1100 cm$^{-1}$ was observed at the exposure portion 13a. It was recognized from this fact that the Si—Si bond at the exposure portion 13a was oxidized, whereby forming an Si—O—Si bond (FIG. 14B). Then, the exposure portion 13a of the polysilane film 13 and the $SiO_2$ film 12 disposed right below the exposure portion 13a were subjected to etching, with the unexposed portion 13b of the polysilane film 13 being used as a mask, using a magnetron RIE apparatus under the conditions of; 30 sccm in $C_4F_8$ flow rate; 100 sccm in CO flow rate; 200 sccm in Ar flow rate; 40 mTorr in vacuum degree; and 200 W in induction power. As a result, it was possible to obtain a line-and-space $SiO_2$ film pattern having a line width of 0.18 μm.

When the polysilane (LPS-47) was substituted for the polysilane (LPS-25) in the above experiment, almost the same results as mentioned above were obtained.

When the polysilane dendrimer synthsized in No. 16 was substituted for the polysilane (LPS-25) in the above experiment, almost the same results as mentioned above were obtained.

When the polysilane (ArPS-1) (average molecular weight: 15000) was substituted for the polysilane (LPS-25) in the above experiment, almost the same results as mentioned above were obtained.

When the polysilane (ArPS-23) (average molecular weight: 17000) was substituted for the polysilane (LPS-25) in the above experiment, almost the same results as mentioned above were obtained.

When the organosilicon polymer (SL-I 1) (average molecular weight: 18000) was substituted for the polysilane (LPS-25) in the above experiment, almost the same results as mentioned above were obtained.

EXAMPLE 32

A fluorine-containing $SiO_2$ film having a thickness of 500 nm was formed on a silicon wafer by means of an LPCVD method. Then, a solution of 10 g of polysilane (LPS-25) in 90 g of xylene was coated on the fluorine-containing $SiO_2$ film and baked in a nitrogen atmosphere and at 160° C. for 100 seconds to form a polysilane film having a thickness of 150 nm which was capable of functioning as a resist.

Then, the polysilane film was subjected to exposure with a dosage of 500 mJ/cm$^2$, which was effected from a reduction projection stepper employing KrF excimer laser as a light source. When the infrared absorption spectrum of the polysilane film was measured, an absorption band of 1000 to 1100 cm$^{-1}$ was observed at the exposure portion of the polysilane film.

Then, the exposure portion of the polysilane film and a portion of the $SiO_2$ film disposed right below the exposure portion were subjected to an etching step, with the unexposed portion of the polysilane film being used as a mask, using a magnetron RIE apparatus under the conditions of; 30 sccm in $CHF_3$ flow rate; 5 sccm in $O_2$ flow rate; 100 sccm in Ar flow rate; 40 mTorr in vacuum degree; and 200 W in induction power. As a result, it was possible to obtain a line-and-space $SiO_2$ film pattern having a line width of 0.18 μm.

When the polysilane dendrimer synthsized in No. 16 was substituted for the polysilane (LPS-25) in the above experiment, almost the same results as mentioned above were obtained.

When the polysilane (ArPS-1) (average molecular weight: 15000) was substituted for the polysilane (LPS-25) in the above experiment, almost the same results as mentioned above were obtained.

When the polysilane (ArPS-23) (average molecular weight: 17000) was substituted for the polysilane (LPS-25) in the above experiment, almost the same results as mentioned above were obtained.

When the organosilicon polymer (SL-I 1) (average molecular weight: 18000) was substituted for the polysilane (LPS-25) in the above experiment, almost the same results as mentioned above were obtained.

EXAMPLE 33

An SiN film having a thickness of 500 nm was formed on a silicon wafer by means of an LPCVD method. Then, a solution of 10 g of polysilane (LPS-25) in 90 g of xylene was coated on the SiN film and baked in a nitrogen atmosphere and at 180° C. for 100 seconds to form a polysilane film which was capable of functioning as a resist.

Then, the polysilane film was subjected to exposure with a dosage of 500 mJ/cm$^2$, which was effected from a reduction projection stepper employing KrF excimer laser as a light source. When the infrared absorption spectrum of the polysilane film was measured, an absorption band of 1000 to 1100 cm$^{-1}$ was observed at the exposure portion. It was recognized from this fact that the Si—Si bond at the exposure portion was oxidized, whereby forming an Si—O—Si bond. Then, the exposure portion of the polysilane film and the SiN film disposed right below the exposure portion were subjected to an etching step, with the unexposed portion of the polysilane film being used as a mask, using a magnetron RIE apparatus under the conditions of; 30 sccm in $C_4F_8$ flow rate; 100 sccm in CO flow rate; 200 sccm in Ar flow rate; 40 mTorr in vacuum degree; and 200 W in induction power. As a result, it was possible to obtain a line-and-space SiN film pattern having a line width of 0.18 μm.

When the polysilane (LPS-40) was substituted for the polysilane (LPS-25) in the above experiment, almost the same results as mentioned above were obtained.

When the polysilane dendrimer synthsized in No. 16 was substituted for the polysilane (LPS-25) in the above experiment, almost the same results as mentioned above were obtained.

When the polysilane (ArPS-1) (average molecular weight: 15000) was substituted for the polysilane (LPS-25) in the above experiment, almost the same results as mentioned above were obtained.

When the polysilane (ArPS-23) (average molecular weight: 17000) was substituted for the polysilane (LPS-25) in the above experiment, almost the same results as mentioned above were obtained.

When the organosilicon polymer (SL-I 1) (average molecular weight: 18000) was substituted for the polysilane (LPS-25) in the above experiment, almost the same results as mentioned above were obtained.

EXAMPLE 34

A fluorine-containing $SiO_2$ film having a thickness of 500 nm was formed on a silicon wafer by means of an LPCVD method. Then, a solution of 10 g of $AsF_5$-doped polysilane (LPS-35) (average molecular weight: 9000) in 90 g of xylene was coated on the fluorine-containing $SiO_2$ film and baked at 180° C. for 100 seconds to form a polysilane film having a thickness of 300 nm. The conductivity of this polysilane was $5 \times 10^{-6}$ S/cm.

Then, a resist solution which was prepared by dissolving 10 g of polymethylmethacrylate in 90 g of ethyl lactate was coated on the polysilane film and baked at 98° C. for 120 seconds to form a resist film having a thickness of 200 nm. Thereafter, the resist film was subjected to exposure (10 μC/cm$^2$) by making use of an electron beam direct writing apparatus. Subsequently, the resist film was subjected to development with a 0.21N TMAH developing solution thereby to form a line-and-space resist pattern having a line width of 0.18 μm. The resist pattern thus obtained was free from any placement error that might be caused by charge-up. When the profile of the resist pattern thus obtained was observed by means of an SEM, the formation of corrugation due to a standing wave was not recognized on the side wall of the resist pattern.

Then, the polysilane film was etched through this resist pattern (mask) to form a polysilane film pattern, and then fluorine-containing $SiO_2$ film was etched to obtain a fluorine-containing $SiO_2$ film pattern without generating a discrepancy in dimension thereof in relative to the dimension of the resist pattern before etching.

When the polysilane (LPS-71) was substituted for the polysilane (LPS-35) in the above experiment, almost the same results as mentioned above were obtained.

When a C60-doped polysilane dendrimer (PSD-14) (molecular weight: 2512) was substituted for the AsF$_5$doped polysilane (LPS-35) in the above experiment, almost the same results as mentioned above were obtained.

When the polysilane (ArPS-11) (average molecular weight: 17000) was substituted for the polysilane (LPS-35) in the above experiment, almost the same results as mentioned above were obtained.

When the polysilane (ArPS-23) (average molecular weight: 17000) was substituted for the polysilane (LPS-35) in the above experiment, almost the same results as mentioned above were obtained.

When the organosilicon polymer (SL-VII 3) (average molecular weight: 12000) was substituted for the polysilane (LPS-35) in the above experiment, almost the same results as mentioned above were obtained.

EXAMPLE 35

A fluorine-containing SiO$_2$ film having a thickness of 500 nm was formed on a silicon wafer by means of an LPCVD method. Then, a solution of 10 g of polysilane (LPS-35) (average molecular weight: 9000) in 90 g of xylene was coated on the fluorine-containing SiO$_2$ film and baked at 180° C. for 100 seconds to form a polysilane film having a thickness of 300 nm. Then, a chemically amplified positive resist (APEX-E) was coated on the polysilane film and baked at 98° C. for 120 seconds to form a resist film having a thickness of 200 nm. Then, a patterning exposure (800 mJ/cm$^2$) was effected to the resist film by making use of an X-ray stepper employing synchrotron radiation as a source. Subsequently, the resist was subjected to baking at 98° C. for 120 seconds, and then to development with a 0.21N TMAH developing solution thereby to form a line-and-space resist pattern having a line width of 0.18 μm. When the profile of the resist pattern thus obtained was observed by means of an SEM, the formation of corrugation due to a standing wave was not recognized on the side wall of the resist pattern.

Then, the polysilane film was etched through this resist pattern (mask) to form a polysilane film pattern, and then fluorine-containing SiO$_2$ film was etched to obtain a fluorine-containing SiO$_2$ film pattern without generating a discrepancy in dimension thereof in relative to the dimension of the resist pattern before etching.

When a polysilane (LPS-51)/anisole solution was substituted for the polysilane (LPS-35)/xylene solution in the above experiment, almost the same results as mentioned above were obtained.

When the polysilane dendrimer (PSD-14) (molecular weight: 2512) was substituted for the polysilane (LPS-35) in the above experiment, almost the same results as mentioned above were obtained.

When the polysilane (ArPS-11) (average molecular weight: 17000) was substituted for the polysilane (LPS-35) in the above experiment, almost the same results as mentioned above were obtained.

When the polysilane (ArPS-33) (average molecular weight: 17000) was substituted for the polysilane (LPS-35) in the above experiment, almost the same results as mentioned above were obtained.

When the organosilicon polymer (SL-VII 3) (average molecular weight: 12000) was substituted for the polysilane (LPS-35) in the above experiment, almost the same results as mentioned above were obtained.

EXAMPLE 36

A solution of 10 g of polysilane (LPS-25) (average molecular weight: 12000) in 90 g of xylene was coated on a quartz substrate and baked at 160° C. for 100 seconds to form a polysilane film having a thickness of 300 nm. Then, a chemically amplified positive resist (APEX-E) was coated on the polysilane film and baked at 98° C. for 120 seconds to form a resist film having a thickness of 200 nm. Then, the resist film was subjected to exposure (1 μC/cm$^2$) by making use of an electron beam direct writing apparatus. Subsequently, the resist film was subjected to baking at 98° C. for 120 seconds, and then to development with a 0.21N TMAH developing solution thereby to form a line-and-space resist pattern having a line width of 0.9 μm. When the profile of the resist pattern thus obtained was observed by means of an SEM, the formation of corrugation due to a standing wave was not recognized on the side wall of the resist pattern.

Then, the polysilane film was etched through this resist pattern (mask) to form a polysilane film pattern, and then quartz substrate was etched to form a groove having a depth of 0.4 μm, thus making it possible to process the photomask glass.

When the polysilane dendrimer synthesized in No. 16 was substituted for the polysilane (LPS-35) in the above experiment, almost the same results as mentioned above were obtained.

When the polysilane (ArPS-1) (average molecular weight: 15000) was substituted for the polysilane (LPS-35) in the above experiment, almost the same results as mentioned above were obtained.

When the polysilane (ArPS-23) (average molecular weight: 17000) was substituted for the polysilane (LPS-5) in the above experiment, almost the same results as mentioned above were obtained.

When the organosilicon polymer (SL-I 1) (average molecular weight: 18000) was substituted for the polysilane (LPS-35) in the above experiment, almost the same results as mentioned above were obtained.

EXAMPLE 37

A fluorine-containing SiO$_2$ film having a thickness of 500 nm was formed on a silicon wafer by means of an LPCVD method. Then, a solution of 10 g of polysilane (LPS-25) in 90 g of anisole was coated on the fluorine-containing SiO$_2$ film and baked in a nitrogen atmosphere and at 180° C. for 100 seconds to form a polysilane film which was capable of functioning as a resist.

Then, the polysilane film was subjected to exposure with a dosage of 500 mJ/cm$^2$, which was effected from a reduction projection stepper employing ArF excimer laser as a light source. When infrared absorption spectrum of the polysilane film was measured, an absorption band of 1000 to 1100 cm$^{-1}$ was observed at the exposure portion of the polysilane film. It was recognized from this fact that the Si—Si bond at the exposure portion was oxidized, whereby forming an Si—O—Si bond.

Then, the exposure portion of the polysilane film and a portion of the SiO$_2$ film disposed right below the exposure portion were subjected to an etching step, with the unexposed portion of the polysilane film being used as a mask, using a magnetron RIE apparatus under the conditions of; 30 sccm in C$_4$F$_8$ flow rate; 40 mTorr in vacuum degree; and 200 W in induction power. As a result, it was possible to obtain a line-and-space SiO$_2$ film pattern having a line width of 0.18 μm.

When the polysilane dendrimer synthesized in No. 16 was substituted for the polysilane (LPS-25) in the above experiment, almost the same results as mentioned above were obtained.

When the polysilane (ArPS-1) (average molecular weight: 15000) was substituted for the polysilane (LPS-25) in the above experiment, almost the same results as mentioned above were obtained.

When the polysilane (ArPS-23) (average molecular weight: 17000) was substituted for the polysilane (LPS-25) in the above experiment, almost the same results as mentioned above were obtained.

When the organosilicon polymer (SL-I 1) (average molecular weight: 18000) was substituted for the polysilane (LPS-25) in the above experiment, almost the same results as mentioned above were obtained.

EXAMPLE 38

An $SiO_2$ film 12 having a thickness of 500 nm was formed on a silicon wafer 11 by means of a CVD method. Then, a solution of 10 g of polysilane (LPS-31) (average molecular weight: 9800) in 90 g of xylene was coated on the $SiO_2$ film 12 and baked at 160° C. for 120 seconds to form a polysilane film 13 having a thickness of 100 nm.

Figure 15A:
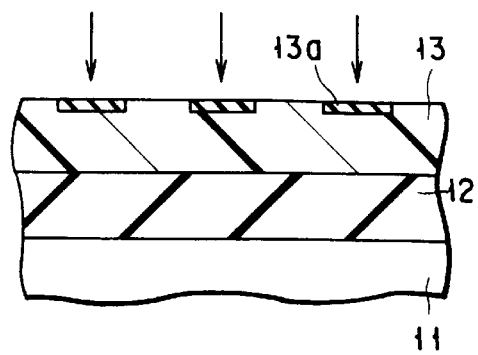
FIGS. 15A to 15C are sectional views illustrating the steps of processing a silicon oxide film by making use of the polysilane of Example 38 as a resist.
Figure 15B:
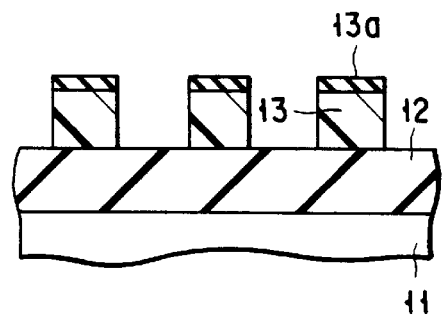
Figure 14C:
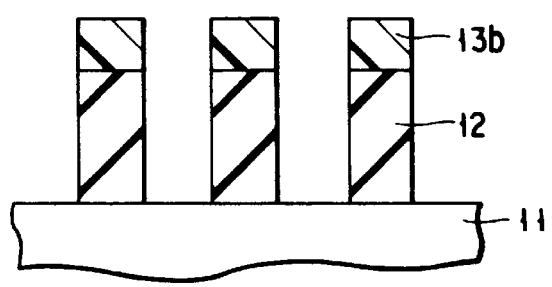

Then, the polysilane film 13 was subjected to exposure with a dosage of 30 mJ/cm$^2$, which was effected from a reduction projection stepper employing KrF excimer laser as a light source, whereby selectively oxidizing the exposed portion 13a of the polysilane film 13 (FIG. 15A). Then, the unexposed portion, which was not oxidized, of the polysilane film 13 was etched away by making use of a magnetron RIE apparatus under the conditions of; 100 sccm in HBr flow rate; 75 mTorr in vacuum degree; and 200 W in induction power, thereby to obtain a line-and-space polysilane film pattern 13 having a line width of 0.25 µm (FIG. 15B).

Figure 15C:
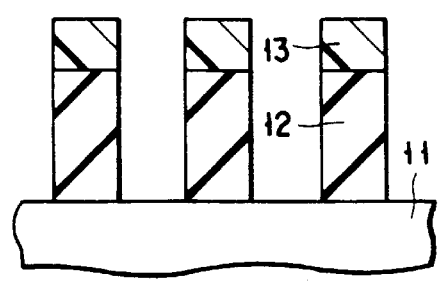

Then, the $SiO_2$ film was subjected to etching with the polysilane film pattern 13 being used as a mask, using a magnetron RIE apparatus under the conditions of; 40 sccm in $C_4F_8$ flow rate; 100 sccm in CO flow rate; 200 sccm in Ar flow rate and 3 sccm in $O_2$ flow rate. As a result, it was possible to obtain a line-and-space $SiO_2$ film pattern having a desired line width of 0.25 µm (FIG. 15C).

Since a polysilane film was employed as a resist in this example, the number of processing steps can be reduced. Further, since a polysilane film pattern which was capable of functioning as a resist was formed by surface-imaging method, the influence of the reflecting light from the underlayers could be minimized, thus making it possible to achieve excellent dimension controllability.

When a polysilane (LPS-40)/anisole solution was substituted for the polysilane (LPS-31)/xylene solution in the above experiment, almost the same results as mentioned above were obtained.

When the polysilane dendrimer (PSD-5) (molecular weight: 6200) was substituted for the polysilane (LPS-31) in the above experiment, almost the same results as mentioned above were obtained.

When the polysilane (ArPS-7) (average molecular weight: 18000) was substituted for the polysilane (LPS-31) in the above experiment, almost the same results as mentioned above were obtained.

When the polysilane (ArPS-29) (average molecular weight: 18000) was substituted for the polysilane (LPS-31) in the above experiment, almost the same results as mentioned above were obtained.

When the organosilicon polymer (SL-VII 8) (average molecular weight: 12000) was substituted for the polysilane (LPS-31) in the above experiment, almost the same results as mentioned above were obtained.

EXAMPLE 39

An SiN film having a thickness of 500 nm was formed on a silicon wafer by means of a CVD method. Then, a solution of 10 g of polysilane (LPS-25) in 90 g of xylene was coated on the SiN film and baked at 160° C. for 120 seconds to form a polysilane film having a thickness of 100 nm.

Then, the polysilane film was subjected to exposure with a dosage of 100 mJ/cm$^2$, which was effected from a stepper employing KrF excimer laser as a light source, whereby selectively oxidizing the exposed portion of the polysilane film. Then, the unexposed portion (which was not oxidized) of the polysilane film was etched away by making use of a magnetron RIE apparatus under the conditions of; 100 sccm in $Cl_2$ flow rate; 75 mTorr in vacuum degree; and 200 W in induction power, thereby to obtain a line-and-space polysilane film pattern having a line width of 0.25 µm.

Then, the SiN film was subjected to etching with the polysilane film pattern being used as a mask, using a magnetron RIE apparatus under the conditions of; 40 sccm in $CHF_3$ flow rate; 100 sccm in CO flow rate and 100 sccm in $O_2$ flow rate. As a result, it was possible to obtain a line-and-space SiN film pattern having a desired line width of 0.25 µm.

When the polysilane dendrimer (PSD-14) (molecular weight: 2512) was substituted for the polysilane (LPS-25) in the above experiment, almost the same results as mentioned above were obtained.

When the polysilane (ArPS-11) (average molecular weight: 17000) was substituted for the polysilane (LPS-25) in the above experiment, almost the same results as mentioned above were obtained.

When the polysilane (ArPS-23) (average molecular weight: 17000) was substituted for the polysilane (LPS-25) in the above experiment, almost the same results as mentioned above were obtained.

When the organosilicon polymer (SL-VII 3) (average molecular weight: 12000) was substituted for the polysilane (LPS-25) in the above experiment, almost the same results as mentioned above were obtained.

EXAMPLE 40

An $SiO_2$ film having a thickness of 500 nm was formed on a silicon wafer. Then, a solution of 10 g of polysilane (HMPS-1) (molecular weight: 4000) (n:m=1:1) in 90 g of PGMEA was coated on the $SiO_2$ film and baked to form a polysilane film having a thickness of 250 nm. Then, the polysilane film was heated at 200° C. for 5 minutes, thereby crosslinking the polysilane. Then, a chemically amplified positive resist (TDUR-P007) was coated on the polysilane film and baked at 98° C. for 120 seconds to form a resist film having a thickness of 250 nm.

Thereafter, the resist film was subjected to exposure through a mask with a dosage of 30 mJ/cm$^2$, which was effected from a reduction projection stepper employing KrF excimer laser as a light source. Subsequently, the resist film was subjected to baking at 98° C. for 120 seconds, and then to development with a 0.21N TMAH developing solution thereby to form a line-and-space resist pattern having a line width of 0.18 µm. When the profile of the resist pattern thus obtained was observed by means of an SEM, the formation of corrugation due to a standing wave was not recognized on the side wall of the resist pattern.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4H_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form a $SiO_2$ film pattern having vertical side walls. The residual polysilane film could be easily removed by making use of an aqueous organic alkaline solution or an aqueous dilute hydrofluoric acid solution.

When the polysilane (HMPS-2) (n:m=5:1) (molecular weight: 3500) was substituted for the polysilane (HMPS-1) in the above experiment, almost the same results as mentioned above were obtained.

When the polysilane (HMPS-3) (molecular weight: 5600) was substituted for the polysilane (HMPS-1) in the above experiment and heated at 250° C. for 5 minutes so as to allow the polysilane to crosslink, almost the same results as mentioned above were obtained.

EXAMPLE 41

An $SiO_2$ film having a thickness of 500 nm was formed on a silicon wafer. Then, a solution of 10 g of polysilane (RMPS-5) (molecular weight: 20000) (n:m=1:1) in 90 g of PGMEA was coated on the $SiO_2$ film and baked to form a polysilane film having a thickness of 250 nm. Then, the polysilane film was heated in the air and on a hot plate at 200° C. for 5 minutes thereby to crosslink and insolubilize the polysilane. Then, a chemically amplified positive resist (TDUR-P007) was coated on the polysilane film and baked at 98° C. for 120 seconds to form a resist film having a thickness of 250 nm.

Thereafter, the resist film was subjected to exposure through a mask with a dosage of 30 mJ/cm$^2$, which was effected from a reduction projection stepper employing KrF excimer laser as a light source. Subsequently, the resist film was subjected to baking at 98° C. for 120 seconds, and then to development with a 0.21N TMAH developing solution thereby to form a line-and-space resist pattern having a line width of 0.18 μm. When the profile of the resist pattern thus obtained was observed by means of an SEM, the formation of corrugation due to a standing wave was not recognized on the side wall of the resist pattern.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4H_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

When the polysilane (RMPS-7) (l:m:n=4:1:5) (average molecular weight: 15000) was substituted for the polysilane (RMPS-5) in the above experiment, almost the same results as mentioned above were obtained.

When the polysilane (RMPS-6) (n:m=1:1) (molecular weight: 30000) was substituted for the polysilane (RMPS-5) in the above experiment and the heat treatment time at the curing step was changed to 10 minutes, almost the same results as mentioned above were obtained.

When the polysilane (RMPS-4) (average molecular weight: 20000) was substituted for the polysilane (RMPS-5) in the above experiment, almost the same results as mentioned above were obtained.

When the polysilane (RMPS-8) (average molecular weight: 21000) was substituted for the polysilane (RMPS-5) in the above experiment, almost the same results as mentioned above were obtained.

When the polysilane (RMPS-8) (average molecular weight: 33000) was substituted for the polysilane (RMPS-5) in the above experiment, almost the same results as mentioned above were obtained.

When a polysilane (RMPS-9) (average molecular weight: 7000)/anisole solution was substituted for the polysilane (RMPS-5)/PGMEA solution in the above experiment, almost the same results as mentioned above were obtained.

EXAMPLE 42

An $SiO_2$ film having a thickness of 500 nm was formed on a silicon wafer. Then, a solution of 10 g of polysilane (PCPS-1) in 100 g of xylene was coated on the $SiO_2$ film and baked to form a polysilane film having a thickness of 250 nm. Then, the polysilane film was exposed to i-line (365 nm) for 2 minutes in a nitrogen atmosphere thereby to crosslink and insolubilize the polysilane. Then, after this polysilane film was allowed to expose to $I_2$ vapor, a chemically amplified positive resist (TDUR-P007) was coated on the polysilane film and baked at 98° C. for 120 seconds to form a resist film having a thickness of 250 nm.

Thereafter, the resist film was subjected to exposure through a mask with a dosage of 30 mJ/cm$^2$, which was effected from a reduction projection stepper employing KrF excimer laser as a light source. Subsequently, the resist film was subjected to baking at 98° C. for 120 seconds, and then to development with a 0.21N TMAH developing solution thereby to form a line-and-space resist pattern having a line width of 0.28 μm. When the profile of the resist pattern thus obtained was observed by means of an SEM, the formation of corrugation due to a standing wave was not recognized on the side wall of the resist pattern.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate;

10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

EXAMPLE 43

An $SiO_2$ film having a thickness of 500 nm was formed on a silicon wafer. Then, a solution of 10 g of polysilane (PCPS-2) in 90 g of xylene was coated on the $SiO_2$ film and baked for 3 minutes at 150° C. to form a polysilane film having a thickness of 250 nm. Then, the polysilane film was exposed to i-line (365 nm) for 2 minutes in a nitrogen atmosphere thereby to crosslink and insolubilize the polysilane. Then, after this polysilane film was allowed to expose to $SbF_5$ vapor, a chemically amplified positive resist (TDUR-P007) was coated on the polysilane film and baked at 98° C. for 120 seconds to form a resist film having a thickness of 250 nm.

Thereafter, the resist film was subjected to exposure with a dosage of 100 $\mu C/cm^2$ by way of EB exposure. Subsequently, the resist film was subjected to baking at 98° C. for 120 seconds, and then to development with a 0.21N TMAH developing solution thereby to form a line-and-space resist pattern having a line width of 0.20 $\mu m$. When the profile of the resist pattern thus obtained was observed by means of an SEM, the formation of corrugation due to a standing wave was not recognized on the side wall of the resist pattern.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

EXAMPLE 44

An $SiO_2$ film having a thickness of 500 nm was formed on a silicon wafer. Then, a solution of 10 g of polysilane (PCPS-5) in 90 g of xylene was coated on the $SiO_2$ film and baked for 3 minutes at 150° C. to form a polysilane film having a thickness of 250 nm. Then, the polysilane film was exposed to i-line (365 nm) for 2 minutes in a nitrogen atmosphere thereby to crosslink and insolubilize the polysilane. Then, a chemically amplified positive resist (TDUR-P007) was coated on the polysilane film and baked at 98° C. for 120 seconds to form a resist film having a thickness of 250 nm.

While being exposed to a weak ultraviolet rays, the resist film was subjected to exposure with a dosage of 100 $\mu C/cm^2$ by way of EB exposure. Subsequently, the resist film was subjected to baking at 98° C. for 120 seconds, and then to development with a 0.21N TMAH developing solution thereby to form a line-and-space resist pattern having a line width of 0.20 $\mu m$. When the profile of the resist pattern thus obtained was observed by means of an SEM, the formation of corrugation due to a standing wave was not recognized on the side wall of the resist pattern. Thereafter, a portion of the polysilane film that was exposed through the resist pattern was exposed to $SbF_5$ vapor.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

EXAMPLE 45

An $SiO_2$ film having a thickness of 500 nm was formed on a silicon wafer. Then, a solution of 10 g of polysilane (PCPS-22) and 0.1 g of C60 in 90 g of xylene was coated on the $SiO_2$ film and baked to form a polysilane film having a thickness of 250 nm. Then, the polysilane film was exposed to i-line (365 nm) for 2 minutes in a nitrogen atmosphere thereby to crosslink and insolubilize the polysilane. The polysilane filme was exposed $SbF_5$ vapor. Then, a chemically amplified positive resist (TDUR-P007) was coated on the polysilane film and baked at 98° C. for 120 seconds to form a resist film having a thickness of 250 nm. Thereafter, the resist film was subjected to exposure through a mask with a dosage of 30 $mJ/cm^2$, which was effected from a reduction projection stepper employing KrF excimer laser as a light source. Then, while being exposed to light having a wavelength larger than 400 nm, the unexposed portion of resist film was subjected to EB exposure. In this manner, the resist was subjected to both ultraviolet exposure and EB exposure. Subsequently, the resist film was baked at 98° C. for 120 seconds, and then subjected to development with a 0.21N TMAH developing solution thereby to form a line-and-space resist pattern having a line width of 0.25 $\mu m$ at the UV exposure portion and a line width of 0.2 $\mu m$ at the EB exposure portion.

Then, the polysilane film was etched through this resist pattern (mask), while being exposed to ultraviolet rays, under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching

EXAMPLE 46

An SiO$_2$ film having a thickness of 500 nm was formed on a silicon wafer. Then, a solution of 10 g of polysilane (PCPS-8) in 90 g of xylene was coated on the SiO$_2$ film and baked for 10 minutes at 120° C. to form a polysilane film having a thickness of 250 nm. Then, the polysilane film was exposed to i-line (365nm) for 2 minutes in a nitrogen atmosphere thereby to crosslink and insolubilize the polysilane. Then, a chemically amplified positive resist (TDUR-P007) was coated on the polysilane film and baked at 98° C. for 120 seconds to form a resist film having a thickness of 250 nm. Thereafter, the resist film was subjected to exposure through a mask with a dosage of 30 mJ/cm$^2$, which was effected from a reduction projection stepper employing KrF excimer laser as a light source. Then, while being exposed to light having a wavelength larger than 400 nm, the unexposed portion of resist film was subjected to EB exposure. In this manner, the resist was subjected to both ultraviolet exposure and EB exposure. Subsequently, the resist film was baked at 98° C. for 120 seconds, and then subjected to development with a 0.21N TMAH developing solution thereby to form a line-and-space resist pattern having a line width of 0.25 μm at the UV exposure portion and a line width of 0.2 μm at the EB exposure portion.

Then, the polysilane film was etched through this resist pattern (mask), while being exposed to ultraviolet rays, under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate between these films.

Next, the SiO$_2$ film was subjected to etching with this polysilane film pattern being employed as a mask under the conditions of; 50 sccm in C$_4$F$_8$ flow rate; 10 sccm in CO flow rate; 100 sccm in Ar flow rate; 3 sccm in O$_2$ flow rate; 10 mTorr in vacuum degree; and 200 W in induction power. As a result, the polysilane film indicated excellent etching resistance so that it was possible to form an SiO$_2$ film pattern having vertical side walls. The residual polysilane film could be easily removed by making use of an aqueous organic alkaline solution or an aqueous dilute hydrofluoric acid solution.

EXAMPLE 47

An SiO$_2$ film having a thickness of 500 nm was formed on a silicon wafer. Then, a solution of 10 g of polysilane (PCPS-5) and 1 g of a conductive material (CM-8) in 100 g of anisole was coated on the SiO$_2$ film and baked to form a polysilane film having a thickness of 250 nm. Then, the polysilane film was exposed to i-line (365 nm) for 2 minutes in a nitrogen atmosphere thereby to crosslink and insolubilize the polysilane. Then, a chemically amplified positive resist (TDURP007) was coated on the polysilane film and baked at 98° C. for 120 seconds to form a resist film having a thickness of 250 nm. Thereafter, the resist film was subjected to exposure through a mask with a dosage of 30 mJ/cm$^2$, which was effected from a reduction projection stepper employing KrF excimer laser as a light source. Then, the unexposed portion of resist film was subjected to EB exposure. In this manner, the resist was subjected to both ultraviolet exposure and EB exposure. Subsequently, the resist film was baked at 98° C. for 120 seconds, and then subjected to development with a 0.21N TMAH developing solution thereby to form a line-and-space resist pattern having a line width of 0.25 μm at the UV exposure portion and a line width of 0.2 μm at the EB exposure portion.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the SiO$_2$ film was subjected to etching with this polysilane film pattern being employed as a mask under the conditions of; 50 sccm in C$_4$F$_8$ flow rate; 10 sccm in CO flow rate; 100 sccm in Ar flow rate; 3 sccm in O$_2$ flow rate; 10 mTorr in vacuum degree; and 200 W in induction power. As a result, the polysilane film indicated excellent etching resistance so that it was possible to form an SiO$_2$ film pattern having vertical side walls. The residual polysilane film could be easily removed by making use of an aqueous organic alkaline solution or an aqueous dilute hydrofluoric acid solution.

EXAMPLE 48

An SiO$_2$ film having a thickness of 500 nm was formed on a silicon wafer. Then, a solution of 10 g of polysilane (PCPS-7) and 1 g of a conductive material (CM-30) in 100 g of anisole was coated on the SiO$_2$ film and baked to form a polysilane film having a thickness of 250 nm. Then, the polysilane film was exposed to i-line (365 nm) for 2 minutes in a nitrogen atmosphere thereby to crosslink and insolubilize the polysilane. Then, a chemically amplified positive resist (TDUR-P007) was coated on the polysilane film and baked at 98° C. for 120 seconds to form a resist film having a thickness of 250 nm. Thereafter, the resist film was subjected to exposure through a mask with a dosage of 30 mJ/cm$^2$, which was effected from a reduction projection stepper employing KrF excimer laser as a light source. Subsequently, the resist film was baked at 98° C. for 120 seconds, and then subjected to development with a 0.21N TMAH developing solution thereby to form a line-and-space resist pattern having a line width of 0.25 μm. Thereafter, the entire surface of the resist pattern and the portion of the polysilane film which was exposed through the resist pattern was irradiated with ultraviolet rays.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the SiO$_2$ film was subjected to etching with this polysilane film pattern being employed as a mask under the conditions of; 50 sccm in C$_4$F$_8$ flow rate; 10 sccm in CO flow rate; 100 sccm in Ar flow rate; 3 sccm in O$_2$ flow rate; 10 mTorr in vacuum degree; and 200 W in induction power. As a result, the polysilane film indicated excellent etching resistance so that it was possible to form an SiO$_2$ film pattern having vertical side walls. The residual polysilane film could be easily removed by making use of an aqueous organic alkaline solution or an aqueous dilute hydrofluoric acid solution.

EXAMPLE 49

An $SiO_2$ film having a thickness of 500 nm was formed on a silicon wafer. Then, a solution of 10 g of polysilane (PCPS-8) and 1 g of a conductive material (CM-42) in 100 g of anisole was coated on the $SiO_2$ film and baked to form a polysilane film having a thickness of 250 nm. Then, the polysilane film was exposed to i-line (365 nm) for 2 minutes in a nitrogen atmosphere thereby to crosslink and insolubilize the polysilane. Then, a chemically amplified positive resist (TDUR-P007) was coated on the polysilane film and baked at 98° C. for 120 seconds to form a resist film having a thickness of 250 nm. Thereafter, the resist film was subjected to exposure through a mask with a dosage of 30 $mJ/cm^2$, which was effected from a reduction projection stepper employing KrF excimer laser as a light source. Then, the unexposed portion of resist film was subjected to EB exposure. In this manner, the resist was subjected to both ultraviolet exposure and EB exposure. Subsequently, the resist film was baked at 98° C. for 120 seconds, and then subjected to development with a 0.21N TMAH developing solution thereby to form a line-and-space resist pattern having a line width of 0.25 µm at the UV exposure portion and a line width of 0.2 µm at the EB exposure portion.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

EXAMPLE 50

An $SiO_2$ film having a thickness of 500 nm was formed on a silicon wafer. Then, a solution of 10 g of polysilane (PCPS-21) and 1 g of a conductive material (CM-47) in 100 g of anisole was coated on the $SiO_2$ film and baked to form a polysilane film having a thickness of 250 nm. Then, the polysilane film was exposed to i-line (365 nm) for 2 minutes in a nitrogen atmosphere thereby to crosslink and insolubilize the polysilane. Then, a chemically amplified positive resist (TDUR-P007) was coated on the polysilane film and baked at 98° C. for 120 seconds to form a resist film having a thickness of 250 nm. Thereafter, the resist film was subjected to exposure through a mask with a dosage of 30 $mJ/cm^2$, which was effected from a reduction projection stepper employing KrF excimer laser as a light source. Then, the unexposed portion of resist film was subjected to EB exposure. In this manner, the resist was subjected to both ultraviolet exposure and EB exposure. Subsequently, the resist film was baked at 98° C. for 120 seconds, and then subjected to development with a 0.21N TMAH developing solution thereby to form a line-and-space resist pattern having a line width of 0.25 µm at the UV exposure portion and a line width of 0.2 µm at the EB exposure portion.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

EXAMPLE 51

An $SiO_2$ film having a thickness of 500 nm was formed on a silicon wafer. Then, a solution of 10 g of polysilane (PCPS-22) and 1 g of a conductive material (CM-8) in 100 g of anisole was coated on the $SiO_2$ film and baked to form a polysilane film having a thickness of 250 nm. Then, the polysilane film was exposed to i-line (365 nm) for 2 minutes in a nitrogen atmosphere thereby to crosslink and insolubilize the polysilane. Then, a chemically amplified positive resist (TDUR-P007) was coated on the polysilane film and baked at 98° C. for 120 seconds to form a resist film having a thickness of 250 nm. Thereafter, the resist film was subjected to exposure through a mask with a dosage of 30 $mJ/cm^2$, which was effected from a reduction projection stepper employing KrF excimer laser as a light source. Subsequently, the resist film was baked at 98° C. for 120 seconds, and then subjected to development with a 0.21N TMAH developing solution thereby to form a line-and-space resist pattern having a line width of 0.25 µm. Then, the polysilane film which was exposed from the resist pattern was exposed to an $I_2$ vapor.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

EXAMPLE 52

An $SiO_2$ film having a thickness of 500 nm was formed on a silicon wafer. Then, a solution of 10 g of polysilane (PCPS-8) in 90 g of xylene was coated on the $SiO_2$ film and baked to form a polysilane film having a thickness of 250 nm. Then, the polysilane film was exposed to i-line (365 nm) for 2 minutes in a nitrogen atmosphere thereby to crosslink and insolubilize the polysilane. Then, a chemically amplified positive resist (TDUR-P007) was coated on the polysilane film and baked at 98° C. for 120 seconds to form a resist film having a thickness of 250 nm. The resist film was then subjected to exposure through a mask with a dosage of 30 mJ/cm$^2$, which was effected from a reduction projection stepper employing KrF excimer laser as a light source.

Subsequently, the resist film was baked at 98° C. for 120 seconds, and then subjected to development with a 0.21N TMAH developing solution thereby to form a line-and-space resist pattern having a line width of 0.18 µm. When the profile of the resist pattern thus obtained was observed by means of an SEM, the formation of corrugation due to a standing wave was not recognized on the side wall of the resist pattern.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the SiO$_2$ film was subjected to etching with this polysilane film pattern being employed as a mask under the conditions of; 50 sccm in C$_4$F$_8$ flow rate; 10 sccm in CO flow rate; 100 sccm in Ar flow rate; 3 sccm in O$_2$ flow rate; 10 mTorr in vacuum degree; and 200 W in induction power. As a result, the polysilane film indicated excellent etching resistance so that it was possible to form an SiO$_2$ film pattern having vertical side walls. The residual polysilane film could be easily removed by making use of an aqueous organic alkaline solution or an aqueous dilute hydrofluoric acid solution.

EXAMPLE 53

An SiO$_2$ film having a thickness of 500 nm was formed on a silicon wafer. Then, a solution of 10 g of polysilane (PCPS-21) in 90 g of xylene was coated on the SiO$_2$ film and baked to form a polysilane film having a thickness of 250 nm. Then, the polysilane film was exposed to i-line (365 nm) for 2 minutes in a nitrogen atmosphere thereby to crosslink and insolubilize the polysilane. Then, a chemically amplified positive resist (TDUR-P007) was coated on the polysilane film and baked at 98° C. for 120 seconds to form a resist film having a thickness of 250 nm. The resist film was then subjected to exposure through a mask with a dosage of 30 mJ/cm$^2$, which was effected from a reduction projection stepper employing KrF excimer laser as a light source.

Subsequently, the resist film was baked at 98° C. for 120 seconds, and then subjected to development with a 0.21N TMAH developing solution thereby to form a line-and-space resist pattern having a line width of 0.18 µm. When the profile of the resist pattern thus obtained was observed by means of an SEM, the formation of corrugation due to a standing wave was not recognized on the side wall of the resist pattern.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the SiO$_2$ film was subjected to etching with this polysilane film pattern being employed as a mask under the conditions of; 50 sccm in C$_4$F$_8$ flow rate; 10 sccm in CO flow rate; 100 sccm in Ar flow rate; 3 sccm in O$_2$ flow rate; 10 mTorr in vacuum degree; and 200 W in induction power. As a result, the polysilane film indicated excellent etching resistance so that it was possible to form an SiO$_2$ film pattern having vertical side walls. The residual polysilane film could be easily removed by making use of an aqueous organic alkaline solution or an aqueous dilute hydrofluoric acid solution.

EXAMPLE 54

An experiment was performed as described below, the conditions and results being shown in Table 29. Namely, a solution of each polysilane (shown in Table 29) in 100 g of a solvent was spin-coated on a silicon wafer and baked for one minute at 100° C. to form a polysilane film having a thickness of 500 nm. Then, each polysilane film was exposed to i-line (365 nm) for 2 minutes in a nitrogen atmosphere. By the way, the polysilane film of Comparative Example 5 was not subjected to exposure to i-line. The polysilane films thus obtained were measured to examine the absorbance per 0.1 µm thickness at a wavelength of 248 nm. Further, each polysilane was dipped into PGMEA (a solvent for the resist) for one minute, then pulled up and dried to observe whether the thickness thereof was reduced or not, thereby evaluating the solubility to PGMEA of each polysilane film. This evaluation is a measure to determine if the mixing thereof with a resist would occur.

In addition to the samples of polysilane film prepared as mentioned above, the samples wherein a chemically amplified positive resist (APEX-E) was coated on a silicon wafer, and the samples wherein an SiO$_2$ film was formed on a silicon wafer were prepared. Then, these films were etched by means of a magnetron RIE to determine the etching rates thereof. Based on these etching rates thus measured, the etch rate ratio between a polysilane film and a resist film, ERR (P/R), and the etch rate ratio between a polysilane film and an SiO$_2$ film, ERR (P/S) were calculated. In this case, the ERR (P/R) was determined under the etching conditions of; 50 sccm in HBr flow rate; 8 mTorr in vacuum degree; and 200 W in induction power. The ERR (P/S) was determined under the etching conditions of; 50 sccm in C$_4$F$_8$ flow rate; 10 sccm in CO flow rate; 100 sccm in Ar flow rate; 3 sccm in O$_2$ flow rate; 10 mTorr in vacuum degree; and 200 W in induction power.

As seen from Table 29, it was possible to prevent the mixing with a resist by rendering a polysilane having a photo-crosslinkable substituent to crosslink by means of light, and at the same time to obtain a film excellent in anti-reflective property and in etching resistance. On the other hand, as seen in Comparative Example 5, the polysilane films which were not subjected to crosslinking by means of light were soluble in the solvent (PGMEA) for the resist.

TABLE 29

| polysilane | Comparative Example 5<br>PCPS-1 | Example | | | | | | | | |
|---|---|---|---|---|---|---|---|---|---|---|
| | | 54-1<br>PCPS-1 | 54-2<br>PCPS-5 | 54-3<br>PCPS-6 | 54-4<br>PCPS-8 | 54-5<br>PCPS-9 | 54-6<br>PCPS-16 | 54-7<br>PCPS-18 | 54-8<br>PCPS-21 | 54-9<br>PCPS-23 |
| i-line irradiation | no | in $N_2$<br>2 min | in $N_2$<br>2 min | in $N_2$<br>2 min | in $N_2$<br>2 min | in $N_2$<br>2 min | in $N_2$<br>2 min | in $N_2$<br>2 min | in $N_2$<br>2 min | in $N_2$<br>2 min |
| absorbance | 0.25 | 0.24 | 0.26 | 0.30 | 0.26 | 0.28 | 0.29 | 0.30 | 0.31 | 0.32 |
| PGMEA solubility | soluble | insoluble | insoluble | insoluble | insoluble | insoluble | insoluble | insoluble | insoluble | insoluble |
| ERR(P/R) | 8 | 6 | 9 | 5 | 8 | 6 | 8 | 6 | 6 | 7 |
| ERR(P/S) | 0.05 | 0.04 | 0.07 | 0.02 | 0.06 | 0.07 | 0.05 | 0.04 | 0.06 | 0.07 |

Comparative Example 6

An $SiO_2$ film having a thickness of 500 nm was formed on a silicon wafer. Then, a solution of polysilane (PCPS-16) was coated on the $SiO_2$ film and baked to form a polysilane film having a thickness of 250 nm. Without subjecting the polysilane film to a crosslinking treatment by means of light, a chemically amplified positive resist (TDUR-P007) was coated on the polysilane film and baked at 89° C. for 120 seconds to form a resist film having a thickness of 250 nm. The resist film was then subjected to exposure through a mask with a dosage of 30 mJ/cm², which was effected from a reduction projection stepper employing KrF excimer laser as a light source.

Subsequently, the resist film was baked at 98° C. for 120 seconds, and then subjected to development with a 0.21N TMAH developing solution. As a result, an insolubilized layer was formed at the interface of polysilane/resist, and hence the resolution of the pattern was deteriorated.

EXAMPLE 55

An $SiO_2$ film having a thickness of 500 nm was formed on a silicon wafer. Then, a solution of 10 g of polysilane (PS-1) in 100 g of xylene was coated on the $SiO_2$ film and baked to form a polysilane film having a thickness of 250 nm. Then, after this polysilane film was allowed to expose to $I_2$ vapor, a chemically amplified positive resist (TDUR-P007) was coated on the polysilane film and baked at 98° C. for 120 seconds to form a resist film having a thickness of 250 nm. The resist film was then subjected to exposure through a mask with a dosage of 30 mJ/cm², which was effected from a reduction projection stepper employing KrF excimer laser as a light source.

Subsequently, the resist film was baked at 98° C. for 120 seconds, and then subjected to development with a 0.21N TMAH developing solution thereby to form a line-and-space resist pattern having a line width of 0.28 μm. When the profile of the resist pattern thus obtained was observed by means of an SEM, the formation of corrugation due to a standing wave was not recognized on the side wall of the resist pattern.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

EXAMPLE 56

An $SiO_2$ film having a thickness of 500 nm was formed on a silicon wafer. Then, 7 g of polysilane (PS-1), 3 g of naphthol novolak resin and 0.01 g of $Ph_3P$ were dissolved in 100 g of cyclohexanone to obtain a solution, which was then coated on the $SiO_2$ film and baked for 3 minutes at 150° C. to form a polysilane film having a thickness of 250 nm. Then, after this polysilane film was allowed to expose to $SbF_5$ vapor, a chemically amplified positive resist (TDUR-P007) was coated on the polysilane film and baked at 98° C. for 120 seconds to form a resist film having a thickness of 250 nm. The resist film was then subjected to EB exposure with a dosage of 100 μC/cm².

Subsequently, the resist film was baked at 98° C. for 120 seconds, and then subjected to development with a 0.21N TMAH developing solution thereby to form a line-and-space resist pattern having a line width of 0.20 μm. When the profile of the resist pattern thus obtained was observed by means of an SEM, the formation of corrugation due to a standing wave was not recognized on the side wall of the resist pattern.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

Comparative Example 7

An $SiO_2$ film having a thickness of 500 nm was formed on a silicon wafer. Then, 7 g of polysilane (PS-1), 3 g of naphthol novolak resin and 0.01 g of $Ph_3P$ were dissolved in 100 g of cyclohexanone to obtain a solution, which was then coated on the $SiO_2$ film and baked for 3 minutes at 150° C. to form a polysilane film having a thickness of 250 nm. A chemically amplified positive resist (TDUR-P007) was then coated on the polysilane film and baked at 89° C. for 120 seconds to form a resist film having a thickness of 250 nm. The resist film was then subjected to EB exposure with a dosage of 100 $\mu C/cm^2$, and baked at 98° C. for 120 seconds. When this resist film was subjected to development with a 0.21N TMAH developing solution, it was impossible to obtain a resist pattern having a line width of 0.20 $\mu m$.

EXAMPLE 57

An $SiO_2$ film having a thickness of 500 nm was formed on a silicon wafer. Then, 7 g of polysilane (PS-1), 3 g of bismaleimide resin and 0.01 g of benzoyl peroxide were dissolved in 100 g of cyclohexanone to obtain a solution, which was then coated on the $SiO_2$ film and baked for 3 minutes at 150° C. to form a polysilane film having a thickness of 250 nm. Then, a chemically amplified positive resist (TDUR-P007) was coated on the polysilane film and baked at 98° C. for 120 seconds to form a resist film having a thickness of 250 nm. The resist film was then subjected, while being irradiated with weak ultraviolet rays, to EB exposure with a dosage of 100 $\mu C/cm^2$.

Subsequently, the resist film was baked at 98° C. for 120 seconds, and then subjected to development with a 0.21N TMAH developing solution thereby to form a line-and-space resist pattern having a line width of 0.20 $\mu m$. When the profile of the resist pattern thus obtained was observed by means of an SEM, the formation of corrugation due to a standing wave was not recognized on the side wall of the resist pattern. A portion of this polysilane film which was exposed out of the resist pattern was allowed to expose to $SbF_5$ vapor.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

EXAMPLE 58

An $SiO_2$ film having a thickness of 500 nm was formed on a silicon wafer. Then, 10 g of polysilane (PS-33) and 0.01 g of C60 were dissolved in 100 g of xylene to obtain a solution, which was then coated on the $SiO_2$ film and baked to form a polysilane film having a thickness of 250 nm. Then, after this polysilane film was allowed to expose to $SbF_5$ vapor, a chemically amplified positive resist (TDUR-P007) was coated on the polysilane film and baked at 98° C. for 120 seconds to form a resist film having a thickness of 250 nm. Thereafter, the resist film was subjected to exposure through a mask with a dosage of 30 $mJ/cm^2$, which was effected from a reduction projection stepper employing KrF excimer laser as a light source. Then, while being exposed to light having a wavelength larger than 400 nm, the unexposed portion of resist film was subjected to EB exposure. In this manner, the resist was subjected to both ultraviolet exposure and EB exposure. Subsequently, the resist film was baked at 98° C. for 120 seconds, and then subjected to development with a 0.21N TMAH developing solution thereby to form a line-and-space resist pattern having a line width of 0.25 $\mu m$ at the UV exposure portion and a line width of 0.2 $\mu m$ at the EB exposure portion.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

EXAMPLE 59

An $SiO_2$ film having a thickness of 500 nm was formed on a silicon wafer. Then, 7 g of polysilane (PS-13), 3 g of epibisepoxy resin, 0.01 g of Al(acac) and 1 g of TCNQ (tetracyanoquinodimethane) were dissolved in 100 g of xylene to obtain a solution, which was then coated on the $SiO_2$ film and baked for 10 minutes at 120° C. to form a polysilane film having a thickness of 250 nm. Then, a chemically amplified positive resist (TDUR-P007) was coated on the polysilane film and baked at 98° C. for 120 seconds to form a resist film having a thickness of 250 nm. Thereafter, the resist film was subjected to exposure through a mask with a dosage of 30 $mJ/cm^2$, which was effected from a reduction projection stepper employing KrF excimer laser as a light source. Then, while being exposed to light having a wavelength larger than 400 nm, the unexposed portion of resist film was subjected to EB exposure. In this manner, the resist was subjected to both ultraviolet exposure and EB exposure. Subsequently, the resist film was baked at 98° C. for 120 seconds, and then subjected to development with a 0.21N TMAH developing solution thereby to form a line-and-space resist pattern having a line width of 0.25 $\mu m$ at the UV exposure portion and a line width of 0.2 $\mu m$ at the EB exposure portion.

Then, the polysilane film was etched through this resist pattern (mask), while being exposed to ultraviolet rays, under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

EXAMPLE 60

An $SiO_2$ film having a thickness of 500 nm was formed on a silicon wafer. Then, 10 g of polysilane (PS-11) and 1 g of the conductive material (CM-18) were dissolved in 100 g of cyclohexanone to obtain a solution, which was then coated on the $SiO_2$ film and baked to form a polysilane film having a thickness of 250 nm. After the polysilane film was irradiated with ultraviolet rays, a chemically amplified positive resist (TDUR-P007) was coated on the polysilane film and baked at 98° C. for 120 seconds to form a resist film having a thickness of 250 nm. Thereafter, the resist film was subjected to exposure through a mask with a dosage of 30 $mJ/cm^2$, which was effected from a reduction projection stepper employing KrF excimer laser as a light source. Then, the unexposed portion of resist film was subjected to EB exposure. In this manner, the resist was subjected to both ultraviolet exposure and EB exposure. Subsequently, the resist film was baked at 98° C. for 120 seconds, and then subjected to development with a 0.21N TMAH developing solution thereby to form a line-and-space resist pattern having a line width of 0.25 μm at the UV exposure portion and a line width of 0.2 μm at the EB exposure portion.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

EXAMPLE 61

An $SiO_2$ film having a thickness of 500 nm was formed on a silicon wafer. Then, 10 g of polysilane (PS-49) and 1 g of the conductive material (CM-42) were dissolved in 100 g of cyclohexanone to obtain a solution, which was then coated on the $SiO_2$ film and baked to form a polysilane film having a thickness of 250 nm. After the polysilane film was entirely irradiated with ultraviolet rays, a chemically amplified positive resist (TDUR-P007) was coated on the polysilane film and baked at 98° C. for 120 seconds to form a resist film having a thickness of 250 nm. Thereafter, the resist film was subjected to exposure through a mask with a dosage of 30 $mJ/cm^2$, which was effected from a reduction projection stepper employing KrF excimer laser as a light source. Then, the unexposed portion of resist film was subjected to EB exposure. In this manner, the resist was subjected to both ultraviolet exposure and EB exposure. Subsequently, the resist film was baked at 98° C. for 120 seconds, and then subjected to development with a 0.21N TMAH developing solution thereby to form a line-and-space resist pattern having a line width of 0.25 μm at the UV exposure portion and a line width of 0.2 μm at the EB exposure portion.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

EXAMPLE 62

An $SiO_2$ film having a thickness of 500 nm was formed on a silicon wafer. Then, 10 g of polysilane (PS-54) and 1 g of the conductive material (CM-47) were dissolved in 100 g of cyclohexanone to obtain a solution, which was then coated on the $SiO_2$ film and baked to form a polysilane film having a thickness of 250 nm. A chemically amplified positive resist (TDUR-P007) was then coated on the polysilane film and baked at 98° C. for 120 seconds to form a resist film having a thickness of 250 nm. Thereafter, the resist film was subjected to exposure through a mask with a dosage of 30 $mJ/cm^2$, which was effected from a reduction projection stepper employing KrF excimer laser as a light source. Then, the unexposed portion of resist film was subjected to EB exposure. In this manner, the resist was subjected to both ultraviolet exposure and EB exposure. Subsequently, the resist film was baked at 98° C. for 120 seconds, and then subjected to development with a 0.21N TMAH developing solution thereby to form a line-and-space resist pattern having a line width of 0.25 μm at the UV exposure portion and a line width of 0.2 μm at the EB exposure portion.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

EXAMPLE 63

An $SiO_2$ film having a thickness of 500 nm was formed on a silicon wafer. Then, 10 g of polysilane (PS-54) and 1 g of the conductive material (CM-47) were dissolved in 100 g of cyclohexanone to obtain a solution, which was then coated on the $SiO_2$ film and baked to form a polysilane film having a thickness of 250 nm. A chemically amplified positive resist (TDUR-P007) was then coated on the polysilane film and baked at 98° C. for 120 seconds to form a resist film having a thickness of 250 nm. Thereafter, the resist film was subjected to exposure through a mask with a dosage of 30 $mJ/cm^2$, which was effected from a reduction projection stepper employing KrF excimer laser as a light source. Subsequently, the resist film was baked at 98° C. for 120 seconds, and then subjected to development with a 0.21N TMAH developing solution thereby to form a line-and-space resist pattern having a line width of 0.25 μm. Then, a portion of the polysilane film which was exposed out of the resist pattern was exposed to an $I_2$ vapor.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

EXAMPLE 64

An $SiO_2$ film having a thickness of 500 nm was formed on a silicon wafer. Then, 10 g of polysilane (PS-29) and 1 g of benzophenone tetracarboxylic acid t-butylperoxide (BTTB)(RG-12) were dissolved in 100 g of cyclohexanone to obtain a solution, which was then coated on the $SiO_2$ film and baked to form a polysilane film having a thickness of 250 nm, which was capable of functioning as a resist. Thereafter, the resist film was subjected to exposure through a mask with a dosage of 30 $mJ/cm^2$, which was effected from a reduction projection stepper employing KrF excimer laser as a light source. Then, the unexposed portion of resist film was subjected to EB exposure. In this manner, the resist was subjected to both ultraviolet exposure and EB exposure. Subsequently, the resist film was baked at 98° C. for 120 seconds, and then subjected to development with a 0.21N TMAH developing solution thereby to form a line-and-space polysilane film pattern having a line width of 0.25 μm at the UV exposure portion and a line width of 0.2 μm at the EB exposure portion.

Then, the $SiO_2$ film was subjected to etching with this polysilane film pattern being employed as a mask, while being exposed to ultraviolet rays, under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

EXAMPLE 65

An $SiO_2$ film having a thickness of 500 nm was formed on a silicon wafer. Then, 10 g of polysilane (PS-3) and 3 g of decaphenylpentasilyl-1,5-diol were dissolved in 100 g of cyclohexanone to obtain a solution, which was then coated on the $SiO_2$ film and baked to form a polysilane film having a thickness of 250 nm. Then, the polysilane film was heated for 5 minutes at 160° C. thereby to crosslink and insolubilize the polysilane film. A chemically amplified positive resist (TDUR-P007) was then coated on the polysilane film and baked at 98° C. for 120 seconds to form a resist film having a thickness of 250 nm. Thereafter, the resist film was subjected to exposure through a mask with a dosage of 30 $mJ/cm^2$, which was effected from a reduction projection stepper employing KrF excimer laser as a light source. Subsequently, the resist film was baked at 98° C. for 120 seconds, and then subjected to development with a 0.21N TMAH developing solution thereby to form a line-and-space resist pattern having a line width of 0.18 μm. When the profile of the resist pattern thus obtained was observed by means of an SEM, the formation of corrugation due to a standing wave was not recognized on the side wall of the resist pattern.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

When a polysilane solution containing 1 g of benzophenone tetracarboxylic acid t-butylperoxide (BTTB) or 0.5 g of azobisisobutyronitrile (AIBN) was substituted for the aforementioned polysilane solution in the above experiment and heated for one minute at 140° C. so as to crosslink and insolubilize the polysilane film, almost the same results as described above were obtained.

EXAMPLE 66

An $SiO_2$ film having a thickness of 500 nm was formed on a silicon wafer. Then, 10 g of polysilane (PS-11) and 4 g of decaphenylpentasilyl-1,5-dimethacrylate were dissolved in 100 g of cyclohexanone to obtain a solution, which was then coated on the $SiO_2$ film and baked to form a polysilane film having a thickness of 250 nm. Then, the polysilane film was heated for 5 minutes at 160° C. thereby to crosslink and insolubilize the polysilane film. A chemically amplified positive resist (TDUR-P007) was then coated on the polysilane film and baked at 98° C. for 120 seconds to form a resist film having a thickness of 250 nm. Thereafter, the resist film was subjected to exposure through a mask with a dosage of 30 $mJ/cm^2$, which was effected from a reduction projection stepper employing KrF excimer laser as a light source. Subsequently, the resist film was baked at 98° C. for 120 seconds, and then subjected to development with a 0.21N TMAH developing solution thereby to form a line-and-space resist pattern having a line width of 0.18 μm. When the profile of the resist pattern thus obtained was observed by means of an SEM, the formation of corrugation due to a standing wave was not recognized on the side wall of the resist pattern.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

When a polysilane solution containing 1 g of BTTB or 0.5 g of AIBN was substituted for the aforementioned polysilane solution in the above experiment and heated for one minute at 140° C. so as to crosslink and insolubilize the polysilane film, almost the same results as described above were obtained.

EXAMPLE 67

An $SiO_2$ film having a thickness of 500 nm was formed on a silicon wafer. Then, 10 g of polysilane (PS-1) and 1 g of BTTB (RG-12) were dissolved in 100 g of cyclohexanone to obtain a solution, which was then coated on the $SiO_2$ film and baked to form a polysilane film having a thickness of 250 nm. Then, tetravinylsilane gas was introduced to the reaction system while heating the polysilane film at 160° C. under a reduced pressure thereby to crosslink and insolubilize the polysilane film. A chemically amplified positive resist (TDUR-P007) was then coated on the polysilane film and baked at 98° C. for 120 seconds to form a resist film having a thickness of 250 nm. Thereafter, the resist film was subjected to exposure through a mask with a dosage of 30 mJ/cm², which was effected from a reduction projection stepper employing KrF excimer laser as a light source. Subsequently, the resist film was baked at 98° C. for 120 seconds, and then subjected to development with a 0.21N TMAH developing solution thereby to form a line-and-space resist pattern having a line width of 0.18 μm. When the profile of the resist pattern thus obtained was observed by means of an SEM, the formation of corrugation due to a standing wave was not recognized on the side wall of the resist pattern.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

EXAMPLE 68

An $SiO_2$ film having a thickness of 500 nm was formed on a silicon wafer. Then, 10 g of polysilane f(PS-55) and 10 g of decaphenylpentasilyl-1,5-diacrylate were dissolved in 100 g of cyclohexanone to obtain a solution, which was then coated on the $SiO_2$ film and baked to form a polysilane film having a thickness of 250 nm. Then, the polysilane film was heated for 5 minutes at 160° C. thereby to crosslink and insolubilize the polysilane film. A chemically amplified positive resist (TDUR-P007) was then coated on the polysilane film and baked at 98° C. for 120 seconds to form a resist film having a thickness of 250 nm. Thereafter, the resist film was subjected to exposure through a mask with a dosage of 30 mJ/cm², which was effected from a reduction projection stepper employing KrF excimer laser as a light source. Subsequently, the resist film was baked at 98° C. for 120 seconds, and then subjected to development with a 0.21N TMAH developing solution thereby to form a line-and-space resist pattern having a line width of 0.18 μm. When the profile of the resist pattern thus obtained was observed by means of an SEM, the formation of corrugation due to a standing wave was not recognized on the side wall of the resist pattern.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

When a polysilane solution containing 1 g of BTTB or 0.5 g of AIBN was substituted for the aforementioned polysilane solution in the above experiment and heated for one minute at 140° C. so as to crosslink and insolubilize the polysilane film, almost the same results as described above were obtained.

EXAMPLE 69

An $SiO_2$ film having a thickness of 500 nm was formed on a silicon wafer. Then, 10 g of polysilane (PS-69) and 5 g of decaphenylpentasilyl-1,5-diol were dissolved in 100 g of cyclohexanone to obtain a solution, which was then coated on the $SiO_2$ film and baked to form a polysilane film having a thickness of 250 nm. Then, the polysilane film was heated for 5 minutes at 160°0 C. thereby to crosslink and insolubilize the polysilane film. A chemically amplified positive resist (TDUR-P007) was then coated on the polysilane film and baked at 98° C. for 120 seconds to form a resist film having a thickness of 250 nm. Thereafter, the resist film was subjected to exposure through a mask with a dosage of 30 mJ/cm², which was effected from a reduction projection stepper employing KrF excimer laser as a light source. Subsequently, the resist film was baked at 98° C. for 120 seconds, and then subjected to development with a 0.21N TMAH developing solution thereby to form a line-and-space resist pattern having a line width of 0.18 µm. When the profile of the resist pattern thus obtained was observed by means of an SEM, the formation of corrugation due to a standing wave was not recognized on the side wall of the resist pattern.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

When a polysilane solution containing 1 g of BTTB or 0.5 g of AIBN was substituted for the aforementioned polysilane solution in the above experiment and heated for one minute at 140° C. so as to crosslink and insolubilize the polysilane film, almost the same results as described above were obtained.

EXAMPLE 70

An experiment was performed as described below, the conditions and results being shown in Table 30. Namely, a solution of each polysilane (together with a crosslinking agent and a catalyst, if required) in 100 g of a solvent was spin-coated on a silicon wafer and baked for one minute at 100° C. to form a polysilane film having a thickness of 500 nm. The substituent groups of the crosslinking agents employed in Examples 70-27 to 70-33 are: (SC-2) (X=Me) in Example 70-27; (SC-2) (X=OH) in Example 70-28; (SC-3) (X=NEt₂) in Example 70-29; (SC-7) (X=COCH₃) in Example 70-30; (SC-3) (X=NCEt₂) in Example 70-31; (SC-7) (X=NMeCOMe) in Example 70-32; and (SC-3) (X=OMe) in Example 70-33.

Then, each polysilane film was post-baked after performing the exposure thereof under a predetermined condition or without performing the exposure. The polysilane films thus obtained were measured to examine the absorbance per 0.1 µm thickness at an exposure wavelength of 248 nm. Further, each polysilane was dipped into ethyl lactate (EL) (a solvent for the resist) for one minute, then pulled up and dried to observe whether the thickness thereof was reduced or not, thereby evaluating the solubility to PGMEA of each polysilane film. This evaluation is a measure to determine if the mixing thereof with a resist would occur.

In addition to the samples of polysilane film prepared as mentioned above, a sample wherein a chemically amplified positive resist (APEX-E) was coated on a silicon wafer, and a sample wherein an $SiO_2$ film was formed on a silicon wafer were prepared. Then, these films were etched by means of a magnetron RIE to determine the etching rates thereof. Based on these etching rates thus measured, the etch rate ratio between a polysilane film and a resist film, ERR (P/R), and the etch rate ratio between a polysilane film and an $SiO_2$ film, ERR (P/S) were calculated. In this case, the ERR (P/R) was determined under the etching conditions of; 50 sccm in HBr flow rate; 8 mTorr in vacuum degree; and 200 W in induction power. The ERR (P/S) was determined under the etching conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power.

As seen from Table 30, it was possible to prevent the mixing with a resist by rendering a polysilane to crosslink by means of light or heat according to the method of this invention, and at the same time to obtain a film excellent in anti-reflective property and in etching resistance.

TABLE 30

| | Comparative | Example | | | | |
|---|---|---|---|---|---|---|
| | Example 8 | 70-1 | 70-2 | 70-3 | 70-4 | 70-5 |
| polysilane (g) | PS-1 (100) | PS-1 (90) | PS-1 (90) | PS-2 (90) | PS-4 (90) | PS-7 (90) |
| crosslinking agent (g) | — | MB-7 (10) | MB-7 (10) | MB-7 (10) | MB-10 (10) | MB-11 (10) |
| catalyst (g) | — | — | RG-12 (5) | — | RG-1 (5) | RG-12 (5) |
| exposure | — | 193 nm 500 mJ | 193 nm 500 mJ | 193 nm 500 mJ | — | — |
| post baking | 200° C. 3 min | 200° C. 1 min | 150° C. 1 min | 180° C. 1 min | 180° C. 2 min | 180° C. 2 min |
| absorbance | 0.25 | 0.35 | 0.55 | 0.45 | 0.55 | 0.60 |
| EL solubility | soluble | insoluble | insoluble | insoluble | insoluble | insoluble |
| ERR(P/R) | 7 | 10 | 15 | 11 | 12 | 15 |
| ERR(P/S) | 0.25 | 0.10 | 0.08 | 0.2 | 0.10 | 0.09 |
| | Example | | | | | |
| | 70-6 | 70-7 | 70-8 | 70-9 | 70-10 | 70-11 |
| polysilane | PS-15 | PS-20 | PS-23 | PS-28 | PS-1 | PS-2 |

TABLE 30-continued

| | | | | | | |
|---|---|---|---|---|---|---|
| (g) | (90) | (90) | (90) | (90) | (90) | (90) |
| crosslinking agent | MB-13 | MB-66 | MB-69 | MB-70 | OH-6 | OH-7 |
| (g) | (10) | (10) | (20) | (10) | (20) | (20) |
| catalyst | RG-12 | RG-12 | RG-12 | RG-12 | — | — |
| (g) | (5) | (5) | (5) | (7) | | |
| exposure | 193 nm 500 mJ | — | 193 nm 500 mJ | — | — | — |
| post baking | 140° C. 1 min | 180° C. 3 min | 150° C. 1 min | 180° C. 2 min | 180° C. 1 min | 180° C. 1 min |
| absorbance | 0.66 | 0.55 | 0.55 | 0.45 | 0.55 | 0.60 |
| EL solubility | insoluble | insoluble | insoluble | insoluble | insoluble | insoluble |
| ERR(P/R) | 15 | 15 | 12 | 8 | 10 | 13 |
| ERR(P/S) | 0.05 | 0.08 | 0.03 | 0.07 | 0.10 | 0.07 |

| | Example | | | | | |
|---|---|---|---|---|---|---|
| | 70-12 | 70-13 | 70-14 | 70-15 | 70-16 | 70-17 |
| polysilane | PS-2 | PS-4 | PS-7 | PS-15 | PS-20 | PS-23 |
| (g) | (90) | (90) | (90) | (90) | (90) | (90) |
| crosslinking agent | OH-8 | OH-9 | OH-13 | OH-10 | OH-22 | OH-28 |
| (g) | (10) | (20) | (10) | (10) | (10) | (20) |
| catalyst | — | — | RG-12 | — | RG-12 | — |
| (g) | | | (5) | | (5) | |
| exposure | 193 nm 500 mJ | — | — | — | — | — |
| post baking | 180° C. 1 min | 180° C. 2 min | 180° C. 2 min | 170° C. 1 min | 190° C. 3 min | 170° C. 1 min |
| absorbance | 0.65 | 0.70 | 0.60 | 0.66 | 0.50 | 0.55 |
| EL solubility | insoluble | insoluble | insoluble | insoluble | insoluble | insoluble |
| ERR(P/R) | 11 | 12 | 15 | 15 | 14 | 12 |
| ERR(P/S) | 0.2 | 0.04 | 0.09 | 0.05 | 0.08 | 0.03 |

| | Example | | | | | |
|---|---|---|---|---|---|---|
| | 70-18 | 70-19 | 70-20 | 70-21 | 70-22 | 70-23 |
| polysilane | PS-1 | PS-2 | PS-2 | PS-4 | PS-7 | PS-15 |
| (g) | (90) | (90) | (90) | (90) | (90) | (90) |
| crosslinking agent | EP-1 | EP-3 | EP-10 | EP-11 | EP-8 | AM-1 |
| (g) | (20) | (10) | (20) | (10) | (20) | (10) |
| catalyst | — | AG-7 | AG-7 | AG-7 | RG-12 | RG-12 |
| (g) | | (3) | (3) | (3) | (5) | (5) |
| exposure | — | 193 nm 100 mJ | 193 nm 100 mJ | 193 nm 100 mJ | — | — |
| post baking | 180° C. 1 min | 150° C. 1 min | 150° C. 1 min | 150° C. 2 min | 180° C. 2 min | 140° C. 1 min |
| absorbance | 0.45 | 0.60 | 0.45 | 0.60 | 0.60 | 0.70 |
| EL solubility | insoluble | insoluble | insoluble | insoluble | insoluble | insoluble |
| ERR(P/R) | 15 | 15 | 11 | 12 | 15 | 15 |
| ERR(P/S) | 0.10 | 0.08 | 0.2 | 0.10 | 0.09 | 0.05 |

| | Example | | | | | |
|---|---|---|---|---|---|---|
| | 70-24 | 70-25 | 70-26 | 70-27 | 70-28 | 70-29 |
| polysilane | PS-20 | PS-23 | PS-28 | PS-1 | PS-2 | PS-2 |
| (g) | (90) | (90) | (90) | (90) | (90) | (90) |
| crosslinking agent | AM-12 | AM-13 | PO-1 | SC-1 | SC-2 | SC-3 |
| (g) | (10) | (10) | (10) | (10) | (10) | (10) |
| catalyst | RG-12 | RG-12 | — | — | RG-12 | RG-12 |
| (g) | (5) | (5) | | | (5) | (5) |
| exposure | — | — | 193 nm 100 mJ | — | 193 nm 500 mJ | 193 nm 500 mJ |
| post baking | 150° C. 3 min | 150° C. 1 min | 150° C. 2 min | 200° C. 1 min | 150° C. 1 min | 180° C. 1 min |
| absorbance | 0.55 | 0.55 | 0.45 | 0.35 | 0.55 | 0.45 |
| EL solubility | insoluble | insoluble | insoluble | insoluble | insoluble | insoluble |
| ERR(P/R) | 15 | 12 | 8 | 10 | 15 | 11 |
| ERR(P/S) | 0.08 | 0.03 | 0.07 | 0.10 | 0.08 | 0.2 |

| | Example | | | | | |
|---|---|---|---|---|---|---|
| | 70-30 | 70-31 | 70-32 | 70-33 | 70-34 | 70-35 |
| polysilane | PS-4 | PS-7 | PS-15 | PS-20 | PS-1 | MB-86 |
| (g) | (90) | (90) | (90) | (90) | (10) | (10) |
| crosslinking agent | SC-7 | SC-3 | SC-7 | SC-13 | MB-85 | — |
| (g) | (10) | (10) | (10) | (10) | (3) | |

TABLE 30-continued

| catalyst (g) | — | — | — | — | RG-12 (1) | RG-12 (0.1) |
|---|---|---|---|---|---|---|
| exposure | — | — | — | — | — | — |
| post baking | 190° C. 2 min | 180° C. 2 min | 170° C. 1 min | 180° C. 3 min | 150° C. 1 min | 150° C. 1 min |
| absorbance | 0.45 | 0.60 | 0.56 | 0.55 | 0.75 | 0.75 |
| EL solubility | insoluble | insoluble | insoluble | insoluble | insoluble | insoluble |
| ERR(P/R) | 12 | 15 | 15 | 15 | 20 | 20 |
| ERR(P/S) | 0.10 | 0.09 | 0.05 | 0.08 | 0.08 | 0.08 |

EXAMPLE 71

An $SiO_2$ film having a thickness of 500 nm was formed on a silicon wafer. Then, a solution comprising the polysilane (PS-1) of Example 70-2, the crosslinking agent (MB-7) and BTTB (RG-12) (catalyst) was coated on the $SiO_2$ film and baked to form a polysilane film having a thickness of 250 nm. Then, after this polysilane film was allowed to crosslink under the conditions described in Table 30 thereby to insolubilize the polysilane film, a chemically amplified positive resist (TDUR-P007) was coated on the polysilane film and baked at 98° C. for 120 seconds to form a resist film having a thickness of 250 nm. The resist film was then subjected to exposure through a mask with a dosage of 30 mJ/cm², which was effected from a reduction projection stepper employing KrF excimer laser as a light source.

Subsequently, the resist film was baked at 98° C. for 120 seconds, and then subjected to development with a 0.21N TMAH developing solution thereby to form a line-and-space resist pattern having a line width of 0.18 μm. When the profile of the resist pattern thus obtained was observed by means of an SEM, the formation of corrugation due to a standing wave was not recognized on the side wall of the resist pattern.

Then, the polysilane film was etched through this resist pattern (mask) under the conditions of; 50 sccm in HBr flow rate; 80 mTorr in vacuum degree; and 200 W in induction power. As a result, it was possible to form a polysilane film pattern having vertical side walls. The resist film remained on the polysilane film, thus indicating a sufficiently large etching rate ratio between these films.

Next, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. As a result, the polysilane film indicated excellent etching resistance so that it was possible to form an $SiO_2$ film pattern having vertical side walls. The residual polysilane film could be easily removed by making use of an aqueous organic alkaline solution or an aqueous dilute hydrofluoric acid solution.

Comparative Example 9

An $SiO_2$ film having a thickness of 500 nm was formed on a silicon wafer. Then, a solution comprising the polysilane (PS-1) of Example 70-2, the crosslinking agent (MB-7) and BTTB (RG-12) (catalyst) was coated on the $SiO_2$ film to form a polysilane film having a thickness of 250 nm. Without subjecting the polysilane film to an insolubilizing treatment by crosslinking thereof, a chemically amplified positive resist (TDUR-P007) was coated on the polysilane film and baked at 89° C. for 120 seconds to form a resist film having a thickness of 250 nm. The resist film was then subjected to exposure through a mask with a dosage of 30 mJ/cm², which was effected from a reduction projection stepper employing KrF excimer laser as a light source.

Subsequently, the resist film was baked at 98° C. for 120 seconds, and then subjected to development with a 0.21N TMAH developing solution. As a result, an insolubilized layer was formed at the interface of polysilane/resist, and hence the resolution of the pattern was deteriorated.

EXAMPLE 72

As shown in the following Table 31, a polysilane, a crosslinking agent, a catalyst and a conductive material were dissolved in 100 g of a solvent to prepare a solution, which was then employed to form an $SiO_2$ film pattern according to any one of the following six treating methods and then the property of the polysilane as an etching mask was examined. The results are shown in Table 31.

Treating Method (1)

An $SiO_2$ film having a thickness of 500 nm was formed on a silicon wafer. Then, a polysilane solution was coated on the $SiO_2$ film and baked to form a polysilane film having a thickness of 250 nm. Due to this baking, the polysilane which was crosslinkable was allowed to cure. Then, a chemically amplified positive resist (TDUR-P007) was coated on the polysilane film and baked at 90° C. for 120 seconds to form a resist film having a thickness of 250 nm. The resist film was then subjected to exposure through a mask with a dosage of 30 mJ/cm², which was effected from a reduction projection stepper employing KrF excimer laser as a light source.

Subsequently, the resist film was baked at 100° C. for 120 seconds, and then subjected to development with a 0.21N TMAH developing solution thereby to form a line-and-space resist pattern.

Then, the polysilane film was etched through this resist pattern (mask) under the conditions of; 50 sccm in HBr flow rate; 80 mTorr in vacuum degree; and 200 W in induction power. Then, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. The residual polysilane film was removed by making use of an aqueous organic alkaline solution or an aqueous dilute hydrofluoric acid solution.

Treating Method (2)

An $SiO_2$ film having a thickness of 500 nm was formed on a silicon wafer. Then, a polysilane solution was coated on the $SiO_2$ film and baked to form a polysilane film having a thickness of 250 nm. Due to this baking, the polysilane which was crosslinkable was allowed to cure. Then, a chemically amplified positive resist (TDUR-P007) was coated on the polysilane film and baked at 90° C. for 120 seconds to form a resist film having a thickness of 250 nm.

The resist film was then subjected to EB exposure with a dosage of 50 $\mu C/cm^2$.

Subsequently, the resist film was baked at 100° C. for 120 seconds, and then subjected to development with a 0.21N TMAH developing solution thereby to form a line-and-space resist pattern.

Then, the polysilane film was etched through this resist pattern (mask) under the conditions of; 50 sccm in HBr flow rate; 80 mTorr in vacuum degree; and 200 W in induction power. Then, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. The residual polysilane film was removed by making use of an aqueous organic alkaline solution or an aqueous dilute hydrofluoric acid solution.

Treating Method (3)

An $SiO_2$ film having a thickness of 500 nm was formed on a silicon wafer. Then, a polysilane solution was coated on the $SiO_2$ film and baked to form a polysilane film having a thickness of 250 nm. Due to this baking, the polysilane which was crosslinkable was allowed to cure. Then, a chemically amplified positive resist (TDUR-P007) was coated on the polysilane film and baked at 90° C. for 120 seconds to form a resist film having a thickness of 250 nm. The resist film was then subjected to EB exposure with a dosage of 50 $\mu C/cm^2$, in concurrent with an irradiation of ultraviolet rays of 350 nm or more in wavelength.

Subsequently, the resist film was baked at 100° C. for 120 seconds, and then subjected to development with a 0.21N TMAH developing solution thereby to form a line-and-space resist pattern.

Then, the polysilane film was etched through this resist pattern (mask) under the conditions of; 50 sccm in HBr flow rate; 80 mTorr in vacuum degree; and 200 W in induction power. Then, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. The residual polysilane film was removed by making use of an aqueous organic alkaline solution or an aqueous dilute hydrofluoric acid solution.

Treating Method (4)

An $SiO_2$ film having a thickness of 500 nm was formed on a silicon wafer. Then, a polysilane solution was coated on the $SiO_2$ film and baked to form a polysilane film having a thickness of 250 nm. Due to this baking, the polysilane which was crosslinkable was allowed to cure. Then, a chemically amplified positive resist (TDUR-P007) was coated on the polysilane film and baked at 90° C. for 120 seconds to form a resist film having a thickness of 250 nm. The resist film was then subjected to exposure through a mask with a dosage of 30 $mJ/cm^2$, which was effected from a reduction projection stepper employing KrF excimer laser as a light source. Additionally, unexposed portion of the resist film was subjected to EB exposure with a dosage of 50 $\mu C/cm^2$, in concurrent with an irradiation of ultraviolet rays of 350 nm or more in wavelength. Subsequently, the resist film was baked at 100° C. for 120 seconds, and then subjected to development with a 0.21N TMAH developing solution thereby to form a line-and-space resist pattern.

Then, the polysilane film was etched through this resist pattern (mask) under the conditions of; 50 sccm in HBr flow rate; 80 mTorr in vacuum degree; and 200 W in induction power. Then, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. The residual polysilane film was removed by making use of an aqueous organic alkaline solution or an aqueous dilute hydrofluoric acid solution.

Treating Method (5)

An $SiO_2$ film having a thickness of 500 nm was formed on a silicon wafer. Then, a polysilane solution was coated on the $SiO_2$ film and baked to form a polysilane film having a thickness of 250 nm. Due to this baking, the polysilane which was crosslinkable was allowed to cure. Then, a chemically amplified positive resist (TDUR-P007) was coated on the polysilane film and baked at 90° C. for 120 seconds to form a resist film having a thickness of 250 nm. The resist film was then subjected to exposure through a mask with a dosage of 30 $mJ/cm^2$, which was effected from a reduction projection stepper employing ArF excimer laser as a light source.

Subsequently, the resist film was baked at 100° C. for 120 seconds, and then subjected to development with a 0.21N TMAH developing solution thereby to form a line-and-space resist pattern.

Then, the polysilane film was etched through this resist pattern (mask) under the conditions of; 50 sccm in HBr flow rate; 80 mTorr in vacuum degree; and 200 W in induction power. Then, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. The residual polysilane film was removed by making use of an aqueous organic alkaline solution or an aqueous dilute hydrofluoric acid solution.

Treating Method (6)

An $SiO_2$ film having a thickness of 500 nm was formed on a silicon wafer. Then, a polysilane solution was coated on the $SiO_2$ film and baked to form a polysilane film having a thickness of 250 nm. Due to this baking, the polysilane which was crosslinkable was allowed to cure. Then, a chemically amplified positive resist (TDUR-P007) was coated on the polysilane film and baked at 90° C. for 120 seconds to form a resist film having a thickness of 250 nm. The resist film was then subjected to exposure through a mask with a dosage of 30 $mJ/cm^2$, which was effected from a reduction projection stepper employing KrF excimer laser as a light source. Additionally, unexposed portion of the resist film was subjected to EB exposure with a dosage of 50 $\mu C/cm^2$, in concurrent with an irradiation of ultraviolet rays of 350 nm or more in wavelength. Subsequently, the resist film was baked at 100° C. for 120 seconds, and then subjected to development with a 0.21N TMAH developing solution thereby to form a line-and-space resist pattern.

Then, under an irradiation of ultraviolet rays having a wavelength of 350 nm or more, the polysilane film was etched through this resist pattern (mask) under the conditions of; 50 sccm in HBr flow rate; 80 mTorr in vacuum degree; and 200 W in induction power. Then, the $SiO_2$ film was subjected to etching with this polysilane film pattern being employed as a mask under the conditions of; 50 sccm in $C_4F_8$ flow rate; 10 sccm in CO flow rate; 100 sccm in Ar flow rate; 3 sccm in $O_2$ flow rate; 10 mTorr in vacuum degree; and 200 W in induction power. The residual polysilane film was removed by making use of an aqueous organic alkaline solution or an aqueous dilute hydrofluoric acid solution.

The charge-up was evaluated as follows. Namely, a polysilane was coated on a substrate provided with an ITO electrode and then baked to form a polysilane film having a thickness of 250 nm. Then, the polysilane film was charged by way of corona charge and the resultant surface potential was measured to evaluate the charge-up.

In every samples, the formation of corrugation due to a standing wave was not recognized on the side wall of the resist pattern. Further, the patterns of polysilane film and $SiO_2$ film were formed with the sizes shown in Table 31, the side walls thereof being substantially vertical. When the EB exposure was performed concurrent with an irradiation of ultraviolet rays having a wavelength of 350 nm or more, the charge-up was not recognized at all, and the dimensional accuracy of the pattern was limited within 20 nm.

TABLE 31

| | Example | | | | |
|---|---|---|---|---|---|
| | 72-1 | 72-2 | 72-3 | 72-4 | 72-5 |
| polysilane (g) | PS-1 (10) | LPS-1 (10) | LPS-10 (10) | PS-1 (7) | PS-1 (7) |
| crosslinking agent (g) | — | — | — | naphthol novolak (3) | bismalaimide (3) |
| catalyst (g) | RG-12 (1) | — | — | $Ph_3P$ (0.01) | RG-1 (0.01) |
| conductive material (g) | — | — | — | — | — |
| solvent (g) | xylene (100) | xylene (100) | xylene (100) | xylene (100) | xylene (100) |
| post baking | 200° C. 5 min | 150° C. 3 min | 150° C. 3 min | 200° C. 5 min | 200° C. 5 min |
| treating method | 1 | 1 | 2 | 2 | 1 |
| solubility | EL insoluble | EL insoluble | EL insoluble | EL insoluble | EL insoluble |
| charge up | occurred | occurred | occurred | occurred | occurred |
| pattern size (μm) | 0.28 | 0.20 | 0.20 | 0.20 | 0.20 |
| dimension accuracy | — | — | — | — | — |

| | Example | | | | |
|---|---|---|---|---|---|
| | 72-6 | 72-7 | 72-8 | 72-9 | 72-10 |
| polysilane (g) | PS-3 (10) | PS-11 (10) | PS-1 (10) | PS-55 (10) | PS-56 (10) |
| crosslinking agent (g) | EP-1 (3) | PS-22 (4) | — | PS-22 (10) | EP-1 (5) |
| catalyst (g) | — | — | RG-12 (1) | AIBN (0.2) | — |
| conductive material (g) | — | — | — | — | — |
| solvent (g) | xylene (100) | xylene (100) | xylene (100) | cyclohexanone (100) | cyclohexanone (100) |
| post baking | 200° C. 5 min | 200° C. 5 min | 200° C. 5 min | 160° C. 5 min | 160° C. 5 min |
| treating method | 2 | 1 | 2 | 1 | 3 |
| solubility | EL insoluble | PGMEA insoluble | PGMEA insoluble | EL insoluble | EL insoluble |
| charge up | occurred | occurred | occurred | occurred | no |
| pattern size (μm) | 0.20 | 0.20 | 0.20 | 0.25 | 0.22 |
| dimension accuracy | — | — | — | — | — |

| | Example | | | | |
|---|---|---|---|---|---|
| | 72-11 | 72-12 | 72-13 | 72-14 | 72-15 |
| polysilane (g) | PS-56 (10) | MB-86 (10) | PS-29 (10) | PS-33 (10) | PS-11 (10) |
| crosslinking agent (g) | MB-85 (3) | — | — | — | — |
| catalyst (g) | RG-12 (1) | RG-12 (1) | RG-12 (1) | — | — |
| conductive material (g) | — | — | CM-18 (1) | C60 (0.1) | CM-18 (1) |
| solvent (g) | toluene (100) | toluene (100) | cyclohexanone (100) | xylene (100) | cyclohexanone (100) |
| post baking | 160° C. 5 min | 160° C. 5 min | 160° C. 5 min | 160° C. 5 min | 160° C. 5 min |
| treating method | 3 | 1 | 4 | 4 | 4 |
| solubility | EL insoluble | EL insoluble | EL insoluble | EL insoluble | EL insoluble |

TABLE 31-continued

| | | | | | |
|---|---|---|---|---|---|
| charge up | occurred | occurred | no | no | no |
| pattern size (μm) | 0.25 | 0.25 | 0.25 | 0.16 | 0.22 |
| dimension accuracy | — | — | <20 nm | <20 nm | <20 nm |

| | Example | | | | |
|---|---|---|---|---|---|
| | 72-16 | 72-17 | 72-18 | 72-19 | 72-20 |
| polysilane (g) | PS-49 (10) | PS-54 (10) | PS-59 (10) | PS-49 (10) | PS-49 (10) |
| crosslinking agent (g) | — | — | — | — | — |
| catalyst (g) | — | — | — | — | — |
| conductive material (g) | CM-42 (1) | CM-47 (1) | C70 (1) | RG-34 (1) | dicyano-anthracene (1) |
| solvent (g) | cyclohexanone (100) | cyclohexanone (100) | anisole (100) | anisole (100) | anisole (100) |
| post baking | 160° C. 5 min | 160° C. 5 min | 160° C. 5 min | 160° C. 5 min | 160° C. 5 min |
| treating method | 4 | 4 | 4 | 4 | 4 |
| solubility | EL insoluble | EL insoluble | EL insoluble | EL insoluble | EL insoluble |
| charge up | no | no | no | no | no |
| pattern size (μm) | 0.22 | 0.18 | 0.16 | 0.18 | 0.18 |
| dimension accuracy | <20 nm | <20 nm | <20 nm | <20 nm | <20 nm |

| | Example | | | | |
|---|---|---|---|---|---|
| | 72-21 | 72-22 | 72-23 | 72-24 | 72-25 |
| polysilane (g) | PS-55(6) PS-79(4) | PS-79 (10) | PS-13 (7) | MB-85 (10) | PS-13 (5) MB-87 (5) |
| crosslinking agent (g) | — | — | epoxy | — | |
| catalyst (g) | — | — | OM-1 (0.01) | RG-12 (1) | RG-12 (1) |
| conductive material (g) | CM-47 (0.15) | CM-70 (0.5) | TCNQ (1) | C60 (0.1) | C70 (0.01) |
| solvent (g) | xylene (100) | xylene (100) | xylene (100) | anisole (100) | anisole (100) |
| post baking | 160° C. 5 min | 160° C. 5 min | 160° C. 5 min | 160° C. 5 min | 160° C. 5 min |
| treating method | 4 | 5 | 4 | 4 | 5 |
| solubility | EL insoluble | EL insoluble | EL insoluble | EL insoluble | EL insoluble |
| charge up | no | no | no | no | no |
| pattern size (μm) | 0.18 | 0.18 | 0.18 | 0.18 | 0.18 |
| dimension accuracy | <20 nm | <20 nm | <20 nm | <20 nm | <20 nm |

| | Example | | | | |
|---|---|---|---|---|---|
| | 72-26 | 72-27 | 72-28 | 72-29 | 72-30 |
| polysilane (g) | PS-32 (5) | PS-55(6) PS-79(4) | PS-79 (10) | LPS-1 (10) | LPS-12 (10) |
| crosslinking agent (g) | MB-86 (5) | — | — | — | — |
| catalyst (g) | RG-12 (1) | — | — | — | — |
| conductive material (g) | C60 (0.2) | CM-47 (0.1) | CM-70 (0.5) | CM-43 (1) | C60 (0.1) |
| solvent (g) | anisole (100) | xylene (100) | xylene (100) | xylene (100) | xylene (100) |
| post baking | 160° C. 5 min | 160° C. 5 min | 160° C. 5 min | 160° C. 5 min | 160° C. 5 min |
| treating method | 4 | 4 | 4 | 4 | 6 |
| solubility | EL insoluble | EL insoluble | EL insoluble | EL insoluble | EL insoluble |
| charge up | no | no | no | no | no |
| pattern size (μm) | 0.20 | 0.18 | 0.18 | 0.18 | 0.18 |
| dimension accuracy | <20 nm | <20 nm | <20 nm | <20 nm | <20 nm |

Comparative Example 10

An SiO$_2$ film having a thickness of 500 nm was formed on a silicon wafer. Then, a chemically amplified positive resist (TDUR-P007) was coated on the polysilane film and baked at 90° C. for 120 seconds to form a resist film having a thickness of 250 nm. The resist film was then subjected to EB exposure with a dosage of 50 μC/cm$^2$ and baked at 100° C. for 120 seconds. When this resist film was developed with a 0.21N TMAH developing solution, the dimensional error of the resultant pattern was 100 nm.

Comparative Example 11

An SiO$_2$ film having a thickness of 500 nm was formed on a silicon wafer. Then, a solution of cresol novolak resin was coated on the SiO$_2$ film and baked for 30 minutes at 200° C. thereby to allow the cresol novolak resin film to crosslink. Then, a chemically amplified positive resist (TDUR-P007) was coated on the cresol novolak resin film and baked at 90° C. for 120 seconds to form a resist film having a thickness of 250 nm. The resist film was then subjected to exposure through a mask with a dosage of 30 mJ/cm$^2$, which was effected from a reduction projection stepper employing KrF excimer laser as a light source.

Subsequently, the resist film was baked at 100° C. for 120 seconds, and then subjected to development with a 0.21N TMAH developing solution. However, a pattern having an extremely sloped side walls was obtained.

EXAMPLE 74

An SiN film having a thickness of 500 nm was formed on a silicon wafer by means of an LPCVD method. Then, 10 g of a polysilane obtained in Synthesis No. 20 and having an organic silicon nanocluster structure (average molecular weight: 5000) was dissolved in 90 g of toluene to prepare a solution, which was then coated on the SiN film and baked at 120° C. for 120 seconds to form a polysilane film having a thickness of 250 nm.

When the complex refractive index of the polysilane film was measured at a wavelength of 248 nm by means of spectroellipsometry, complex refractive indexes of; n=2.08, k=0.36 were obtained. Then, a chemically amplified positive resist (APEX-E) was coated on the polysilane film and baked at 98° C. for 120 seconds to form a resist film having a thickness of 250 nm.

Then, the resist film was exposed through a mask to light with a dosage of 30 mJ/cm$^2$, which was effected from a reduction projection stepper employing KrF excimer laser as a light source. Subsequently, the resist was baked at 98° C. for 120 seconds, and then subjected to development with a 0.21N TMAH developing solution thereby to form a line-and-space pattern having a line width of 0.18 μm. At this moment, the thickness of the resist pattern had been reduced to 230 nm. When the profile of the resist pattern thus obtained was observed by means of an SEM, the formation of corrugation due to a standing wave was not recognized on the side wall of the resist pattern.

Then, the polysilane film was etched through this resist pattern (mask) using a magnetron RIE apparatus under the conditions of; 20 sccm in HBr flow rate; 30 mTorr in vacuum degree; and 300 W in induction power. As a result, the phenomenon that the resist pattern was disappeared in the middle of etching was not recognized at all. The profile of the side wall of the polysilane film after etching was vertical and excellent in anisotropy, and the discrepancy in dimension thereof in relative to the dimension of the resist pattern before etching was not recognized at all. The thickness of the resist film remaining after the etching was 100 nm.

Meanwhile, when the resist film and polysilane film were individually formed, and the etching rates thereof were measured under the same conditions as described above, the etching rate of the resist film was 25 nm/min, that of the polysilane film was 200 nm/min, and thus the etching rate of polysilane was 8.0 times as high as that of the resist film.

Next, the SiN film was etched through the resist pattern and the polysilane pattern (both being used as a mask) using a magnetron RIE apparatus under the conditions of; 30 sccm in CF$_4$ flow rate; 160 sccm in Ar flow rate; 3 mTorr in vacuum degree; and 350 W in induction power. As a result, the phenomenon that the polysilane pattern was disappeared in the middle of etching was not recognized at all. The profile of the side wall of the SiN film after etching was vertical and excellent in anisotropy, and the discrepancy in dimension thereof in relative to the dimension of the resist pattern before etching was not recognized at all.

Meanwhile, when the resist film, polysilane film and SiN film were individually formed, and the etching rates thereof were measured under the same conditions as described above, the etching rate of the resist film was 45 nm/min, that of the polysilane film was 17 nm/min, and that of the SiN film was 230 nm/min. The etching rate of SiN film was 13.0 times higher than that of the polysilane film, and 5.1 times higher than that of the resist film, indicating that the dry etching resistance of the polysilane film was higher than that of the resist film. It is considered that because of this excellent dry etching resistance of the polysilane film, it was possible to perform the etching of the SiN film in a desirable manner, i.e. excellent in perpendicularity and anisotropy without generating a dimensional discrepancy in relative to the dimension of the resist pattern before etching.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A method of forming a pattern, comprising:
   a) forming an insulating layer or conducting layer on a substrate;
   b) forming an organosilicon polymer film containing crosslinking agent on said insulating layer or conducting layer;
   c) subjecting said organosilicon polymer film to a crosslinking reaction by means of light or heat;
   d) forming a resist pattern on said organosilicon polymer film;
   e) etching said organosilicon polymer film with said resist pattern being employed as a mask, thereby forming an organosilicon polymer film pattern; and
   f) etching said insulating layer or conducting layer with said resist pattern and said organosilicon polymer film pattern being employed as a mask,
   wherein said organosilicon polymer is selected from the group consisting of
   a polysilane copolymer having a repeating unit selected from the group consisting of the following formulae (LPS-II) and (LPS-VI):

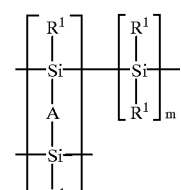
(LPS-II)

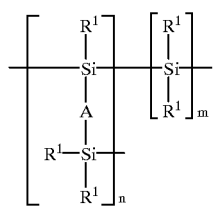
(LPS-VI)

wherein A is a bivalent organic group; $R^1$ substituents are the same or different and are selected from the group consisting or hydrogen, optionally hydrocarbon group and silyl group;

a polysilane copolymer having a repeating unit selected from the group consisting of the following formulae (ARPS-I) and (ARPS-II):

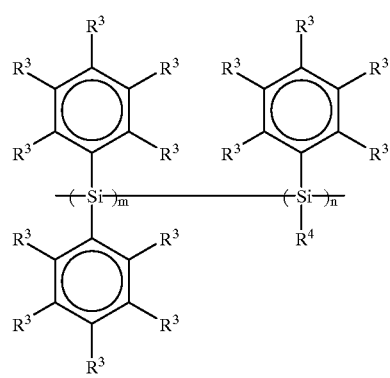
(ArPs-I)

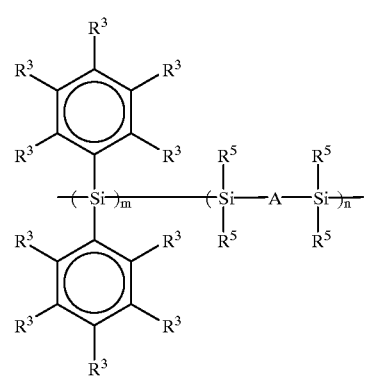
(ArPs-II)

wherein $R^3$ is selected from the group consisting of hydrogen, optionally substituted hydrocarbon group having not more than four carbon atoms, silyl, and alkoxyl; $R^4$ is selected from the group consisting of hydrogen, optionally substituted hydrocarbon having not more than four carbon atoms and silyl; $R^5$ is selected from the group consisting of hydrogen, optionally substituted aryl and hydrocarbon having not more than four carbon atoms;

m and n are positive integers;

a polysilane dendrimer having the formula (PSD-I) or (PSD-II):

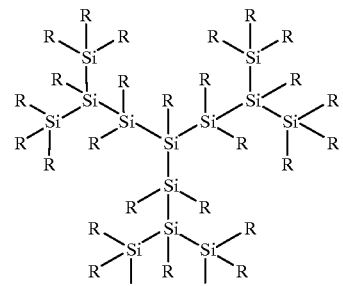
(PSD-I)

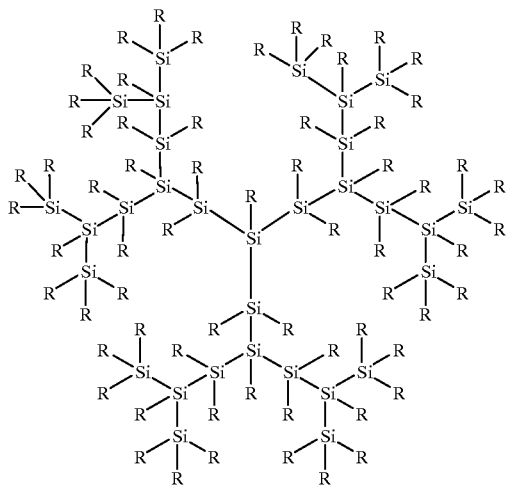
(PSD-II)

wherein R is optionally a substituted hydrocarbon.

2. The method of claim 1, wherein said organosilicon polymer further contains a reaction accelerator.

3. The method of claim 2, wherein said reaction accelerator is selected from the group consisting of a radical generator and an acid generator.

4. The method of claim 1, wherein said crosslinking agent is selected from the group consisting of a compound having a multiple bond; an organic compound having a hydroxyl group; an organic compound having an epoxy group; an organic compound having an amino group; pyridine oxide; a silicon compound having a group selected from the group consisting of alkoxysilyl; silyl ester; oxymesolyl; phenoxysilyl; aminosilyl; amidesilyl; aminoxysilyl; and halogen; an organometallic compound; and a compound containing halogen.

* * * * *